US006850179B2

(12) United States Patent
Toyama et al.

(10) Patent No.: US 6,850,179 B2

(45) Date of Patent: Feb. 1, 2005

(54) ENCODING APPARATUS AND ENCODING METHOD

(75) Inventors: Keisuke Toyama, Tokyo (JP); Shiro Suzuki, Kanagawa (JP); Minoru Tsuji, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/344,842

(22) PCT Filed: Jun. 14, 2002

(86) PCT No.: PCT/JP02/05956

§ 371 (c)(1), (2), (4) Date: Jun. 12, 2003

(87) PCT Pub. No.: WO02/103683

PCT Pub. Date: Dec. 27, 2002

(65) Prior Publication Data

US 2004/0015766 A1 Jan. 22, 2004

(30) Foreign Application Priority Data

Jun. 15, 2001 (JP) ........................................ 2001-182093

(51) Int. Cl.[7] ................................................ H03M 7/00

(52) U.S. Cl. ............................ 341/160; 341/50; 341/51

(58) Field of Search ............................ 341/160, 51, 50, 341/139; 704/225, 229, 219; 702/179

(56) References Cited

U.S. PATENT DOCUMENTS

| | | | | |
|---|---|---|---|---|
| 5,327,520 | A | 7/1994 | Chen | |
| 5,731,767 | A | 3/1998 | Tsutsui | 341/51 |
| 5,752,224 | A | 5/1998 | Tsutsui | 704/225 |
| 5,825,320 | A | 10/1998 | Miyamori | 341/139 |
| 5,901,234 | A | 5/1999 | Sonohara | 381/104 |
| 5,960,390 | A | 9/1999 | Ueno | 704/229 |
| 5,974,379 | A | 10/1999 | Hatanaka | 704/225 |
| 6,266,632 | B1 | 7/2001 | Kato | 704/219 |
| 6,675,125 | B2 * | 1/2004 | Bizjak | 702/179 |

FOREIGN PATENT DOCUMENTS

| | | |
|---|---|---|
| EP | 0 573216 | 8/1993 |
| EP | 0 693828 | 1/1996 |
| JP | 11-265200 | 9/1990 |
| JP | 06-083400 | 3/1994 |
| JP | 07-221648 | 8/1995 |
| JP | 07-221649 | 8/1995 |
| JP | 07-273657 | 10/1995 |
| JP | 08-223049 | 8/1996 |
| JP | 08-237132 | 9/1996 |
| JP | 09-16053 | 6/1997 |
| JP | 09-261063 | 10/1997 |
| JP | 09-284719 | 10/1997 |
| JP | 2000-114975 | 4/2000 |
| JP | 2000-196861 | 7/2000 |
| JP | 3186412 | 5/2001 |
| JP | 3263881 | 12/2001 |
| JP | 3307138 | 5/2002 |
| JP | 3307875 | 5/2002 |
| WO | WO 95/21489 | 8/1995 |

* cited by examiner

*Primary Examiner*—Jean Bruner Jeanglaude

(74) *Attorney, Agent, or Firm*—Sonnenschein, Nath & Rosenthal LLP

(57) ABSTRACT

Information is encoded into a code with a smaller number of bits. An encoding apparatus encodes an acoustic time series signal such that the acoustic time series signal is split into band signals in predetermined bands and gain adjustment is made on the band signals, at a gain control position by a gain control amount, for each of as many positions as indicated by a gain control number. Although the gain control number can take any one of values from 0 to 7, it has a high probability of taking a particular value (0, for example). The gain control number is encoded such that a code with a small number of bits is assigned to the gain control number equal to a value having a high-occurrence probability. The encoding is also applied to a voice recording apparatus.

81 Claims, 119 Drawing Sheets

| VALUE | CODE | NUMBER OF BITS |
|---|---|---|
| 0 | 0 | 1 |
| 1 | 10 | 2 |
| 2 | 110 | 3 |
| 3 | 1110 | 4 |
| 4~7 | 1111 + (NUMBER OF GAIN-CONTROLLED PARTS−4)(2 BITS) | 6 |

FIG. 13

| NUMBER OF GAIN-CONROLLED PARTS | | NUMBER OF BITS |
|---|---|---|
| $GA_0$ | 1 | 2 |
| $GA_1$ | 0 | 1 |
| $GA_2$ | 1 | 2 |
| $GA_3$ | 1 | 2 |
| $GA_4$ | 1 | 2 |
| $GA_5$ | 3 | 4 |
| $GA_6$ | 1 | 2 |
| $GA_7$ | 2 | 3 |
| $GA_8$ | 1 | 2 |
| $GA_9$ | 1 | 2 |
| $GA_{10}$ | 1 | 2 |
| $GA_{11}$ | 1 | 2 |
| | | 26 bits |

FIG. 14

| $b_0$ | $b_1$ | $b_2$ | $b_3$ | $b_4$ $b_5$ |
|---|---|---|---|---|
| 1 | 1 | 1 | 1 | NUMBER OF GAIN-CONROLLED PARTS − 4 |

FIG. 17

| NUMBER OF GAIN-CONROLLED PARTS | | DIFFERENCE VALUE VA | NUMBER OF BITS |
|---|---|---|---|
| $GA_0$ | 1 | — | 2 |
| $GA_1$ | 2 | 1 | 2 |
| $GA_2$ | 1 | −1 | 3 |
| $GA_3$ | 1 | 0 | 1 |
| $GA_4$ | 1 | 0 | 1 |
| $GA_5$ | 1 | 0 | 1 |
| $GA_6$ | 1 | 0 | 1 |
| $GA_7$ | 1 | 0 | 1 |
| $GA_8$ | 1 | 0 | 1 |
| $GA_9$ | 1 | 0 | 1 |
| $GA_{10}$ | 1 | 0 | 1 |
| $GA_{11}$ | 1 | 0 | 1 |
| | | | 16 bits |

FIG. 18

| VALUE | CODE | NUMBER OF BITS |
|---|---|---|
| −2 | 11110 | 5 |
| −1 | 110 | 3 |
| 0 | 0 | 1 |
| 1 | 10 | 2 |
| 2 | 1110 | 4 |
| OTHERS | 11111+ ORIGINAL VALUE (3 BITS) | 8 |

FIG. 19

| NUMBER OF GAIN-CONROLLED PARTS | | ENCODING FLAG | NUMBER OF BITS |
|---|---|---|---|
| $GA_0$ | 1 | — | 3 |
| $GA_1$ | 4 | 1 | 3 |
| $GA_2$ | 1 | 1 | 3 |
| $GA_3$ | 1 | 0 | |
| $GA_4$ | 1 | 0 | |
| $GA_5$ | 1 | 0 | |
| $GA_6$ | 1 | 0 | |
| $GA_7$ | 1 | 0 | |
| $GA_8$ | 1 | 0 | |
| $GA_9$ | 1 | 0 | |
| $GA_{10}$ | 1 | 0 | |
| $GA_{11}$ | 1 | 0 | |
| | | 11 bits | 9 bits |

FIG. 22

| NUMBER OF GAIN-CONROLLED PARTS | |
|---|---|
| $GA_0$ | 2 |
| $GA_1$ | 2 |
| $GA_2$ | 2 |
| $GA_3$ | 1 |
| $GA_4$ | 1 |
| $GA_5$ | 1 |
| $GA_6$ | 2 |
| $GA_7$ | 1 |
| $GA_8$ | 1 |
| $GA_9$ | 1 |
| $GA_{10}$ | 1 |
| $GA_{11}$ | 2 |

FIG. 23

| | NUMBER OF BITS |
|---|---|
| NUMBER OF BITS OF DATA REPRESENTING THE NECESSARY NUMBER OF BITS | 2 |
| NUMBER OF BITS OF DATA REPRESENTING THE MINIMUM VALUE | 3 |
| NUMBER OF GAIN-CONTROLLED PARTS − MINIMUM VALUE | $1 \times 12$ |

FIG. 26

| NUMBER OF GAIN-CONTROLLED PARTS | | NUMBER OF GAIN-CONTROLLED PARTS | | DIFFERENCE VALUE WA1 | NUMBER OF BITS |
|---|---|---|---|---|---|
| $GAL_0$ | 2 | $GAR_0$ | 1 | -1 | 3 |
| $GAL_1$ | 1 | $GAR_1$ | 1 | 0 | 1 |
| $GAL_2$ | 1 | $GAR_2$ | 1 | 0 | 1 |
| $GAL_3$ | 2 | $GAR_3$ | 2 | 0 | 1 |
| $GAL_4$ | 1 | $GAR_4$ | 1 | 0 | 1 |
| $GAL_5$ | 2 | $GAR_5$ | 2 | 0 | 1 |
| $GAL_6$ | 1 | $GAR_6$ | 1 | 0 | 1 |
| $GAL_7$ | 3 | $GAR_7$ | 3 | 0 | 1 |
| $GAL_8$ | 3 | $GAR_8$ | 3 | 0 | 1 |
| $GAL_9$ | 3 | $GAR_9$ | 3 | 0 | 1 |
| $GAL_{10}$ | 3 | $GAR_{10}$ | 3 | 0 | 1 |
| $GAL_{11}$ | 2 | $GAR_{11}$ | 2 | 0 | 1 |
| | | | | | 14 bits |

FIG. 27

| NUMBER OF GAIN-CONTROLLED PARTS (Lch) | | NUMBER OF GAIN-CONTROLLED PARTS (Rch) | | ENCODING FLAG | NUMBER OF BITS |
|---|---|---|---|---|---|
| $GAL_0$ | 1 | $GAR_0$ | 4 | 1 | 3 |
| $GAL_1$ | 1 | $GAR_1$ | 1 | 0 | 0 |
| $GAL_2$ | 1 | $GAR_2$ | 1 | 0 | 0 |
| $GAL_3$ | 2 | $GAR_3$ | 2 | 0 | 0 |
| $GAL_4$ | 1 | $GAR_4$ | 1 | 0 | 0 |
| $GAL_5$ | 2 | $GAR_5$ | 2 | 0 | 0 |
| $GAL_6$ | 1 | $GAR_6$ | 1 | 0 | 0 |
| $GAL_7$ | 1 | $GAR_7$ | 1 | 0 | 0 |
| $GAL_8$ | 1 | $GAR_8$ | 1 | 0 | 0 |
| $GAL_9$ | 1 | $GAR_9$ | 1 | 0 | 0 |
| $GAL_{10}$ | 1 | $GAR_{10}$ | 1 | 0 | 0 |
| $GAL_{11}$ | 1 | $GAR_{11}$ | 1 | 0 | 0 |
| | | | | 12 bits | 3 bits |

FIG. 29

| NUMBER OF GAIN-CONTROLLED PARTS (Lch) | | NUMBER OF GAIN-CONTROLLED PARTS (Rch) | |
|---|---|---|---|
| $GAL_0$ | 3 | $GAR_0$ | 3 |
| $GAL_1$ | 1 | $GAR_1$ | 1 |
| $GAL_2$ | 2 | $GAR_2$ | 2 |
| $GAL_3$ | 1 | $GAR_3$ | 1 |
| $GAL_4$ | 2 | $GAR_4$ | 2 |
| $GAL_5$ | 2 | $GAR_5$ | 2 |
| $GAL_6$ | 1 | $GAR_6$ | 1 |
| $GAL_7$ | 2 | $GAR_7$ | 2 |
| $GAL_8$ | 3 | $GAR_8$ | 3 |
| $GAL_9$ | 1 | $GAR_9$ | 1 |
| $GAL_{10}$ | 1 | $GAR_{10}$ | 1 |
| $GAL_{11}$ | 1 | $GAR_{11}$ | 1 |

FIG. 33

| NUMBER OF GAIN-CONTROLLED PARTS (Lch) | | NUMBER OF GAIN-CONTROLLED PARTS (Rch) | | DIFFERECE VALUE WA2 | NUMBER OF BITS |
|---|---|---|---|---|---|
| $GAL_0$ | 2 | $GAR_0$ | 1 | -1 | 2 |
| $GAL_1$ | 1 | $GAR_1$ | 1 | -1 | 2 |
| $GAL_2$ | 1 | $GAR_2$ | 1 | 0 | 1 |
| $GAL_3$ | 2 | $GAR_3$ | 2 | 0 | 1 |
| $GAL_4$ | 1 | $GAR_4$ | 1 | 0 | 1 |
| $GAL_5$ | 2 | $GAR_5$ | 2 | 0 | 1 |
| $GAL_6$ | 2 | $GAR_6$ | 1 | -1 | 2 |
| $GAL_7$ | 3 | $GAR_7$ | 3 | 1 | 3 |
| $GAL_8$ | 3 | $GAR_8$ | 3 | 0 | 1 |
| $GAL_9$ | 3 | $GAR_9$ | 3 | 0 | 1 |
| $GAL_{10}$ | 3 | $GAR_{10}$ | 3 | 0 | 1 |
| $GAL_{11}$ | 2 | $GAR_{11}$ | 2 | 0 | 1 |
| | | | | | 17 bits |

| VALUE | CODE | NUMBER OF BITS |
|---|---|---|
| -1 | 10 | 2 |
| 0 | 0 | 1 |
| 1 | 110 | 3 |
| OTHERS | 111 + ORIGINAL VALUE (3 BITS) | 6 |

| VALUE | CODE | NUMBER OF BITS |
|---|---|---|
| 3 | 110 | 3 |
| 5 | 0 | 1 |
| 6 | 100 | 3 |
| 7 | 101 | 3 |
| OTHERS | 111 + ORIGINAL VALUE (4 BITS) | 7 |

FIG. 39

| GAIN CONTROL AMOUNT INFORMATION | | NUMBER OF BITS | TOTAL NUMBER OF BITS |
|---|---|---|---|
| $GB_0$ | 6 | | 3 |
| $GB_1$ | 6,5 | 3,1 | 4 |
| $GB_2$ | 7 | | 3 |
| $GB_3$ | 5 | | 1 |
| $GB_4$ | 6 | | 3 |
| $GB_5$ | 5 | | 1 |
| $GB_6$ | 6 | | 3 |
| $GB_7$ | 5 | | 1 |
| $GB_8$ | 5 | | 1 |
| $GB_9$ | 6 | | 3 |
| $GB_{10}$ | 5 | | 1 |
| $GB_{11}$ | 5 | | 1 |
| | 13 PIECES OF GAIN CONTROL AMOUNT INFORMATION | | 25 bits |

FIG. 40

| GAIN CONTROL AMOUNT INFORMATION | | DIFFERENCE VALUE VB1 | NUMBER OF BITS | SUM OF THE NUMBER OF BITS |
|---|---|---|---|---|
| $GB_0$ | 7,5,4 | -2,-1 | 3,2,1 | 6 |
| $GB_1$ | 3,1,2 | -2,1 | 3,2,5 | 10 |
| $GB_2$ | 7,6 | -1 | 3,1 | 4 |
| $GB_3$ | 5,3 | -2 | 1,2 | 3 |
| $GB_4$ | 6 | | 3 | 3 |
| $GB_5$ | 6,5 | -1 | 3,1 | 4 |
| $GB_6$ | 6,5,4,3,2 | -1,-1,-1,-1 | 3,1,1,1,1 | 7 |
| $GB_7$ | 6,5,4,3,2 | -1,-1,-1,-1 | 3,1,1,1,1 | 7 |
| $GB_8$ | 6,5,4,3 | -1,-1,-1 | 3,1,1,1 | 6 |
| $GB_9$ | 5,4,3,2,3 | -1,-1,-1,1 | 1,1,1,1,5 | 9 |
| $GB_{10}$ | 7,6,5 | -1,-1 | 3,1,1 | 5 |
| $GB_{11}$ | 7,6,5 | -1,-1 | 3,1,1 | 5 |
| | 38 PIECES OF GAIN CONTROL AMOUNT INFORMATION | | | 69 bits |

| VALUE | CODE | NUMBER OF BITS |
|---|---|---|
| −4 | 11100 | 5 |
| −3 | 110 | 3 |
| −2 | 10 | 2 |
| −1 | 0 | 1 |
| 1 | 11101 | 5 |
| OTHERS | 1111 + ORIGINAL VALUE (4 BITS) | 8 |

FIG. 46

| GAIN CONTROL AMOUNT INFORMATION | | DIFFERENCE VALUE VB2 | NUMBER OF BITS | SUM OF THE NUMBER OF BITS |
|---|---|---|---|---|
| $GB_0$ | — | | | |
| $GB_1$ | 5 | 0 | 1 | 1 |
| $GB_2$ | 7,6 | 2,1 | 4,3 | 7 |
| $GB_3$ | 7,6 | 0,0 | 1,1 | 2 |
| $GB_4$ | 6 | -1 | 3 | 3 |
| $GB_5$ | 6,5 | 0,0 | 1,1 | 2 |
| $GB_6$ | 6 | 0 | 1 | 1 |
| $GB_7$ | 8,5 | 2,0 | 4,1 | 5 |
| $GB_8$ | 7,6,5 | -1,1,0 | 3,3,1 | 7 |
| $GB_9$ | 8 | 1 | 3 | 3 |
| $GB_{10}$ | 8 | 0 | 1 | 1 |
| $GB_{11}$ | 6 | -2 | 3 | 3 |
| | 17 PIECES OF GAIN CONTROL AMOUNT INFORMATION | | | 35 bits |

| VALUE | CODE | NUMBER OF BITS |
|---|---|---|
| −3 | 11110 | 5 |
| −2 | 110 | 3 |
| −1 | 101 | 3 |
| 0 | 0 | 1 |
| 1 | 100 | 3 |
| 2 | 1110 | 4 |
| OTHERS | 11111 + ORIGINAL VALUE (4 BITS) | 9 |

FIG. 50

| GAIN CONTROL AMOUNT INFORMATION | | DIFFERENCE VALUE VB1 | DIFFERENCE VALUE VB3 | NUMBER OF BITS | SUM OF THE NUMBER OF BITS |
|---|---|---|---|---|---|
| $GB_0$ | 5,4,2 | 0,-1,-2 | 0,-1,-2 | 2,1,3 | 6 |
| $GB_1$ | 5,4,3 | 0,-1,-1 | 0,0,1 | 2,2,4 | 8 |
| $GB_2$ | 7,5,4 | 2,-2,-1 | 2,-1,0 | 9,1,2 | 12 |
| $GB_3$ | 7,6,5 | 0,-1,-1 | 0,1,0 | 2,4,2 | 8 |
| $GB_4$ | 6,5,4 | -1,-1,-1 | -1,0,0 | 1,2,2 | 5 |
| $GB_5$ | 6,5,3 | 0,-1,-2 | 0,0,-1 | 2,2,1 | 5 |
| $GB_6$ | 7,5,3 | 1,-2,-2 | 1,-1,0 | 4,1,2 | 7 |
| $GB_7$ | 8,5,4 | 1,-3,-1 | 1,-1,1 | 4,1,4 | 9 |
| $GB_8$ | 7,5,4 | -1,-2,-1 | -1,1,0 | 1,4,2 | 7 |
| $GB_9$ | 8,7,6 | 1,-1,-1 | 1,1,0 | 4,4,1 | 9 |
| $GB_{10}$ | 8,7,6 | 0,-1,-1 | 0,0,0 | 2,2,2 | 6 |
| $GB_{11}$ | 5,4,3 | -3,-1,-1 | -3,0,0 | 5,2,2 | 9 |
| | 36 PIECES OF GAIN CONTROL AMOUNT INFORMATION | | | | 91 bits |

FIG. 51

| VALUE | CODE | NUMBER OF BITS |
|---|---|---|
| -3 | 11110 | 5 |
| -2 | 110 | 3 |
| -1 | 0 | 1 |
| 0 | 10 | 2 |
| 1 | 1110 | 4 |
| OTHERS | 11111 + ORIGINAL VALUE (4 BITS) | 9 |

FIG. 52

| GAIN CONTROL AMOUNT INFORMATION | | ENCODING FLAG | DIFFERENCE VALUE VB1 | NUMBER OF BITS | SUM OF THE NUMBER OF BITS |
|---|---|---|---|---|---|
| $GB_0$ | 7,5,4 | | -2,-1 | 3,2,1 | 6 |
| $GB_1$ | 7,5,4 | 0 | | | |
| $GB_2$ | 7,6 | 1 | -1 | 3,1 | 4 |
| $GB_3$ | 5 | 1 | | 1 | 1 |
| $GB_4$ | 5 | 0 | | | |
| $GB_5$ | 5 | 0 | | | |
| $GB_6$ | 6,5,4,3,2 | 1 | -1,-1,-1,-1 | 3,1,1,1,1 | 7 |
| $GB_7$ | 6,5,4,3,2 | 0 | | | |
| $GB_8$ | 6,5,4,3,2 | 0 | | | |
| $GB_9$ | 5,4,3,2 | 1 | -1,-1,-1 | 1,1,1,1 | 4 |
| $GB_{10}$ | 7,6,5 | 1 | -1,-1 | 3,1,1 | 5 |
| $GB_{11}$ | 7,6,5 | 0 | | 8 | |
| | 36 PIECES OF GAIN CONTROL AMOUNT INFORMATION | 11 bits | | | 27 bits |

| GAIN CONTROL AMOUNT INFORMATION | |
| --- | --- |
| $GB_7$ | 9, 7, 6, 9 |

FIG. 57

| GAIN CONTROL AMOUNT INFORMATION | |
|---|---|
| $GB_0$ | 5 |
| $GB_1$ | 7,6 |
| $GB_2$ | 6 |
| $GB_3$ | 7 |
| $GB_4$ | 7,6 |
| $GB_5$ | 8,7,6,5 |
| $GB_6$ | 7,6 |
| $GB_7$ | 8,7,5 |
| $GB_8$ | 8,6,5 |
| $GB_9$ | 7,6,5 |
| $GB_{10}$ | 8,7,6 |
| $GB_{11}$ | 7 |
| | 26 PIECES OF GAIN CONTROL AMOUNT INFORMATION |

| PARAMETERS TO BE ENCODED | NUMBER OF BITS |
|---|---|
| NUMBER OF BITS OF DATA REPRESENTING THE NECESSARY NUMBER OF BITS (bitlen) | 2 |
| NUMBER OF BITS OF DATA REPRESENTING THE MINIMUM VALUE | 4 |
| GAIN CONTROL AMOUNT INFORMATION – MINIMUM VALUE | 2×26 |

FIG. 62

| NUMBER OF GAIN-CONTROLLED PARTS (Lch) | | NUMBER OF GAIN-CONTROLLED PARTS (Rch) | | DIFFERENCE VALUE WB1 | NUMBER OF BITS | SUM OF THE NUMBERS OF BITS |
|---|---|---|---|---|---|---|
| $GBL_0$ | 5 | $GBR_0$ | 5 | 0 | 1 | 1 |
| $GBL_1$ | 7,6 | $GBR_1$ | 7,6 | 0,0 | 1,1 | 2 |
| $GBL_2$ | 6,5,3 | $GBR_2$ | 6,5,3 | 0,0,0 | 1,1,1 | 3 |
| $GBL_3$ | 5,2 | $GBR_3$ | 4,2 | -1,0 | 3,1 | 4 |
| $GBL_4$ | 6 | $GBR_4$ | 5 | -1 | 3 | 3 |
| $GBL_5$ | 5 | $GBR_5$ | 5 | 0 | 1 | 1 |
| $GBL_6$ | 6 | $GBR_6$ | 6 | 0 | 1 | 1 |
| $GBL_7$ | 5 | $GBR_7$ | 5 | 0 | 1 | 1 |
| $GBL_8$ | 5 | $GBR_8$ | 5 | 0 | 1 | 1 |
| $GBL_9$ | 5 | $GBR_9$ | 6 | 1 | 2 | 2 |
| $GBL_{10}$ | 5 | $GBR_{10}$ | 5 | 0 | 1 | 1 |
| $GBL_{11}$ | 6 | $GBR_{11}$ | 6 | 0 | 1 | 1 |
| | 16 PIECES OF GAIN CONTROL AMOUNT INFORMATION (Lch) | | 16 PIECES OF GAIN CONTROL AMOUNT INFORMATION (Rch) | | | 21 bits |

FIG. 63

| VALUE | CODE | NUMBER OF BITS |
| --- | --- | --- |
| -2 | 1110 | 4 |
| -1 | 110 | 3 |
| 0 | 0 | 1 |
| 1 | 10 | 2 |
| 2 | 11110 | 5 |
| OTHERS | 11111 + ORIGINAL VALUE (4 BITS) | 9 |

FIG. 64

| GAIN CONTROL AMOUNT INFORMATION (Lch) | | GAIN CONTROL AMOUNT INFORMATION (Rch) | | ENCODEING FLAG | DIFFERENCE VALUE WB1 | NUMBER OF BITS |
|---|---|---|---|---|---|---|
| $GBL_0$ | 5 | $GBR_0$ | 5 | 0 | | |
| $GBL_1$ | 7,6 | $GBR_1$ | 7,6 | 0 | | |
| $GBL_2$ | 6,5,3 | $GBR_2$ | 6,5,3 | 0 | | |
| $GBL_3$ | 4,2 | $GBR_3$ | 4,2 | 0 | | |
| $GBL_4$ | 6 | $GBR_4$ | 5 | 1 | -1 | 3 |
| $GBL_5$ | 6 | $GBR_5$ | 5 | 1 | -1 | 3 |
| $GBL_6$ | 6,5 | $GBR_6$ | 6,5 | 0 | | |
| $GBL_7$ | 5 | $GBR_7$ | 5 | 0 | | |
| $GBL_8$ | 5,4 | $GBR_8$ | 5,4 | 0 | | |
| $GBL_9$ | 5 | $GBR_9$ | 6 | 1 | 1 | 2 |
| $GBL_{10}$ | 5 | $GBR_{10}$ | 5 | 0 | | |
| $GBL_{11}$ | 6 | $GBR_{11}$ | 6 | 0 | | |
| | 18 PIECES OF GAIN CONTROL AMOUNT INFORMATION (Lch) | | 18 PIECES OF GAIN CONTROL AMOUNT INFORMATION (Rch) | 12 bits | | 8 bits |

FIG. 66

| GAIN CONTROL AMOUNT INFORMATION (Lch) | | GAIN CONTROL AMOUNT INFORMATION (Rch) | |
|---|---|---|---|
| $GBL_0$ | 5,3 | $GBR_0$ | 5,3 |
| $GBL_1$ | 7,6 | $GBR_1$ | -7,6 |
| $GBL_2$ | 6,5,3 | $GBR_2$ | 6,5,3 |
| $GBL_3$ | 5,4,3,2 | $GBR_3$ | 5,4,3,2 |
| $GBL_4$ | 7,6,5 | $GBR_4$ | 7,6,5 |
| $GBL_5$ | 5 | $GBR_5$ | 5 |
| $GBL_6$ | 6 | $GBR_6$ | 6 |
| $GBL_7$ | 5,4 | $GBR_7$ | 5,4 |
| $GBL_8$ | 5,4 | $GBR_8$ | 5,4 |
| $GBL_9$ | 6,5,4 | $GBR_9$ | 6,5,4 |
| $GBL_{10}$ | 5 | $GBR_{10}$ | 5 |
| $GBL_{11}$ | 6,4 | $GBR_{11}$ | 6,4 |
| | 26 PIECES OF GAIN CONTROL AMOUNT INFORMATION (Lch) | | 26 PIECES OF GAIN CONTROL AMOUNT INFORMATION (Rch) |

FIG. 70

| GAIN CONTROL AMOUNT INFORMATION (Lch) | | GAIN CONTROL AMOUNT INFORMATION (Rch) | | DIFFERENCE VALUE WB2 | NUMBER OF BITS | SUM OF THE NUMBERS OF BITS |
|---|---|---|---|---|---|---|
| $GBL_0$ | 5,4,3,2 | $GBR_0$ | 5,4,3,2 | 0,0,0,0 | 1,1,1,1 | 4 |
| $GBL_1$ | 7,6,4 | $GBR_1$ | 7,6,3 | 0,0,-1 | 1,1,2 | 4 |
| $GBL_2$ | 6,5,3 | $GBR_2$ | 6,5,3 | 0,0,0 | 1,1,1 | 3 |
| $GBL_3$ | 5,2 | $GBR_3$ | 4,2 | -1,1 | 2,3 | 5 |
| $GBL_4$ | 6,5,3 | $GBR_4$ | 5,4,3 | -1,0,1 | 2,1,3 | 6 |
| $GBL_5$ | 5 | $GBR_5$ | 5 | 0 | 1 | 1 |
| $GBL_6$ | 6 | $GBR_6$ | 6 | 0 | 1 | 1 |
| $GBL_7$ | 5,4 | $GBR_7$ | 5,4 | 0,0 | 1,1 | 2 |
| $GBL_8$ | 5,4,3 | $GBR_8$ | 5,4,3 | 0,0,0 | 1,1,1 | 3 |
| $GBL_9$ | 5,3 | $GBR_9$ | 6,4 | 1,0 | 3,1 | 4 |
| $GBL_{10}$ | 5,4,3 | $GBR_{10}$ | 5,4,3 | 0,0,0 | 1,1,1 | 3 |
| $GBL_{11}$ | 6,4 | $GBR_{11}$ | 6,4 | 0 | 1 | 1 |
| | 29 PIECES OF GAIN CONTROL AMOUNT INFORMATION (Lch) | | 29 PIECES OF GAIN CONTROL AMOUNT INFORMATION (Rch) | | | 37 bits |

| VALUE | CODE | NUMBER OF BITS |
|---|---|---|
| −2 | 1110 | 4 |
| −1 | 10 | 2 |
| 0 | 0 | 1 |
| 1 | 110 | 3 |
| OTHERS | 1111 + ORIGINAL VALUE (4 BITS) | 8 |

FIG. 74

| GAIN CONTROL AMOUNT INFORMATION (Lch) | | GAIN CONTROL AMOUNT INFORMATION (Rch) | | DIFFERENCE VALUE WB3 | NUMBER OF BITS | SUM OF THE NUMBERS OF BITS |
|---|---|---|---|---|---|---|
| $GBL_0$ | 5,4,3,2 | $GBR_0$ | 5,4,3,2 | 0,0,0,0 | 1,1,1,1 | 4 |
| $GBL_1$ | 7,6,4 | $GBR_1$ | 7,6,3 | 0,0,-1 | 1,1,3 | 5 |
| $GBL_2$ | 6,5,3 | $GBR_2$ | 6,5,3 | 0,0,1 | 1,1,3 | 5 |
| $GBL_3$ | 5,2 | $GBR_3$ | 4,2 | -1,0 | 3,1 | 4 |
| $GBL_4$ | 6,5,3 | $GBR_4$ | 5,4,3 | 0,-1,0 | 1,3,1 | 5 |
| $GBL_5$ | 5 | $GBR_5$ | 5 | 1 | 3 | 3 |
| $GBL_6$ | 6 | $GBR_6$ | 6 | 0 | 1 | 1 |
| $GBL_7$ | 5,4 | $GBR_7$ | 5,4 | 0,0 | 1,1 | 2 |
| $GBL_8$ | 5,4,3 | $GBR_8$ | 5,4,3 | 0,0,0 | 1,1,1 | 3 |
| $GBL_9$ | 5,3 | $GBR_9$ | 6,4 | 1,1 | 3,3 | 6 |
| $GBL_{10}$ | 5,4,3 | $GBR_{10}$ | 5,4,3 | -1,-1,0 | 3,3,1 | 7 |
| $GBL_{11}$ | 6,4 | $GBR_{11}$ | 6,4 | 0 | | 1 |
| | 29 PIECES OF GAIN CONTROL AMOUNT INFORMATION (Lch) | | 29 PIECES OF GAIN CONTROL AMOUNT INFORMATION (Rch) | | | 46 bits |

FIG. 75

| VALUE | CODE | NUMBER OF BITS |
|---|---|---|
| -2 | 100 | 3 |
| -1 | 101 | 3 |
| 0 | 0 | 1 |
| 1 | 110 | 3 |
| OTHERS | 111 + ORIGINAL VALUE (4 BITS) | 8 |

FIG. 79

| GAIN CONTROL POSITION INFORMATION | | NUMBER OF BITS | SUM OF THE NUMBER OF BITS |
|---|---|---|---|
| $GC_0$ | 29,31 | 5,1 | 6 |
| $GC_1$ | 26 | 5 | 5 |
| $GC_2$ | 26 | 5 | 5 |
| $GC_3$ | 26,28 | 5,3 | 8 |
| $GC_4$ | 26 | 5 | 5 |
| $GC_5$ | 25,28 | 5,3 | 8 |
| $GC_6$ | 28 | 5 | 5 |
| $GC_7$ | 25,27,29 | 5,3,2 | 10 |
| $GC_8$ | 25,26,29 | 5,3,3 | 11 |
| $GC_9$ | 25,27,28 | 5,3,2 | 10 |
| $GC_{10}$ | 25,29,30 | 5,3,1 | 9 |
| $GC_{11}$ | 25,27 | 5,3 | 8 |
| | 24 PIECES OF GAIN CONTROL POSITION INFORMATION | | 90 bits |

FIG. 83

| VALUE | CODE | NUMBER OF BITS |
|---|---|---|
| 1 | 0000 | 4 |
| 3 | 0001 | 4 |
| 5 | 0010 | 4 |
| 7 | 0011 | 4 |
| 9 | 0100 | 4 |
| 11 | 0101 | 4 |
| 13 | 0110 | 4 |
| 15 | 0111 | 4 |
| 17 | 1000 | 4 |
| 19 | 1001 | 4 |
| 21 | 1010 | 4 |
| 23 | 1011 | 4 |
| 25 | 1100 | 4 |
| 27 | 1101 | 4 |
| 29 | 1110 | 4 |
| 31 | 11110 | 5 |
| OTHERS | 11111 + ORIGINAL VALUE (5 BITS) | 10 |

FIG. 84

| GAIN CONTROL POSITION INFORMATION | | NUMBER OF BITS | SUM OF THE NUMBER OF BITS |
|---|---|---|---|
| $GC_0$ | $15^A$ | 5 | 5 |
| $GC_1$ | $4^A, 5^A, 13^R$ | 5,5,4 | 14 |
| $GC_2$ | $0^A$ | 5 | 5 |
| $GC_3$ | $7^A, 23^R$ | 5,4 | 9 |
| $GC_4$ | $21^A$ | 5 | 5 |
| $GC_5$ | $15^A$ | 5 | 5 |
| $GC_6$ | $29^A$ | 5 | 5 |
| $GC_7$ | $21^A$ | 5 | 5 |
| $GC_8$ | $3^A, 13^R$ | 5,4 | 9 |
| $GC_9$ | $4^A, 15^R$ | 5,4 | 9 |
| $GC_{10}$ | $5^A$ | 5 | 5 |
| $GC_{11}$ | $5^A, 13^R$ | 5,4 | 9 |
| | 18 PIECES OF GAIN CONTROL POSITION INFORMATION | | 85 bits |

FIG. 87

| GAIN CONTROL POSITION INFORMATION | | NUMBER OF BITS | SUM OF THE NUMBER OF BITS |
|---|---|---|---|
| $GC_0$ | $7^A,9^A,11^R$ | 5,3,1 | 9 |
| $GC_1$ | $7^A,17^R,27^R$ | 5,5,5 | 15 |
| $GC_2$ | $5^A,7^R$ | 5,1 | 6 |
| $GC_3$ | $7^A,15^R$ | 5,4 | 9 |
| $GC_4$ | $6^A$ | 5 | 5 |
| $GC_5$ | $6^A,11^A$ | 5,4 | 9 |
| $GC_6$ | $6^A,7^A,9^A,13^A,15^A$ | 5,1,3,4,3 | 16 |
| $GC_7$ | $5^A,8^A,9^A,13^R,15^R$ | 5,4,1,3,1 | 14 |
| $GC_8$ | $5^A,9^A,14^A,15^A$ | 5,4,4,1 | 14 |
| $GC_9$ | $5^A,9^A,13^A,15^R,25^R$ | 5,4,4,1,5 | 19 |
| $GC_{10}$ | $4^A,5^A,6^A,9^A$ | 5,1,1,4 | 11 |
| $GC_{11}$ | $5^A,6^A,9^A$ | 5,1,4 | 10 |
| | 39 PIECES OF GAIN CONTROL POSITION INFORMATION | | 137 bits |

FIG. 88

| ATTACK | | |
|---|---|---|
| DIFFERENCE VALUE | CODE | NUMBER OF BITS |
| 1 | 0 | 1 |
| 2 | 100 | 3 |
| 3 | 1010 | 4 |
| 4 | 1011 | 4 |
| 5 | 1100 | 4 |
| 6 | 11010 | 5 |
| 7 | 11011 | 5 |
| 8~15 | 1110 + (GAIN CONROL POSITION INFORMATION - 8) (3 BITS) | 7 |
| 16~31 | 1111 + (GAIN CONROL POSITION INFORMATION - 16) (4 BITS) | 8 |

FIG. 89

| RELEASE | | |
|---|---|---|
| VALUE | CODE | NUMBER OF BITS |
| 1 | 1010 | 4 |
| 2 | 0 | 1 |
| 4 | 100 | 3 |
| 6 | 1011 | 4 |
| 8 | 1100 | 4 |
| 10 | 11010 | 5 |
| 12 | 110110 | 6 |
| 14 | 110111 | 6 |
| OTHERS | 111 + ORIGINAL VALUE (5 BITS) | 8 |

FIG. 92

| GAIN CONTROL POSITION INFORMATION | | NUMBER OF BITS | SUM OF THE NUMBER OF BITS |
|---|---|---|---|
| $GC_0$ | $5^A,7^A,9^A$ | 5,5,5 | 15 |
| $GC_1$ | $5^A,7^A$ | 2,2 | 4 |
| $GC_2$ | $5^A,7^A$ | 2,2 | 4 |
| $GC_3$ | $6^A,9^A$ | 4,5 | 9 |
| $GC_4$ | $6^A$ | 2 | 2 |
| $GC_5$ | $6^A,11^A$ | 2,6 | 8 |
| $GC_6$ | $6^A,7^A,9^A,11^A,21^R$ | 2,6,6,6,4 | 24 |
| $GC_7$ | $6^A,7^A,9^A,11^A,21^R$ | 2,2,2,2,3 | 11 |
| $GC_8$ | $5^A,7^A,9^A,11^A,23^R$ | 4,2,2,2,4 | 14 |
| $GC_9$ | $5^A,9^A,11^A,12^A$ | 2,5,5,4 | 16 |
| $GC_{10}$ | $5^A,6^A,9^A$ | 2,6,5 | 13 |
| $GC_{11}$ | $5^A,6^A,9^A$ | 2,2,2 | 6 |
| | 37 PIECES OF GAIN CONTROL POSITION INFORMATION | | 126 bits |

FIG. 93

| ATTACK | | |
|---|---|---|
| VALUE | CODE | NUMBER OF BITS |
| -2 | 01110 | 5 |
| -1 | 0101 | 4 |
| 0 | 00 | 2 |
| 1 | 0100 | 4 |
| 2 | 01100 | 5 |
| 3 | 01101 | 5 |
| 4 | 01111 | 5 |
| OTHERS | 1+ ORIGINAL VALUE (5 BITS) | 6 |

FIG. 94

| RELEASE | | |
|---|---|---|
| VALUE | CODE | NUMBER OF BITS |
| -2 | 110010 | 6 |
| 0 | 000 | 3 |
| 1 | 110011 | 6 |
| 2 | 0010 | 4 |
| 3 | 110100 | 6 |
| 4 | 110101 | 6 |
| 5 | 110110 | 6 |
| 7 | 01110 | 5 |
| 9 | 0011 | 4 |
| 11 | 1111 | 4 |
| 13 | 0100 | 4 |
| 15 | 0101 | 4 |
| 17 | 110111 | 6 |
| 19 | 0110 | 4 |
| 21 | 1000 | 4 |
| 23 | 11000 | 5 |
| 25 | 1001 | 4 |
| 27 | 1010 | 4 |
| 29 | 1011 | 4 |
| OTHERS | 111 + ORIGINAL VALUE (5 BITS) | 8 |

FIG. 97

| GAIN CONTROL POSITION INFORMATION | | DIFFERENCE OF VALUE VC3 | NUMBER OF BITS | SUM OF THE NUMBER OF BITS |
|---|---|---|---|---|
| $GC_0$ | $5^A,7^A,9^A$ | $5^A,2^A,2^A$ | 5,4,4 | 13 |
| $GC_1$ | $5^A,7^A$ | $0^A,0^A$ | 2,2 | 4 |
| $GC_2$ | $5^A,7^A$ | $0^A,0^A$ | 2,2 | 4 |
| $GC_3$ | $6^A,9^A$ | $1^A,1^A$ | 3,3 | 6 |
| $GC_4$ | $6^A$ | $0^A$ | 2 | 2 |
| $GC_5$ | $6^A,11^A$ | $0^A,5^A$ | 2,5 | 7 |
| $GC_6$ | $6^A,7^A,9^A,11^A,21^R$ | $0^A,-4^A,2^A,2^A,10^R$ | 2,6,4,4,5 | 21 |
| $GC_7$ | $6^A,7^A,9^A,11^A,12^R$ | $0^A,0^A,0^A,0^A,0^R$ | 2,2,2,2,3 | 11 |
| $GC_8$ | $5^A,7^A,9^A,11^A,23^R$ | $-1^A,1^A,0^A,0^A,2^R$ | 4,3,2,2,2 | 13 |
| $GC_9$ | $5^A,9^A,11^A,12^A$ | $0^A,2^A,0^A,-1^A$ | 2,4,2,4 | 12 |
| $GC_{10}$ | $5^A,6^A,9^A$ | $0^A,-3^A,1^A$ | 2,5,3 | 10 |
| $GC_{11}$ | $5^A,6^A,9^A$ | $0^A,0^A,0^A$ | 2,2,2 | 6 |
| | 37 PIECES OF GAIN CONTROL POSITION INFORMATION | | | 109 bits |

FIG. 98

| ATTACK | | |
|---|---|---|
| VALUE | CODE | NUMBER OF BITS |
| -4 | 101111 | 6 |
| -3 | 10101 | 5 |
| -2 | 10100 | 5 |
| -1 | 0111 | 4 |
| 0 | 00 | 2 |
| 1 | 010 | 3 |
| 2 | 0110 | 4 |
| 3 | 10000 | 5 |
| 4 | 10001 | 5 |
| 5 | 10010 | 5 |
| 6 | 10011 | 5 |
| 7 | 101100 | 6 |
| 8 | 101101 | 6 |
| 9 | 101110 | 6 |
| OTHERS | 11 + ORIGINAL VALUE (5 BITS) | 7 |

FIG. 99

| RELEASE | | |
|---|---|---|
| VALUE | CODE | NUMBER OF BITS |
| -2 | 01110 | 5 |
| -1 | 1101100 | 7 |
| 0 | 010 | 3 |
| 1 | 01111 | 5 |
| 2 | 00 | 2 |
| 3 | 1101101 | 7 |
| 4 | 0110 | 4 |
| 5 | 101000 | 6 |
| 6 | 10000 | 5 |
| 7 | 101001 | 6 |
| 8 | 10001 | 5 |
| 9 | 10010 | 5 |
| 10 | 10011 | 5 |
| 11 | 101010 | 6 |
| 12 | 101011 | 6 |
| 13 | 101100 | 6 |
| 14 | 1101110 | 7 |
| 15 | 101101 | 6 |
| 16 | 1101111 | 7 |
| 17 | 101110 | 6 |
| 19 | 101111 | 6 |
| 21 | 110000 | 6 |
| 23 | 110001 | 6 |
| 25 | 110010 | 6 |
| 27 | 110011 | 6 |
| 29 | 110100 | 6 |
| OTHERS | 111 + ORIGINAL VALUE (5 BITS) | 8 |

FIG. 100

| GAIN CONTROL POSITION INFORMATION | | ENCODING FLAG | NUMBER OF BITS | SUM OF THE NUMBER OF BITS |
|---|---|---|---|---|
| $GC_0$ | $7^A,9^A,11^R$ | — | 5,3,1 | 9 |
| $GC_1$ | $7^A,9^A,11^R$ | 0 | | |
| $GC_2$ | $5^A,7^R$ | 1 | 5,1 | 6 |
| $GC_3$ | $6^A$ | 1 | 5 | 5 |
| $GC_4$ | $6^A$ | 0 | | |
| $GC_5$ | $6^A$ | 0 | | |
| $GC_6$ | $6^A,7^A,9^A,13^A,15^A$ | 1 | 5,1,3,4,3 | 16 |
| $GC_7$ | $6^A,7^A,9^A,13^A,15^A$ | 0 | | |
| $GC_8$ | $5^A,9^A,14^A,15^A$ | 1 | 5,4,4,1 | 14 |
| $GC_9$ | $5^A,9^A,14^A,15^A$ | 0 | | |
| $GC_{10}$ | $5^A,6^A,9^A$ | 1 | 5,1,4 | 11 |
| $GC_{11}$ | $5^A,6^A,9^A$ | 0 | | |
| | 35 PIECES OF GAIN CONTROL POSITION INFORMATION | 11 bits | | 61 bits |

| GAIN CONTROL POSITION INFORMATION | |
|---|---|
| $GC_3$ | 5,6,7,8 |

FIG. 105

| GAIN CONTROL POSITION INFORMATION | |
|---|---|
| $GC_0$ | 5 |
| $GC_1$ | 4,5,10 |
| $GC_2$ | 5,6 |
| $GC_3$ | 4,8 |
| $GC_4$ | 4 |
| $GC_5$ | 4 |
| $GC_6$ | 5,8 |
| $GC_7$ | 5,8,10 |
| $GC_8$ | 3,8 |
| $GC_9$ | 4,5 |
| $GC_{10}$ | 5 |
| $GC_{11}$ | 5,10 |
| | 22 PIECES OF GAIN CONTROL POSITION INFORMATION |

| PARAMETERS TO BE ENCODED | NUMBER OF BITS |
|---|---|
| NUMBER OF BITS OF DATA REPRESENTING THE NECESSARY NUMBER OF BITS (bitlen) | 2 |
| NUMBER OF BITS OF DATA REPRESENTING THE MINIMUM VALUE | 5 |
| GAIN CONTROL AMOUNT INFORMATION – MINIMUM VALUE | 3 x 22 |

FIG. 110

| GAIN CONTROL POSITION INFORMATION (Lch) | | GAIN CONTROL POSITION INFORMATION (Rch) | | DIFFERENCE VALUE WC1 | NUMBER OF BITS | SUM OF THE NUMBERS OF BITS |
|---|---|---|---|---|---|---|
| $GCL_0$ | $15^A$ | $GCR_0$ | $15^A$ | $0^A$ | 1 | 1 |
| $GCL_1$ | $4^A,5^A,13^R$ | $GCR_1$ | $4^A,5^A,13^R$ | $0^A,0^A,0^R$ | 1,1,1 | 3 |
| $GCL_2$ | $8^A$ | $GCR_2$ | $10^A$ | $2^A$ | 4 | 4 |
| $GCL_3$ | $7^A,23^R$ | $GCR_3$ | $7^A,23^R$ | $0^A,0^R$ | 1,1 | 2 |
| $GCL_4$ | $21^A$ | $GCR_4$ | $20^A$ | $-1^A$ | 4 | 4 |
| $GCL_5$ | $15^A$ | $GCR_5$ | $15^A$ | $0^A$ | 1 | 1 |
| $GCL_6$ | $29^A$ | $GCR_6$ | $29^A$ | $0^A$ | 1 | 1 |
| $GCL_7$ | $21^A$ | $GCR_7$ | $21^A$ | $0^A$ | 1 | 1 |
| $GCL_8$ | $15^A,21^A$ | $GCR_8$ | $17^A,21^A$ | $2^A,0^A$ | 4,1 | 5 |
| $GCL_9$ | $5^A,23^R$ | $GCR_9$ | $5^A,23^R$ | $0^A,0^R$ | 1,1 | 2 |
| $GCL_{10}$ | $5^A$ | $GCR_{10}$ | $6^A$ | $1^A$ | 4 | 4 |
| $GCL_{11}$ | $5^A$ | $GCR_{11}$ | $5^A$ | $0^A$ | 1 | 1 |
| | 17 PIECES OF GAIN CONTROL POSITION INFORMATION (Lch) | | 17 PIECES OF GAIN CONTROL POSITION INFORMATION (Rch) | | | 29 bits |

FIG. 111

| ATTACK | | |
|---|---|---|
| VALUE | CODE | NUMBER OF BITS |
| -2 | 10111 | 5 |
| -1 | 1001 | 4 |
| 0 | 0 | 1 |
| 1 | 1000 | 4 |
| 2 | 1010 | 4 |
| 3 | 10110 | 5 |
| OTHERS | 11 + ORIGINAL VALUE (5 BITS) | 7 |

FIG. 112

| RELEASE | | |
|---|---|---|
| VALUE | CODE | NUMBER OF BITS |
| 0 | 0 | 1 |
| 2 | 10000 | 5 |
| 7 | 10001 | 5 |
| 9 | 10010 | 5 |
| 11 | 10011 | 5 |
| 13 | 10100 | 5 |
| 15 | 10101 | 5 |
| 17 | 10110 | 5 |
| 19 | 10111 | 5 |
| 21 | 11000 | 5 |
| 25 | 11001 | 5 |
| 27 | 11010 | 5 |
| 29 | 11011 | 5 |
| OTHERS | 111 + ORIGINAL VALUE (5 BITS) | 8 |

FIG. 113

| GAIN CONTROL POSITION INFORMATION (Lch) | | GAIN CONTROL POSITION INFORMATION (Rch) | | FLAG | DIFFERENCE VALUE | NUMBER OF BITS | SUM OF THE NUMBERS OF BITS |
|---|---|---|---|---|---|---|---|
| $GCL_0$ | $15^A$ | $GCR_0$ | $15^A$ | 0 | | | |
| $GCL_1$ | $4^A,5^A,13^R$ | $GCR_1$ | $4^A,5^A,13^R$ | 0 | | | |
| $GCL_2$ | $8^A,10^A$ | $GCR_2$ | $8^A,10^A$ | 0 | | | |
| $GCL_3$ | $7^A,23^R$ | $GCR_3$ | $7^A,23^R$ | 0 | | | |
| $GCL_4$ | $20^A,21^R$ | $GCR_4$ | $20^A,21^R$ | 0 | | | |
| $GCL_5$ | $15^A$ | $GCR_5$ | $15^A$ | 0 | | | |
| $GCL_6$ | $28^A,29^R$ | $GCR_6$ | $29^A,31^R$ | 1 | $1^A,2^R$ | 4,5 | 9 |
| $GCL_7$ | $21^A$ | $GCR_7$ | $21^A$ | 0 | | | |
| $GCL_8$ | $15^A,21^A$ | $GCR_8$ | $17^A,21^A$ | 1 | $2^A,0^A$ | 4,1 | 5 |
| $GCL_9$ | $5^A,23^R$ | $GCR_9$ | $5^A,23^R$ | 0 | | | |
| $GCL_{10}$ | $5^A,23^R$ | $GCR_{10}$ | $6^A,23^R$ | 1 | $1^A,0^R$ | 4,1 | 5 |
| $GCL_{11}$ | $5^A,22^R$ | $GCR_{11}$ | $5^A,22^R$ | 0 | | | |
| | 22 PIECES OF GAIN CONTROL POSITION INFORMATION (Lch) | | 22 PIECES OF GAIN CONTROL POSITION INFORMATION (Rch) | 12 bits | | | 19 bits |

FIG. 115

| GAIN CONTROL POSITION INFORMATION (Lch) | | GAIN CONTROL POSITION INFORMATION (Rch) | |
|---|---|---|---|
| $GCL_0$ | $15^A$ | $GCR_0$ | $15^A$ |
| $GCL_1$ | $4^A, 5^A, 13^R$ | $GCR_1$ | $4^A, 5^A, 13^R$ |
| $GCL_2$ | $8^A, 10^A$ | $GCR_2$ | $8^A, 10^A$ |
| $GCL_3$ | $7^A, 23^R$ | $GCR_3$ | $7^A, 23^R$ |
| $GCL_4$ | $20^A$ | $GCR_4$ | $20^A$ |
| $GCL_5$ | $15^A$ | $GCR_5$ | $15^A$ |
| $GCL_6$ | $15^A, 29^R$ | $GCR_6$ | $15^A, 29^R$ |
| $GCL_7$ | $21^A$ | $GCR_7$ | $21^A$ |
| $GCL_8$ | $16^A, 21^A$ | $GCR_8$ | $16^A, 21^A$ |
| $GCL_9$ | $5^A, 23^R$ | $GCR_9$ | $5^A, 23^R$ |
| $GCL_{10}$ | $5^A, 23^R$ | $GCR_{10}$ | $5^A, 23^R$ |
| $GCL_{11}$ | $5^A$ | $GCR_{11}$ | $5^A$ |
| | 20 PIECES OF GAIN CONTROL POSITION INFORMATION (Lch) | | 20 PIECES OF GAIN CONTROL POSITION INFORMATION (Rch) |

FIG. 119

| GAIN CONTROL POSITION INFORMATION (Lch) | | GAIN CONTROL POSITION INFORMATION (Rch) | | DIFFERENCE VALUE WC2 | NUMBER OF BITS | SUM OF THE NUMBERS OF BITS |
|---|---|---|---|---|---|---|
| $GCL_0$ | $15^A$ | $GCR_0$ | $15^A$ | $0^A$ | 1 | 1 |
| $GCL_1$ | $4^A,5^A,13^R$ | $GCR_1$ | $4^A,5^A,13^R$ | $0^A,0^A,0^R$ | 1,1,1 | 3 |
| $GCL_2$ | $8^A,10^A$ | $GCR_2$ | $10^A,12^A$ | $2^A,0^A$ | 5,1 | 6 |
| $GCL_3$ | $7^A,23^R$ | $GCR_3$ | $7^A,23^R$ | $0^A,0^R$ | 1,1 | 2 |
| $GCL_4$ | $20^A,21^R$ | $GCR_4$ | $21^A,24^R$ | $-1^A,2^R$ | 5,4 | 9 |
| $GCL_5$ | $15^A$ | $GCR_5$ | $15^A$ | $0^A$ | 1 | 1 |
| $GCL_6$ | $28^A,29^R$ | $GCR_6$ | $29^A,30^R$ | $1^A,0^R$ | 4,1 | 5 |
| $GCL_7$ | $21^A$ | $GCR_7$ | $21^A$ | $0^A$, | 1 | 1 |
| $GCL_8$ | $15^A,21^A$ | $GCR_8$ | $17^A,21^A$ | $2^A,-2^A$ | 5,6 | 11 |
| $GCL_9$ | $5^A,23^R$ | $GCR_9$ | $5^A,23^R$ | $0^A,0^R$ | 1,1 | 2 |
| $GCL_{10}$ | $5^A,23^R$ | $GCR_{10}$ | $6^A,24^R$ | $1^A,0^R$ | 4,1 | 5 |
| $GCL_{11}$ | $5^A,22^R$ | $GCR_{11}$ | $5^A,22^R$ | $0^A,0^R$ | 1,1 | 2 |
| | 22 PIECES OF GAIN CONTROL POSITION INFORMATION (Lch) | | 22 PIECES OF GAIN CONTROL POSITION INFORMATION (Rch) | | | 48 bits |

FIG. 120

| ATTACK | | |
|---|---|---|
| VALUE | CODE | NUMBER OF BITS |
| -2 | 101100 | 6 |
| -1 | 10010 | 5 |
| 0 | 0 | 1 |
| 1 | 1000 | 4 |
| 2 | 10011 | 5 |
| 3 | 10100 | 5 |
| 4 | 10101 | 5 |
| 5 | 101101 | 6 |
| 6 | 101110 | 6 |
| 7 | 101111 | 6 |
| OTHERS | 11 + ORIGINAL VALUE (5 BITS) | 7 |

FIG. 121

| RELEASE | | |
|---|---|---|
| VALUE | CODE | NUMBER OF BITS |
| -2 | 1101100 | 7 |
| 0 | 0 | 1 |
| 1 | 101000 | 6 |
| 2 | 1000 | 4 |
| 4 | 10010 | 5 |
| 5 | 101001 | 6 |
| 6 | 10011 | 5 |
| 7 | 101010 | 6 |
| 8 | 101011 | 6 |
| 9 | 101100 | 6 |
| 10 | 101101 | 6 |
| 11 | 101110 | 6 |
| 12 | 1101101 | 7 |
| 13 | 101111 | 6 |
| 14 | 110000 | 6 |
| 15 | 110001 | 6 |
| 17 | 110010 | 6 |
| 21 | 1101110 | 7 |
| 23 | 110011 | 6 |
| 25 | 110100 | 6 |
| 27 | 110101 | 6 |
| 31 | 1101111 | 7 |
| OTHERS | 111 + ORIGINAL VALUE (5 BITS) | 8 |

FIG. 124

| GAIN CONTROL POSITION INFORMATION (Lch) | | GAIN CONTROL POSITION INFORMATION (Rch) | | DIFFERENCE VALUE WC3 | NUMBER OF BITS | SUM OF THE NUMBERS OF BITS |
|---|---|---|---|---|---|---|
| $GCL_0$ | $15^A$ | $GCR_0$ | $15^A$ | $0^A$ | 1 | 1 |
| $GCL_1$ | $4^A,5^A,13^R$ | $GCR_1$ | $4^A,5^A,13^R$ | $0^A,0^A,0^R$ | 1,1,1 | 3 |
| $GCL_2$ | $8^A,10^A$ | $GCR_2$ | $8^A,10^A$ | $0^A,0^A$ | 1,1 | 2 |
| $GCL_3$ | $7^A,21^R$ | $GCR_3$ | $7^A,23^R$ | $0^A,2^R$ | 1,2 | 3 |
| $GCL_4$ | $20^A,21^R$ | $GCR_4$ | $21^A,25^R$ | $1^A,2^R$ | 6,4 | 8 |
| $GCL_5$ | $15^A$ | $GCR_5$ | $15^A$ | $0^A$ | 1 | 1 |
| $GCL_6$ | $28^A,29^R$ | $GCR_6$ | $29^A,31^R$ | $1^A,2^R$ | 6,2 | 8 |
| $GCL_7$ | $21^A$ | $GCR_7$ | $21^A$ | $1^A$ | 6 | 6 |
| $GCL_8$ | $15^A,21^A$ | $GCR_8$ | $17^A,21^A$ | $2^A,0^A$ | 6,1 | 7 |
| $GCL_9$ | $5^A,23^R$ | $GCR_9$ | $5^A,23^R$ | $-2^A,0^R$ | 6,1 | 7 |
| $GCL_{10}$ | $5^A,23^R$ | $GCR_{10}$ | $5^A,23^R$ | $0^A,0^R$ | 1,1 | 2 |
| $GCL_{11}$ | $5^A,22^R$ | $GCR_{11}$ | $5^A,22^R$ | $0^A,0^R$ | 1,1 | 2 |
| | 22 PIECES OF GAIN CONTROL POSITION INFORMATION (Lch) | | 22 PIECES OF GAIN CONTROL POSITION INFORMATION (Rch) | | | 50 bits |

FIG. 125

| ATTACK | | |
|---|---|---|
| VALUE | CODE | NUMBER OF BITS |
| 0 | 0 | 1 |
| OTHERS | 1 + ORIGINAL VALUE (5 BITS) | 6 |

FIG. 126

| RELEASE | | |
|---|---|---|
| VALUE | CODE | NUMBER OF BITS |
| 0 | 0 | 1 |
| 2 | 10 | 2 |
| OTHERS | 11 + ORIGINAL VALUE (5 BITS) | 7 |

ENCODING APPARATUS AND ENCODING METHOD

This application is the national phase under 35 U.S.C. 371 of PCT International No. PCT/JP02/05956 which has an International filing date of Jun. 14, 2002 which claims priority based on Japanese Application No. 2001-182093 filed on Jun. 15, 2001.

TECHNICAL FIELD

The present invention relates to an encoding apparatus and an encoding method, and more particularly, to an encoding apparatus and an encoding method capable of performing encoding with an improved encoding efficiency.

BACKGROUND ART

FIG. 1 shows an example of a construction of an encoding apparatus 1 according to a conventional technique.

A band splitter 11, formed of a filter such as a QMF (Quadrature Mirror Filter) or a PQF (Polyphase Quadrature Filter), splits input audio signal into plural (12, in this specific example) frequency bands and outputs resultant signals of respective bands (hereinafter, such signals will be referred to as encoding units) A0 to A11 (when it is not necessary to distinguish individual encoding units from each other, a simple expression "encoding unit A" will be employed. Similar simple expressions will also be used elsewhere in the present description) to respective spectrum converters 12-1 to 12-12 corresponding to the bands.

The band splitter 11 may split the signal into bands with an equal bandwidth or into critical bands whose bandwidth increases with frequency taking into account the characteristics of human ears.

The spectrum converters 12-1 to 12-12 divide the encoding units A0 to A11 received from the band splitter 11 into blocks (frames) with a fixed length (a fixed period of time), generate gain control information G0 to G11 (which will be described in detail later) depending on the amplitudes of the waveform signals of the respective blocks, and control the gains of the waveform signals of the respective blocks in accordance with the gain control information G0 to G11. The generated gain control information G0 to G11 are supplied from the spectrum converters 12-1 to 12-12 to a multiplexer 16.

After performing the gain control, the spectrum converters 12-1 to 12-12 perform spectrum conversions based on DFT (discrete Fourier transformation) or DCT (discrete cosine transformation) on the signals thereby generating spectral component signals S0 to S11. The resultant spectral component signals S0 to S11 are supplied to a quantization step size setting unit 14 and also to normalizers 13-1 to 13-12 of the respective bands.

The normalizers 13-1 to 13-12 normalize the spectral component signals S0 to S11 received from the spectrum converters 12-1 to 12-12.

More specifically, the normalizers 13-1 to 13-12 detect a signal component having a greatest absolute value from the spectral component signals S0 to S11 every unit of time and normalize the spectral component signals S0 to S11 by employing relative values of coefficients with respect to the detected greatest value as the normalized spectral component signals B0 to B11.

The normalizers 13-1 to 13-12 supply the calculated normalized coefficients B0 to B11 to the multiplexer 16 and supply normalized data C0 to C11 obtained by normalizing the spectral component signals S0 to S11 to respective quantizers 15-1 to 15-12 corresponding to the respective bands.

On the basis of the spectral component signals S0 to S11 received from the spectrum converters 12-1 to 12-12, the quantization step size setting unit 14 determines quantization step sizes to be used in quantization of the normalized data C0 to C11, and outputs quantization step size information D0 to D11 indicating the determined quantization step sizes to the corresponding quantizers 15-1 to 15-12. The quantization step size setting unit 14 also supplies the quantization step size information D0 to D11 to the multiplexer 16.

The quantizers 15-1 to 15-12 quantize the normalized data C0 to C11 supplied every unit of time from the normalizers 13-1 to 13-12, by employing quantization step sized specified by the quantization step size information D0 to D11 received from the quantization step size setting unit 14. Resultant quantized coefficients F0 to F11 (quantized coefficients F of one frame) obtained via the quantization are supplied to the multiplexer 16.

The multiplexer 16 encodes the gain control information G0 to G11 received from the spectrum converter 12, the normalized coefficients B0 to B11 received from the normalizer 13, the quantization step size information D0 to D11 received from the quantization step size setting unit 14, and the quantized coefficients F0 to F11 received from the quantizer 15, on a frame-by-frame basis.

For example, as shown in FIG. 2, encoded data of an (L−1)th frame and encoded data of an Lth frame each include encoded gain control information G0 to G11, normalized coefficients B0 to B11, quantization step size information D0 to D11, and quantized coefficients F0 to F11.

FIG. 3 shows an example of a construction of the spectrum converter 12.

A windowing unit 21 divides an encoding unit A received from the band splitter 11 into blocks having a fixed length (a fixed period of time) and each blocks is multiplied by a window conversion function. More precisely, the windowing unit 21 applies the window conversion function for a range including one block and portions of temporally adjacent blocks. As a result, a waveform signal such as that shown in FIG. 4A or 4B is generated. The windowing unit 21 supplies the resultant waveform signal to a detector 22.

The detector 22 determines whether the waveform signal received from the windowing unit 21 includes an attack portion AT or a release portion RE, on a block-by-block basis. If it is determined that the waveform signal includes an attack portion AT or a release portion RE, the detector 22 generates a detection flag indicating that the waveform signal includes an attack portion AT or a release portion RE.

The attack portion AT refers to a portion in which the level of the waveform signal increases abruptly, and the release portion RE refers to a portion in which the level decreases abruptly, as shown in FIG. 4A or 4B.

If an attack portion AT or a release portion RE is detected in a waveform signal of a block, the detector 22 generates a detection flag indicating that the waveform signal includes an attack portion AT or a release portion RE. In this case, the detector 22 also generates gain control amount information indicating a gain control amount depending on the level of a low-level signal preceding the attack portion AT (hereinafter, such a low-level signal will be referred to as a semi stationary portion SS) or depending on the level of the release portion RE, gain control position information indicating a position at which gain control is to be performed by the gain control amount, and the number of portions to be subjected to the gain control (hereinafter, such a number of portions will be referred to as a gain control number).

For example, when a waveform signal such as that shown in FIG. 4A or 4B is input, the detector 22 generates a detection flag indicating that the signal includes an attack portion AT or a release portion RE and also generates first gain control amount information indicating the gain control amount corresponding to the level of the semi stationary portion SS, second gain control amount information indicating the gain control amount corresponding to the level of the release portion, first gain control position information indicating a position at which gain control is to be performed by the gain control amount indicated by the first gain control amount information, second gain control position information indicating a position at which gain control is to be performed by the gain control amount indicated by the second gain control amount information, and a gain control number indicating that gain control is to be performed at two positions.

For example, in a case in which the gain control amount of the release portion RE is set to 1, the gain control amount information associated with the semi stationary portion SS shown in FIG. 4A indicates a relatively small gain control amount (SSa), as shown in FIG. 4C, because the noise levels of the semi stationary portion SS and the release portion RE are relatively high.

On the other hand the gain control amount information associated with the waveform signal shown in FIG. 4B indicates a relatively large gain control amount (SSb), as shown in FIG. 4C, because the noise levels of the semi stationary portion SS and the release portion RE are relatively low.

In the case in which the waveform signal of a block includes an attack portion AT or a release portion RE, a detection flag indicating that the waveform signal includes an attack portion AT or a release portion RE, gain control amount information, gain control position information, and a gain control number are generated by the detector 22 and supplied to a controller 23 together with the waveform signal output from the windowing unit 21. In a case in which a waveform signal of a block includes neither an attack portion AT nor a release portion RE, the detector 22 outputs to the controller 23 a detection flag indicating that the waveform signal includes neither attack portion AT nor a release portion RE, together with the waveform signal received from the windowing unit 21.

In the case in which the detection flag indicates that the waveform signal includes an attack portion AT or a release portion RE, the controller 23 controls the gain of the waveform signal of the block in accordance with the gain control number, the gain control amount information, and the gain control position information, which were supplied together with the detection flag. The signal obtained via the gain control process is supplied to a spectrum converter 24 from the controller 23.

For example, in the case of the waveform signal shown in FIG. 4A, the waveform signal is multiplied by a gain control function A shown in FIG. 4C. In the case of the waveform signal shown in FIG. 4B, the waveform signal is multiplied by a gain control function B shown in FIG. 4C.

In the case in which the detection flag indicates that the waveform signal includes neither an attack portion AT or a release portion RE, the controller 23 does not substantially perform the gain control on the waveform signal of the block received from the detector 22 but directly supplies the waveform signal to the spectrum converter 24.

When the controller 23 receives, in addition to a detection flag, a gain control number, gain control amount information, and gain control position information from the detector 22, the controller 23 supplies the received data as gain control information G to the multiplexer 16. However, in the case in which a gain control number, gain control amount information, and gain control position information were not supplied, the controller 23 outputs, to the multiplexer 16, gain control information G including only the detection flag indicating that the waveform signal includes neither an attack portion AT nor a release portion RE.

In the case in which the gain control information G received from the controller 23 of the spectrum converter 12 includes only a detection flag, the multiplexer 16 encodes and multiplexes only the detection flag as the gain control information G, as is the case with the encoded data of the (L−1)th frame shown in FIG. 2.

However, in the case in which the gain control information G received from the controller 23 includes not only a detection flag but also a gain control number, gain control amount information, and gain control position information, the multiplexer 16 encodes and multiplexes the detection flag, the gain control number, the gain control amount information, and the gain control position information, as the gain control information G, as is the case with the encoded data of the Lth frame shown in FIG. 2.

Referring again to FIG. 3, the spectrum converter 24 performs a spectrum conversion based on DFT, DCT, or MDCT on the signal received from the controller 23. A resultant spectral component signal S obtained via the spectrum conversion is supplied to the normalizer 13.

FIG. 5 shows an example of a construction of a decoding apparatus 2 for decoding the encoded data generated by the encoding apparatus 1 shown in FIG. 1.

A demultiplexer 31 decodes the encoded data supplied from the encoding apparatus 1 shown in FIG. 1 and separates the decoded data into gain control information G0 to G11, normalized coefficients B0 to B11, quantization step size information D0 to D11, and quantized coefficients F0 to F11.

The separated normalized coefficients B0 to B11, quantization step size information D0 to D11, and quantized coefficients F0 to F11 are supplied from the demultiplexer 31 to corresponding dequantizers/denormalizers 32-1 to 32-12, while the gain control information G0 to G11 are supplied to corresponding inverse spectrum converters 33-1 to 33-12.

The dequantizer/denormalizer 32 dequantizes the quantized coefficients F by employing a quantization step size corresponding to that indicated by the quantization step size information D and multiplies the normalized data C obtained via the dequantization by a value corresponding to the normalized coefficient B (thereby denormalizing the normalized data C). The signal obtained as a result of the above process is supplied to the inverse spectrum converter 33.

The inverse spectrum converter 33 performs an inverse spectrum conversion which is an inverse transformation of the spectrum conversion performed by the encoding apparatus 1.

In accordance with the gain control information G, the inverse spectrum converter 33 performs a gain control adjustment on the signal obtained via the inverse spectrum conversion and the inverse spectrum converter 33 outputs resultant encoding units A to a band combiner 34.

The band combiner 34 combines the encoding units A received from the inverse spectrum converter 33 such that overlapped sample data of the block are interfered with each other, thereby reconstructing an audio signal.

FIG. 6 shows an example of a construction of the inverse spectrum converter 33.

An inverse spectrum converter 41 performs an inverse spectrum conversion, which is an inverse transformation of the spectrum conversion performed by the encoding apparatus 1, on the data output from the dequantizer/denormalizer 32.

More specifically, in a case in which the spectrum conversion is performed by the encoding apparatus 1 on the basis of DFT, the inverse spectrum conversion is performed on the basis of IDFT. In a case in which the spectrum conversion is performed by the encoding apparatus 1 on the basis of DCT, the inverse spectrum conversion is performed on the basis of IDCT.

The adjusting unit 42 performs a gain control adjustment on the signal received from the inverse spectrum converter 41, in accordance with the gain control information G supplied from the demultiplexer 31.

More specifically, when the detection flag included in the gain control information G indicates the presence of an attack portion AT or a release portion RE, the adjusting unit 42 performs the gain control adjustment on the signal received from the inverse spectrum converter 41, in accordance with the gain control number, the gain control position information, and the gain control amount information That is, the signal output from the inverse spectrum converter 41 is multiplied by the a gain control adjustment function corresponding to the gain control function employed in the encoding process.

For example, in the case of a waveform signal shown in FIG. 4A, when the encoding apparatus 1 controlled the gain thereof, a gain control function A having relatively small gain control amounts as shown in FIG. 4C was employed. Therefore, in the gain control adjustment for the signal obtained by dequantizing and denormalizing the encoded data of the waveform signal shown in FIG. 4A, the signal is multiplied by a gain control adjustment function having relatively small gain control amounts.

Thus, in this case, as can be seen from FIG. 4D, although noise suppression for the semi stationary portion SS and the release portion RE is relatively low, quantization noise energy is suppressed to a low level over the entire block.

On the other hand, in the case of a waveform signal shown in FIG. 4B, when the encoding apparatus 1 controlled the gain thereof, a gain control function B having relatively large gain control amounts as shown in FIG. 4C was employed. Therefore, in the gain control adjustment for the signal obtained by dequantizing and denormalizing the encoded data of the waveform signal shown in FIG. 4B, the signal is multiplied by a gain control adjustment function having relatively large gain control amounts.

Thus, in this case, as can be seen from FIG. 4E, although the attack portion AT in the block includes relatively large quantization noise energy, quantization noise is suppressed to low levels for both the semi stationary portion SS and the release portion RE.

Therefore, a pre-echo or post-echo problem in hearing the waveform signal such as that shown in FIG. 4A or 4B is suppressed.

On the other hand, in the case in which the detection flag indicates that there is neither an attack portion AT nor a release portion RE, the adjusting unit 42 does not substantially perform the signal attenuating process on the signal received from the inverse spectrum converter 41.

The manner of encoding and decoding an audio signal has been described above.

In the case in which a waveform signal in a frame includes an attack portion AT or a release portion RE, the encoding apparatus 1 also encodes gain control information G including gain control number, gain control position information and gain control amount information in addition to a detection flag. In the conventional technique, for example, the gain control number, the gain control position information, and the gain control amount information are encoded into 3-bit, 4-bit, and 5-bit codes, respectively.

Because the total data size of encoded data of a frame is generally fixed, encoding of the gain control number, the gain control position information, and the gain control amount information into such fixed-length codes results in a limitation on the number of bits available for encoding of quantized coefficients F and thus results in a reduction in the encoding efficiency of the quantized coefficients F.

DISCLOSURE OF THE INVENTION

In view of the above, it is an object of the present invention to provide a technique of improving the encoding efficiency.

The present invention provides a first encoding apparatus comprising detection means for detecting a gain control number of a first arbitrary band signal of band signals and a gain control number of a second band signal in a band adjacent to the band of the first band signal; calculation means for calculating the difference value between first gain control number detected by the detection means from the first band signal and second gain control number detected by the detection means from the second band signal; retaining means for retaining a table indicating a value-code correspondence in which a code with a small number of bits is assigned to a value having a high probability of being obtained as the result of the calculation of the difference value performed by the calculation means; gain control number encoding means for encoding the first gain control number such that a code corresponding to the difference value calculated by the calculation means is retrieved from the table and the retrieved code is employed as the code of the first gain control number; gain control amount information encoding means for encoding gain control amount information indicating a particular value corresponding to a gain control amount; and gain control position information encoding means for encoding gain control position information indicating a particular value corresponding to a gain control position.

The table indicating the difference value versus code correspondence may include only one or more difference values having high probabilities of being obtained as the result of the calculation performed by the calculation means. In this case, when a calculated difference value is not found in the table, the gain control number encoding means may encode an escape code and the first gain control number.

The present invention provides a first encoding method comprising a detection step of detecting a gain control number of a first arbitrary band signal of band signals and a gain control number of a second band signal in a band adjacent to the band of the first band signal; a calculation step of calculating the value between a first gain control number detected in the detection step from the first band signal and a second gain control number detected in the detection step from the second band signal; a retaining step of retaining a table indicating a value-code correspondence in which a code with a small number of bits is assigned to a value having a high probability of being obtained as the result of the calculation of the difference value performed in the calculation step; a gain control number encoding step of encoding the first gain control number such that a code corresponding to the difference value calculated in the calculation step is retrieved from the table and the retrieved code is employed as the code of the first gain control number; a gain control amount information encoding step of encoding gain control amount information indicating a particular value corresponding to a gain control amount; and a gain control position information encoding step of encoding gain control position information indicating a particular value corresponding to a gain control position.

In the first encoding apparatus and encoding method according to the present invention, a gain control number of a first arbitrary band signal of band signals and a gain control number of a second band signal in a band adjacent to the band of the first band signal are detected; the difference value between first gain control number detected from the first band signal and second gain control number detected from the second band signal is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control number; gain control amount information indicating a particular value corresponding to a gain control amount is encoded; and gain control position information indicating a particular value corresponding to a gain control position is encoded.

The present invention provides a second encoding apparatus comprising detection means for detecting a gain control number of a first arbitrary band signal of band signals and a gain control number of a second band signal in a band adjacent to the band of the first band signal; determination means for determining whether a first gain control number detected by the detection means from the first band signal and a second gain control number detected by the detection means from the second band signal are equal to each other; gain control number encoding means for performing encoding such that if the determination made by the determination means is affirmative, only a flag indicating that the first and second gain control numbers are equal to each other is encoded, while, if the determination made by the determination means is negative, both a flag indicating that the first and second gain control numbers are not equal to each other and the second gain control number are encoded; gain control amount information encoding means for encoding gain control amount information indicating a particular value corresponding to a gain control amount; and gain control position information encoding means for encoding gain control position information indicating a particular value corresponding to a gain control position.

The present invention provides a second encoding method comprising a detection step of detecting a gain control number of a first arbitrary band signal of band signals and a gain control number of a second band signal in a band adjacent to the band of the first band signal; a determination step of determining whether a first gain control number detected in the detection step from the first band signal and a second gain control number detected from the second band signal are equal to each other; a gain control number encoding step of performing encoding such that if the determination made in the determination step is affirmative, only a flag indicating that the first and second gain control numbers are equal to each other is encoded, while, if the determination made in the determination step is negative, both a flag indicating that the first and second gain control numbers are not equal to each other and the second gain control number are encoded; a gain control amount information encoding step of encoding gain control amount information indicating a particular value corresponding to a gain control amount; and a gain control position information encoding step of encoding gain control position information indicating a particular value corresponding to a gain control position.

In the second encoding apparatus and encoding method according to the present invention, a gain control number of a first arbitrary band signal of band signals and a gain control number of a second band signal in a band adjacent to the band of the first band signal are detected; it is determined whether a first gain control number detected from the first band signal and a second gain control number detected from the second band signal are equal to each other; if the result of the determination is affirmative, only a flag indicating that the first gain control number and the second gain control number are equal to each other is encoded, while if the result of the determination is negative, a flag indicating that the first gain control number and the second gain control number are not equal to each other and the second gain control number are encoded; gain control amount information indicating a particular value corresponding to a gain control amount is encoded; and gain control position information indicating a particular value corresponding to a gain control position is encoded.

The present invention provides a third encoding apparatus comprising detection means for detecting a gain control number of a band signal; calculation means for calculating a smallest number of bits which can represent the difference between the maximum and minimum values of the gain control numbers detected by the detection means; gain control number encoding means for encoding the gain control number such that the minimum value determined by the calculation means is encoded, a value obtained by subtracting the minimum value from the gain control number detected by the detection means is expressed by as many bits as the smallest number of bits calculate by the calculation means, and a resultant expression is employed as the code of the gain control number; gain control amount information encoding means for encoding gain control amount information indicating a particular value corresponding to a gain control amount; and gain control position information encoding means for encoding gain control position information indicating a particular value corresponding to a gain control position.

The present invention provides a third encoding method comprising a detection step of detecting gain control numbers of the band signals; a calculation step of calculating a smallest number of bits which can represent the difference between the maximum and minimum values of the gain control numbers detected in the detection step; a gain control number encoding step for encoding the gain control number such that the minimum value determined in the calculation step is encoded, a value obtained by subtracting the minimum value from the gain control number detected in the detection step is expressed by as many bits as the smallest number of bits calculated in the calculation step, and a resultant expression is employed as the code of the gain control number; a gain control amount information encoding step of encoding gain control amount information indicating a particular value corresponding to a gain control amount; and a gain control position information encoding step of encoding gain control position information indicating a particular value corresponding to a gain control position.

In the third encoding apparatus and encoding method according to the present invention, a gain control number of a band signal is detected; the smallest number of bits which can represent the difference between the maximum and minimum values of the detected gain control numbers is calculated; the determined minimum value is encoded and furthermore gain control numbers are encoded such that values obtained by subtracting the minimum value from the detected gain control numbers are expressed by as many bits as the smallest number of bits calculate above, and resultant expressions are employed as the codes of the gain control numbers; gain control amount information indicating a particular value corresponding to a gain control amount is encoded; and gain control position information indicating a particular value corresponding to a gain control position is encoded.

The present invention provides a fourth encoding apparatus comprising detection means for detecting a gain control number of an arbitrary band signal of the left-channel signal and a gain control number of a band signal of the right-channel signal in the same band as that of the band signal of the left-channel signal; calculation means for calculating the difference value between a first gain control number detected by the detection means from a band signal of the left-channel signal and a second gain control number detected by the detection means from a band signal of the right-channel signal; retaining means for retaining a table indicating a value-code correspondence in which a code with a small number of bits is assigned to a value having a high probability of being obtained as the result of the calculation of the difference value performed by the calculation means; gain control number encoding means for encoding the first or second gain control number such that a code corresponding to the difference value calculated by the calculation means is retrieved from the table and the retrieved code is employed as the code of the first or second gain control number; gain control amount information encoding means for encoding gain control amount information indicating a particular value corresponding to a gain control amount; and gain control position information encoding means for encoding gain control position information indicating a particular value corresponding to a gain control position.

The table indicating the difference value versus code correspondence may include only one or more difference values having high probabilities of being obtained as the result of the calculation performed by the calculation means. In this case, when the correspondence of the calculated difference value is not found in the table, the gain control number encoding means may encode an escape code and the gain control number.

The present invention provides a fourth encoding method comprising a detection step of detecting a gain control number of an arbitrary band signal of a left-channel signal and a gain control number of a band signal of a right-channel signal in the same band as that of the band signal of the left-channel signal; a calculation step of calculating the difference value between first gain control number detected in the detection step from the band signal of the left-channel signal and second gain control number detected in the detection step from the band signal of the right-channel signal; a retaining step of retaining a table indicating a value-code correspondence in which a code with a small number of bits is assigned to a value having a high probability of being obtained as the result of the calculation of the difference value performed in the calculation step; a gain control number encoding step of encoding the first or second gain control number such that a code corresponding to the difference value calculated in the calculation step is retrieved from the table and the retrieved code is employed as the code of the first or second gain control number; a gain control amount information encoding step of encoding gain control amount information indicating a particular value corresponding to a gain control amount; and a gain control position information encoding step of encoding gain control position information indicating a particular value corresponding to a gain control position.

In the fourth encoding apparatus and encoding method according to the present invention, a gain control number of an arbitrary band signal of a left-channel signal and a gain control number of a band signal of a right-channel signal in the same band as that of the band signal of the left-channel signal are detected; the difference value between a first gain control number detected from a band signal of the left-channel signal and a second gain control number detected from a band signal of the right-channel signal are calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first or second gain control number; gain control amount information indicating a particular value corresponding to a gain control amount is encoded; and gain control position information indicating a particular value corresponding to a gain control position is encoded.

The present invention provides a fifth encoding apparatus comprising detection means for detecting a gain control number of an arbitrary band signal of the left-channel signal and a gain control number of a band signal of the right-channel signal in the same band as that of the band signal of the left-channel signal; determination means for determining whether a first gain control number detected by the detection means from a band signal of the left-channel signal and a second gain control number detected by the detection means from a band signal of the right-channel signal are equal to each other; gain control number encoding means for performing encoding such that if the determination made by the determination means is affirmative, a flag indicating that the first and second gain control numbers are equal to each other and the first or second gain control number are encoded, while, if the determination made by the determination means is negative, a flag indicating that the first and second gain control numbers are not equal to each other and the second and gain control numbers are encoded; gain control amount information encoding means for encoding gain control amount information indicating a particular value corresponding to a gain control amount; and gain control position information encoding means for encoding gain control position information indicating a particular value corresponding to a gain control position.

The present invention provides a fifth encoding method comprising a detection step of detecting a gain control number of an arbitrary band signal of a left-channel signal and a gain control number of a band signal of a right-channel signal in the same band as that of the band signal of the left-channel signal; a determination step of determining whether a first gain control number detected in the detection step from the band signal of the left-channel signal and a second gain control number detected in the detection step from the band signal of the right-channel signal are equal to each other; a gain control number encoding step of performing encoding such that if the determination made in the determination step is affirmative, a flag indicating that the first and second gain control numbers are equal to each other and the first or second gain control number are encoded, while, if the determination made in the determination step is negative, a flag indicating that the first and second gain control numbers are not equal to each other and the second and gain control numbers are encoded; a gain control amount information encoding step of encoding gain control amount information indicating a particular value corresponding to a gain control amount; and a gain control position information encoding step of encoding gain control position information indicating a particular value corresponding to a gain control position.

In the fifth encoding apparatus and encoding method according to the present invention, a gain control number of an arbitrary band signal of a left-channel signal and a gain control number of a band signal of a right-channel signal in the same band as that of the band signal of the left-channel signal are detected; it is determined whether a first gain control number detected from the band signal of the left-channel signal and a second gain control number detected from the band signal of the right-channel signal are equal to each other; if the result of the determination is affirmative, a flag indicating that the first gain control number and the second gain control number are equal to each other and the first or second gain control number are encoded, while if the result of the determination is negative, a flag indicating that the first gain control number and the second gain control number are not equal to each other and the first and second gain control number are encoded; gain control amount information indicating a particular value corresponding to a gain control amount is encoded; and gain control position information indicating a particular value corresponding to a gain control position is encoded.

The present invention provides a sixth encoding apparatus comprising detection means for detecting gain control numbers of band signals of the left-channel signal and gain control numbers of band signals of the right-channel signal; determination means for determining whether first gain control numbers detected by the detection means from the band signals of the left-channel signal and second gain control numbers detected by the detection means from the corresponding band signals of the right-channel signal are equal to each other for all bands; gain control number encoding means for performing encoding such that if the determination made by the determination means is affirmative, the first or second gain control numbers are encoded, while, if the determination made by the determination means is negative, the first and second gain control numbers are encoded; gain control amount information encoding means for encoding gain control amount information indicating a particular value corresponding to a gain control amount; and gain control position information encoding means for encoding gain control position information indicating a particular value corresponding to a gain control position.

The present invention provides a sixth encoding method comprising a detection step of detecting a gain control number of a band signal of a left-channel signal and a gain control number of a band signal of a right-channel signal; a determination step of determining whether first gain control numbers detected in the detection step from the band signals of the left-channel signal and second gain control numbers detected in the detection step from the corresponding band signals of the right-channel signal are equal to each other for all bands; a gain control number encoding step of performing encoding such that if the determination made in the determination step is affirmative, the first or second gain control numbers are encoded, while, if the determination made in the determination step is negative, the first and second gain control numbers are encoded; a gain control amount information encoding step of encoding gain control amount information indicating a particular value corresponding to a gain control amount; and a gain control position information encoding step of encoding gain control position information indicating a particular value corresponding to a gain control position.

In the sixth encoding apparatus and encoding method according to the present invention, a gain control number of a band signal of a left-channel signal and a gain control number of a band signal of a right-channel signal are detected; it is determined whether first gain control numbers detected from the band signals of the left-channel signal and second gain control numbers detected from the corresponding band signals of the right-channel signal are equal to each other for all bands; if the result of the determination is affirmative, the first or second gain control numbers are encoded, while if the result of the determination is negative, the first and second gain control numbers are encoded; gain control amount information indicating a particular value corresponding to a gain control amount is encoded; and gain control position information indicating a particular value corresponding to a gain control position is encoded.

The present invention provides a seventh encoding apparatus comprising detection means for detecting gain control numbers of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal; first calculation means for calculating the difference value between first gain control number detected by the detection means from the first band signal and second gain control number detected by the detection means from the second band signal; second calculation means for calculating the difference value between third gain control number detected from the third band signal and fourth gain control number detected from the fourth band signal; third calculation means for calculating the difference value between the difference value calculated by the first calculation means and the difference value calculated by the second calculation means; retaining means for retaining a table indicating a value-code correspondence in which a code with a small number of bits is assigned to a value having a high probability of being obtained as the result of the calculation of the difference value performed by the third calculation means; gain control number encoding means for encoding the first gain control number such that a code corresponding to the difference value calculated by the third calculation means is retrieved from the table and the retrieved code is employed as the code of the first gain control number; gain control amount information encoding means for encoding gain control amount information indicating a particular value corresponding to a gain control amount; and gain control position information encoding means for encoding gain control position information indicating a particular value corresponding to a gain control position.

The table indicating the difference value versus code correspondence may include only one or more difference values having high probabilities of being obtained as the result of the calculation performed by the third calculation means. In this case, when the correspondence of the calculated difference value is not found in the table, the gain control number encoding means may encode an escape code and the first gain control number.

The present invention provides a seventh encoding method comprising a detection step for detecting gain control numbers of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal; a first calculation step of calculating the difference value between a first gain control number detected in the detection step from the first band signal and a second gain control number detected in the detection step from the second band signal; a second calculation step of calculating the difference value between a third gain control number detected from the third band signal and a fourth gain control number detected from the fourth band signal; a third calculation step of calculating the difference value between the difference value calculated in the first calculation step and the difference value calculated in the second calculation step; a retaining step of retaining a table indicating a value-code correspondence in which a code with a small number of bits is assigned to a value having a high probability of being obtained as the result of the calculation of the difference value performed in the third calculation step; a gain control number encoding step of encoding the first gain control number such that a code corresponding to the difference value calculated in the third calculation step is retrieved from the table and the retrieved code is employed as the code of the first gain control number; a gain control amount information encoding step of encoding gain control amount information indicating a particular value corresponding to a gain control amount; and a gain control position information encoding step of encoding gain control position information indicating a particular value corresponding to a gain control position.

In the seventh encoding apparatus and encoding method according to the present invention, gain control numbers of an arbitrary first band signal, a second band signal, a third band signal, and a fourth band signal are detected, wherein the first band signal and the second band signal are of band signals of a left-channel signal, the second band signal is of a band adjacent to a band of the first band signal, the third band signal and the fourth band signal are of band signals of a right-channel signal, the third band signal corresponds to the first band signal, and the fourth band signal corresponds to the second band signal; the difference value between a first gain control number detected from the first band signal and a second gain control number detected from the second band signal is calculated; the difference value between a third gain control number detected from the third band signal and a fourth gain control number detected from the fourth band signal is calculated; the difference value between the calculated difference values is further calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control number; gain control amount information indicating a particular value corresponding to a gain control amount is encoded; and gain control position information indicating a particular value corresponding to a gain control position is encoded.

The present invention provides an eighth encoding apparatus comprising detection means for detecting gain control amount information indicating a particular value corresponding to a gain control amount of a band signal; calculation means for calculating the difference value between arbitrary first gain control amount information of one or more pieces of gain control amount information detected by the detection means from one of the band signals and gain control amount information corresponding to a gain control amount of gain adjustment performed on a part adjacent to a part subjected to gain adjustment performed according to the gain control amount corresponding to the first gain control amount information; retaining means for retaining a table indicating a value-code correspondence in which a code with a small number of bits is assigned to a value having a high probability of being obtained as the result of the calculation of the difference value performed by the calculation means; gain control amount information encoding means for encoding the first gain control amount information such that a code corresponding to the difference value calculated by the calculation means is retrieved from the table and the retrieved code is employed as the code of the first gain control amount information; gain control number encoding means for encoding a gain control number; and gain control position information encoding means for encoding gain control position information indicating a particular value corresponding to a gain control position.

The table may indicate the correspondence of only one or more difference values having high probabilities of being obtained as the result of the calculation performed by the calculation means. In this case, when the correspondence of the calculated difference value is not found in the table, the gain control amount information encoding means may encode an escape code and the first gain control amount information.

The present invention provides an eighth encoding method comprising a detection step of detecting gain control amount information indicating a particular value corresponding to a gain control amount of a band signal; a calculation step of calculating the difference value between arbitrary first gain control amount information of one or more pieces of gain control amount information detected in the detection step from one of the band signals and gain control amount information corresponding to a gain control amount of gain adjustment performed on a part adjacent to a part subjected to gain adjustment performed according to the gain control amount corresponding to the first gain control amount information; a retaining step of retaining a table indicating a value-code correspondence in which a code with a small number of bits is assigned to a value having a high probability of being obtained as the result of the calculation of the difference value performed in the calculation step; a gain control amount information encoding step of encoding the first gain control amount information such that a code corresponding to the difference value calculated in the calculation step is retrieved from the table and the retrieved code is employed as the code of the first gain control amount information; a gain control number encoding step of encoding a gain control number; and a gain control position information encoding step of encoding gain control position information indicating a particular value corresponding to a gain control position.

In the eighth encoding apparatus and encoding method according to the present invention, gain control amount information indicating a particular value corresponding to a gain control amount of a band signal is detected; the difference value between arbitrary first gain control amount information of one or more pieces of gain control amount information detected by the detection means from one of the band signals and gain control amount information corresponding to a gain control amount of gain adjustment performed on a part adjacent to a part subjected to gain adjustment performed according to the gain control amount corresponding to the first gain control amount information is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control amount information; the gain control number is encoded; and gain control position information indicating a particular value corresponding to a gain control position is encoded.

The present invention provides a ninth encoding apparatus comprising detection means for detecting gain control amount information indicating a particular value corresponding to a gain control amount of a first arbitrary band signal of band signals and detecting gain control amount information indicating a particular value corresponding to a gain control amount of a second band signal in a band adjacent to the band of the first band signal; calculation means for calculating the difference value between the first gain control amount information detected by the detection means from the first band signal and the second gain control amount information detected by the detection means from the second band signal; retaining means for retaining a table indicating a value-code correspondence in which a code with a small number of bits is assigned to a value having a high probability of being obtained as the result of the calculation of the difference value performed by the calculation means; gain control amount information encoding means for encoding the first gain control amount information such that a code corresponding to the difference value calculated by the calculation means is retrieved from the table and the retrieved code is employed as the code of the first gain control amount information; gain control number encoding means for encoding a gain control number; and gain control position information encoding means for encoding gain control position information indicating a particular value corresponding to a gain control position.

The table indicating the difference value versus code correspondence may include only one or more difference values having high probabilities of being obtained as the result of the calculation performed by the calculation means. In this case, when the correspondence of the calculated difference value is not found in the table, the gain control amount information encoding means may encode an escape code and the gain control amount information.

The present invention provides a ninth encoding method comprising a detection step of detecting gain control amount information indicating a value corresponding to a gain control amount of a first arbitrary band signal of the band signals and detecting gain control amount information indicating a value corresponding to a gain control amount of a second band signal in a band adjacent to the band of the first band signal; a calculation step of calculating the difference value between first gain control amount information detected in the detection step from the first band signal and second gain control amount information detected in the detection step from the second band signal; a retaining step of retaining a table indicating a value-code correspondence in which a code with a small number of bits is assigned to a value having a high probability of being obtained as the result of the calculation of the difference value performed in the calculation step; a gain control amount information encoding step of encoding the first gain control amount information such that a code corresponding to the difference value calculated in the calculation step is retrieved from the table and the retrieved code is employed as the code of the first gain control amount information; a gain control number encoding step of encoding a gain control number; and a gain control position information encoding step of encoding gain control position information indicating a particular value corresponding to a gain control position.

In the ninth encoding apparatus and encoding method according to the present invention, gain control amount information indicating a particular value corresponding to a gain control amount of a first arbitrary band signal of band signals and also gain control amount information indicating a particular value corresponding to a gain control amount of a second band signal in a band adjacent to the band of the first band signal are detected; the difference value between first gain control amount information detected from the first band signal and second gain control amount information detected from the second band signal is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control amount information; the gain control number is encoded; and gain control position information indicating a particular value corresponding to a gain control position is encoded.

The present invention provides a tenth encoding apparatus comprising detection means for detecting gain control amount information indicating a particular value corresponding to a gain control amount of a first arbitrary band signal of band signals and detecting gain control amount information indicating a particular value corresponding to a gain control amount of a second band signal in a band adjacent to the band of the first band signal; first calculation means for calculating the first difference value between arbitrary first gain control amount information of one or more pieces of gain control amount information detected by the detection means from the first band signal and gain control amount information corresponding to a gain control amount of gain adjustment performed on a part adjacent to a part subjected to gain adjustment performed according to the gain control amount corresponding to the first gain control amount information and also calculating the second difference value between third gain control amount information corresponding to the first gain control amount information and fourth gain control amount information corresponding to the second gain control amount information, the third gain control amount information and the fourth gain control amount information having been detected from the second band signal; second calculation means for calculating the third difference value between the first difference value and the second difference value; retaining means for retaining a table indicating a value-code correspondence in which a code with a small. number of bits is assigned to a value having a high probability of being obtained as the third difference value in the calculation performed by the second calculation means; gain control amount information encoding means for encoding the first gain control amount information such that a code corresponding to the third difference value calculated by the second calculation means is retrieved from the table and the retrieved code is employed as the code of first gain control amount information; gain control number encoding means for encoding a gain control number; and gain control position information encoding means for encoding gain control position information indicating a particular value corresponding to a gain control position.

The table indicating the difference value versus code correspondence may include only one or more difference values having high probabilities of being obtained as the result of the calculation of the third difference value performed by the calculation means. In this case, when the correspondence of the calculated third difference value is not found in the table, the gain control amount information encoding means may encode an escape code and the first gain control amount information.

The present invention provides a tenth encoding method comprising a detection step of detecting gain control amount information indicating a value corresponding to a gain control amount of a first arbitrary band signal of the band signals and detecting gain control amount information indicating a value corresponding to a gain control amount of a second band signal in a band adjacent to the band of the first band signal; a first calculation step for calculating the first difference value between arbitrary first gain control amount information of one or more pieces of gain control amount information detected in the detection step from the first band signal and gain control amount information corresponding to a gain control amount of gain adjustment performed on a part adjacent to a part subjected to gain adjustment performed according to the gain control amount corresponding to the first gain control amount information and also calculating the second difference value between third gain control amount information corresponding to the first gain control amount information and fourth gain control amount information corresponding to the second gain control amount information, the third gain control amount information and the fourth gain control amount information having been detected from the second band signal; a second calculation step of calculating the third difference value between the first difference value and the second difference value; a retaining step of retaining a table indicating a value-code correspondence in which a code with a small number of bits is assigned to a value having a high probability of being obtained as the third difference value in the calculation performed in the second calculation step; a gain control amount information encoding step of encoding the first gain control amount information such that a code corresponding to the third difference value calculated in the second calculation step is retrieved from the table and the retrieved code is employed as the code of the first gain control amount information; a gain control number encoding step of encoding a gain control number; and a gain control position information encoding step of encoding gain control position information indicating a particular value corresponding to a gain control position.

In the tenth encoding apparatus and encoding method according to the present invention, gain control amount information indicating a particular value corresponding to a gain control amount of a first arbitrary band signal of band signals and also gain control amount information indicating a particular value corresponding to a gain control amount of a second band signal in a band adjacent to the band of the first band signal are detected; the first difference value between arbitrary first gain control amount information of one or more pieces of gain control amount information detected by the detection means from the first band signal and gain control amount information corresponding to a gain control amount of gain adjustment performed on a part adjacent to a part subjected to gain adjustment performed according to the gain control amount corresponding to the first gain control amount information is calculated, and furthermore, the second difference value between third gain control amount information corresponding to the first gain control amount information and fourth gain control amount information corresponding to the second gain control amount information, the third gain control amount information and the fourth gain control amount information having been detected from the second band signal is calculated; the third difference value between the first difference value and the second difference value is calculated; there is retained a table in which codes with small numbers of bits are assigned to values having high probabilities of being obtained as a result of calculation of the third difference value; a code corresponding to the calculated third difference value is retrieved from the table and the retrieved code is employed as the code of the first gain control amount information; the gain control number is encoded; and gain control position information indicating a particular value corresponding to a gain control position is encoded.

The present invention provides an eleventh encoding apparatus comprising detection means for detecting gain control amount information indicating a particular value corresponding to gain control amount information of a first arbitrary band signal of band signals and detecting gain control amount information indicating a particular value corresponding to gain control amount information of a second band signal in a band adjacent to the band of the first band signal; determination means for determining whether first gain control amount information detected by the detection means from the first band signal and second gain control amount information detected from the second band signal are equal to each other; gain control amount information encoding means for performing encoding such that if the determination made by the determination means is affirmative, only a flag indicating that the first gain control amount information and second gain control amount information are equal to each other is encoded, while, if the determination made by the determination means is negative, both a flag, indicating that the first gain control amount information and second gain control amount information are not equal to each other, and the second gain control amount information are encoded; gain control number encoding means for encoding a gain control number; and gain control position information encoding means for encoding gain control position information indicating a particular value corresponding to a gain control position.

The present invention provides an eleventh encoding method comprising a detection step of detecting gain control amount information indicating a value corresponding to gain control amount information of a first arbitrary band signal of the band signals and detecting gain control amount information indicating a value corresponding to gain control amount information of a second band signal in a band adjacent to the band of the first band signal; a determination step of determining whether first gain control amount information detected in the detection step from the first band signal and second gain control amount information detected in the detection step from the second band signal are equal to each other; a gain control amount information encoding step of performing encoding such that if the determination made in the determination step is affirmative, only a flag indicating that the first gain control amount information and second gain control amount information are equal to each other is encoded, while, if the determination made in the determination step is negative, both a flag, indicating that the first gain control amount information and second gain control amount information are not equal to each other, and the second gain control amount information are encoded; a gain control number encoding step of encoding a gain control number; and a gain control position information encoding step of encoding gain control position information indicating a particular value corresponding to a gain control position.

In the eleventh encoding apparatus and encoding method according to the present invention, gain control amount information indicating a particular value corresponding to gain control amount information of a first arbitrary band signal of band signals and also gain control amount information indicating a particular value corresponding to a gain control amount information of a second band signal in a band adjacent to the band of the first band signal are detected; it is determined whether first gain control amount information detected from the first band signal and second gain control amount information detected from the second band signal are equal to each other; if the result of the determination is affirmative, only a flag indicating that the first gain control amount information and the second gain control amount information are equal to each other is encoded, while if the result of the determination is negative, a flag indicating that the first gain control amount information and the second gain control amount information are not equal to each other and the second gain control amount information are encoded; the gain control number is encoded; and gain control position information indicating a particular value corresponding to a gain control position is encoded.

The present invention provides a twelfth encoding apparatus comprising detection means for detecting gain control amount information indicating a particular value corresponding to a gain control amount of a band signal; calculation means for calculating a smallest number of bits which can represent the difference between the maximum and minimum values of the gain control amount information detected by the detection means; gain control amount information encoding means for encoding the gain control amount information such that the minimum value determined by the calculation means is encoded, a value obtained by subtracting the minimum value from the gain control amount information detected by the detection means is expressed by as many bits as the number of bits calculate by the calculation means, and a resultant expression is employed as the code of the gain control amount information; gain control number encoding means for encoding a gain control number; and gain control position information encoding means for encoding gain control position information indicating a particular value corresponding to a gain control position.

The calculation means may calculate a smallest number of bits which can represent the difference between the maximum and minimum values of one or more pieces of gain control amount information detected by the detection means from one band signal; and the gain control amount information encoding means may encode the gain control amount information such that values obtained by subtracting the minimum value from the one or more pieces of gain control amount information are expressed by as many bits as the number of bits calculate by the calculation means and resultant expressions are employed as the codes of the one or more pieces of gain control amount information.

The present invention provides a twelfth encoding method comprising a detection step of detecting gain control amount information indicating a particular value corresponding to a gain control amount of a band signal; a calculation step of calculating a smallest number of bits which can represent the difference between the maximum and minimum values of the gain control amount information detected in the detection step; a gain control amount information encoding step for encoding the gain control amount information such that the minimum value determined in the calculation step is encoded, a value obtained by subtracting the minimum value from the gain control amount information detected in the detection step is expressed by as many bits as the number of bits calculated in the calculation step, and a resultant expression is employed as the code of the gain control amount information; a gain control number encoding step of encoding a gain control number; and a gain control position information encoding step of encoding gain control position information indicating a particular value corresponding to a gain control position.

In the twelfth encoding apparatus and encoding method according to the present invention, gain control amount information indicating a particular value corresponding to a gain control amount of a band signal is detected; the smallest number of bits which can represent the difference between the maximum and minimum values of the detected gain control amount information is calculated; the determined minimum value is encoded and furthermore gain control amount information is encoded such that values obtained by subtracting the minimum value from the detected pieces of gain control amount information are expressed by as many bits as the smallest number of bits calculate above, and resultant expressions are employed as the codes of the respective pieces of gain control amount information; the gain control number is encoded; and gain control position information indicating a particular value corresponding to a gain control position is encoded.

The present invention provides a thirteenth encoding apparatus comprising detection means for detecting gain control amount information indicating a particular value corresponding to a gain control amount of a band signal of a left-channel signal and that of a band signal of a right-channel signal in the same band as that of the band signal of the left-channel signal; calculation means for calculating the difference value between the first gain control amount information detected by the detection means from the band signal of the left-channel signal and the second gain control amount information detected by the detection means from the band signal of the right-channel signal; retaining means for retaining a table indicating a value-code correspondence in which a code with a small number of bits is assigned to a value having a high probability of being obtained as the result of the calculation of the difference value performed by the calculation means; gain control amount information encoding means for encoding the first or second gain control amount information such that a code corresponding to the difference value calculated by the calculation means is retrieved from the table and the retrieved code is employed as the code of the first or second gain control amount information; gain control number encoding means for encoding a gain control number; and gain control position information encoding means for encoding gain control position information indicating a particular value corresponding to a gain control position.

The table indicating the difference value versus code correspondence may include only one or more difference values having high probabilities of being obtained as the result of the calculation performed by the calculation means. In this case, when the correspondence of the calculated difference value is not found in the table, the gain control amount information encoding means may encode an escape code and the gain control amount information.

The present invention provides a thirteenth encoding method comprising a detection step, of detecting gain control amount information indicating a particular value corresponding to a gain control amount of a band signal of a left-channel signal and that of a band signal of a right-channel signal in the same band as that of the band signal of the left-channel signal; a calculation step of calculating the difference value between first gain control amount information detected in the detection step from the band signal of the left-channel signal and the second gain control amount information detected in the detection step from the band signal of the right-channel signal; a retaining step of retaining a table indicating a value-code correspondence in which a code with a small number of bits is assigned to a value having a high probability of being obtained as the result of the calculation of the difference value performed in the calculation step; a gain control amount information encoding step of encoding the first or second gain control amount information such that a code corresponding to the difference value calculated in the calculation step is retrieved from the table and the retrieved code is employed as the code of the first or second gain control amount information; a gain control number encoding step of encoding a gain control number; and a gain control position information encoding step of encoding gain control position information indicating a particular value corresponding to a gain control position.

In the thirteenth encoding apparatus and encoding method according to the present invention, gain control amount information indicating a particular value corresponding to a gain control amount of a band signal of a left-channel signal and that of a band signal of a right-channel signal in the same band as that of the band signal of the left-channel signal are detected; the difference value between first gain control amount information detected from the band signal of the left-channel signal and second gain control amount information detected from the band signal of the right-channel signal is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first or second gain control amount information; the gain control number is encoded; and gain control position information indicating a particular value corresponding to a gain control position is encoded.

The present invention provides a fourteenth encoding apparatus comprising detection means for detecting gain control amount information indicating a particular value corresponding to a gain control amount of an arbitrary band signal of a left-channel signal and that of a band signal of a right-channel signal in the same band as that of the band signal of the left-channel signal; determination means for determining whether gain control amount information detected by the detection means from a band signal of the left-channel signal and second gain control amount information detected by the detection means from a band signal of the right-channel signal are equal to each other; gain control amount information encoding means for performing encoding such that if the determination made by the determination means is affirmative, a flag indicating that the first gain control amount information and the second gain control amount information are equal to each other and the first or second gain control amount information are encoded, while, if the determination made by the determination means is negative, a flag indicating that the first gain control amount information and the second gain control amount information are not equal to each other, the first gain control amount information, and the second and gain control amount information are encoded; gain control number encoding means for encoding a gain control number; and gain control position information encoding means for encoding gain control position information indicating a particular value corresponding to a gain control position.

The present invention provides a fourteenth encoding method comprising a detection step, of detecting gain control amount information indicating a particular value corresponding to a gain control amount of an arbitrary band signal of a left-channel signal and that of a band signal of a right-channel signal in the same band as that of the band signal of the left-channel signal; a determination step of determining whether first gain control amount information detected in the detection step from the band signal of the left-channel signal and second gain control amount information detected in the detection step from the band signal of the right-channel signal are equal to each other; a gain control amount information encoding step of performing encoding such that if the determination made in the determination step is affirmative, a flag indicating that the first gain control amount information and the second gain control amount information are equal to each other and the first or second gain control amount information are encoded, while, if the determination made in the determination step is negative, a flag indicating that the first gain control amount information and the second gain control amount information are not equal to each other, the first gain control amount information, and the second and gain control amount information are encoded; a gain control number encoding step of encoding a gain control number; and a gain control position information encoding step of encoding gain control position information indicating a particular value corresponding to a gain control position.

In the fourteenth encoding apparatus and encoding method according to the present invention, gain control amount information indicating a particular value corresponding to a gain control amount of an arbitrary band signal of a left-channel signal and that of a band signal of a right-channel signal in the same band as that of the band signal of the left-channel signal are detected; it is determined whether gain control amount information detected from a band signal of the left-channel signal and second gain control amount information detected by the detection means from a band signal of the right-channel signal are equal to each other; if the result of the determination is affirmative, a flag indicating that the first gain control amount information and the second gain control amount information are equal to each other and the first or second gain control amount information are encoded, while if the result of the determination is negative, a flag indicating that the first gain control amount information and the second gain control amount information are not equal to each other and the first and second gain control amount information are encoded; the gain control number is encoded; and gain control position information indicating a particular value corresponding to a gain control position is encoded.

The present invention provides a fifteenth encoding apparatus comprising detection means for detecting gain control amount information indicating a particular value corresponding to a gain control amount of a band signal of a left-channel signal and that of a band signal of a right-channel signal; determination means for determining whether gain control amount information detected by the detection means from the band signals of the left-channel signal and gain control amount information detected by the detection means from the corresponding band signals of the right-channel signal are equal to each other for all bands; gain control amount information encoding means for performing encoding such that if the determination made by the determination means is affirmative, the first or second gain control amount information is encoded, while, if the determination made by the determination means is negative, the first gain control amount information and the second gain control amount information are encoded; gain control number encoding means for encoding a gain control number; and gain control position information encoding means for encoding gain control position information indicating a particular value corresponding to a gain control position.

The present invention provides a fifteenth encoding method comprising detection step for detecting gain control amount information indicating a particular value corresponding to a gain control amount of a band signal of a left-channel signal and that of a band signal of a right-channel signal; a determination step of determining whether gain control amount information detected in the detection step from the band signals of the left-channel signal and gain control amount information detected in the detection step from the band signals of the right-channel signal are equal to each other in each of all bands; a gain control amount information encoding step of performing encoding such that if the determination made in the determination step is affirmative, the first or second gain control amount information is encoded, while, if the determination made in the determination step is negative, the first gain control amount information and the second gain control amount information are encoded; a gain control number encoding step of encoding a gain control number; and a gain control position information encoding step of encoding gain control position information indicating a particular value corresponding to a gain control position.

In the fifteenth encoding apparatus and encoding method according to the present invention, gain control amount information indicating a particular value corresponding to a gain control amount of a band signal of a left-channel signal and that of a band signal of a right-channel signal are detected; it is determined whether gain control amount information detected from the band signals of the left-channel signal and gain control amount information detected from the corresponding band signals of the right-channel signal are equal to each other for all bands; if the result of the determination is affirmative, the first or second gain control amount information is encoded, while if the result of the determination is negative, the first gain control amount information and the second gain control amount information are encoded; the gain control number is encoded; and gain control position information indicating a particular value corresponding to a gain control position is encoded.

The present invention provides a sixteenth encoding apparatus comprising detection means for detecting gain control amount information indicating a particular value corresponding to a gain control amount of an arbitrary band signal of a left-channel signal and that of a band signal of a right-channel signal in the same band as that of the band signal of the left-channel signal; first calculation means for calculating the first difference value between arbitrary first gain control amount information of one or more pieces of gain control amount information detected by the detection means from the band signal of the left-channel signal and gain control amount information corresponding to a gain control amount of gain adjustment performed on a part adjacent to a part subjected to gain adjustment performed according to the gain control amount corresponding to the first gain control amount information and also calculating the second difference value between third and fourth gain control amount information of one or more pieces of gain control amount information detected from the band signal of the right-channel signal, the third gain control amount information and the fourth gain control amount information corresponding to the first gain control amount information and the second gain control amount information, respectively; second calculation means for calculating the third difference value between the first difference value and the second difference value; retaining means for retaining a table indicating a value-code correspondence in which a code with a small number of bits is assigned to a value having a high probability of being obtained as the third difference value in the calculation performed by the second calculation means; gain control amount information encoding means for encoding the first gain control amount information such that a code corresponding to the third difference value calculated by the second calculation means is retrieved from the table and the retrieved code is employed as the code of first gain control amount information; gain control number encoding means for encoding a gain control number; and gain control position information encoding means for encoding gain control position information indicating a particular value corresponding to a gain control position.

The table indicating the difference value versus code correspondence may include only one or more difference values having high probabilities of being obtained as the result of the calculation performed by the calculation means. In this case, when the correspondence of the calculated third difference value is not found in the table, the gain control amount information encoding means may encode an escape code and the first gain control amount information.

The present invention provides a sixteenth encoding method comprising a detection step, of detecting gain control amount information indicating a particular value corresponding to a gain control amount of an arbitrary band signal of a left-channel signal and that of a band signal of a right-channel signal in the same band as that of the band signal of the left-channel signal; a first calculation step of calculating the first difference value between arbitrary first gain control amount information of one or more pieces of gain control amount information detected by in detection step from the band signal of the left-channel signal and gain control amount information corresponding to a gain control amount of gain adjustment performed on a part adjacent to a part subjected to gain adjustment performed according to the gain control amount corresponding to the first gain control amount information and also calculating the second difference value between third and fourth gain control amount information of one or more pieces of gain control amount information detected from the band signal of the right-channel signal, the third gain control amount information and the fourth gain control amount information corresponding to the first gain control amount information and the second gain control amount information, respectively; a second calculation step of calculating the third difference value between the first difference value and the second difference value; a retaining step of retaining a table indicating a value-code correspondence in which a code with a small number of bits is assigned to a value having a high probability of being obtained as the third difference value in the calculation performed in the second calculation step; a gain control amount information encoding step of encoding the first gain control amount information such that a code corresponding to the third difference value calculated in the second calculation step is retrieved from the table and the retrieved code is employed as the code of the first gain control amount information; a gain control number encoding step of encoding a gain control number; and a gain control position information encoding step of encoding gain control position information indicating a particular value corresponding to a gain control position.

In the sixteenth encoding apparatus and encoding method according to the present invention, gain control amount information indicating a particular value corresponding to a gain control amount of an arbitrary band signal of a left-channel signal and that of a band signal of a right-channel signal in the same band as that of the band signal of the left-channel signal are detected; the first difference value between arbitrary first gain control amount information of one or more pieces of gain control amount information detected from the band signal of the left-channel signal and gain control amount information corresponding to a gain control amount of gain adjustment performed on a part adjacent to a part subjected to gain adjustment performed according to the gain control amount corresponding to the first gain control amount information is calculated, and furthermore, the second difference value between third and fourth gain control amount information of one or more pieces of gain control amount information detected from the band signal of the right-channel signal is calculated, wherein the third gain control amount information and the fourth gain control amount information correspond to the first gain control amount information and the second gain control amount information, respectively; the third difference value between the first difference value and the second difference value is calculated; there is retained a table in which codes with small numbers of bits are assigned to values having high probabilities of being obtained as the result of calculation of the third difference value; a code corresponding to the calculated third difference value is retrieved from the table and the retrieved code is employed as the code of the first gain control amount information; the gain control number is encoded; and gain control position information indicating a particular value corresponding to a gain control position is encoded.

The present invention provides a seventh encoding apparatus comprising detection means for detecting gain control amount information indicating values corresponding to gain control amounts of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal; first calculation means for calculating the difference value between first gain control amount information detected by the detection means from the first band signal and second gain control amount information detected by the detection means from the second band signal; second calculation means for calculating the difference value between third gain control amount information detected from the third band signal and fourth gain control amount information detected from the fourth band signal; third calculation means for calculating the difference value between the difference value calculated by the first calculation means and the difference value calculated by the second calculation means; retaining means for retaining a table indicating a value-code correspondence in which a code with a small number of bits is assigned to value having a high probability of being obtained as the result of the calculation of the difference value performed by the third calculation means; gain control amount information encoding means for encoding the first gain control amount information such that a code corresponding to the difference value calculated by the third calculation means is retrieved from the table and the retrieved code is employed as the code of the first gain control amount information; gain control number encoding means for encoding a gain control number; and gain control position information encoding means for encoding gain control position information indicating a particular value corresponding to a gain control position.

The table indicating the difference value versus code correspondence may include only one or more difference values having high probabilities of being obtained as the result of the calculation performed by the third calculation means. In this case, when the correspondence of the calculated difference value is not found in the table, the gain control amount information encoding means may encode an escape code and the first gain control amount information.

The present invention provides a seventh encoding method comprising a detection step of detecting gain control amount information indicating values corresponding to gain control amounts of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal; a first calculation step of calculating the difference value between first gain control amount information detected in the detection step from the first band signal and second gain control amount information detected in the detection step from the second band signal; a second calculation step of calculating the difference value between third gain control amount information detected from the third band signal and fourth gain control amount information detected from the fourth band signal; a third calculation step of calculating the difference value between the difference value calculated in the first calculation step and the difference value calculated in the second calculation step; a retaining step of retaining a table indicating a value-code correspondence in which a code with a small number of bits is assigned to a value having a high probability of being obtained as the result of the calculation of the difference value performed in the third calculation step; a gain control amount information encoding step of encoding the first gain control amount information such that a code corresponding to the difference value calculated in the third calculation step is retrieved from the table and the retrieved code is employed as the code of the first gain control amount information; a gain control number encoding step of encoding a gain control number; and a gain control position information encoding step of encoding gain control position information indicating a particular value corresponding to a gain control position.

In the seventh encoding apparatus and encoding method according to the present invention, gain control amount information indicating values corresponding to gain control amounts of an arbitrary first band signal, a second band signal, a third band signal, and a fourth band signal are detected, wherein the first band signal and the second band signal are of band signals of a left-channel signal, the second band signal is of a band adjacent to a band of the first band signal, the third band signal and the fourth band signal are of band signals of a right-channel signal, the third band signal corresponds to the first band signal, and the fourth band signal corresponds to the second band signal; the difference value between first gain control amount information detected from the first band signal and second gain control amount information detected from the second band signal is calculated; the difference value between third gain control amount information detected from the third band signal and fourth gain control amount information detected from the fourth band signal is calculated; the difference value between the calculated difference values is further calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control amount information; the gain control number is encoded; and gain control position information indicating a particular value corresponding to a gain control position is encoded.

The present invention provides an eighteenth encoding apparatus comprising detection means for detecting gain control position information indicating a particular value corresponding to a gain control position of a band signal; gain control position information encoding means for encoding gain control position information such that a value represented by a particular number of bits indicating the difference between first gain control position information of one or more pieces of gain control position information detected by the detection means from one of the band signals and gain control position information corresponding to a gain control position of a part adjacent to a part indicated by a gain control position corresponding to the first gain control position information is employed as the code of the first gain control position information; gain control number encoding means for encoding a gain control number; and gain control amount information encoding means for encoding gain control amount information indicating a particular value corresponding to a gain control amount.

The present invention provides an eighteenth encoding method comprising a detection step, of detecting gain control position information indicating a particular value corresponding to a gain control position of a band signal; a gain control position information encoding step of encoding gain control position information such that a value represented by a particular number of bits indicating the difference between first gain control position information of one or more pieces of gain control position information detected in the detection step from one of the band signals and gain control position information corresponding to a gain control position of a part adjacent to a part indicated by a gain control position corresponding to the first gain control position information is employed as the code of the first gain control position information; a gain control number encoding step of encoding a gain control number; and a gain control amount information encoding step of encoding gain control amount information indicating a particular value corresponding to a gain control amount.

In the eighteenth encoding apparatus and encoding method according to the present invention, gain control position information indicating a particular value corresponding to a gain control position of a band signal is detected; gain control position information is encoded such that a value represented by a particular number of bits indicating the difference between first gain control position information of one or more pieces of gain control position information detected from one of the band signals and gain control position information corresponding to a gain control position of a part adjacent to a part indicated by a gain control position corresponding to the first gain control position information is employed as the code of the first gain control position information; the gain control number is encoded; and gain control amount information indicating a particular value corresponding to a gain control amount is encoded.

The present invention provides a nineteenth encoding apparatus comprising detection means for detecting gain control position information indicating a particular value corresponding to a gain control position of a band signal; calculation means for calculating the difference value between arbitrary first gain control position information of one or more pieces of gain control position information detected by the detection means from one of the band signals and gain control position information corresponding to the gain control position of a part adjacent to a part indicated by the gain control position corresponding to the first gain control position information; retaining means for retaining a table indicating a value-code correspondence in which a code with a small number of bits is assigned to a value having a high probability of being obtained as the result of the calculation of the difference value performed by the calculation means; gain control position information encoding means for encoding the first gain control position information such that a code corresponding to the difference value calculated by the calculation means is retrieved from the table and the retrieved code is employed as the code of the first gain control position information; gain control number encoding means for encoding a gain control number; and gain control amount information encoding means for encoding gain control amount information indicating a particular value corresponding to a gain control amount.

The table indicating the difference value versus code correspondence may include only one or more difference values having high probabilities of being obtained as the result of the calculation performed by the calculation means. In this case, when the correspondence of the calculated difference value is not found in the table, the gain control position information encoding means may encode an escape code and the first gain control position information. The retaining means retains a first table indicating a value-code correspondence which is applied when the first gain control position information indicates a position of an attack portion and in which a code with a small number of bits is assigned to a value having a high probability of being obtained as the result of the calculation of the difference value performed by the calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the calculation means; and the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

The present invention provides a nineteenth encoding method comprising a detection step, of detecting gain control position information indicating a particular value corresponding to a gain control position of a band signal; a calculation step for calculating the difference value between arbitrary first gain control position information of one or more pieces of gain control position information detected in the detection step from one of the band signals and gain control position information corresponding to the gain control position of a part adjacent to a part indicated by the gain control position corresponding to the first gain control position information; a retaining step of retaining a table indicating a value-code correspondence in which a code with a small number of bits is assigned to a value having a high probability of being obtained as the result of the calculation of the difference value performed in the calculation step; a gain control position information encoding step of encoding the first gain control position information such that a code corresponding to the difference value calculated in the calculation step is retrieved from the table and the retrieved code is employed as the code of the first gain control position information; a gain control number encoding step of encoding a gain control number; and a gain control amount information encoding step of encoding gain control amount information indicating a particular value corresponding to a gain control amount.

In the nineteenth encoding apparatus and encoding method according to the present invention, gain control position information indicating a particular value corresponding to a gain control position of a band signal is detected; the difference value between arbitrary first gain control position information of one or more pieces of gain control position information detected from one of the band signals and gain control position information corresponding to the gain control position of a part adjacent to a part indicated by the gain control position corresponding to the first gain control position information is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control position information; the gain control number is encoded; and gain control amount information indicating a particular value corresponding to a gain control amount is encoded.

The present invention provides a twentieth encoding apparatus comprising detection means for detecting a gain control position information indicating a value corresponding to a gain control position of a first arbitrary band signal of the band signals and detecting gain control position information indicating a value corresponding to a gain control position of a second band signal in a band adjacent to the band of the first band signal; calculation means for calculating the difference value between the first gain control position information detected by the detection means from the first band signal and the second gain control position information detected by the detection means from the second band signal; retaining means for retaining a table indicating a value-code correspondence in which a code with a small number of bits is assigned to a value having a high probability of being obtained as the result of the calculation of the difference value performed by the calculation means; gain control position information encoding means for encoding the first gain control position information such that a code corresponding to the difference value calculated by the calculation means is retrieved from the table and the retrieved code is employed as the code of the first gain control position information; gain control number encoding means for encoding a gain control number; and gain control amount information encoding means for encoding gain control amount information indicating a particular value corresponding to a gain control amount.

The table indicating the difference value versus code correspondence may include only one or more difference values having high probabilities of being obtained as the result of the calculation performed by the calculation means. In this case, when the correspondence of the calculated difference value is not found in the table, the gain control position information encoding means may encode an escape code and the first gain control position information.

The retaining means retains a first table indicating a value-code correspondence which is applied when the first gain control position information indicates a position of an attack portion and in which a code with a small number of bits is assigned to a value having a high probability of being obtained as the result of the calculation of the difference value performed by the calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the calculation means; and the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

The present invention provides a twentieth encoding method comprising a detection step of detecting gain control position information indicating a particular value corresponding to a gain control position of a first arbitrary band signal of band signals and gain control position information indicating a particular value corresponding to a gain control position of a second band signal in a band adjacent to the band of the first band signal; a calculation step of calculating the difference value between first gain control position information detected in the detection step from the first band signal and second gain control position information detected in the detection step from the second band signal; a retaining step of retaining a table indicating a value-code correspondence in which a code with a small number of bits is assigned to a value having a high probability of being obtained as the result of the calculation of the difference value performed in the calculation step; a gain control position information encoding step of encoding the first gain control position information such that a code corresponding to the difference value calculated in the calculation step is retrieved from the table and the retrieved code is employed as the code of the first gain control position information; a gain control number encoding step of encoding a gain control number; and a gain control amount information encoding step of encoding gain control amount information indicating a particular value corresponding to a gain control amount.

In the twentieth encoding apparatus and encoding method according to the present invention, gain control position information indicating a particular value corresponding to a gain control position of a first arbitrary band signal of band signals and also gain control position information indicating a particular value corresponding to a gain control position of a second band signal in a band adjacent to the band of the first band signal are detected; the difference value between first gain control position information detected from the first band signal and second gain control position information detected from the second band signal is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control position information; the gain control number is encoded; and gain control amount information indicating a particular value corresponding to a gain control amount is encoded.

The present invention provides a twenty-first encoding apparatus comprising detection means for detecting a gain control position information indicating a value corresponding to a gain control position of a first arbitrary band signal of the band signals and detecting gain control position information indicating a value corresponding to a gain control position of a second band signal in a band adjacent to the band of the first band signal; first calculation means for calculating the first difference value between arbitrary first gain control position information of one or more pieces of gain control position information detected by the detection means from the first band signal and gain control position information corresponding to the gain control position of a part adjacent to a part indicated by the gain control position corresponding to the first gain control position information and also calculating the second difference value between third gain control position information corresponding to the first gain control position information and fourth gain control position information corresponding to the second gain control position information, the third gain control position information and the fourth gain control position information having been detected from the second band signal; second calculation means for calculating the third difference value between the first difference value and the second difference value; retaining means for retaining a table indicating a value-code correspondence in which a code with a small number of bits is assigned to a value having a high probability of being obtained as the third difference value in the calculation performed by the second calculation means; gain control position information encoding means for encoding the first gain control position information such that a code corresponding to the third difference value calculated by the second calculation means is retrieved from the table and the retrieved code is employed as the code of first gain control position information; gain control number encoding means for encoding a gain control number; and gain control amount information encoding means for encoding gain control amount information indicating a particular value corresponding to a gain control amount.

The table indicating the difference value versus code correspondence may include only one or more difference values having high probabilities of being obtained as the result of the calculation of the third difference value performed by the calculation means. In this case, when the correspondence of the calculated third difference value is not found in the table, the gain control position information encoding means may encode an escape code and the first gain control position information.

The retaining means retaining means a first table indicating a value-code correspondence which is applied when the first gain control position information indicates a position of an attack portion and in which a code with a small number of bits is assigned to a third difference value having a high probability of being obtained as a result of the calculation performed by the second calculation means, and also retaining a second table indicating a value-code correspondence which is applied when the first gain control position information indicates a position of a release portion and in which a code with a small number of bits is assigned to a third difference value having a high probability of being obtained as a result of the calculation performed by the second calculation means; and the first encoding means performs encoding of the first gain control position information such that when the first gain control position information corresponds to the position of an attack portion, a code corresponding to the third difference value is retrieved from the first table and the retrieved code is employed as the code of the first gain control position information, while when the first gain control position information corresponds to the position of a release portion, a code corresponding to the third difference value is retrieved from the second table and the retrieved code is employed as the code of the first gain control position information.

The present invention provides a twenty-first encoding method comprising a detection step of detecting gain control position information indicating a particular value corresponding to a gain control position of a first arbitrary band signal of band signals and gain control position information indicating a particular value corresponding to a gain control position of a second band signal in a band adjacent to the band of the first band signal; a first calculation step of calculating the first difference value between arbitrary first gain control position information of one or more pieces of gain control position information detected in the detection step from the first band signal and gain control position information corresponding to the gain control position of a part adjacent to a part indicated by the gain control position corresponding to the first gain control position information and also calculating the second difference value between third gain control position information corresponding to the first gain control position information and fourth gain control position information corresponding to the second gain control position information, the third gain control position information and the fourth gain control position information having been detected from the second band signal; a second calculation step of calculating the third difference value between the first difference value and the second difference value; a retaining step of retaining a table indicating a value-code correspondence in which a code with a small number of bits is assigned to a value having a high probability of being obtained as the third difference value in the calculation performed in the second calculation step; a gain control position information encoding step of encoding the first gain control position information such that a code corresponding to the third difference value calculated in the second calculation step is retrieved from the table and the retrieved code is employed as the code of the first gain control position information; a gain control number encoding step of encoding a gain control number; and a gain control amount information encoding step of encoding gain control amount information indicating a particular value corresponding to a gain control amount.

In the twenty-first encoding apparatus and encoding method according to the present invention, gain control position information indicating a particular value corresponding to a gain control position of a first arbitrary band signal of band signals and also gain control position information indicating a particular value corresponding to a gain control position of a second band signal in a band adjacent to the band of the first band signal are detected; the first difference value between arbitrary first gain control position information of one or more pieces of gain control position information detected from the first band signal and gain control position information corresponding to the gain control position of a part adjacent to a part indicated by the gain control position corresponding to the first gain control position information is calculated, and furthermore, the second difference value between third gain control position information and fourth gain control position information detected from the second band signal is calculated, wherein the third gain control position information and the fourth gain control position information correspond to the first gain control position information and the second gain control position information, respectively; the third difference value between the first difference value and the second difference value is calculated; there is retained a table in which codes with small numbers of bits are assigned to values having high probabilities of being obtained as a result of calculation of the third difference value; a code corresponding to the calculated third difference value is retrieved from the table and the retrieved code is employed as the code of the first gain control position information; the gain control number is encoded; and gain control amount information indicating a particular value corresponding to a gain control amount is encoded.

The present invention provides a twenty-second encoding apparatus comprising detection means for detecting gain control position information indicating a value corresponding to a gain control position information of a first arbitrary band signal of band signals and detecting gain control position information indicating a value corresponding to a gain control position information of a second band signal of a band adjacent to the band of the first band signal; determination means for determining whether first gain control position information detected by the detection means from the first band signal and second gain control position information detected from the second band signal are equal to each other; gain control position information encoding means for performing encoding such that if the determination made by the determination means is affirmative, only a flag indicating that the first gain control position information and second gain control position information are equal to each other is encoded, while, if the determination made by the determination means is negative, both a flag, indicating that the first gain control position information and second gain control position information are not equal to each other, and the second gain control position information are encoded; gain control number encoding means for encoding a gain control number; and gain control amount information encoding means for encoding gain control amount information indicating a particular value corresponding to a gain control amount.

The present invention provides a twenty-second encoding method comprising a detection step of detecting gain control position information indicating a particular value corresponding to a gain control position information of a first arbitrary band signal of band signals and gain control position information indicating a particular value corresponding to a gain control position information of a second band signal in a band adjacent to the band of the first band signal; a determination step of determining whether the first gain control position information detected in the detection step from the first band signal is equal to the second gain control position information detected in the detection step from the second band signal; a gain control position information encoding step of performing encoding such that if the determination made in the determination step is affirmative, only a flag indicating that the first gain control position information and second gain control position information are equal to each other is encoded, while, if the determination made in the determination step is negative, both a flag, indicating that the first gain control position information and second gain control position information are not equal to each other, and the second gain control position information are encoded; a gain control number encoding step of encoding a gain control number; and a gain control amount information encoding step of encoding gain control amount information indicating a particular value corresponding to a gain control amount.

In the twenty-second encoding apparatus and encoding method according to the present invention, gain control position information indicating a particular value corresponding to a gain control position information of a first arbitrary band signal of band signals and also gain control position information indicating a particular value corresponding to a gain control position information of a second band signal in a band adjacent to the band of the first band signal are detected; it is determined whether first gain control position information detected from the first band signal and second gain control position information detected from the second band signal are equal to each other; if the result of the determination is affirmative, only a flag indicating that the first gain control position information and the second gain control position information are equal to each other is encoded, while if the result of the determination is negative, a flag indicating that the first gain control position information and the second gain control position information are not equal to each other and the second gain control position information are encoded; the gain control number is encoded; and gain control amount information indicating a particular value corresponding to a gain control amount is encoded.

The present invention provides a twenty-third encoding apparatus comprising detection means for detecting gain control position information indicating a particular value corresponding to a gain control position of a band signal; calculation means for calculating a smallest number of bits which can represent the difference between the maximum and minimum values of the gain control position information detected by the detection means; gain control position information encoding means for encoding the gain control position information such that the minimum value determined by the calculation means is encoded, a value obtained by subtracting the minimum value from the gain control position information detected by the detection means is expressed by as many bits as the number of bits calculate by the calculation means, and a resultant expression is employed as the code of the gain control position information; gain control number encoding means for encoding a gain control number; and gain control amount information encoding means for encoding gain control amount information indicating a particular value corresponding to a gain control amount.

The calculation means may calculate a smallest number of bits which can represent the difference between the maximum and minimum values of one or more pieces of gain control position information detected by the detection means from one band signal; and the gain control position information encoding means may encode the gain control position information such that values obtained by subtracting the minimum value from the one or more pieces of gain control position information are expressed by as many bits as the number of bits calculate by the calculation means and resultant expressions are employed as the codes of the one or more pieces of gain control position information.

The present invention provides a twenty-third encoding method comprising a detection step, of detecting gain control position information indicating a particular value corresponding to a gain control position of a band signal; a calculation step of calculating a smallest number of bits which can represent the difference between the maximum and minimum values of the gain control position information detected in the detection step; a gain control position information encoding step for encoding the gain control position information such that the minimum value determined in the calculation step is encoded, a value obtained by subtracting the minimum value from the gain control position information detected in the detection step is expressed by as many bits as the number of bits calculated in the calculation step, and a resultant expression is employed as the code of the gain control position information; a gain control number encoding step of encoding a gain control number; and a gain control amount information encoding step of encoding gain control amount information indicating a particular value corresponding to a gain control amount.

In the twenty-third encoding apparatus and encoding method according to the present invention, gain control position information indicating a particular value corresponding to a gain control position of a band signal is detected; the smallest number of bits which can represent the difference between the maximum and minimum values of the detected gain control position information is calculated; the determined minimum value is encoded and furthermore gain control position information is encoded such that values obtained by subtracting the minimum value from the detected pieces of gain control position information are expressed by as many bits as the smallest number of bits calculate above, and resultant expressions are employed as the codes of the respective pieces of gain control position information; the gain control number is encoded; and gain control amount information indicating a particular value corresponding to a gain control amount is encoded.

The present invention provides a twenty-fourth encoding apparatus comprising detection means for detecting gain control position information indicating a particular value corresponding to a gain control position of an arbitrary band signal of a left-channel signal and that of a band signal of a right-channel signal in the same band as that of the band signal of the left-channel signal; calculation means for calculating the difference value between the first gain control position information detected by the detection means from the band signal of the left-channel signal and the second gain control position information detected by the detection means from the band signal of the right-channel signal; retaining means for retaining a table indicating a value-code correspondence in which a code with a small number of bits is assigned to a value having a high probability of being obtained as the result of the calculation of the difference value performed by the calculation means; gain control position information encoding means for encoding the first or second gain control position information such that a code corresponding to the difference value calculated by the calculation means is retrieved from the table and the retrieved code is employed as the code of the first or second gain control position information; gain control number encoding means for encoding a gain control number; and gain control amount information encoding means for encoding gain control amount information indicating a particular value corresponding to a gain control amount.

The table indicating the difference value versus code correspondence may include only one or more difference values having high probabilities of being obtained as the result of the calculation performed by the calculation means. In this case, when the correspondence of the calculated difference value is not found in the table, the gain control position information encoding means may encode an escape code and the gain control position information.

The retaining means retaining means a first table indicating a value-code correspondence which is applied when the first gain control position information indicates a position of an attack portion and in which a code with a small number of bits is assigned to a value having a high probability of being obtained as the result of the calculation of the difference value performed by the calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the calculation means; and the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

The present invention provides a twenty-fourth encoding method comprising a detection step of detecting gain control position information indicating a particular value corresponding to a gain control position of an arbitrary band signal of a left-channel signal and that of a band signal of a right-channel signal in the same band as that of the band signal of the left-channel signal; a calculation step of calculating the difference value between first gain control position information detected in the detection step from the band signal of the left-channel signal and second gain control position information detected in the detection step from the band signal of the right-channel signal; a retaining step of retaining a table indicating a value-code correspondence in which a code with a small number of bits is assigned to a value having a high probability of being obtained as the result of the calculation of the difference value performed in the calculation step; a gain control position information encoding step of encoding the first or second gain control position information such that a code corresponding to the difference value calculated in the calculation step is retrieved from the table and the retrieved code is employed as the code of the first or second gain control position information; a gain control number encoding step of encoding a gain control number; and a gain control amount information encoding step of encoding gain control amount information indicating a particular value corresponding to a gain control amount.

In the twenty-fourth encoding apparatus and encoding method according to the present invention, gain control position information indicating a particular value corresponding to a gain control position of an arbitrary band signal of a left-channel signal and that of a band signal of a right-channel signal in the same band as that of the band signal of the left-channel signal are detected; the difference value between first gain control position information detected from the band signal of the left-channel signal and second gain control position information detected from the band signal of the right-channel signal is calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first or second gain control position information; the gain control number is encoded; and gain control amount information indicating a particular value corresponding to a gain control amount is encoded.

The present invention provides a twenty-fifth encoding apparatus comprising detection means for detecting gain control position information indicating a particular value corresponding to a gain control position of an arbitrary band signal of a left-channel signal and that of a band signal of a right-channel signal in the same band as that of the band signal of the left-channel signal; determination means for determining whether gain control position information detected by the detection means from a band signal of the left-channel signal and gain control position information detected by the detection means from a band signal of the right-channel signal are equal to each other; gain control position information encoding means for performing encoding such that if the determination made by the determination means is affirmative, a flag indicating that the first gain control position information and the second gain control position information are equal to each other and the first or second gain control position information are encoded, while, if the determination made by the determination means is negative, a flag indicating that the first gain control position information and the second gain control position information are not equal to each other, the first gain control position information, and the second and gain control position information are encoded; gain control number encoding means for encoding a gain control number; and gain control amount information encoding means for encoding gain control amount information indicating a particular value corresponding to a gain control amount.

The present invention provides a twenty-fifth encoding method comprising a detection step of detecting gain control position information indicating a particular value corresponding to a gain control position of an arbitrary band signal of a left-channel signal and that of a band signal of a right-channel signal in the same band as that of the band signal of the left-channel signal; a determination step of determining whether the first gain control position information detected in the detection step from the band signal of the left-channel signal is equal to the second gain control position information detected in the detection step from the band signal of the right-channel signal; a gain control position information encoding step of performing encoding such that if the determination made in the determination step is affirmative, a flag indicating that first gain control position information and second gain control position information are equal to each other and the first or second gain control position information are encoded, while, if the determination made in the determination step is negative, a flag indicating that the first gain control position information and the second gain control position information are not equal to each other, the first gain control position information, and the second and gain control position information are encoded; a gain control number encoding step of encoding a gain control number; and a gain control amount information encoding step of encoding gain control amount information indicating a particular value corresponding to a gain control amount.

In the twenty-fifth encoding apparatus and encoding method according to the present invention, gain control position information indicating a particular value corresponding to a gain control position of an arbitrary band signal of a left-channel signal and that of a band signal of a right-channel signal in the same band as that of the band signal of the left-channel signal are detected; it is determined whether gain control position information detected from a band signal of the left-channel signal and gain control position information detected by the detection means from a band signal of the right-channel signal are equal to each other; if the result of the determination is affirmative, a flag indicating that the first gain control position information and the second gain control position information are equal to each other and the first or second gain control position information are encoded, while if the result of the determination is negative, a flag indicating that the first gain control position information and the second gain control position information are not equal to each other and the first and second gain control position information are encoded; the gain control number is encoded; and gain control amount information indicating a particular value corresponding to a gain control amount is encoded.

The present invention provides a twenty-sixth encoding apparatus comprising detection means for detecting gain control position information indicating a particular value corresponding to a gain control position of a band signal of a left-channel signal and that of a band signal of a right-channel signal; determination means for determining whether gain control position information detected by the detection means from the band signals of the left-channel signal and gain control position information detected by the detection means from the corresponding band signals of the right-channel signal are equal to each other for all bands; gain control position information encoding means for performing encoding such that if the determination made by the determination means is affirmative, the first or second gain control position information is encoded, while, if the determination made by the determination means is negative, the first gain control position information and the second gain control position information are encoded; gain control number encoding means for encoding a gain control number; and gain control amount information encoding means for encoding gain control amount information indicating a particular value corresponding to a gain control amount.

The present invention provides a twenty-sixth encoding method comprising a detection step for detecting gain control position information indicating a particular value corresponding to a gain control position of a band signal of a left-channel signal and that of a band signal of a right-channel signal; a determination step of determining whether gain control position information detected in the detection step from the band signal of the left-channel signal and gain control position information detected in the detection step from the band signal of the right-channel signal are equal to each other for all bands; a gain control position information encoding step of performing encoding such that if the determination made in the determination step is affirmative, the first or second gain control position information is encoded, while, if the determination made in the determination step is negative, the first gain control position information and the second gain control position information are encoded; a gain control number encoding step of encoding a gain control number; and a gain control amount information encoding step of encoding gain control amount information indicating a particular value corresponding to a gain control amount.

In the twenty-sixth encoding apparatus and encoding method according to the present invention, gain control position information indicating a particular value corresponding to a gain control position of a band signal of a left-channel signal and that of a band signal of a right-channel signal are detected; it is determined whether gain control position information detected from the band signals of the left-channel signal and gain control position information detected from the corresponding band signals of the right-channel signal are equal to each other for all bands; if the result of the determination is affirmative, the first or second gain control position information is encoded, while if the result of the determination is negative, the first gain control position information and the second gain control position information are encoded; the gain control number is encoded; and gain control amount information indicating a particular value corresponding to a gain control amount is encoded.

The present invention provides a twenty-seventh encoding apparatus comprising detection means for detecting gain control position information indicating a particular value corresponding to a gain control position of an arbitrary band signal of a left-channel signal and that of a band signal of a right-channel signal in the same band as that of the band signal of the left-channel signal; first calculation means for calculating the difference value between first gain control position information and second gain control position information, wherein the first gain control position information is arbitrary gain control position information of one or more pieces of gain control position information detected by the detection means from the band signal of the left-channel signal, and the second gain control position information has a value corresponding to a gain control position adjacent to the first gain control position; second calculation means for calculating the difference value between third gain control position information and fourth gain control position information, wherein the third gain control position information and fourth gain control position information are gain control position information of one or more pieces of gain control position information detected from the band signal of the right-channel signal, and the third gain control position information and fourth gain control position information correspond to the first gain control position information and second gain control position information, respectively; third calculation means for calculating the difference value between the difference value calculated by the first calculation means and the difference value calculated by the second calculation means; retaining means for retaining a table indicating a value-code correspondence in which a code with a small number of bits is assigned to a value having a high probability of being obtained as the result of the calculation of the difference value performed by the third calculation means; gain control position information encoding means for encoding the first gain control position information such that a code corresponding to the difference value calculated by the third calculation means is retrieved from the table and the retrieved code is employed as the code of the first gain control position information; gain control number encoding means for encoding a gain control number; and gain control amount information encoding means for encoding gain control amount information indicating a particular value corresponding to a gain control amount.

The table indicating the difference value versus code correspondence may include only one or more difference values having high probabilities of being obtained as the result of the calculation performed by the calculation means. In this case, when the correspondence of the calculated difference value is not found in the table, the gain control position information encoding means may encode an escape code and the first gain control position information.

The retaining means retaining means a first table indicating a value-code correspondence which is applied when the first gain control position information indicates a position of an attack portion and in which a code with a small number of bits is assigned to a value having a high probability of being obtained as the result of the calculation of the difference value performed by the second calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the second calculation means; and the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the third difference value is retrieved from the second table and the retrieved code is employed as the code of the first gain control position information.

The present invention provides a twenty-seventh encoding method comprising a detection step of detecting gain control position information indicating a particular value corresponding to a gain control position of an arbitrary band signal of a left-channel signal and that of a band signal of a right-channel signal in the same band as that of the band signal of the left-channel signal; a first calculation step of calculating the difference value between first gain control position information and second gain control position information, wherein the first gain control position information is arbitrary gain control position information of one or more pieces of gain control position information detected in the detection step from the band signal of the left-channel signal, and the second gain control position information has a value corresponding to a gain control position adjacent to the first gain control position; a second calculation step for calculating the difference value between third gain control position information and fourth gain control position information, wherein the third gain control position information and fourth gain control position information are gain control position information of one or more pieces of gain control position information detected from the band signal of the right-channel signal, and the third gain control position information and fourth gain control position information correspond to the first gain control position information and second gain control position information, respectively; a third calculation step of calculating the difference value between the difference value calculated in the first calculation step and the difference value calculated in the second calculation step; a retaining step of retaining a table indicating a value-code correspondence in which a code with a small number of bits is assigned to a value having a high probability of being obtained as the result of the calculation of the difference value performed in the third calculation step; a gain control position information encoding step of encoding the first gain control position information such that a code corresponding to the difference value calculated in the third calculation step is retrieved from the table and the retrieved code is employed as the code of the first gain control position information; a gain control number encoding step of encoding a gain control number; and a gain control amount information encoding step of encoding gain control amount information indicating a particular value corresponding to a gain control amount.

In the twenty-seventh encoding apparatus and encoding method according to the present invention, gain control position information indicating a particular value corresponding to a gain control position of an arbitrary band signal of a left-channel signal and that of a band signal of a right-channel signal in the same band as that of the band signal of the left-channel signal are detected; the difference value between first gain control position information and second gain control position information is calculated, wherein the first gain control position information is arbitrary gain control position information of one or more pieces of gain control position information detected by the detection means from the band signal of the left-channel signal, and the second gain control position information has a value corresponding to a gain control position adjacent to the first gain control position; and also calculating the second difference value between third and fourth gain control position information of one or more pieces of gain control position information detected from the band signal of the right-channel signal, the third gain control position information and the fourth gain control position information corresponding to the first gain control position information and the second gain control position information, respectively; the difference value between the calculated difference values is further calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control position information; the gain control number is encoded; and gain control amount information indicating a particular value corresponding to a gain control amount is encoded.

The present invention provides a twenty-eighth encoding apparatus comprising detection means for detecting gain control position information indicating values corresponding to gain control positions of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal; first calculation means for calculating the difference value between first gain control position information detected by the detection means from the first band signal and second gain control position information detected by the detection means from the second band signal; second calculation means for calculating the difference value between third gain control position information detected from the third band signal and fourth gain control position information detected from the fourth band signal; third calculation means for calculating the difference value between the difference value calculated by the first calculation means and the difference value calculated by the second calculation means; retaining means for retaining a table indicating a value-code correspondence in which a code with a small number of bits is assigned to a value having a high probability of being obtained as the result of the calculation of the difference value performed by the third calculation means; gain control position information encoding means for encoding the first gain control position information such that a code corresponding to the difference value calculated by the third calculation means is retrieved from the table and the retrieved code is employed as the code of the first gain control position information; gain control number encoding means for encoding a gain control number; and gain control amount information encoding means for encoding gain control amount information indicating a particular value corresponding to a gain control amount.

The table indicating the difference value versus code correspondence may include only one or more difference values having high probabilities of being obtained as the result of the calculation performed by the third calculation means. In this case, when the correspondence of the calculated difference value is not found in the table, the gain control position information encoding means may encode an escape code and the first gain control position information.

The retaining means retaining means a first table indicating a value-code correspondence which is applied when the first gain control position information indicates a position of an attack portion and in which a code with a small number of bits is assigned to a value having a high probability of being obtained as the result of the calculation of the difference value performed by the third calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the third calculation means; and the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

The present invention provides a twenty-eighth encoding method comprising a detection step for detecting gain control position information indicating values corresponding to gain control positions of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal; a first calculation step of calculating the difference value between first gain control position information detected in the detection step from the first band signal and second gain control position information detected in the detection step from the second band signal; a second calculation step for calculating the difference value between third gain control position information detected from the third band signal and fourth gain control position information detected from the fourth band signal; a third calculation step of calculating the difference value between the difference value calculated in the first calculation step and the difference value calculated in the second calculation step; a retaining step of retaining a table indicating a value-code correspondence in which a code with a small number of bits is assigned to a value having a high probability of being obtained as the result of the calculation of the difference value performed in the third calculation step; a gain control position information encoding step of encoding the first gain control position information such that a code corresponding to the difference value calculated in the third calculation step is retrieved from the table and the retrieved code is employed as the code of the first gain control position information; a gain control number encoding step of encoding a gain control number; and a gain control amount information encoding step of encoding gain control amount information indicating a particular value corresponding to a gain control amount.

In the twenty-eighth encoding apparatus and encoding method according to the present invention, gain control position information indicating values corresponding to gain control positions of an arbitrary first band signal, a second band signal, a third band signal, and a fourth band signal, respectively, is detected, wherein the first band signal and the second band signal are of band signals of a left-channel signal, the second band signal is of a band adjacent to a band of the first band signal, the third band signal and the fourth band signal are of band signals of a right-channel signal, the third band signal corresponds to the first band signal, and the fourth band signal corresponds to the second band signal; the difference value between first gain control position information detected from the first band signal and second gain control position information detected from the second band signal is calculated; the difference value between third gain control position information detected from the third band signal and fourth gain control position information detected from the fourth band signal is calculated; the difference value between the calculated difference values is further calculated; there is retained a table in which codes with small numbers of bits are assigned to values having high probabilities of being obtained as the result of calculation of the difference value; a code corresponding to the calculated difference value is retrieved from the table and the retrieved code is employed as the code of the first gain control position information; the gain control number is encoded; and gain control amount information indicating a particular value corresponding to a gain control amount is encoded.

The present invention provides a twenty-ninth encoding apparatus comprising band splitting means for splitting the acoustic time series signal into N bands thereby producing N band signals; execution means for producing gain control numbers, gain control amount information having values corresponding to the gain control amounts, and gain control position information having values corresponding to gain control positions associated with the respective band signals and executing gain control process on the band signals in accordance with the gain control numbers, the gain control amount information, and the gain control position information; a plurality of gain control number encoding means for encoding the gain control number; first selection means for selecting one of the gain control number encoding means, in accordance with information indicating the code length of the gain control numbers encoded by the plurality of gain control number encoding means; a plurality of gain control amount information encoding means for encoding the gain control amount information; second selection means for selecting one of the gain control amount information encoding means, in accordance with information indicating the code length of the gain control amount information encoded by the plurality of gain control amount information encoding means; a plurality of gain control position information encoding means for encoding the gain control position information; third selection means for selecting one of the gain control position information encoding means, in accordance with information indicating the code length of the gain control position information encoded by the plurality of gain control position information encoding means; multiplexing means for multiplexing the gain control numbers encoded by the gain control number encoding means selected by the first selection means, the gain control amount information encoded by the gain control amount information encoding means selected by the second selection means, and the gain control position information encoded by the gain control position information encoding means selected by the third selection means, together with the encoded acoustic time series signal, thereby producing encoded data.

The present invention provides a twenty-ninth encoding method comprising a band splitting step of splitting the acoustic time series signal into N bands thereby producing N band signals; an execution step of producing gain control numbers, gain control amount information having values corresponding to the gain control amounts, and gain control position information having values corresponding to gain control positions associated with the respective band signals and executing gain control process on the band signals in accordance with the gain control numbers, the gain control amount information, and the gain control position information; a gain control number encoding step of encoding the gain control numbers; a first selection step of selecting one of the gain control number encoding step, in accordance with information indicating the code length of the gain control numbers encoded in the plurality of gain control number encoding step; a plurality of gain control amount information encoding steps for encoding the gain control amount information; a second selection step of selecting one of the gain control amount information encoding step, in accordance with information indicating the code length of the gain control amount information encoded in the plurality of gain control amount information encoding step; a plurality of gain control position information encoding steps for encoding the gain control position information; a third selection step of selecting one of the gain control position information encoding step, in accordance with information indicating the code length of the gain control position information encoded in the plurality of gain control position information encoding step; a multiplexing step of multiplexing the gain control numbers encoded in the gain control number encoding step selected in the first selection step, the gain control amount information encoded in the gain control amount information encoding steps selected in the second selection step, and the gain control position information encoded in the gain control position information encoding steps selected in the third selection step, together with the encoded acoustic time series signal, thereby producing encoded data.

In the twenty-ninth encoding apparatus and encoding method according to the present invention, the acoustic time series signal is split into N bands thereby producing N band signals; gain control numbers, gain control amount information having values corresponding to the gain control amounts, and gain control position information having values corresponding to gain control positions associated with the respective band signals are produced, and gain control process is executed on the band signals in accordance with the gain control numbers, the gain control amount information, and the gain control position information; the gain control numbers are encoded; one of the gain control number encoding methods is selected in accordance with information indicating the code length of the encoded gain control numbers; the gain control amount information is encoded; one of the gain control amount information encoding methods is selected in accordance with information indicating the code length of the encoded gain control amount information; the gain control position information is encoded; one of the gain control position information encoding methods is selected in accordance with information indicating the code length of the encoded gain control position information; and the selected encoded gain control numbers, the selected encoded gain control amount information, and the selected encoded gain control position information are encoded together with the encoded acoustic time series signal thereby producing encoded data.

BRIEF DESCRIPTION OF THE DRAWINGS

FIG. 13 is a table showing an example of a set of gain control number GA.

FIG. 14 is a diagram showing the procedure of determining codes shown in FIG. 12.

FIG. 17 is a table showing another example of a set of gain control number GA.

FIG. 18 shows another table in which a value-code correspondence and a procedure of determining codes for particular values are represented.

FIG. 19 is a table showing another example of a set of gain control number GA.

FIG. 22 is a table showing another example of a set of gain control number GA.

FIG. 23 is a diagram showing an encoding method employed by the encoder 81-4.

FIG. 26 is a table showing another example of a set of gain control number GA.

FIG. 27 is a table showing another example of a set of gain control number GA.

FIG. 29 is a table showing another example of a set of gain control number GA.

FIG. 33 is a table showing another example of a set of gain control number GA.

FIG. 39 is a table showing an example of a set of gain control amount information GB.

FIG. 40 is a table showing another example of a set of gain control amount information GB.

FIG. 46 is a table showing another example of a set of gain control amount information GB.

FIG. 50 is a table showing another example of a set of gain control amount information GB.

FIG. 51 shows another table in which a value-code correspondence and a procedure of determining codes for particular values are represented.

FIG. 52 is a table showing another example of a set of gain control amount information GB.

FIG. 57 is a table showing another example of a set of gain control amount information GB.

FIG. 62 is a table showing another example of a set of gain control amount information GB.

FIG. 63 shows another table in which a value-code correspondence and a procedure of determining codes for particular values are represented.

FIG. 64 is a table showing another example of a set of gain control amount information GB.

FIG. 66 is a table showing another example of a set of gain control amount information GB.

FIG. 70 is a table showing another example of a set of gain control amount information GB.

FIG. 74 is a table showing another example of a set of gain control amount information GB.

FIG. 75 shows another table in which a value-code correspondence and a procedure of determining codes for particular values are represented.

FIG. 79 is a table showing an example of a set of gain control position information GC.

FIG. 83 shows another table in which a value-code correspondence and a procedure of determining codes for particular values are represented.

FIG. 84 is a table showing another example of a set of gain control position information GC.

FIG. 87 is a table showing another example of a set of gain control position information GC.

FIG. 88 shows another table in which a value-code correspondence and a procedure of determining codes for particular values are represented.

FIG. 89 shows another table in which a value-code correspondence and a procedure of determining codes for particular values are represented.

FIG. 92 is a table showing another example of a set of gain control position information GC.

FIG. 93 shows another table in which a value-code correspondence and a procedure of determining codes for particular values are represented.

FIG. 94 shows another table in which a value-code correspondence and a procedure of determining codes for particular values are represented.

FIG. 97 is a table showing another example of a set of gain control position information GC.

FIG. 98 shows another table in which a value-code correspondence and a procedure of determining codes for particular values are represented.

FIG. 99 shows another table in which a value-code correspondence and a procedure of determining codes for particular values are represented.

FIG. 100 is a table showing another example of a set of gain control position information GC.

FIG. 105 is a table showing another example of a set of gain control position information GC.

FIG. 110 is a table showing another example of a set of gain control position information GC.

FIG. 111 shows another table in which a value-code correspondence and a procedure of determining codes for particular values are represented.

FIG. 112 shows another table in which a value-code correspondence and a procedure of determining codes for particular values are represented.

FIG. 113 is a table showing another example of a set of gain control position information GC.

FIG. 115 is a table showing another example of a set of gain control position information GC.

FIG. 116 is a flow chart showing the operation of an encoder 101-11.

FIG. 117 is a graph showing a characteristic of a difference value WC2.

FIG. 118 is a flow chart showing the operation of an encoder 101-12.

FIG. 119 is a table showing another example of a set of gain control position information GC.

FIG. 120 shows another table in which a value-code correspondence and a procedure of determining codes for particular values are represented.

FIG. 121 shows another table in which a value-code correspondence and a procedure of determining codes for particular values are represented.

FIG. 122 is a graph showing a characteristic of a difference value WC3.

FIG. 123 is a flow chart showing the operation of an encoder 101-13.

FIG. 124 is a table showing another example of a set of gain control position information GC.

FIG. 125 shows another table in which a value-code correspondence and a procedure of determining codes for particular values are represented.

FIG. 126 shows another table in which a value-code correspondence and a procedure of determining codes for particular values are represented.

FIG. 127 is a block diagram showing an example of a construction of a decoding apparatus 151 according to the present invention.

Figure 127:
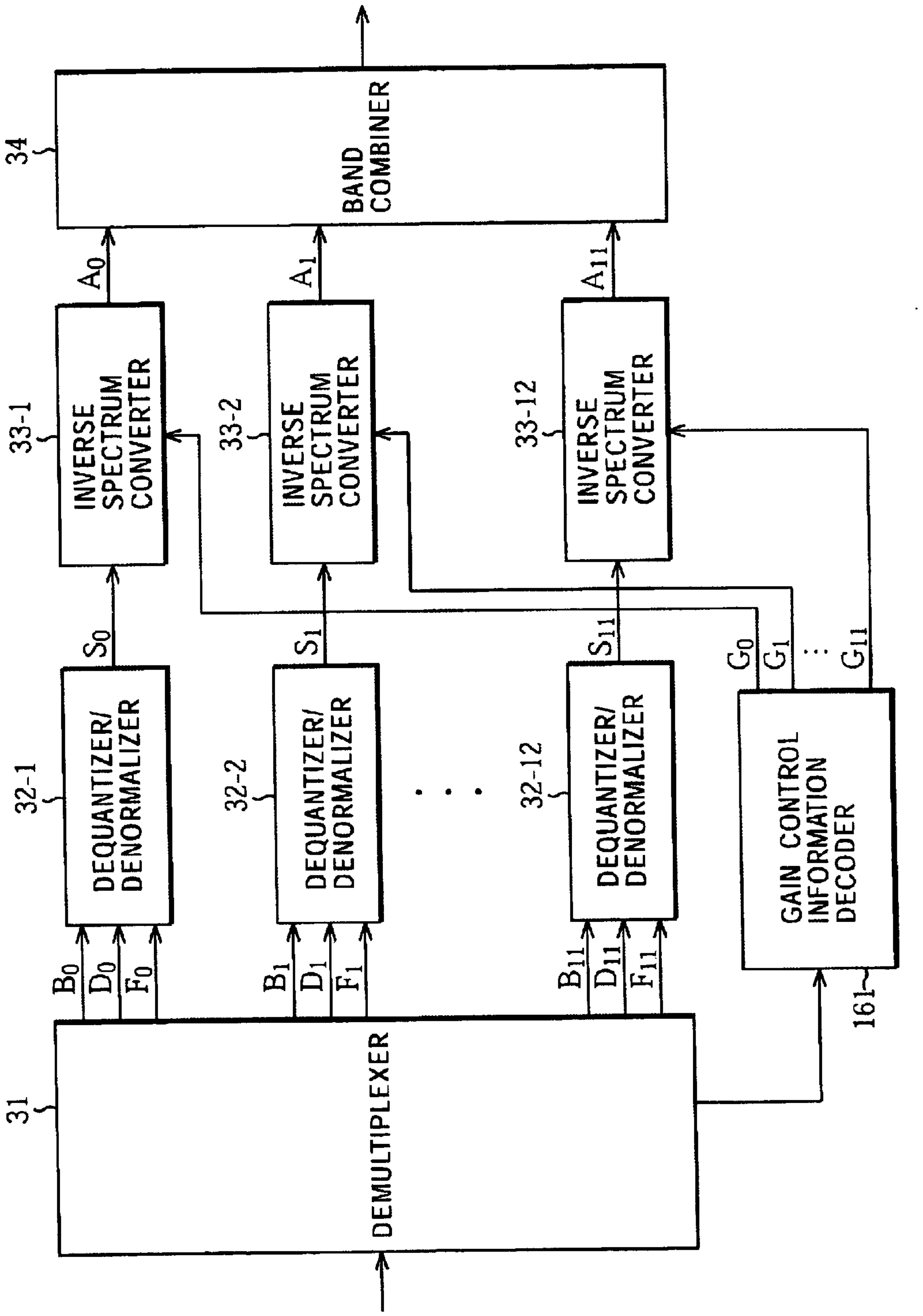
Figure 128:
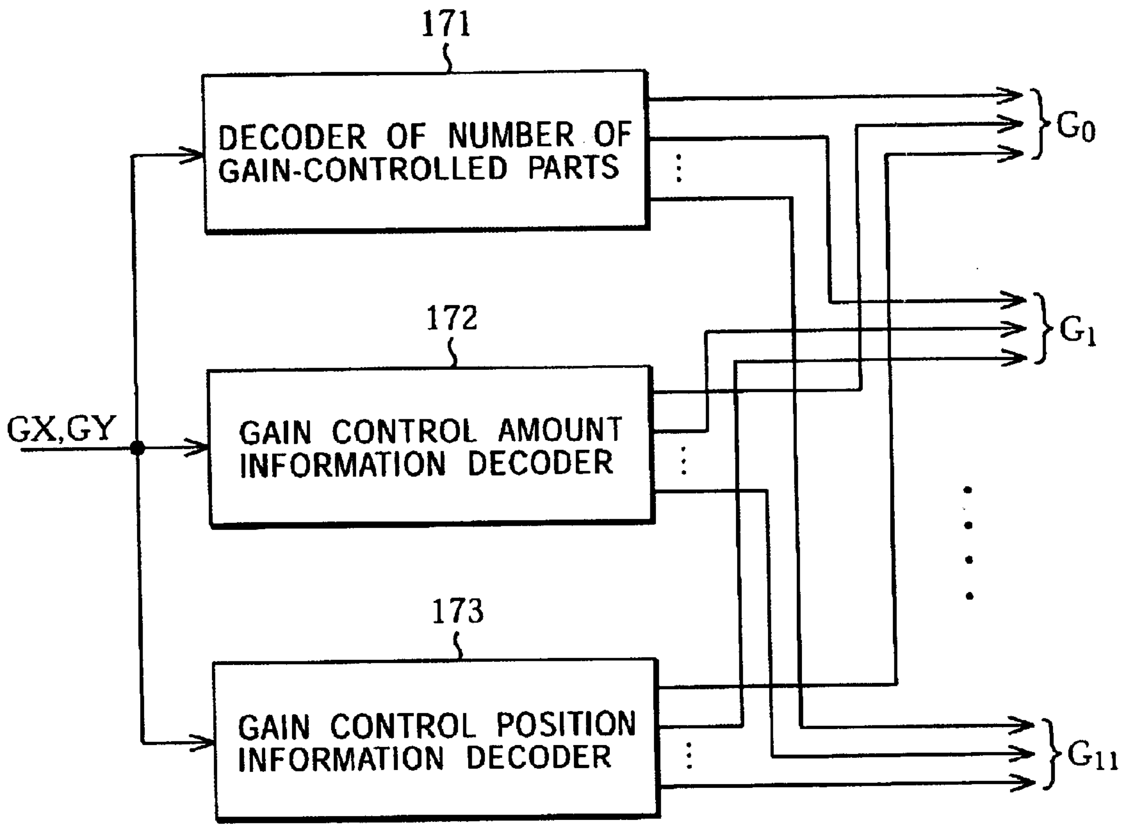

FIG. 128 is a block diagram showing an example of a construction of a gain control information decoder 161 shown in FIG. 127.

Figure 129:
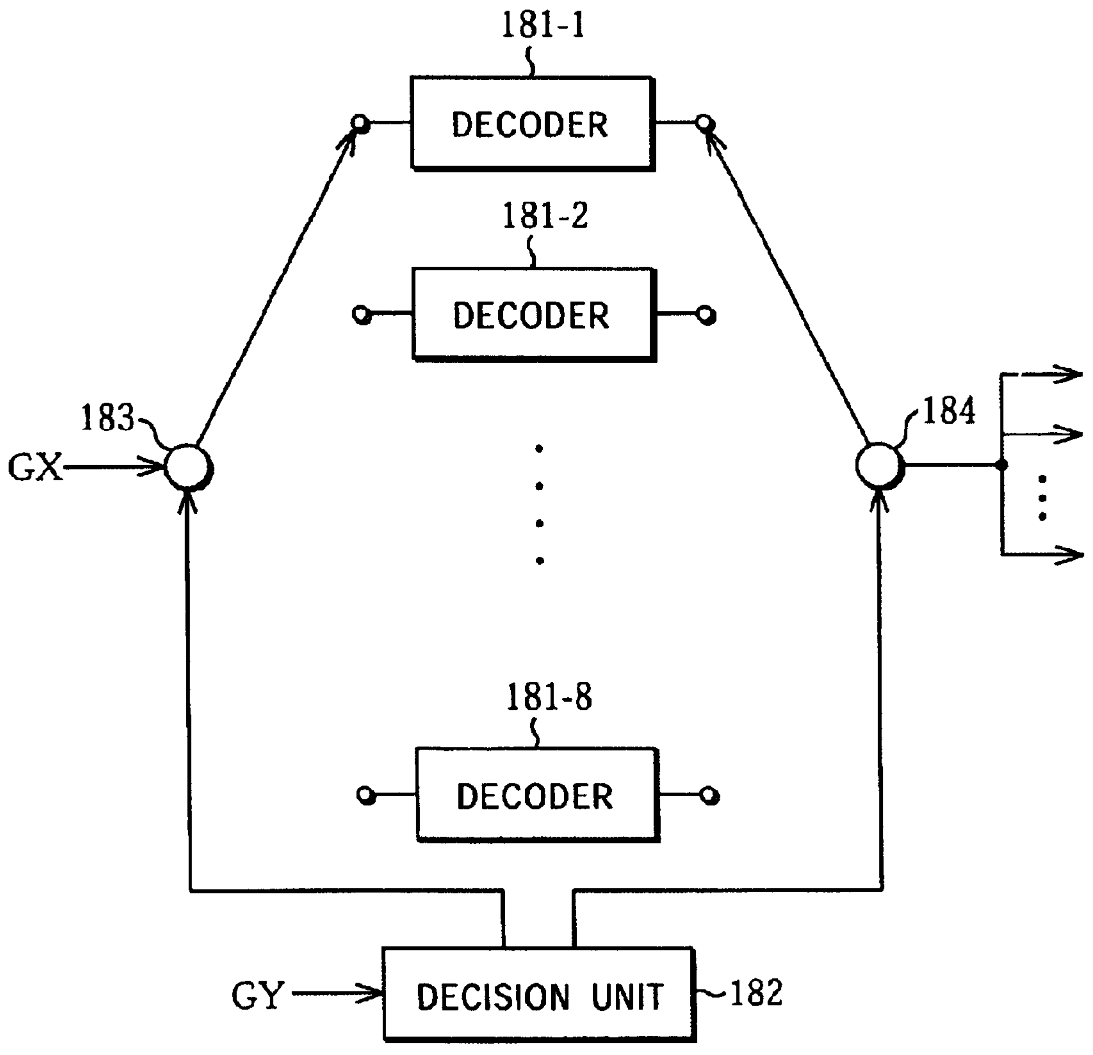

FIG. 129 is a block diagram showing an example of a construction of a gain control number decoder 171 shown in FIG. 128.

Figure 130:
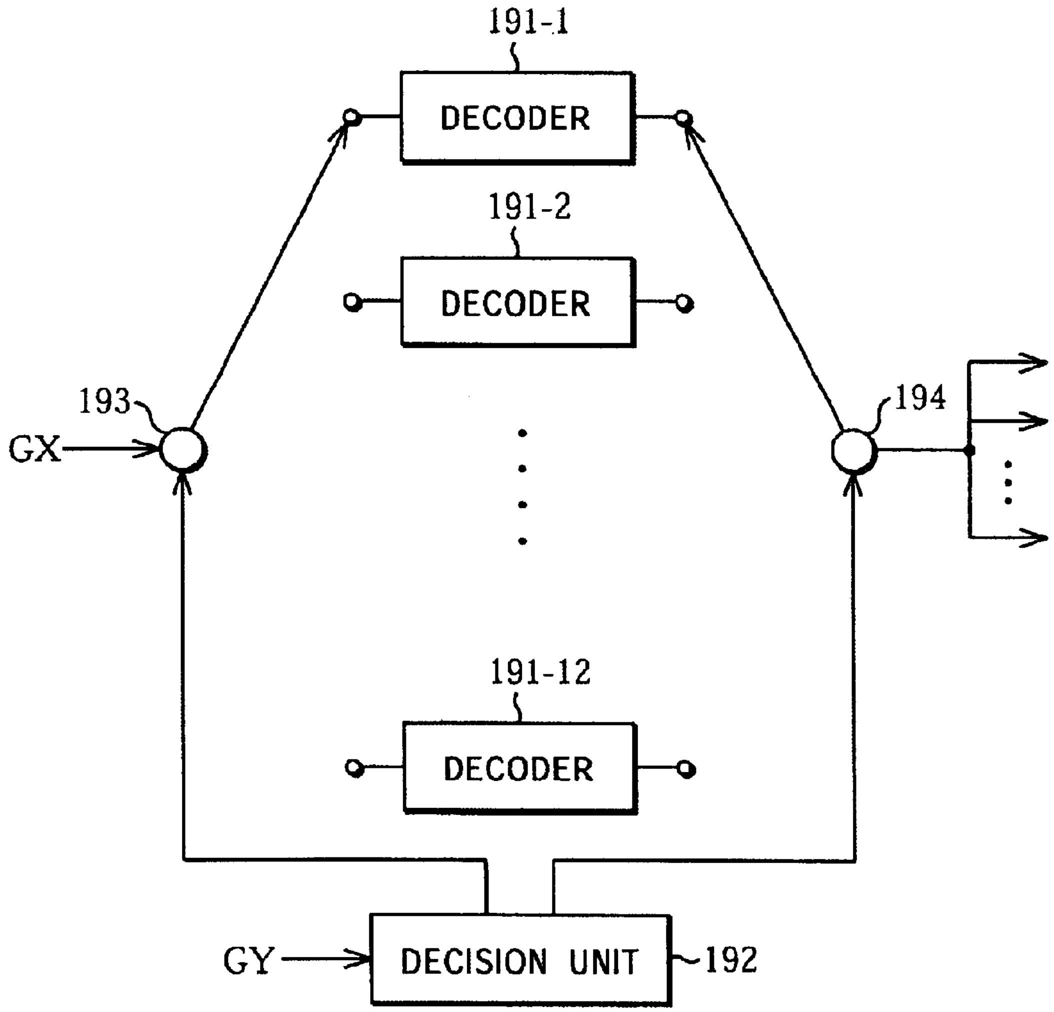

FIG. 130 is a block diagram showing an example of a construction of a gain control amount information decoder 172 shown in FIG. 128.

Figure 131:
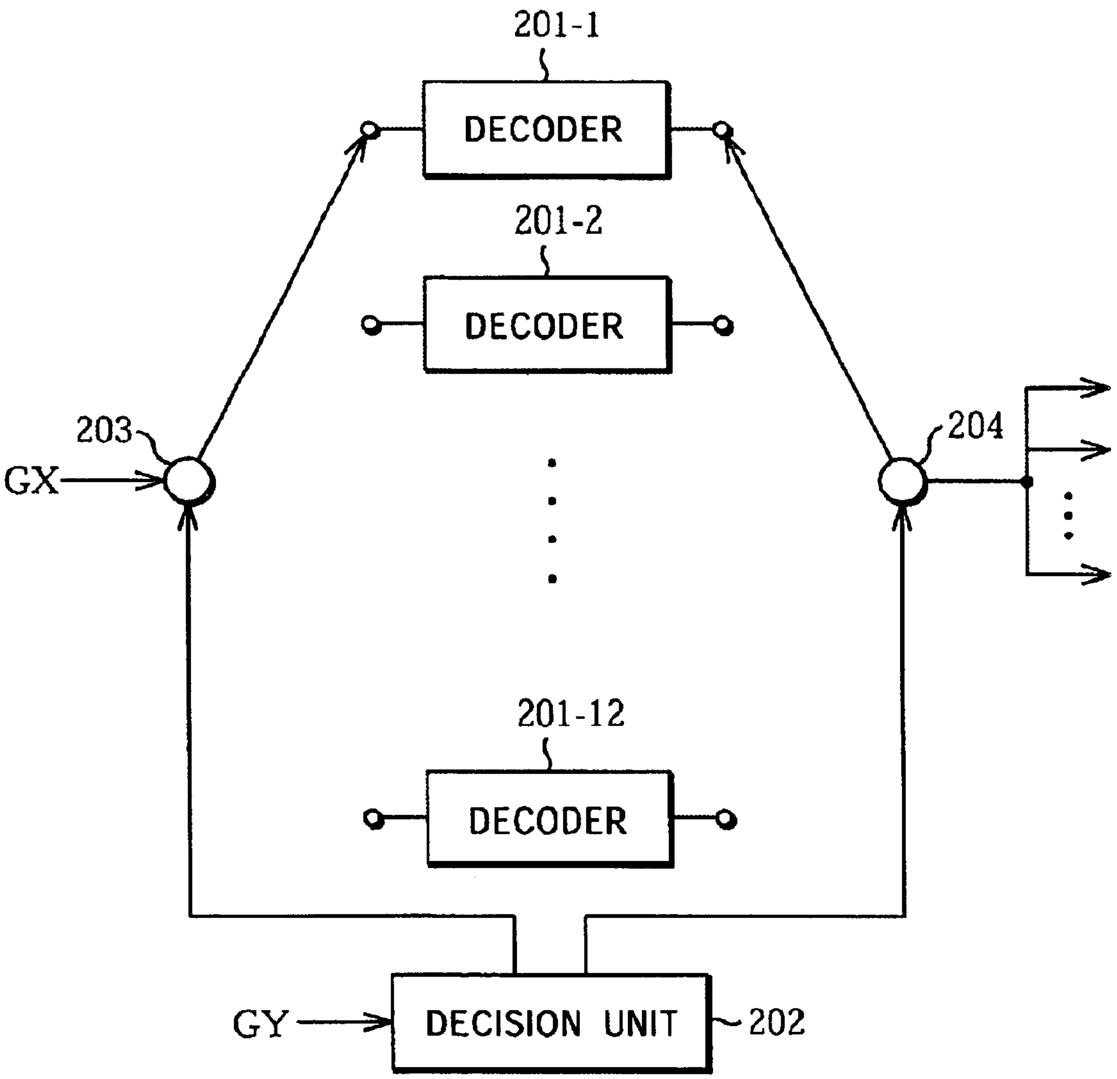

FIG. 131 is a block diagram showing an example of a construction of a gain control position information decoder 173 shown in FIG. 128.

Figure 132:
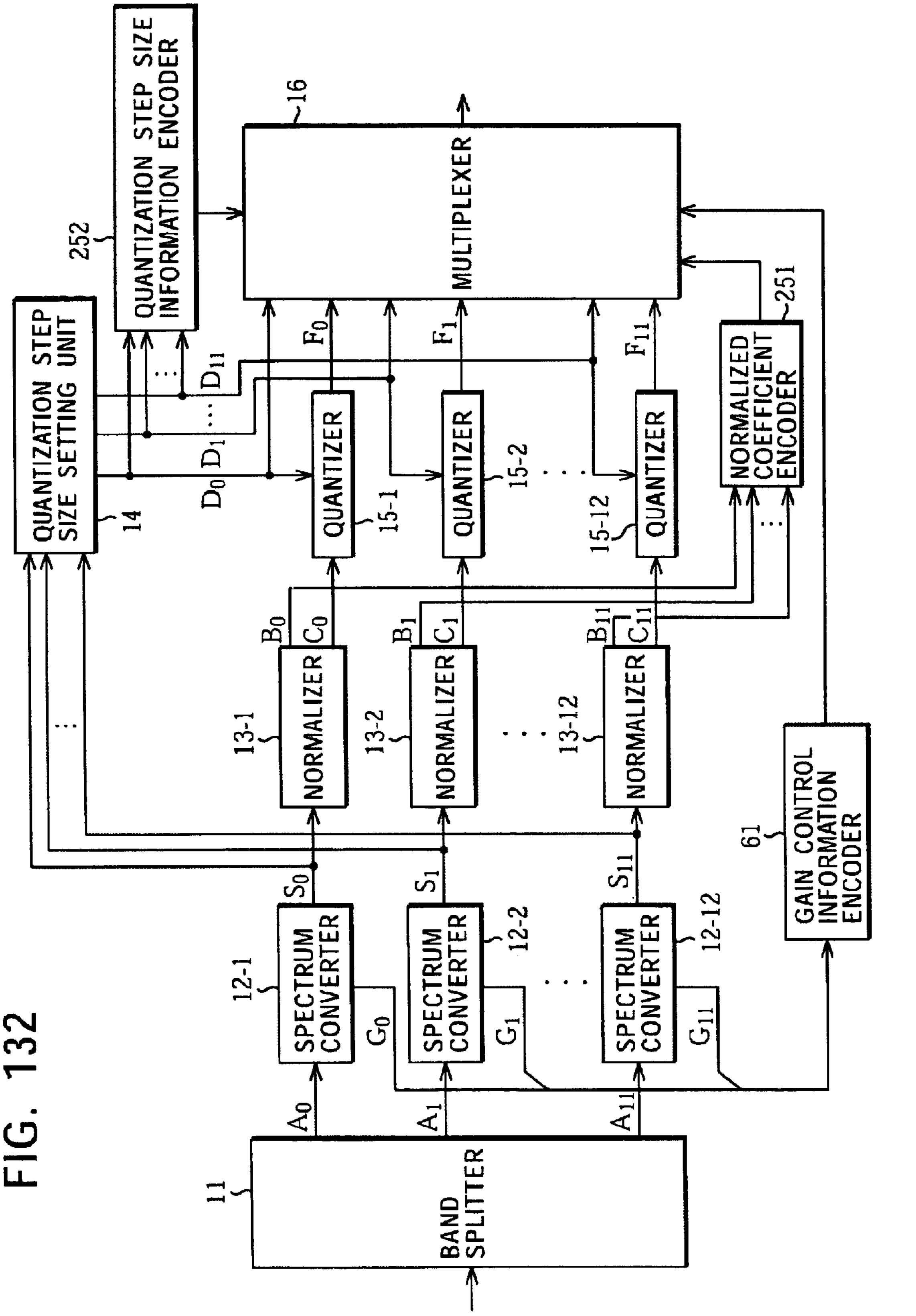

FIG. 132 is a block diagram showing another example of a construction of the encoding apparatus 51.

Figure 133:
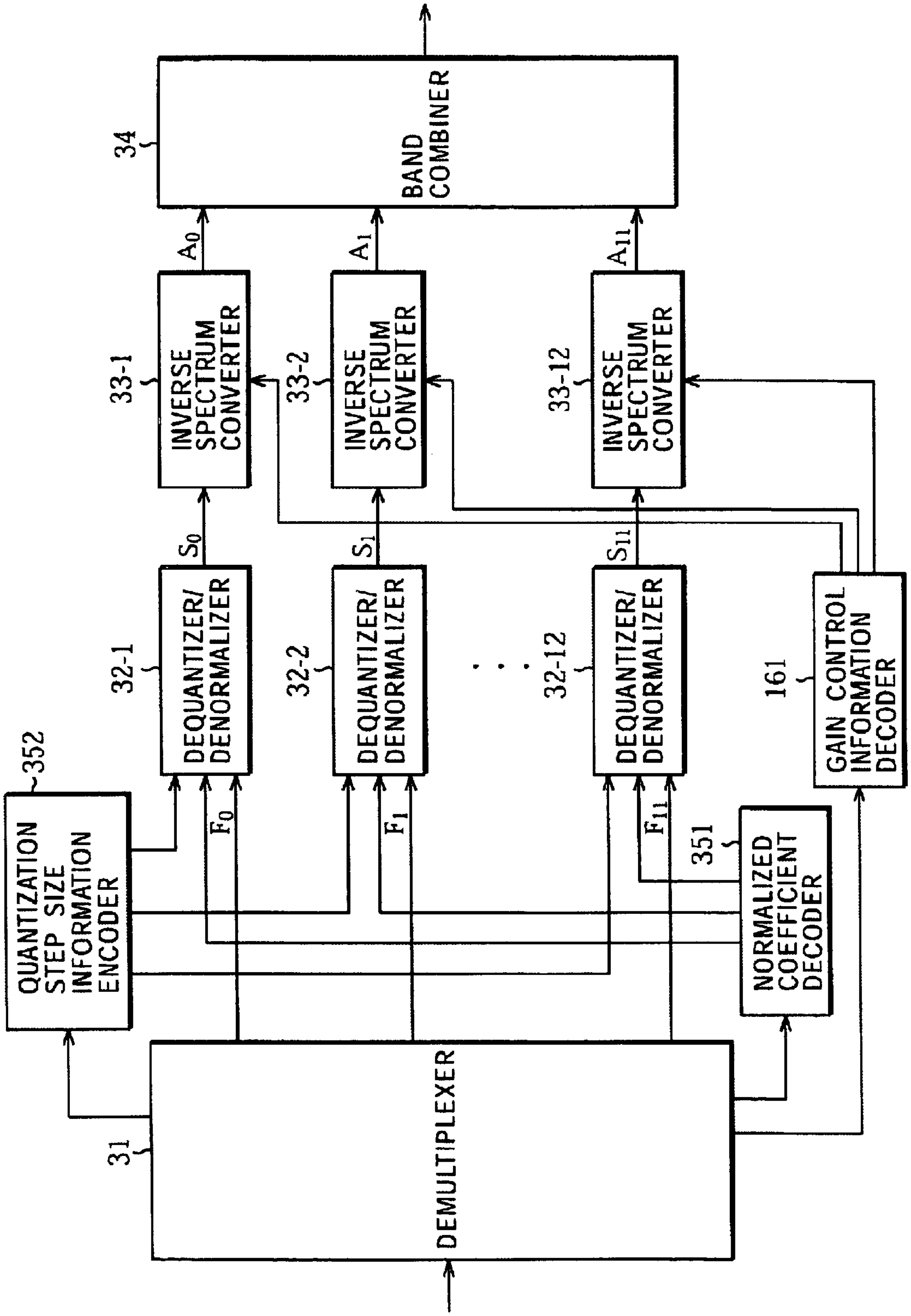

FIG. 133 is a block diagram showing another example of a construction of the decoding apparatus 151.

Figure 134:
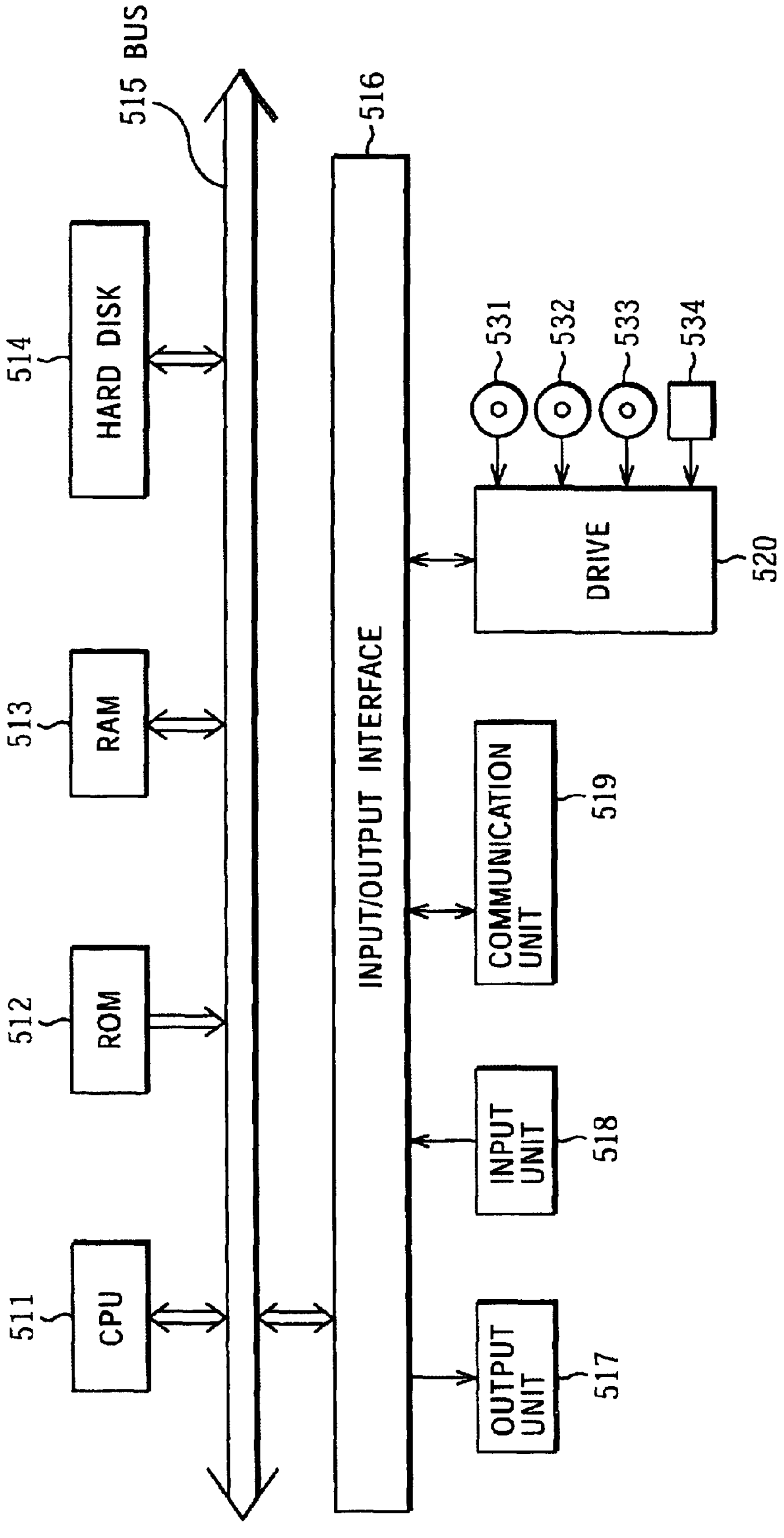

FIG. 134 is a block diagram showing an example of a construction of a computer 501.

BEST MODE FOR CARRYING OUT THE INVENTION

Figure 1:
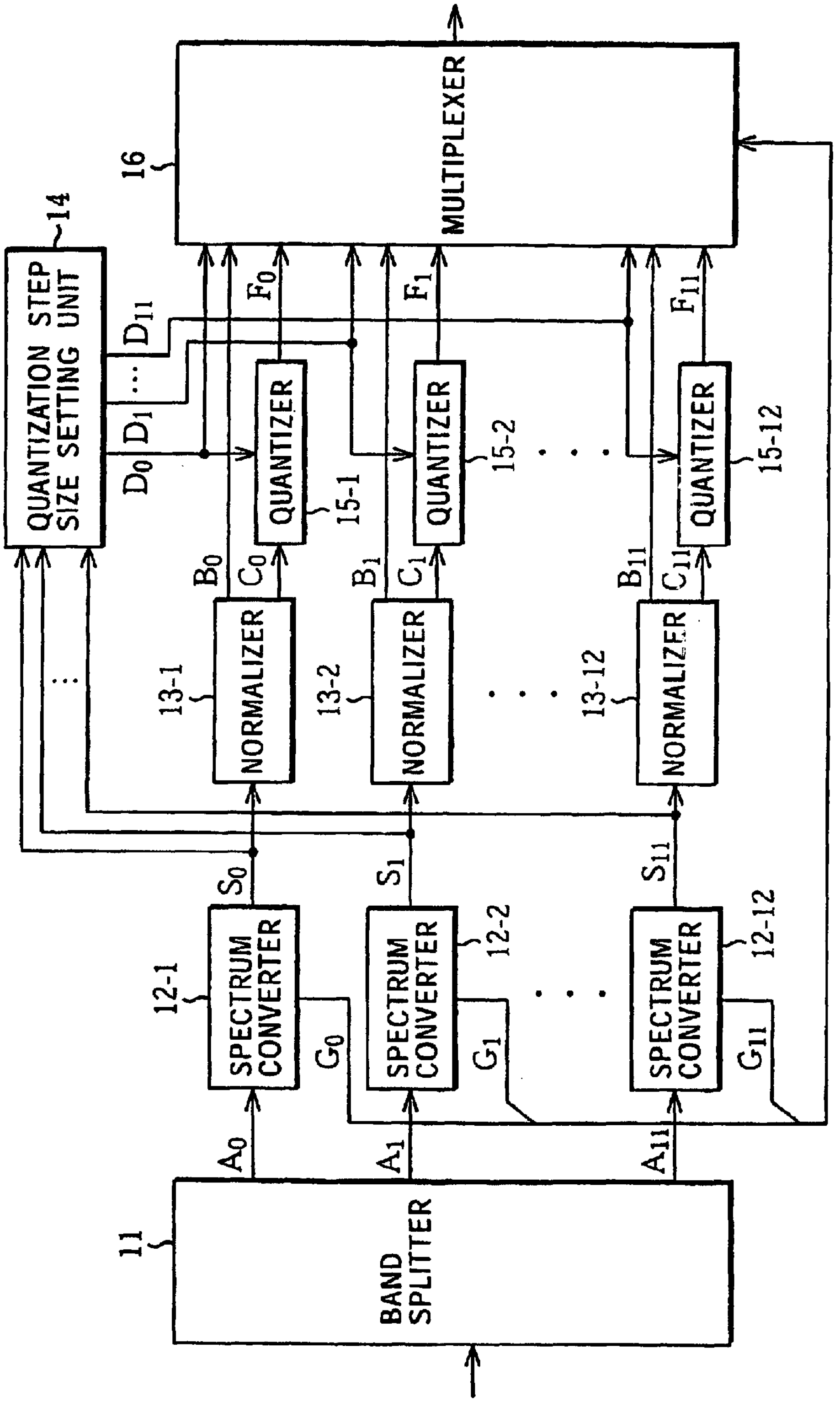
FIG. 1 RELATED ART
FIG. 1 is a block diagram showing an example of a construction of an encoding apparatus 1 according to a conventional technique.
Figure 2:
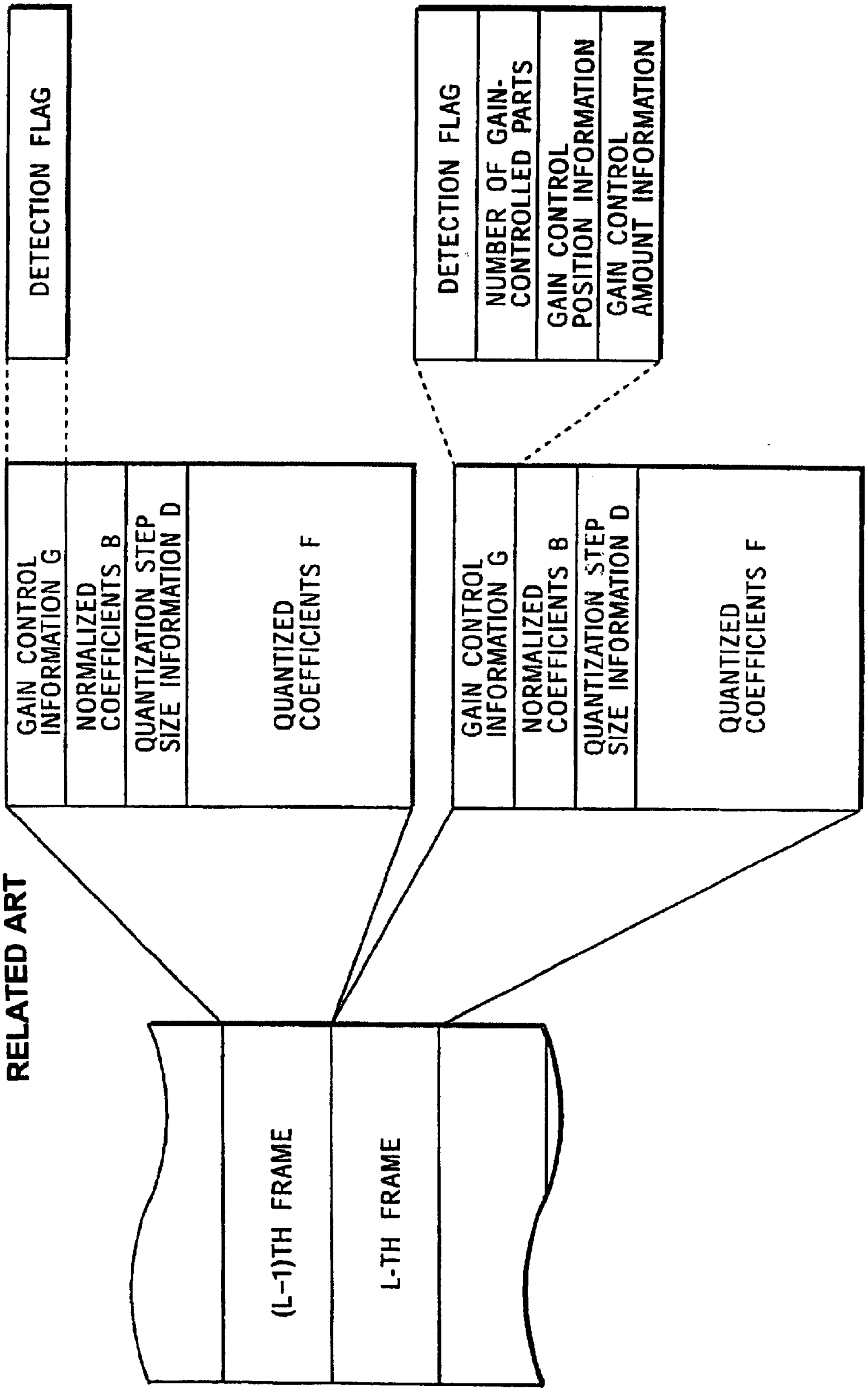
FIG. 2 RELATED ART
FIG. 2 is a diagram showing a format of encoding data.
Figure 3:
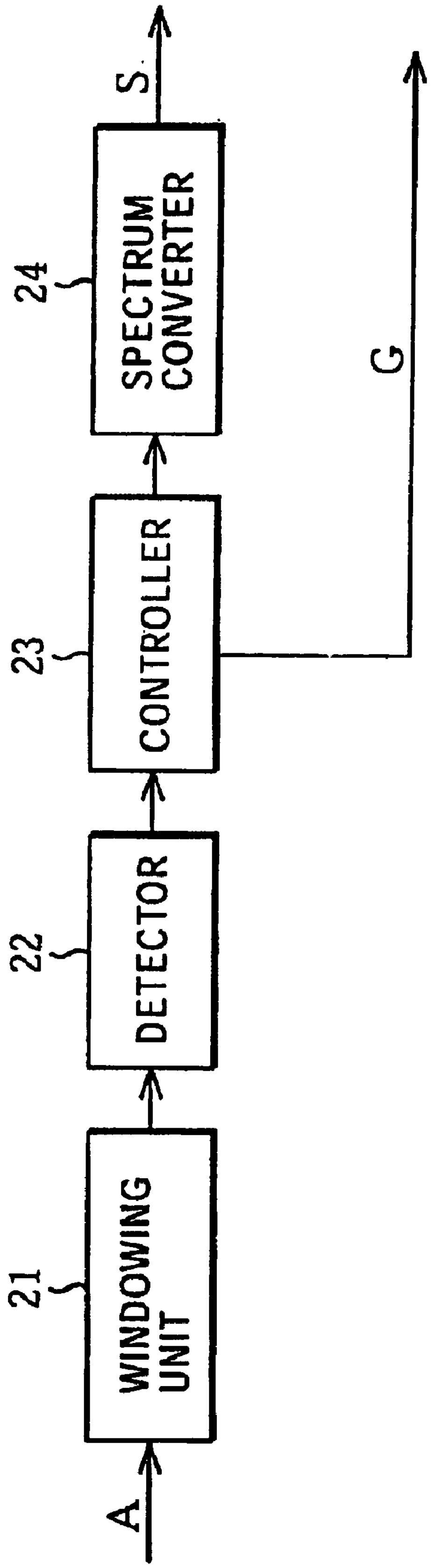
FIG. 3 RELATED ART
FIG. 3 is a block diagram showing an example of a spectrum converter 12 shown in FIG. 1.
Figure 4A:
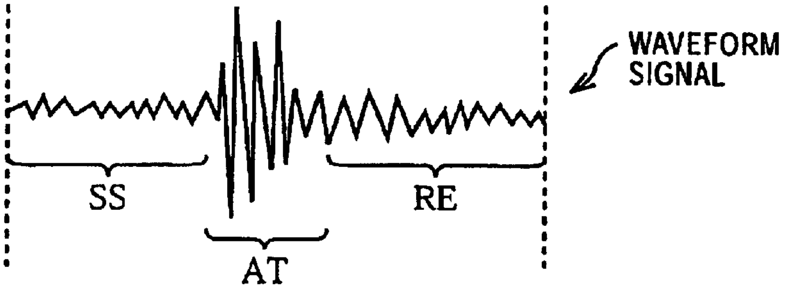
FIG. 4A RELATED ART
FIG. 4A is a diagram showing a waveform signal in a block.
Figure 4B:
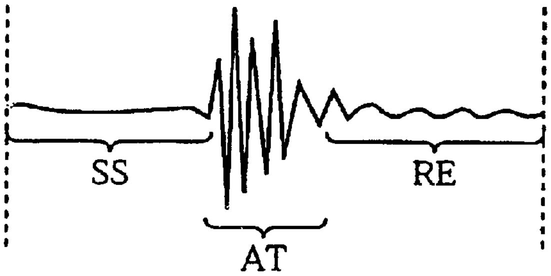
FIG. 4B RELATED ART
FIG. 4B is a diagram showing another waveform signal in a block.
Figure 4C:
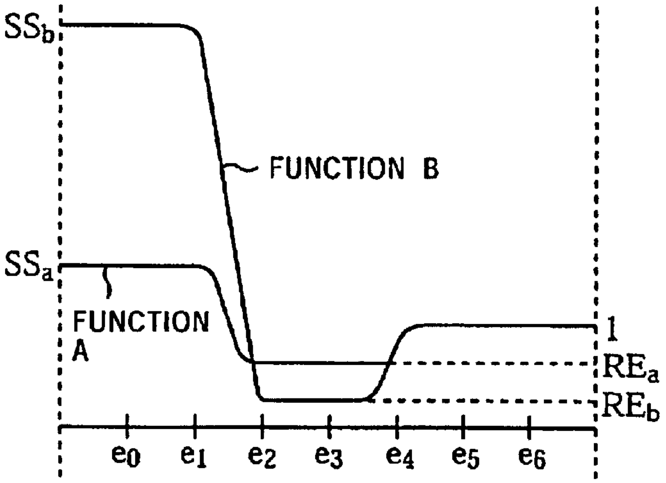
FIG. 4C RELATED ART
FIG. 4C is a diagram showing another waveform signal in a block.
Figure 4D:
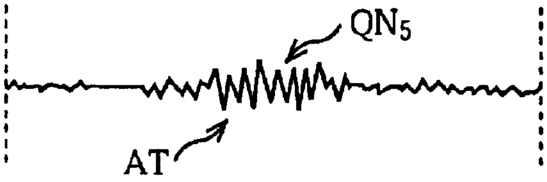
FIG. 4D RELATED ART
FIG. 4D is a diagram showing another waveform signal in a block.
Figure 4E:
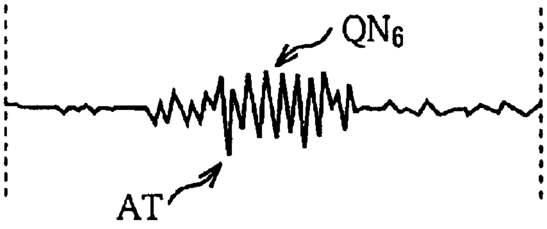
FIG. 4E RELATED ART
FIG. 4E is a diagram showing another waveform signal in a block.
Figure 7:
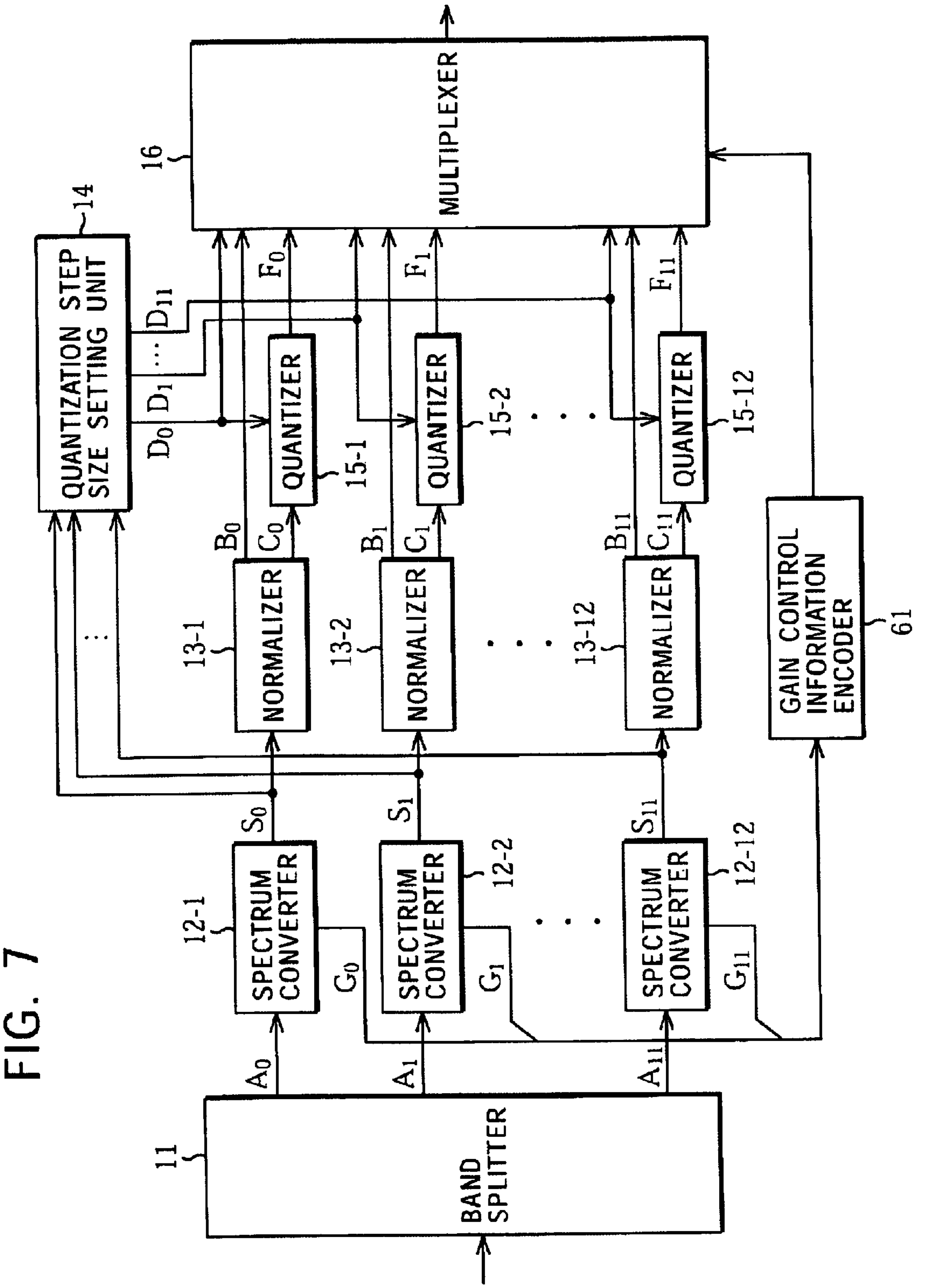
FIG. 7 is a block diagram showing an example of a construction of an encoding apparatus 51 according to the present invention.

FIG. 7 shows an example of a construction of an encoding apparatus 51 according to the present invention. In addition to the parts employed in the encoding apparatus 1 shown in FIG. 1, the encoding apparatus 51 further includes gain control information encoder 61. The other parts are similar to those of the encoding apparatus 1 shown in FIG. 1 and thus they are not described in further detail herein.

The spectrum converters 12-1 to 12-12 cut encoding units A0 to A11 input from a band splitter 11 into blocks (frames) with a fixed length (time period) and generate gain control information G0 to G11 depending on the amplitudes of the waveform signals in each block. Furthermore, the spectrum converters 12-1 to 12-12 control the gains of the waveform signals in the block in accordance with the gain control information G0 to G11. The spectrum converters 12-1 to 12-12 output produced gain control information G0 to G11 to the gain control information encoder 61.

The spectrum converters 12-1 to 12-12 perform a spectrum conversion based on DFT, DCT, or MDCT, on the signals subjected to the gain control, thereby generating spectral component signals S0 to S11. The resultant spectral component signals S0 to S11 are supplied to normalizers 13-1 to 13-12.

Figure 8:
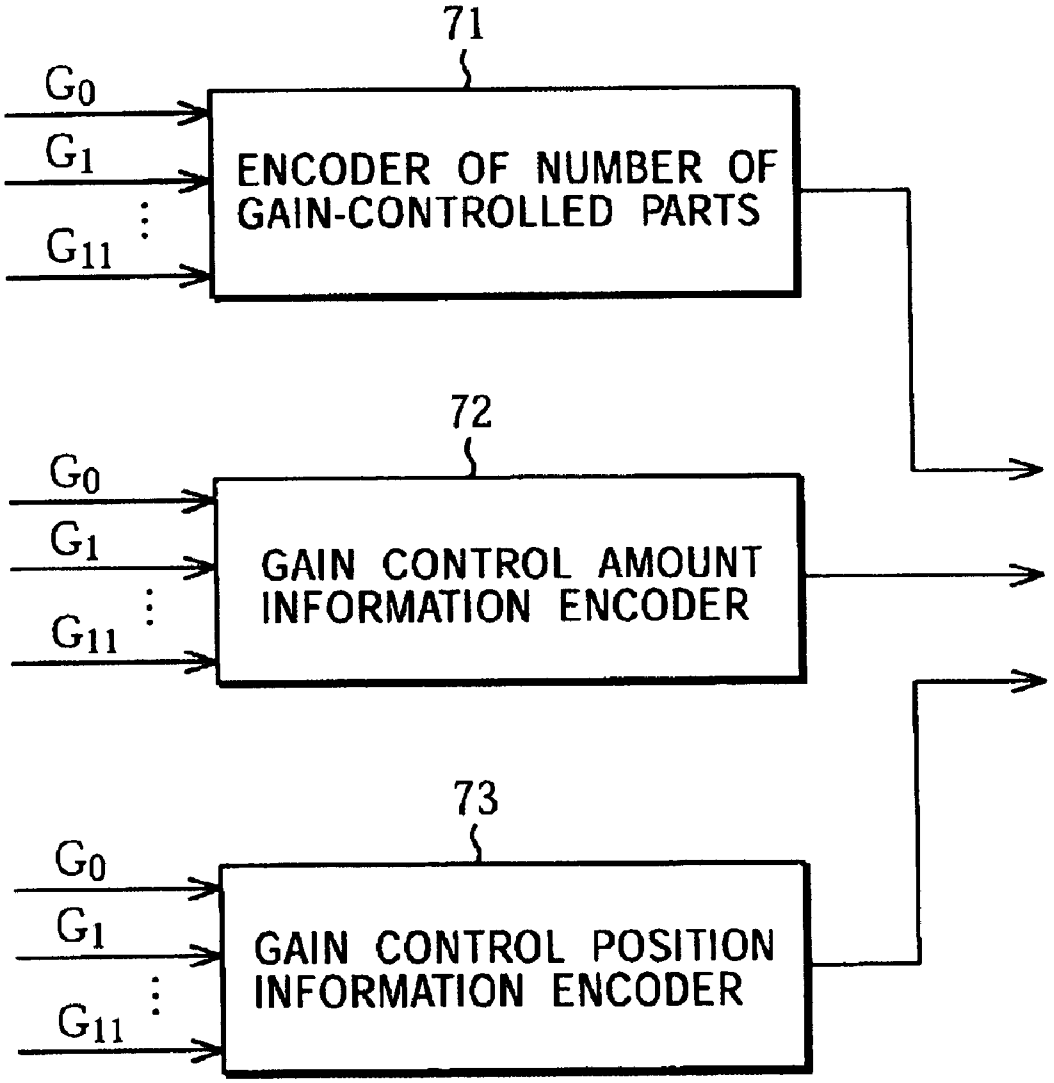
FIG. 8 is a block diagram showing an example of a construction of a gain control information encoder 61 shown in FIG. 7.

FIG. 8 shows a construction of the gain control information encoder 61. The gain control information G0 to G11 output from the spectrum converters 12-1 to 12-12 are input to a gain control number encoder 71, a gain control amount information encoder 72, and a gain control position information encoder 73.

The gain control number encoder 71 encodes gain control numbers GA0 to GA11 included in the input gain control information G0 to G11, by means of various different encoding methods which will be descried in detail later. The gain control number encoder 71 selects encoded gain control numbers GA0 to GA11 having a smallest total number of bits among those encoded by the various different encoding methods and output the selected encoded gain control numbers GA0 to GA11 to a multiplexer 16.

The gain control amount information encoder 72 encodes gain control amount information GB0 to GB11 included in the input gain control information G0 to G11, by means of various different encoding methods which will be descried later. The gain control amount information encoder 72 selects encoded gain control amount information GB0 to GB11 having a smallest total number of bits among those encoded by the various different encoding methods and output the selected encoded gain control amount information GB0 to GB11 to the multiplexer 16.

The gain control position information encoder 73 encodes gain control position information GC0 to GC11 included in the input gain control information G0 to G11, by means of various different encoding methods which will be descried later. The gain control position information encoder 73 selects encoded gain control position information GC0 to GC11 having a smallest total number of bits among those encoded by the various different encoding methods and output the selected encoded gain control position information GC0 to GC11, to the multiplexer 16.

Referring again to FIG. 7, the multiplexer 16 encodes the normalized coefficients B0 to B11 received from the normalizer 13, the quantization step size information D0 to D11 received from the quantization step size setting unit 14, and the quantized coefficients F0 to F11 received from the quantizer 5 and multiplexes them together with the encoded gain control information G0 to G11 (the gain control numbers GA0 to GA11, the gain control amount information GB0 to GB11, and the gain control position information GC0 to GC11) received from the gain control information encoder 61, on a frame-by-frame basis.

That is, in the present invention, the gain control numbers GA, the gain control amount information GB and the gain control position information GC of the gain control information G are respectively encoded into codes with smallest number of bits of those obtained by various encoding methods. That is, the gain control information G is encoded into a variable-length code so that the quantized coefficients F can be encoded more efficiently than can be by the conventional fixed-bit encoding method.

The gain control number encoder 71, the gain control amount information encoder 72, and the gain control position information encoder 73 (FIG. 8) of the gain control information encoder 61 are described in further detail below.

Figure 9:
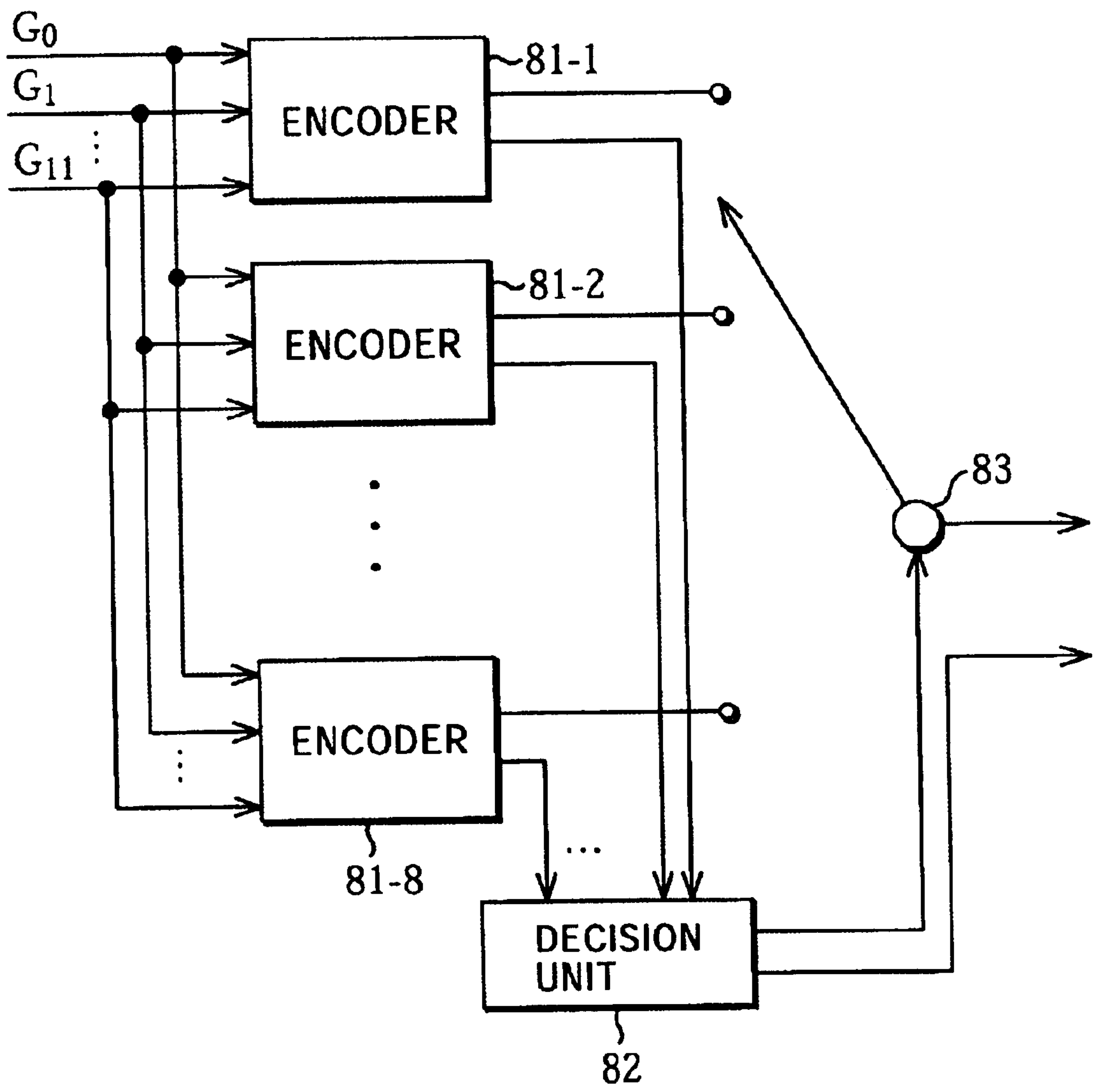
FIG. 9 is a block diagram showing an example of a construction of a gain control number encoder 71 shown in FIG. 8.

First, the details of the gain control number encoder 71 are described. FIG. 9 shows an example of a construction of the gain control number encoder 71.

The gain control information G0 to G11 output from the spectrum converters 12-1 to 12-12 are input to each of eight encoders 81-1 to 81-8.

The encoders 81-1 to 81-8 detect gain control numbers GA0 to GA11 from the respective input gain control information G0 to G11 and encode the detected gain control numbers GA0 to GA11 by means of predetermined encoding methods. Resultant encoded data are output to terminals connected to switch 83.

Each of the encoders 81-1 to 81-8 calculates the sum of the numbers of bits of the encoded gain control numbers GA0 to GA11 and outputs the calculated sum to the decision unit 82.

The decision unit 82 detects, among encoders 81-1 to 81-8, an encoder 81 which has output a smallest sum, that is, the decision unit 82 detects an encoder 81 which has encoded the gain control numbers GA0 to GA11 into a smallest total number of bits, and the decision unit 82 controls the switch 83 so that the encoded gain control numbers GA0 to GA11 encoded by the detected encoder 81 are output to the multiplexer 16. The decision unit 82 also outputs information indicating the encoding method employed by the detected encoder 81 to the multiplexer 16. The decision unit 82 stores information indicating the encoding methods employed by the respective encoders 81.

The encoding methods employed by the respective encoders 81-1 to 81-8 of the gain control number encoder 71 are described.

First, the encoding method employed by the encoder 81-1 is described.

Figure 10:
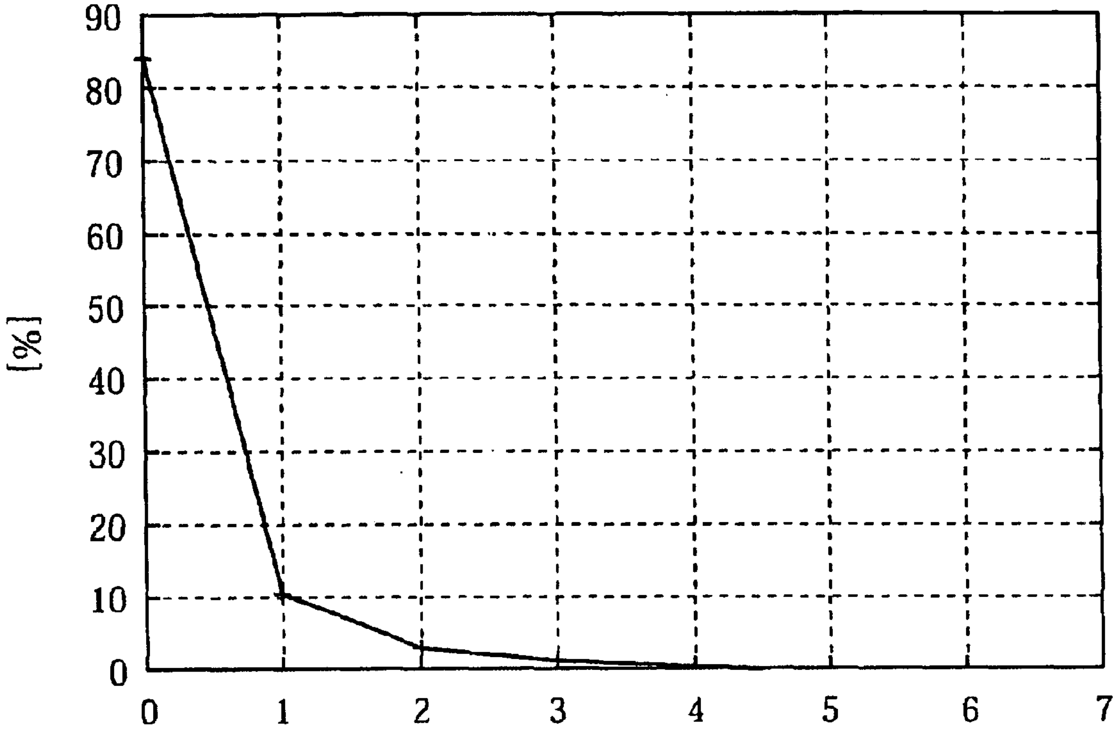
FIG. 10 is a graph showing a characteristic of gain control number GA.

Although the gain control number GA can take any one of values from, in this specific example, 0 to 7, the gain control number GA has a high probability of taking a particular number (for example, 0) as shown in FIG. 10. Thus, in the encoding of the gain control numbers GA, the encoder 81-1 assigns a code with a small number of bits to a gain control number GA having a high occurrence probability.

The operation of the encoder 81-1 is described below with reference to a flow chart shown in FIG. 11.

In step S11, the encoder 81-1 detects gain control numbers GAi (i=0, 1, 2, . . . , 11) of one frequency band from the input gain control information G0 to G11.

In the next step S12, the encoder 81-1 determines a code to be assigned to the gain control number GAi. More specifically, the encoder 81-1 retrieves a code corresponding to the gain control number GAi detected in step S11 from a table shown in FIG. 12 and employs the retrieved code as the code of the gain control number GAi.

For example, in the case of gain control number GA2 of gain control numbers GA0 to GA11 shown in FIG. 13, the gain control number GA2 has a value of 1 and thus a 2-bit code of "10" is employed as the code thereof.

Figures 11, 12:
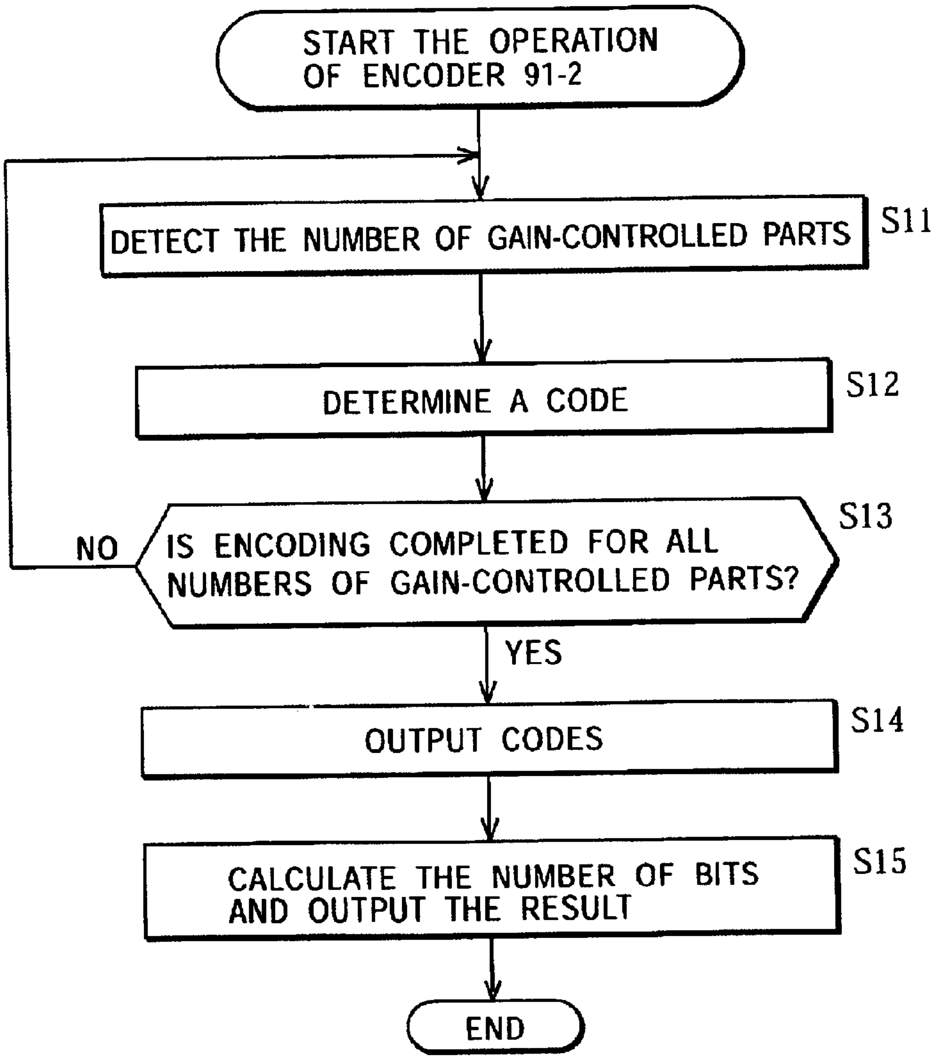
FIG. 11 is a flow chart showing the operation of an encoder 81-1.
FIG. 12 shows a table in which a value-code correspondence and a procedure of determining codes for particular values are represented.

In the table shown in FIG. 12, a 1-bit code "0" is assigned to a value 0, a 2-bit code "10" to a value 1, a 3 bit code "110" to a value 2, and a 4-bit code "1110" to a value 3. Thus, if the encoder 81-1 detects a gain control number GAi having a value in the range of 0 to 3, the encoder 81-1 selects "0", "110", "110", or "1110" corresponding to the value of the gain control number GAi and employs it as the code of the gain control number GAi.

Furthermore, in the table shown in FIG. 12, a procedure of determining a code for a value in the range from 4 to 7 is defined (more specifically, the code is determined by a formula 1111+(gain control number−4)).

According to this procedure, a 6-bit code consisting of bits b0 to b5 is given, as shown in FIG. 14, by a combination of a 4-bit code "1111" (escape code) and a following 2-bit code having a value equal to the gain control number GAi (having a value in the range from 4 to 7) minus 4. That is, if the encoder 81-1 detects a gain control number GAi having a value in the range of 4 to 7, the encoder 81-1 determines a 6-bit code via the above-described procedure and employs it as the code for the gain control number GAi.

In the next step S13, the encoder 81-1 determines whether codes have been determined for all gain control numbers GA0 to GA11, that is, whether all gain control numbers GA0 to GA11 have been encoded. If it is determined that all gain control numbers GAi have not been encoded, the process returns to step S11 to perform the step S11 and following steps to encode a next unencoded gain control number GAi.

If it is determined in step S13 that all gain control numbers GA0 to GA11 have been encoded, the process proceeds to step S14. In step S14, the encoder 81-1 outputs the codes determined in step S12 for the respective gain control numbers GA0 to GA11 to the terminal connected to the switch 83.

In the next step S15, the encoder 81-1 calculates the sum of the numbers of bits of the encoded gain control numbers GA0 to GA11 and outputs the calculated sum to the decision unit 82.

For example, in the case of the gain control numbers GA0 to GA11 shown in FIG. 13, codes with numbers of bits such as those shown in FIG. 13 are produced as the result of the encoding, and thus the total number of bits of the codes becomes equal to 26. Thus, a signal indicating that the total number of bits is equal to 26 is supplied to the decision unit 82.

If the conventional fixed-length (3-bit) encoding method were employed, the gain control numbers GA in the example shown in FIG. 13 would be encoded into codes with a total of 36 (=3×6) bits. Thus, the total number of bits of encoded data according to the present invention is smaller by 10 than that according to the conventional technique.

As described above, assigning a code with a small number of bits (1-bit code “0”) to a gain control number GA having a high occurrence probability makes it possible to reduce the total number of bits of gain control numbers GA0 to GA11.

Although in the table (FIG. 12) used in the present example, escape codes are used for some values, specific codes including no escape code may be assigned to all respective values.

In the present example, the gain control number GA is assumed to have such a characteristic shown in FIG. 10. In a case in which the characteristic of the gain control number GA varies from one encoding unit Ai to another, the coding table may be switched depending on the characteristic of the gain control number GA.

Now, the encoding method employed by the encoder 81-2 is described.

Figure 15:
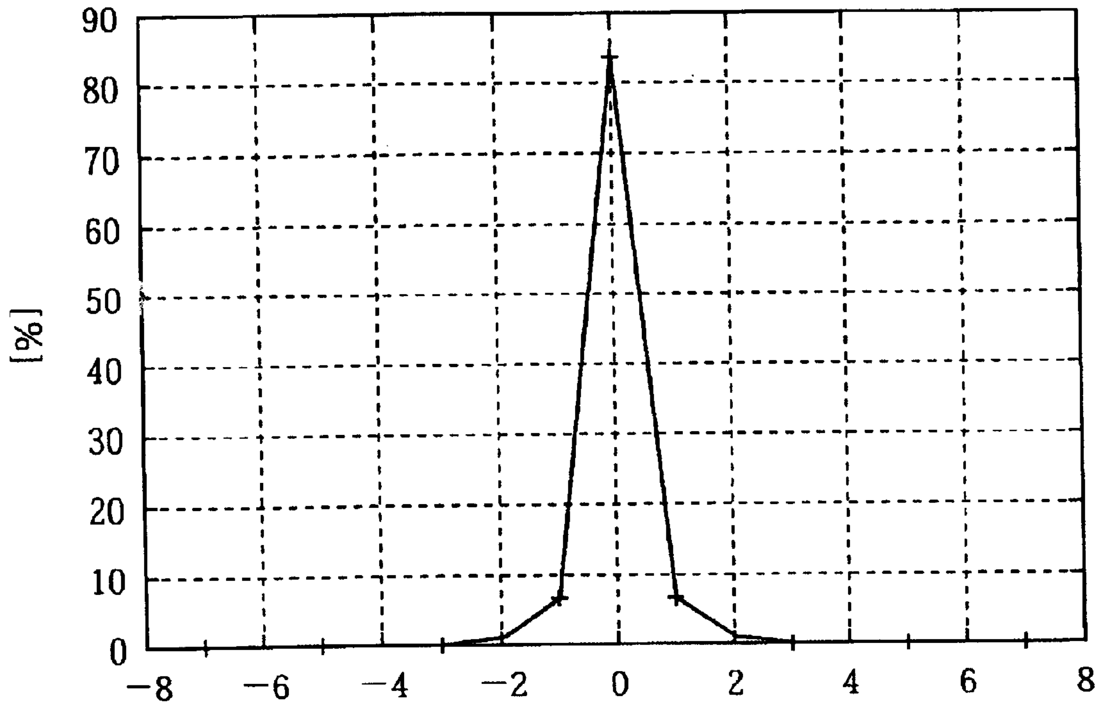
FIG. 15 is a graph showing a characteristic of a difference value VA.

In most cases, the gain control numbers GA of encoding units A in adjacent two frequency bands (the gain control number GAi-1 of the encoding unit Ai-1 and the gain control number GAi of the encoding unit Ai) are equal or close to each other. For example, the absolute value of the difference value VA obtained by subtracting the gain control number GAi-1 from the gain control number GAi has a high probability of becoming equal or close to 0, as shown in FIG. 15.

In view of the above, the encoder 81-2 encodes the gain control number GA in such a manner that codes with small numbers of bits are assigned to difference values VA having high occurrence probabilities.

Figure 16:
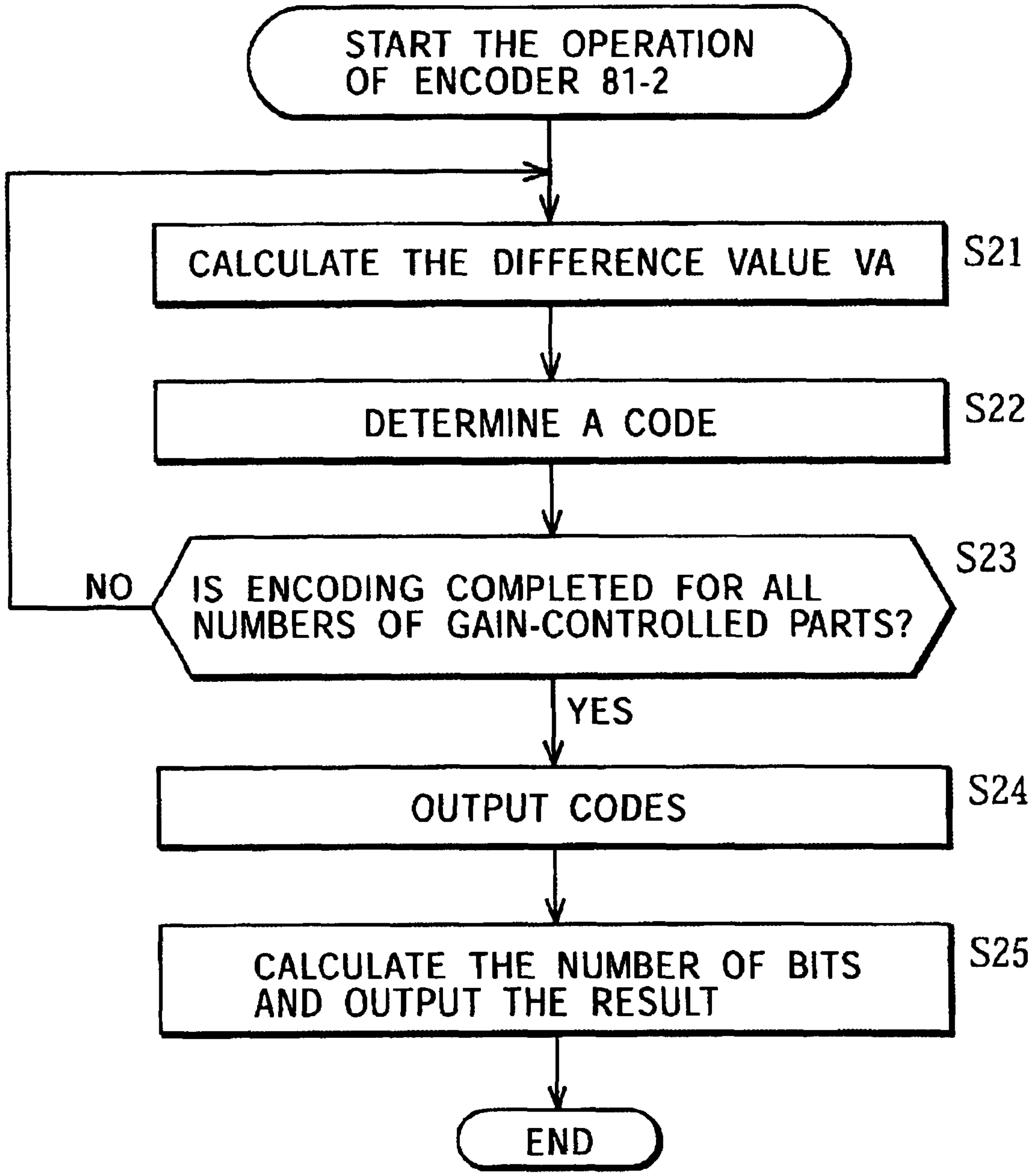
FIG. 16 is a flow chart showing the operation of an encoder 81-2.

The operation of the encoder 81-2 is described below with reference to a flow chart shown in FIG. 16.

In step S21, the encoder 81-2 detects a gain control number GAi of one frequency band from the input gain control information G0 to G11 and determines the difference value VA by subtracting, from the gain control number GAi, the gain control number GAi-1 of the encoding unit Ai-1 which is in a lower frequency band adjacent to the frequency band of the encoding unit Ai and which was detected in previous execution of step 21.

Hereinafter, for simplicity, the difference value VA obtained by subtracting the gain control number GAi-1 from the gain control number GAi will be referred to simply as the difference value VA of the gain control number GAi.

For example, in the case of gain control numbers GA0 to GA11 shown in FIG. 17, the difference value VA of the gain control number GA1 (=2) is calculated as 1 (=gain control number GA1 (=2)−gain control number GA0 (=1)).

Note that the difference value VA of the gain control number GA0 is not calculated because there is no gain control number GA in a band lower than the band of the gain control number GA0.

In the next step S22, the encoder 81-2 retrieves a code corresponding to a value equal to the difference value VA calculated in step S21 from a table shown in FIG. 18 and employs the retrieved code as the code of the gain control number GAi.

In the table shown in FIG. 18, a 5-bit code “11110” is assigned to a value −2, a 3-bit code “110” to a value −1, a 1-bit code “0” to a value 0, a 2-bit code “10” to a value 1, and a 4-bit code “1110” to a value 2.

Furthermore, in the table shown in FIG. 18, a procedure of determining a code for a value other than the values of −2 to 2 is also defined (more specifically, the code is given by a formula 11111+original value). According to this procedure, an 8-bit code is given by a combination of a 5-bit code “11111” and a following 3-bit code having a value equal to the gain control number GA (original value).

In the case of the gain control number GA0, a code corresponding to a value equal to the value of the gain control number GA0 is retrieved from the table shown in FIG. 12, and the retrieved code is employed as the code of the gain control number GA0. For example, the gain control number GA0 shown in FIG. 17 has a value of 1, and thus a 2 bit code of “10” is employed as the code thereof.

In the next step S23, the encoder 81-2 determines whether codes have been determined for all gain control numbers GA0 to GA11, that is, whether all gain control numbers GA0 to GA11 have been encoded. If it is determined that all gain control numbers GAi have not been encoded, the process returns to step S21 to perform the step S21 and following steps to encode a next unencoded gain control number GAi.

If it is determined in step S23 that all gain control numbers GA0 to GA11 have been encoded, the process proceeds to step S24. In step S24, the encoder 81-2 outputs the codes determined in step S22 for the respective gain control numbers GA0 to GA11 to the terminal connected to the switch 83.

In the next step S25, the encoder 81-2 calculates the sum of the numbers of bits of the encoded gain control numbers GA0 to GA11 and outputs the calculated sum to the decision unit 82.

For example, in the case of gain control numbers GA shown in FIG. 17, codes with numbers of bits such as those shown in FIG. 17 are produced as the result of the encoding, and thus the total number of bits of the codes becomes equal to 16. Thus, a signal indicating that the total number of bits is equal to 16 is supplied to the decision unit 82.

If the conventional fixed-length (3-bit) encoding method were employed, the gain control numbers GA in the example shown in FIG. 17 would be encoded into codes with a total of 36 (=3×12) bits. Thus, the total number of bits of encoded data according to the present invention is smaller by 20 than that according to the conventional technique.

Now, the encoding method employed by the encoder 81-3 is described.

In some cases, a gain control number GAi has a value equal to the value of a gain control number GAi-1 of a lower frequency band immediately adjacent to the ban of the gain control number GAi. For example, in the gain control numbers GA0 to GA11 shown in FIG. 19, a gain control number GA3 (=1) is equal in value to a gain control number GA2 (=1).

Thus, when a gain control number GAi-1 and a gain control number GAi are equal in value to each other, the encoder 81-3 encodes the gain control number GA in such a manner that only a flag (encoding flag) set to a value (0, in this specific example) indicating that the gain control number GAi-1 and the gain control number GAi are equal in value to each other is encoded.

Figure 20:
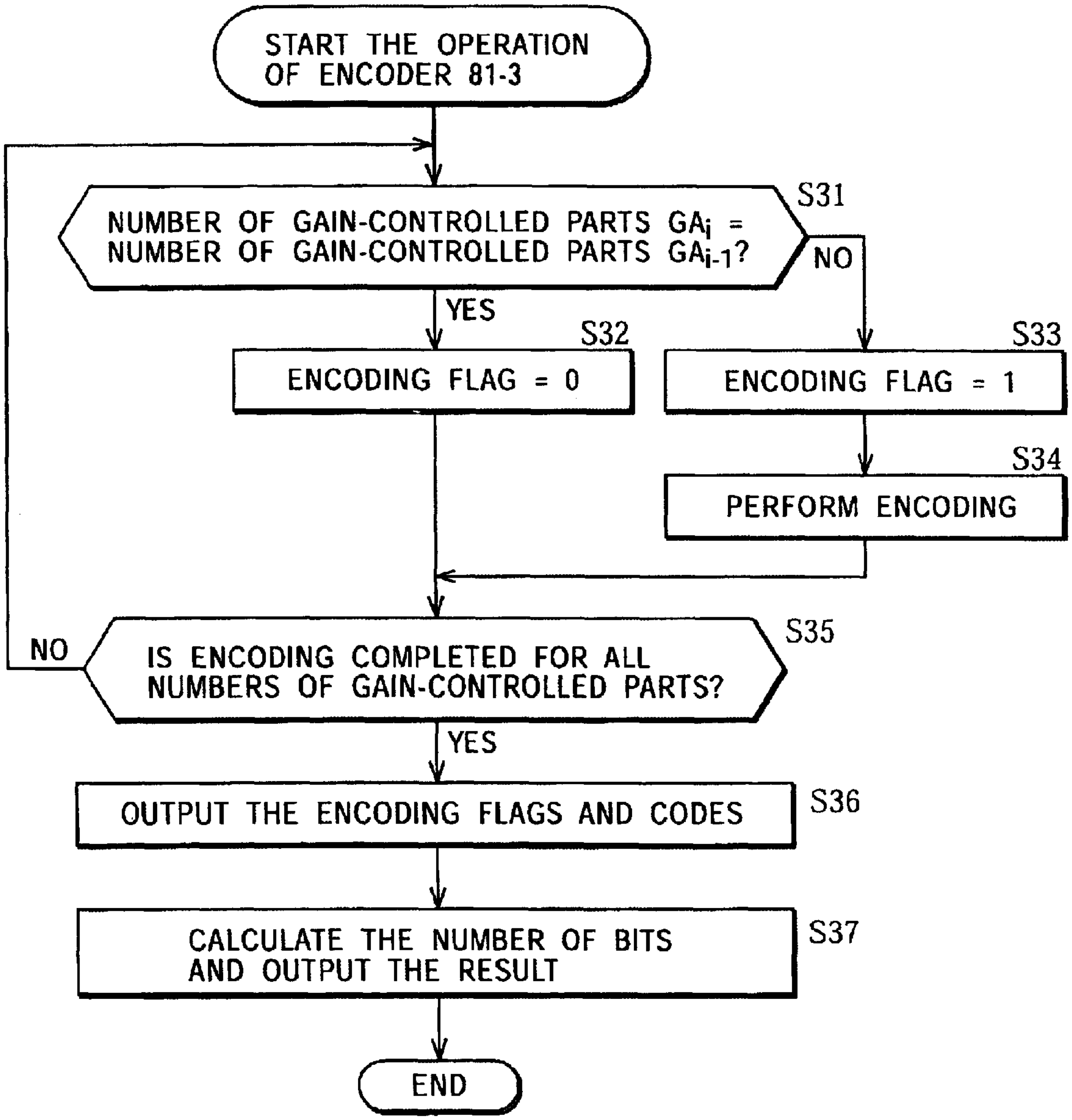
FIG. 20 is a flow chart showing the operation of an encoder 81-3.

The operation of the encoder 81-3 is described below with reference to a flow chart shown in FIG. 20.

In step S31, the encoder 81-3 detects a gain control number GAi of one frequency band from the input gain control information GA0 to GA11, and determines whether the detected gain control number GAi is equal to the gain control number GAi-1 detected in previous execution of step S31. If it is determined that they are equal to each other, the process proceeds to step S32 to set the encoding flag of the gain control number GAi to 0.

In the specific example shown in FIG. 19, the gain control number GA3 (=1) is equal in value to the gain control number GA2 (=1), and thus the encoding flag associated with the gain control number GA3 is set to 0.

In a case in which it is determined in step S31 that the gain control number GAi is not equal to the gain control number GAi-1, the process proceeds to step S33. In step S33, the encoder 81-3 sets the encoding flag associated with the gain control number GAi to 1. In step S34, the encoder 81-3 expresses the gain control number GAi using a fixed number of bits (3 bits) and employs the resultant fixed-length expression as the code of the gain control number GAi.

In the example shown in FIG. 19, a gain control number GA0 (=1) and a gain control number GA1 (=4) are not equal in value to each other, and thus the encoding flag associated with the gain control number GA1 is set to 1, and a 3-bit code representing the value of the gain control number GA1, that is, 4, is assigned to the gain control number GA1.

In this example, there is no encoding flag associated with the gain control number GA0, and the code for the gain control number GA0 is determined in step S34 as with a gain control number GA corresponding to an encoding flag set to 1.

After step S32 in which the encoding flag is set to 0, or after step S34 in which the gain control number GAi is encoded into a 3-bit code, the process proceeds to step S35. In step S35, the encoder 81-3 determines whether all encoding flags have been set to 0 or 1 and all gain control numbers GAi corresponding to the encoding flags set to 1 have been encoded into 3-bit codes, that is, the encoder 813 determines whether all gain control numbers GA0 to GA11 have been encoded. If it is determined that all gain control numbers GAi have not been encoded, the process returns to step S31 to perform the step S31 and following steps to encode a next unencoded gain control number GAi.

If it is determined in step S35 that all gain control numbers GA0 to GA11 have been encoded, the process proceeds to step S36. In step S36, the encoder 81-3 outputs the encoding flag set to 0 or 1 and the codes to the terminal connected to the switch 83.

In the next step S37, the encoder 81-3 calculates the sum of the numbers of bits of the encoded gain control numbers GA0 to GA11 and outputs the calculated sum to the decision unit 82.

In the example shown in FIG. 19, as a result of encoding of the gain control numbers GA, 11 1-bit encoding flags, a 3-bit code associated with the gain control number GA0, a 3-bit code associated with the gain control number GA1, and a 3-bit code associated with the gain control number GA2 are generated, and thus a signal indicating that the total number of bits is equal to 20 is output to the decision unit 82.

If the conventional fixed-length (3-bit) encoding method were employed, the gain control numbers GA in the example shown in FIG. 19 would be encoded into codes with a total of 36 (=3×12) bits. Thus, the total number of bits of encoded data according to the present invention is smaller by 16 than that according to the conventional technique.

Although in the present embodiment, the gain control number GA0, and also the gain control number GAi if it is not equal in value to the gain control number GAi-1, are encoded into codes with the fixed bit length, the encoding may be performed according to another method.

Now, the encoding method employed by the encoder 81-4 is described.

In most cases, because the gain control numbers GA0 to GA11 are close in value to each other, subtracting the minimum value of the gain control numbers GA0 to GA11 from the respective values of the gain control numbers GA0 to GA11 results in small values which can be represented using a small number of bits.

In view of the above, the encoder 81-4 encodes each gain control number GA in such a manner that the minimum value of the gain control numbers GA0 to GA11 is subtracted from the gain control number GAi and the resultant value represented in a predetermined number of bits is employed as the code of the gain control number GAi.

Figure 21:
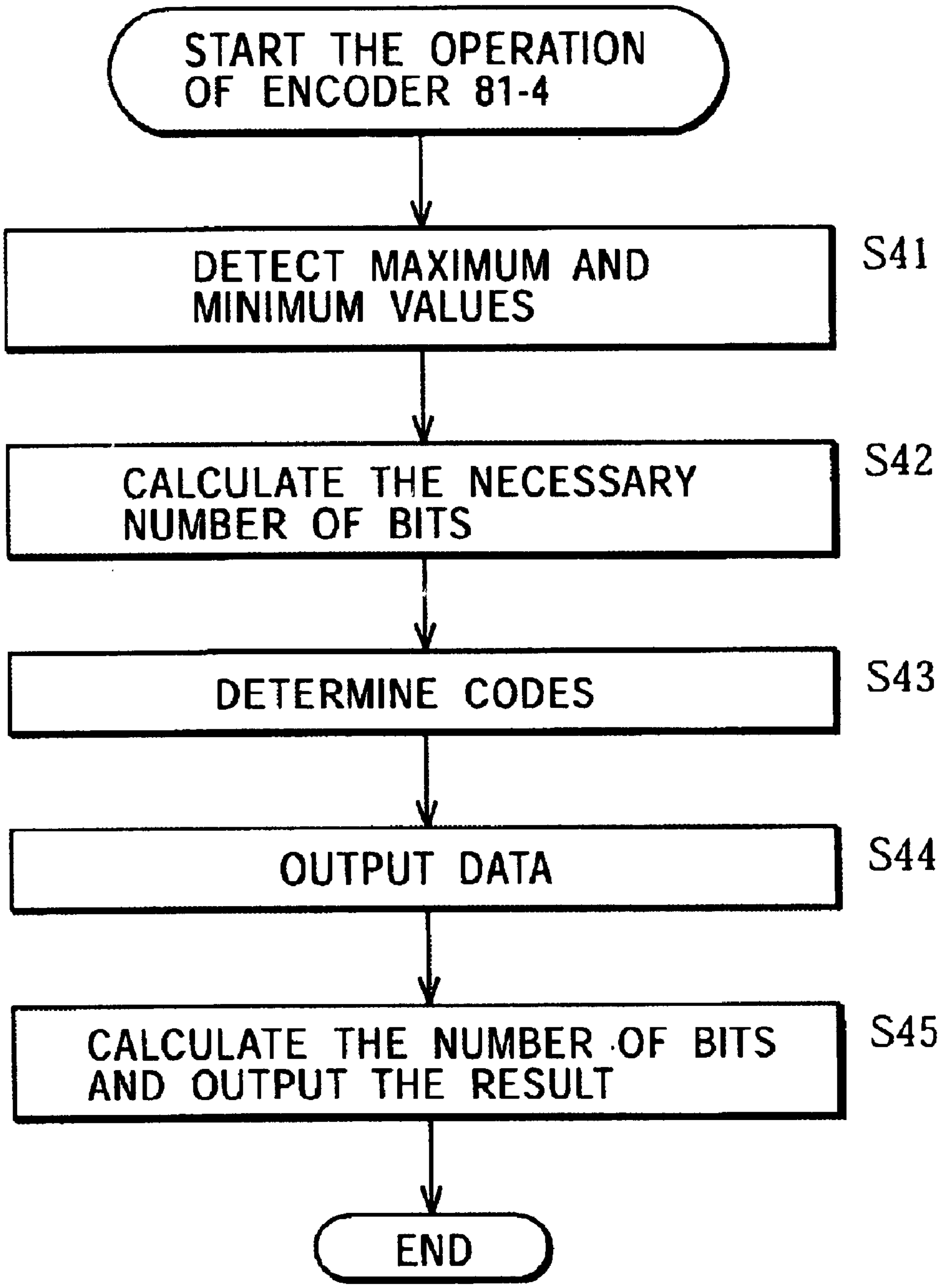
FIG. 21 is a flow chart showing the operation of an encoder 81-4.

The operation of the encoder 81-4 is described below with reference to a flow chart shown in FIG. 21.

In step S41, the encoder 81-4 extracts gain control numbers GA0 to GA11 from the input gain control information G0 to G11 and detects maximum and minimum values of the extracted gain control numbers GA0 to GA11. In the example shown in FIG. 22, the maximum value of the gain control numbers GA0 to GA11 is detected as 2 and the minimum value as 1.

In step S42, the encoder 81-4 calculates the difference between the maximum and minimum values detected in step S41, and determines the number of bits which can represent the difference. Hereinafter, such a number of bits will be referred to as a necessary number of bits. In the example shown in FIG. 22, the difference between the maximum value (2) and the minimum value (1) is equal to 1, and thus the necessary number of bits is 1.

In step S43, the encoder 81-4 subtracts the minimum value detected in step S41 from the respective values of the gain control numbers GA0 to GA11 and expresses the resultant difference values using as many bits as the necessary number of bits calculated in sep S42. The resultant expressions are employed as codes for the respective gain control numbers GA0 to GA11. In the present example, the difference between the maximum and minimum values is equal to 1, and thus it can be represented by 1 bit (and thus the necessary number of bits is 1). Therefore, the values obtained by extracting the minimum value from the respective gain control numbers GA can be represented by 1 bit (equal to the necessary number of bits).

In step S44, the data indicating the minimum value detected in step S41, the data indicating the necessary number of bits calculated in step S42, and the codes, expressed using as many bits as the necessary number of bits, of gain control numbers GA0 to GA11 determined in step S43 are output from the encoder 81-4 to the terminal connected the switch 83.

In the example shown in FIG. 22, 3-bit data indicating the minimum value (=1), 2-bit data indicating the necessary number of bits (1 bit), and 12 codes represented in 1 bit (equal to the necessary number of bits) are output, as shown in FIG. 23.

In the next step S45, the encoder 81-4 calculates the sum of the numbers of bits of the encoded gain control numbers GA0 to GA11 and outputs the calculated sum to the decision unit 82.

For example, in the case of gain control numbers GA shown in FIG. 22, 2-bit data indicating the necessary number of bits, 3-bit data indicating the minimum value, and 12 1 bit (necessary number of bits) codes are generated as the result of the encoding, and thus a signal indicating that the total number of bits is equal to 17 is supplied to the decision unit 82.

If the conventional fixed-length (3-bit) encoding method were employed, the gain control numbers GAR in the example shown in FIG. 22 would be encoded into codes with a total of 36 (=3×12) bits. Thus, the total number of bits of encoded data according to the present invention is smaller by 19 than that according to the conventional technique.

The encoding method employed by the encoder 81-5 is described.

Figure 24:
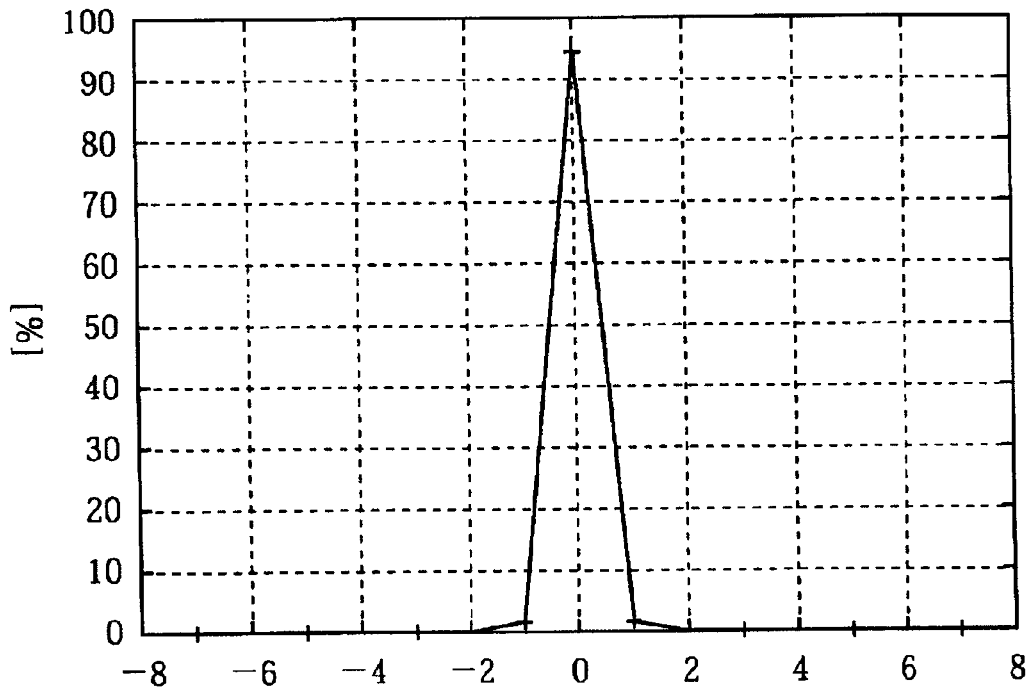
FIG. 24 is a graph showing a characteristic of a difference value WA1.

In most cases, in the stereo audio signal, the gain control number GALi of the left-channel signal and the gain control number GARi of the right-channel signal in the same frequency band are equal or close to each other. Therefore, the absolute value of the difference value WA1 obtained by subtracting the gain control number GALi from the gain control number GARi has a high probability of becoming equal or close to 0, as shown in FIG. 24.

In view of the above, the encoder 81-5 encodes the gain control number GAL or GAR in such a manner that codes with small numbers of bits are assigned to difference values WA1 having high occurrence probabilities. That is, either the gain control number GAL or the gain control number GAR is encoded by means of the above method, and the other is encoded by means of, for example, the conventional encoding method.

Figure 25:
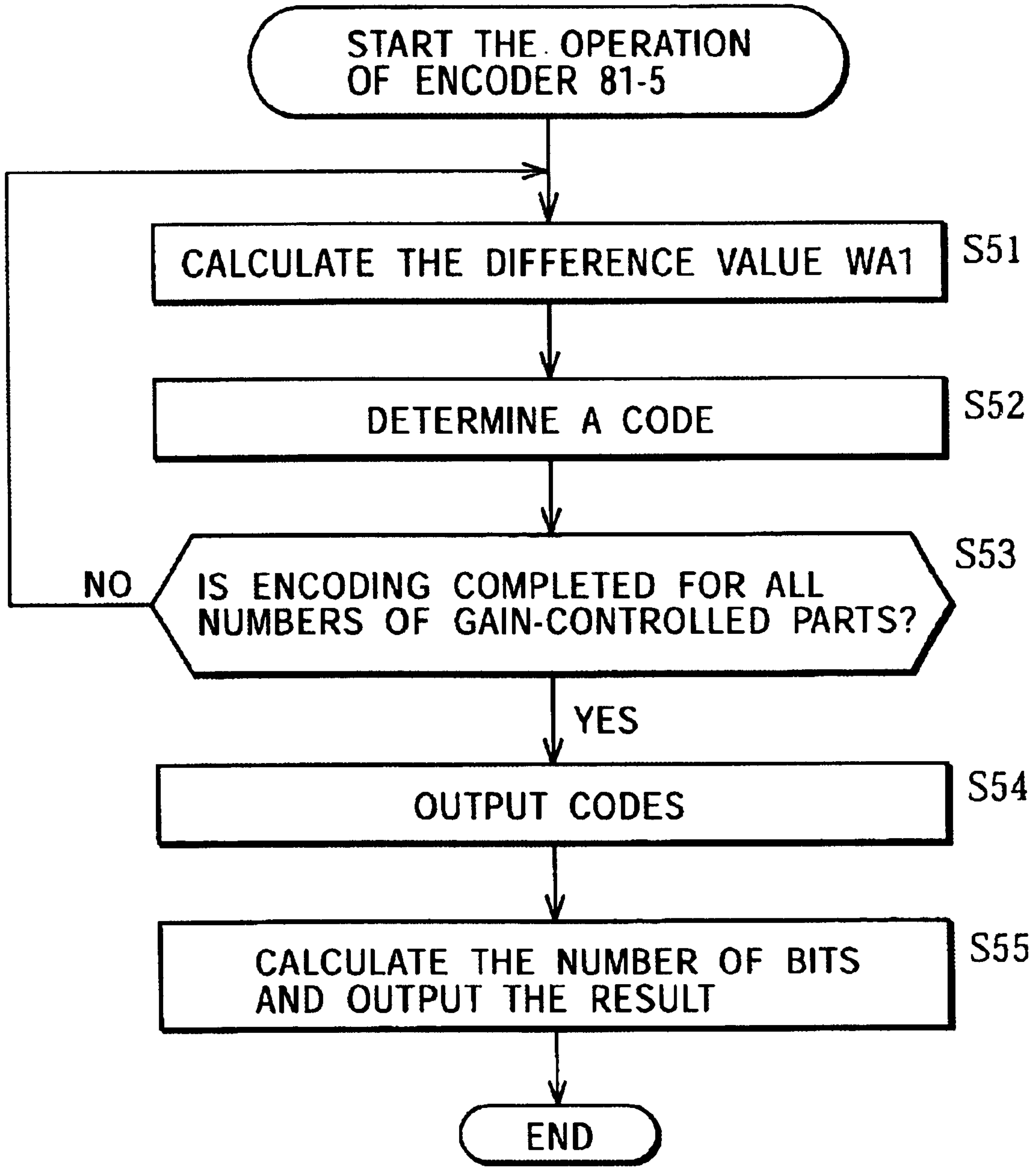
FIG. 25 is a diagram showing an encoding method employed by the encoder 81-5.

The operation of the encoder 81-5 is described below with reference to a flow chart shown in FIG. 25. Herein, it is assumed that the encoder 81-5 encodes the gain control number GAR.

In step S51, the encoder 81-5 detects a gain control number GALi and a gain control number GARi of one frequency band from the input gain control information GL0 to GL11 of the left-channel signal and gain control information GR0 to GR11 of the right-channel signal, respectively, and calculates the difference value WA1 by subtracting the gain control number GALi from the gain control number GARi.

Hereinafter, for simplicity, the difference value WA1 obtained by subtracting the gain control number GALi from the gain control number GARi will be referred to simply as the difference value WA1 of the gain control number GARi.

For example, in the case of the gain control numbers GAR0 to GAR11 shown in FIG. 26, the difference value WA1 of the gain control number GAR0 is calculated as −1 (=gain control number GAR0 (=1)−gain control number GAL0 (=2)).

In the next step S52, the encoder 81-5 retrieves a code corresponding to the difference value WA1 calculated in step S51 from a table similar to that shown in FIG. 18 and employs the retrieved code as the code of the gain control number GARi.

For example, in the case of the gain control number GAR0, because the difference value WA1 thereof is −1, and thus a 3-bit code "110" is employed as the code for the gain control number GAR0.

In step S53, the encoder 81-5 determines whether codes have been determined for all gain control numbers GAR0 to GAR11, that is, whether all gain control numbers GAR0 to GAR11 have been encoded. If it is determined that all gain control numbers GAi have not been encoded, the process returns to step S51 to perform the step S51 and following steps to encode a next unencoded gain control number GARi.

If it is determined in step S53 that all gain control numbers GAR0 to GAR11 have been encoded, the process proceeds to step S54. In step S54, the encoder 81-5 outputs the codes determined in step S52 for the respective gain control numbers GAR0 to GAR11 to the terminal connected to the switch 83.

In the next step S55, the encoder 81-5 calculates the sum of the numbers of bits of the gain control numbers GAR0 to GAR11 and outputs the calculated sum to the decision unit 82.

For example, the gain control numbers GAR shown in FIG. 26 are encoded into codes with as many bits as shown in FIG. 26, and thus the total number of bits of the codes becomes equal to 14. Thus, a signal indicating that the total number of bits is equal to 14 is supplied to the decision unit 82.

If the conventional fixed-length (3-bit) encoding method were employed, the gain control numbers GAL in the example shown in FIG. 26 would be encoded into codes with a total of 36 (=3×12) bits. Thus, the total number of bits of encoded data according to the present invention is smaller by 22 than that according to the conventional technique.

In the encoding table (FIG. 18) employed in the present example, some values are encoded using escape codes. Alternatively, specific codes corresponding to respective values may be defined in the table for all values.

In the present example, the difference value WA1 is assumed to have such a characteristic shown in FIG. 24. In a case in which the characteristic of the difference value WA1 varies from one encoding unit Ai to another, the coding table may be switched depending on the characteristic of the difference value WA1.

Now, the encoding method employed by the encoder 81-6 is described.

In the stereo audio signal, the gain control number GALi of the left-channel signal and the gain control number GARi of the right-channel signal in the same frequency band often become equal to each other. For example, in FIG. 27, a gain control number GAL2 (=1) of the gain control numbers GAL0 to GAL11 is equal in value to a gain control number GAR2 (=1) of the gain control numbers GAR0 to GAR11.

In view of the above, the encoder 81-6 performs encoding in such a manner that either gain control numbers GAL0 to GAL11 or gain control numbers GAR0 to GAR11 are encoded into fixed-length codes, and, in encoding of the other set of gain control numbers, for any gain control number GALi or GARi which is equal in value to a counterpart, only an encoding flag set to a value (0, in this case) indicating equality of the gain control number is encoded.

Figure 28:
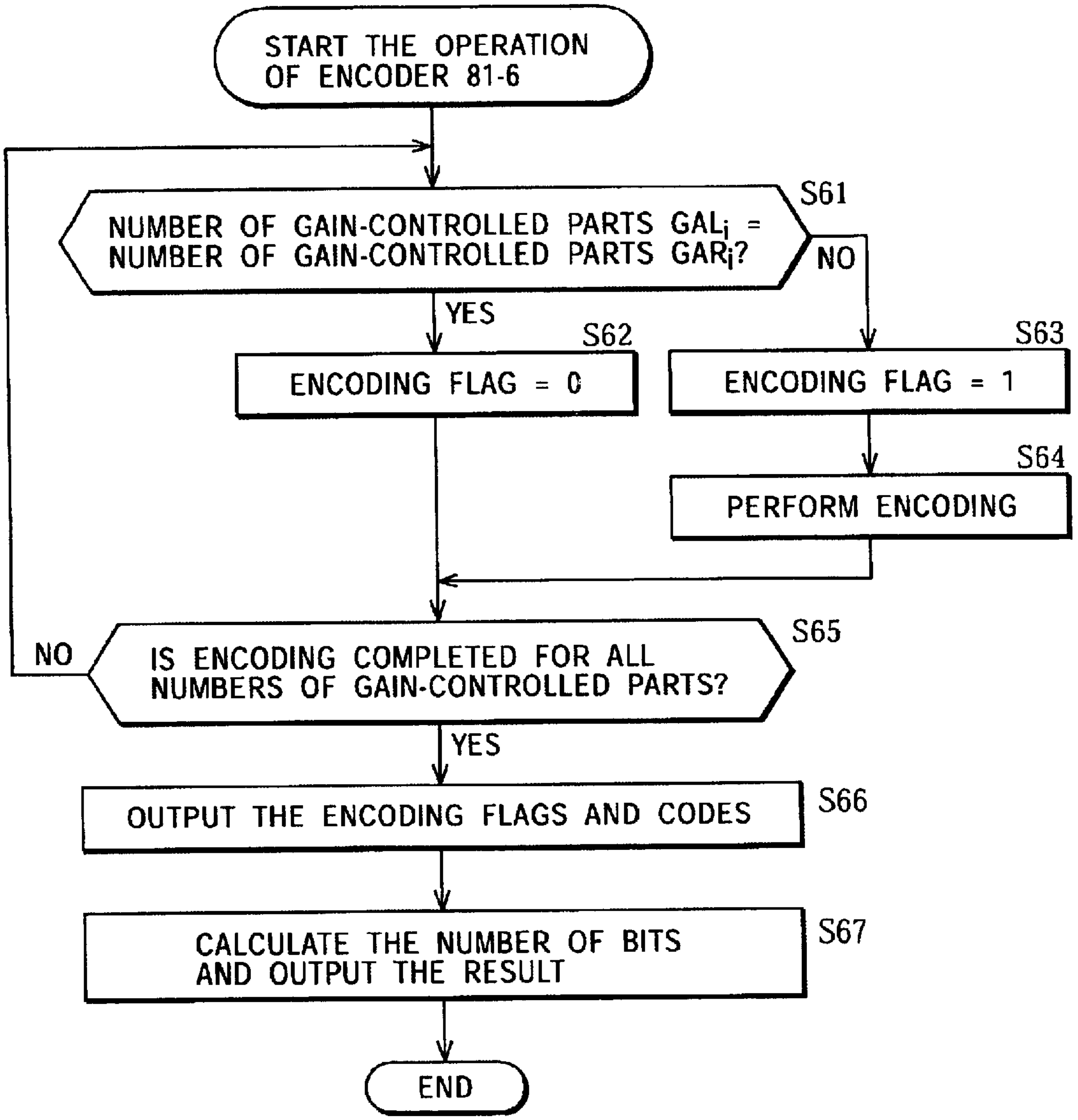
FIG. 28 is a flow chart showing the operation of an encoder 81-6.

In the case in which gain control numbers GAL are encoded into codes with a fixed bit length, coding of gain control numbers GAR is performed in a manner described below with reference to a flow chart shown in FIG. 28.

In step S61, the encoder 81-6 detects a gain control number GALi and a gain control number GARi in the same frequency band from the input gain control information GL0 to GL11 of the left-channel signal and gain control information GR0 to GR11 of the right-channel signal, respectively, and determines whether the detected gain control number GALi and gain control number GARi are equal in value to each other. If it is determined that they are equal to each other, the process proceeds to step S62.

In step S62, the encoder 81-6 sets the encoding flag associated with the gain control number GARi to 0. In the specific example shown in FIG. 27, the gain control number GAL2 (=1) is equal in value to the gain control number GAR2 (=1), and thus the encoding flag associated with the gain control number GAR2 is set to 0.

However, in a case in which it is determined in step S61 that the gain control number GALi and the gain control number GARi-1 are not equal in value to each other, the process proceeds to step S63. In step S63, the encoder 81-6 sets the encoding flag associated with the gain control number GARi to 1. In step S64, the encoder 81-6 encodes the gain control number GARi into a code with a fixed bit length (3 bits).

In the example shown in FIG. 27, a gain control number GAL0 (=1) and a gain control number GAR0 (=4) are not equal in value to each other, and thus the encoding flag associated with the gain control number GAR0 is set to 1, and a 3-bit code representing a value of 4 is assigned to the gain control number GAR0.

After step S62 in which the encoding flag is set to 0, or after step S64 in which the gain control number GARi is encoded into a 3-bit code, the process proceeds to step S65. In step S65, the encoder 81-6 determines whether all encoding flags have been set to 0 or 1 and all gain control numbers GAR corresponding to the encoding flags set to 1 have been encoded into 3-bit codes, that is, the encoder 816 determines whether all gain control numbers GAR0 to GAR11 have been encoded. If it is determined that all gain control numbers GARi have not been encoded, the process returns to step S61 to perform the step S61 and following steps to encode a next unencoded gain control number GARi.

If it is determined in step S65 that all gain control numbers GAR0 to GAR11 have been encoded, the process proceeds to step S66. In step S66, the encoder 81-6 outputs the encoding flag set to 0 or 1 and the codes to the terminal connected to the switch 83.

In the next step S67, the encoder 81-6 calculates the sum of the numbers of bits of the encoded gain control numbers GAR0 to GAR11 and outputs the calculated sum to the decision unit 82.

In the example shown in FIG. 27, as a result of encoding of the gain control numbers GAR, 12 1-bit encoding flags and a 3-bit code associated with the gain control number GAR0 are generated, and thus a signal indicating that the total number of bits is equal to 15 is supplied to the decision unit 82.

If the conventional fixed-length (3-bit) encoding method were employed, the gain control numbers GAR in the example shown in FIG. 27 would be encoded into codes with a total of 36 (=3×12) bits. Thus, the total number of bits of encoded data according to the present invention is smaller by 21 than that according to the conventional technique.

Although in the present embodiment, when the gain control number GAi-1 and the gain control number GAi are not equal in value to each other, the gain control number GAi is encoded into a code with the fixed bit length, the encoding may be performed according to another method.

The encoding method employed by the encoder 81-7 is described.

In the stereo audio signal, as shown in FIG. 29, the gain control numbers GAL0 to GAL11 of the left-channel signal often become equal to corresponding gain control numbers GAR0 to GAR11 of the right-channel signal in the same frequency band.

In view of the above, the encoder 81-7 encodes either gain control numbers GAL0 to GAL11 or gain control numbers GAR0 to GAR11 into codes with a fixed bit length. However, when the gain control numbers GAL0 to GAL11 and the corresponding gain control numbers GAR0 to GAR11 are equal to each other, encoding of the other set of gain control numbers is not performed.

Figure 30:
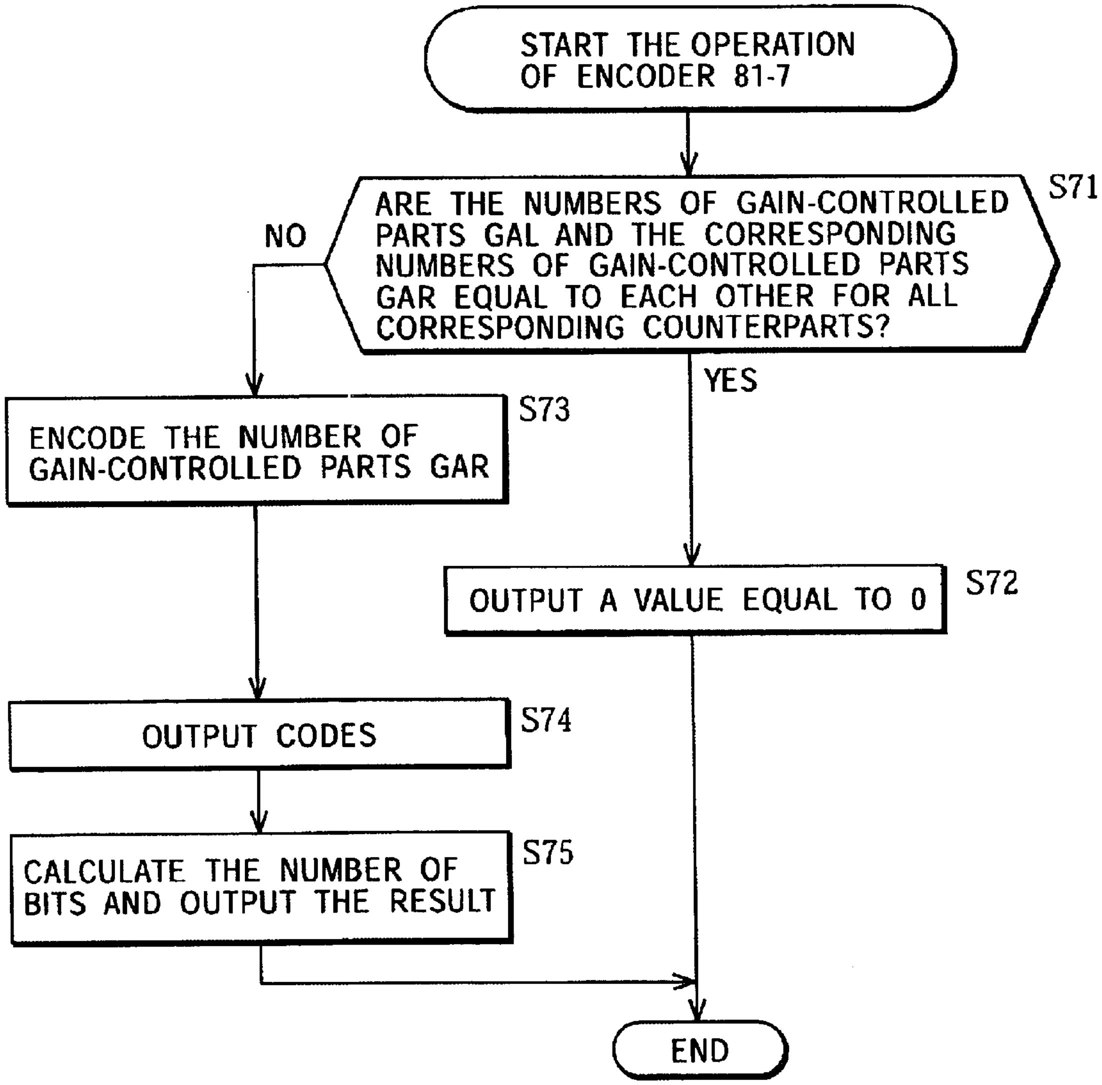
FIG. 30 is a flow chart showing the operation of an encoder 81-7.

When gain control numbers GAL are encoded into codes with the fixed bit length, coding of gain control numbers GAR is performed in a manner described below with reference to a flow chart shown in FIG. 30.

In step S71, the encoder 81-7 detects gain control numbers GAL0 to GAL11 and gain control numbers GAR0 to GAR11 from the input gain control information GL0 to GL11 of the left-channel signal and gain control information GR0 to GR11 of the right-channel signal, respectively. The encoder 81-7 then determines whether the gain control numbers GAL0 to GAL11 and the gain control numbers GAR0 to GAR11 are all equal to each other between corresponding counterparts. If it is determined that they are all equal to each other as is the case in the example shown in FIG. 29, the process proceeds to step S72.

In step S72, the encoder 81-7 does not encode the gain control numbers GAR but the encoder 81-7 outputs a value of 0 indicating that the number of bits of codes is equal to 0 to the decision unit 82.

In a case in which it is determined in step S71 that the gain control numbers GAL0 to GAL11 and the gain control numbers GAR0 to GAR11 are not all equal to each other between corresponding counterparts, the process proceeds to step S73. In step S73, the encoder 81-7 encodes the gain control numbers GAR0 to GAR11 into 3-bit codes.

In the next step S74, the encoder 81-7 outputs the resultant codes of the respective gain control numbers GAL0 to GAL11 to the terminal connected to the switch 83.

In step S75, the encoder 81-7 calculates the sum of the numbers of bits of the encoded gain control numbers GAL0 to GAL11 and outputs the calculated sum to the decision unit 82.

In the example shown in FIG. 29, the total number of bits of the codes of the gain control numbers GAL is equal to 36 (=3×12). Thus, a signal indicating that the total number of bits is equal to 36 is supplied to the decision unit 82.

After step S72 or step S75, the process performed by the encoder 81-7 is completed.

If the conventional fixed-length (3-bit) encoding method were employed, the gain control numbers GAR in the example shown in FIG. 29 would be encoded into codes with a total of 36 (=3×12) bits. Thus, when the gain control numbers GAR are not encoded, the total number of bits of encoded data according to the present invention is smaller by 36 than that according to the conventional technique.

The encoding method employed by the encoder 81-8 is described.

As described earlier with reference to FIG. 15, the difference value VA obtained by subtracting a gain control number GAi-1 of a lower frequency band immediately adjacent to the frequency band of a gain control number GAi from the gain control number GAi often becomes equal to a particular value.

Furthermore, in the case of stereo audio signals, as described earlier with reference to FIG. 24, the difference value WA1 obtained by subtracting a gain control number GALi from a gain control number GARi in the same frequency band has a high probability of becoming equal to a particular value.

Figure 31:
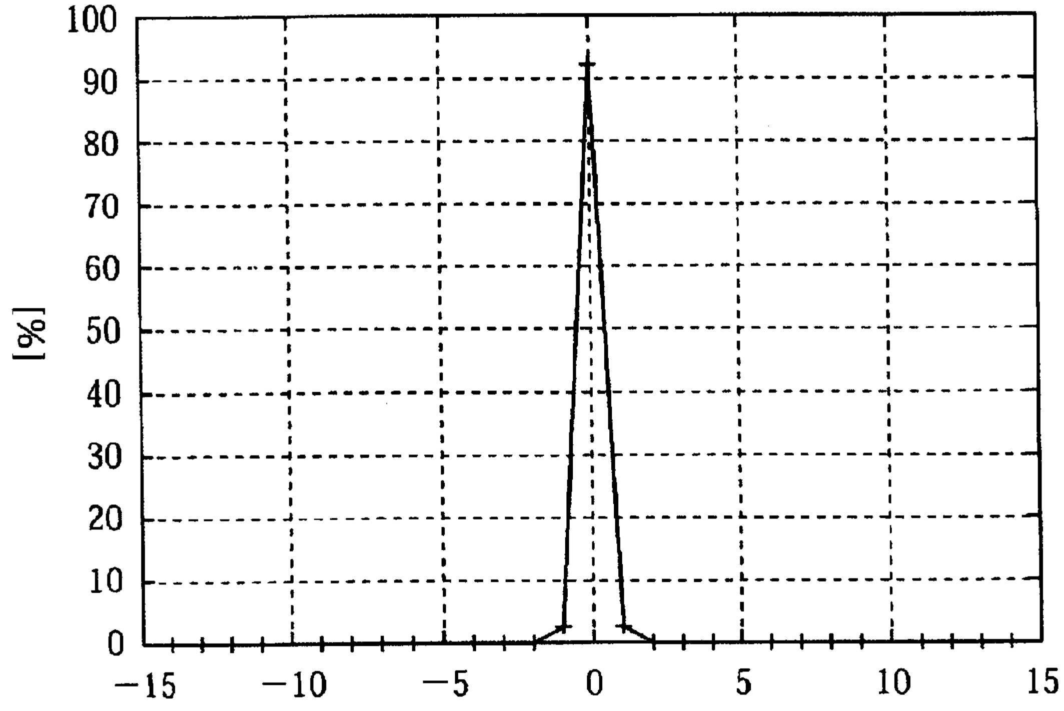
FIG. 31 is a graph showing a characteristic of a difference value WA2.

That is, the absolute value of the difference value WA2 obtained by subtracting the difference value VA of the gain control number GARi from the difference value VA of the gain control number GALi has a high probability of becoming equal or nearly equal to 0, as shown in FIG. 31.

In view of the above, the encoder 81-8 encodes the gain control number GA in such a manner that either gain control numbers GAL0 to GAL11 or gain control numbers GAR0 to GAR11 are encoded, and codes with small numbers of bits are assigned to gain control numbers GA corresponding to difference values WA2 having high occurrence probabilities.

Figure 32:
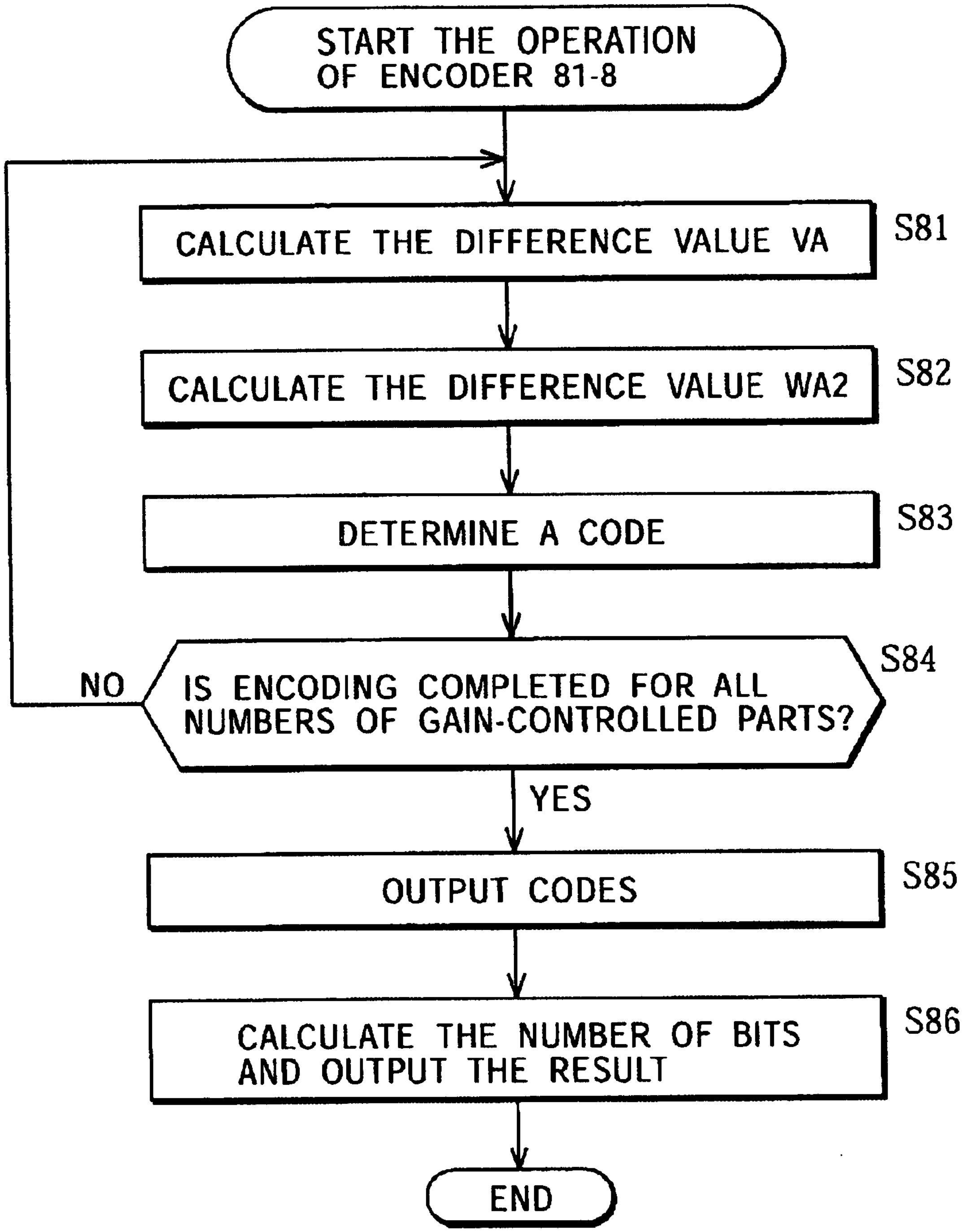
FIG. 32 is a flow chart showing the operation of an encoder 81-8.

The operation of the encoder 81-8 is described below with reference to a flow chart shown in FIG. 32. Herein, it is assumed that the encoder 81-7 encodes the gain control number GAR.

In step S81, the encoder 81-8 detects a gain control number GALi and a gain control number GARi in the same frequency band from the input gain control information GL0 to GL11 of the left-channel signal and gain control information GR0 to GR11 of the right-channel signal, respectively, and determines the difference value VA of the gain control number GALi by subtracting the gain control number GALi-1 of the encoding unit ALi-1, which was detected in previous execution of step S81, from the gain control number GALi.

The encoder 81-8 also determines the difference value VA of the gain control number GARi by subtracting the gain control number GARi-1 of the encoding unit ARi-1, which was detected in previous execution of step S81, from the gain control number GARi.

For example, in the case of gain control numbers GA0 to GA11 shown in FIG. 33, the difference value VA of the gain control number GAL1 (=1) is calculated as −1 (=gain control number GAL1 (=1)−gain control number GAL0 (=2)) (not shown), and the difference value VA of the gain control number GAR1, of the gain control numbers GAR0 to GAR11, is calculated as 0 (=gain control number GAR1 (=1)−gain control number GAR0 (=1)) (not shown).

In the next step S82, the encoder 81-8 calculates the difference value WA2 by subtracting the difference value VA of gain control number GARi from the difference value VA of the gain control number GALi.

For example, the difference value WA2 of the gain control number GAR1 is calculated as −1 (=gain control number GAL1 (=−1)−gain control number GAR1 (=0)).

Figures 34, 35:
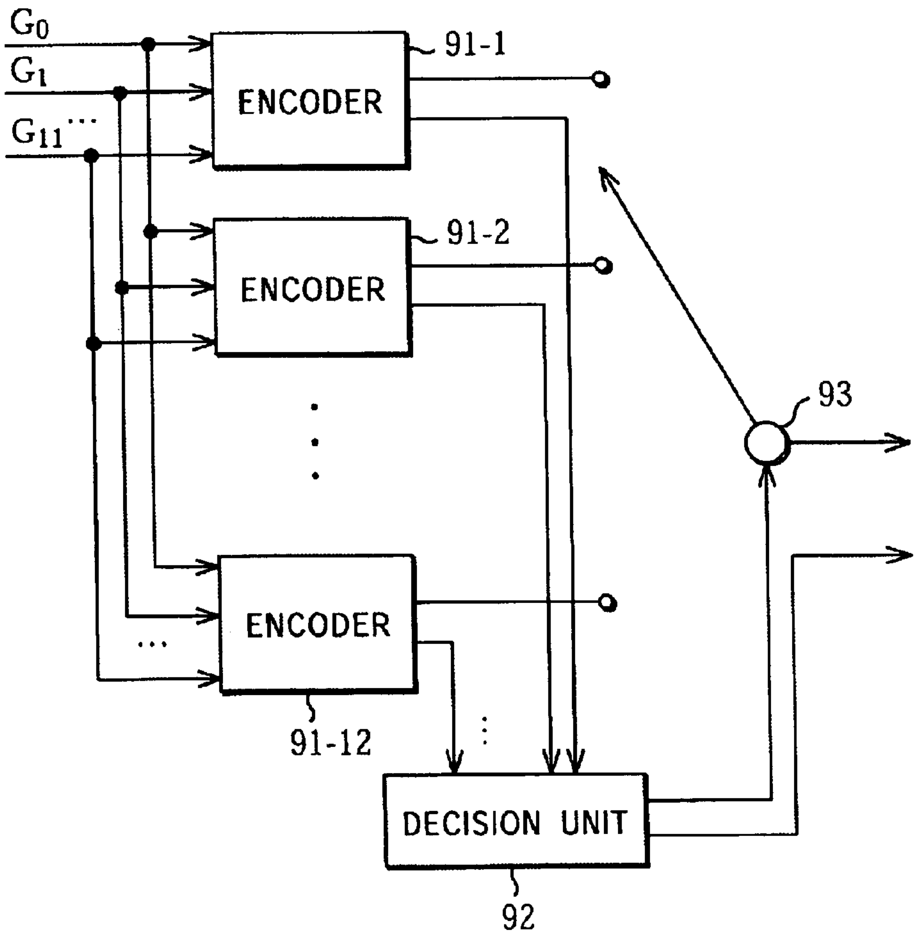
FIG. 34 shows another table in which a value-code correspondence and a procedure of determining codes for particular values are represented.
FIG. 35 is a block diagram showing an example of a construction of a gain control amount information encoder 72 shown in FIG. 8.

In the next step S83, the encoder 81-8 retrieves a code corresponding to a value equal to the difference value WA2 calculated in step S82 from a table shown in FIG. 34 and employs the retrieved code as the code of the gain control number GARi.

For example, in the case of the gain control number GAR1, the difference value WA2 thereof is equal to −1 and thus a 2-bit code of "10" is employed as the code for the gain control number GAR1.

In the table shown in FIG. 34, a 2-bit code "10" is assigned to a value −1, a 1-bit code "0" to a value 0, and a 3-bit code "110" to a value 1.

Furthermore, in the table shown in FIG. 34, a procedure of determining a code for a value other than the value of −1 to 1 is defined (more specifically, the code is given by a formula 111+original value). According to this procedure, a 6-bit code is given by a combination of a 3-bit code "111" and a following 3-bit code having a value equal to the gain control number GA (original value, the gain control number GAR in this specific case).

Referring again to FIG. 32, in step S84, the encoder 81-8 determines whether codes have been determined for all gain control numbers GAR0 to GAR1, that is, whether all gain control numbers GAR0 to GAR11 have been encoded. If it is determined that all gain control numbers GARi have not been encoded, the process returns to step S81 to perform the step S81 and following steps to encode a next unencoded gain control number GARi.

If it is determined in step S84 that all gain control numbers GAR0 to GAR11 have been encoded, the process proceeds to step S85. In step S85, the encoder 81-8 outputs the codes determined in step S83 for the respective gain control number GAR0 to GAR11 to the terminal connected to the switch 83.

In the next step S86, the encoder 81-8 calculates the sum of the numbers of bits of the encoded gain control numbers GAR0 to GAR11 and outputs the calculated sum to the decision unit 82.

For example, the gain control numbers GAR shown in FIG. 33 are encoded into codes with numbers of bits such as those shown in FIG. 33, and thus the total number of bits of the codes becomes equal to 17. Thus, a signal indicating that the total number of bits is equal to 17 is supplied to the decision unit 82.

If the conventional fixed-length (3-bit) encoding method were employed, the gain control numbers GAR in the example shown in FIG. 33 would be encoded into codes with a total of 36 (=3×12) bits. Thus, the total number of bits of encoded data according to the present invention is smaller by 19 than that according to the conventional technique.

Although in the encoding table (FIG. 34) used in the present example, escape codes are used for some values, specific codes including no escape codes may be assigned to all respective values.

In the present example, the difference value WA2 is assumed to have such a characteristic shown in FIG. 31. In a case in which the characteristic of the difference value WA2 varies from one encoding unit Ai to another, the coding table may be switched depending on the characteristic of the difference value WA2.

In addition to above-described various methods employed by the gain control number encoder 71 to encode the gain control number, there may be provided an additional encoder for encoding the gain control number into a code with a fixed bit length according to the conventional technique.

Now, the gain control amount information encoder 72 (FIG. 8) of the gain control information encoder 61 is described. FIG. 35 shows an example of a construction of the gain control amount information encoder 72.

The gain control information G0 to G11 output from the spectrum converters 12-1 to 12-4 are input to each of 12 encoders 91-1 to 91-12.

The encoders 91-1 to 91-12 detect gain control amount information GB0 to GB11 from the respective input gain control information G0 to G11 and encode the detected gain control amount information GB0 to GB11 by means of predetermined encoding methods. Resultant encoded data are output to terminals connected to switch 93.

Each of the encoders 91-1 to 91-12 calculates the sum of the numbers of bits of the encoded gain control numbers GB0 to GB11 and outputs the calculated sum to the decision unit 92.

The decision unit 92 detects, among encoders 91-1 to 91-12, an encoder 91 which has output a smallest sum, that is, the decision unit 92 detects an encoder 91 which has encoded the gain control numbers GB0 to GB11 into a smallest total number of bits, and the decision unit 92 controls the switch 93 so that the encoded gain control numbers GB0 to GB11 encoded by the detected encoder 91 are output to the multiplexer 16. The decision unit 92 outputs information indicating the encoding method employed by the detected encoder 91 to the multiplexer 16. The decision unit 92 stores information indicating the encoding methods employed by the respective encoders 91.

The encoding methods employed by the respective encoders 91-1 to 91-12 are described.

First, the encoding method employed by the encoder 91-1 is described.

Figure 36:
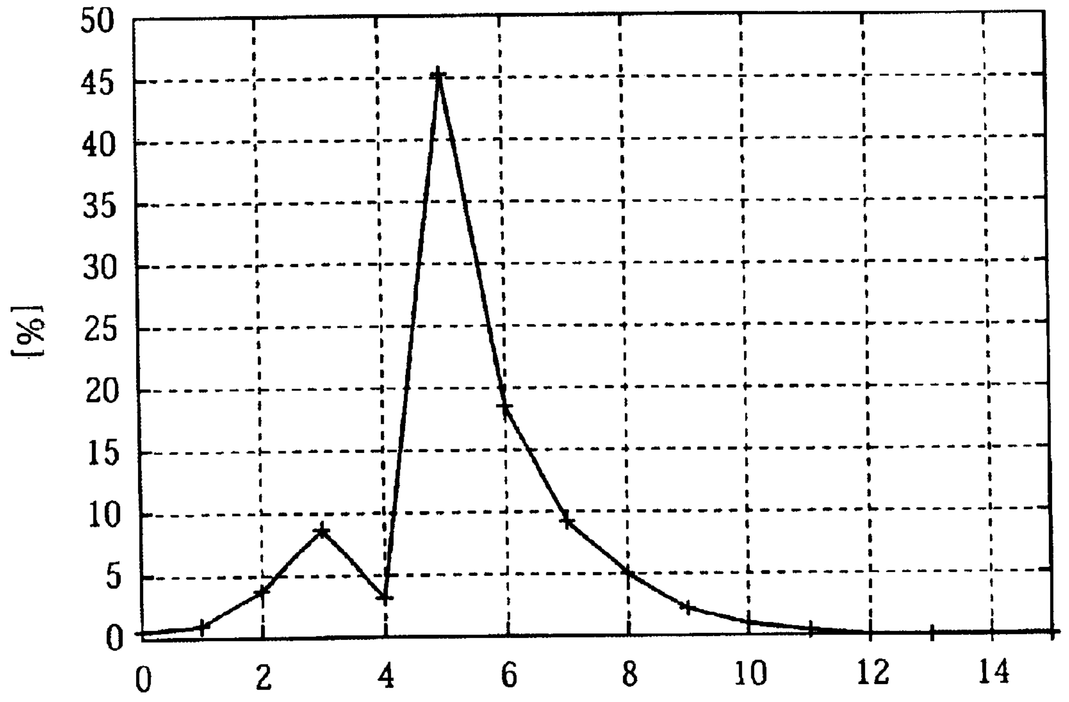
FIG. 36 is a graph showing a characteristic of gain control amount information GB.

In the present example, gain control amount information GB in gain control information G has a 4-bit value serving as an index indicating a gain control amount, and the value of the gain control amount information GB has a high probability of becoming equal to a particular value (such as 3, 5, 6, or 7) as shown in FIG. 36. In view of the above, the encoder 91-1 encodes gain control amount information GB such that codes with small numbers of bits are assigned to values having high probabilities of occurring as gain control amount information GB.

The operation of the encoder 91-1 is described below with reference to a flow chart shown in FIG. 37.

In step S101, the encoder 91-1 detects gain control amount information GBi (i=0, 1, 2, . . . , 11) of one frequency band from the input gain control information G0 to G11.

In the next step S102, the encoder 91-1 determines a code to be assigned to the gain control number GBi. More specifically, the encoder 91-1 retrieves a code corresponding to the gain control amount information GBi from a table shown in FIG. 38 and employs the retrieved code as the code of the gain control amount information GBi.

For example, in the case of gain control amount information GB2 of gain control amount information GB0 to GB11 shown in FIG. 39, the gain control amount information GB2 has a value of 7, and thus a 3-bit code "101" is employed as the code of the gain control amount information GB2.

Figures 37, 38:
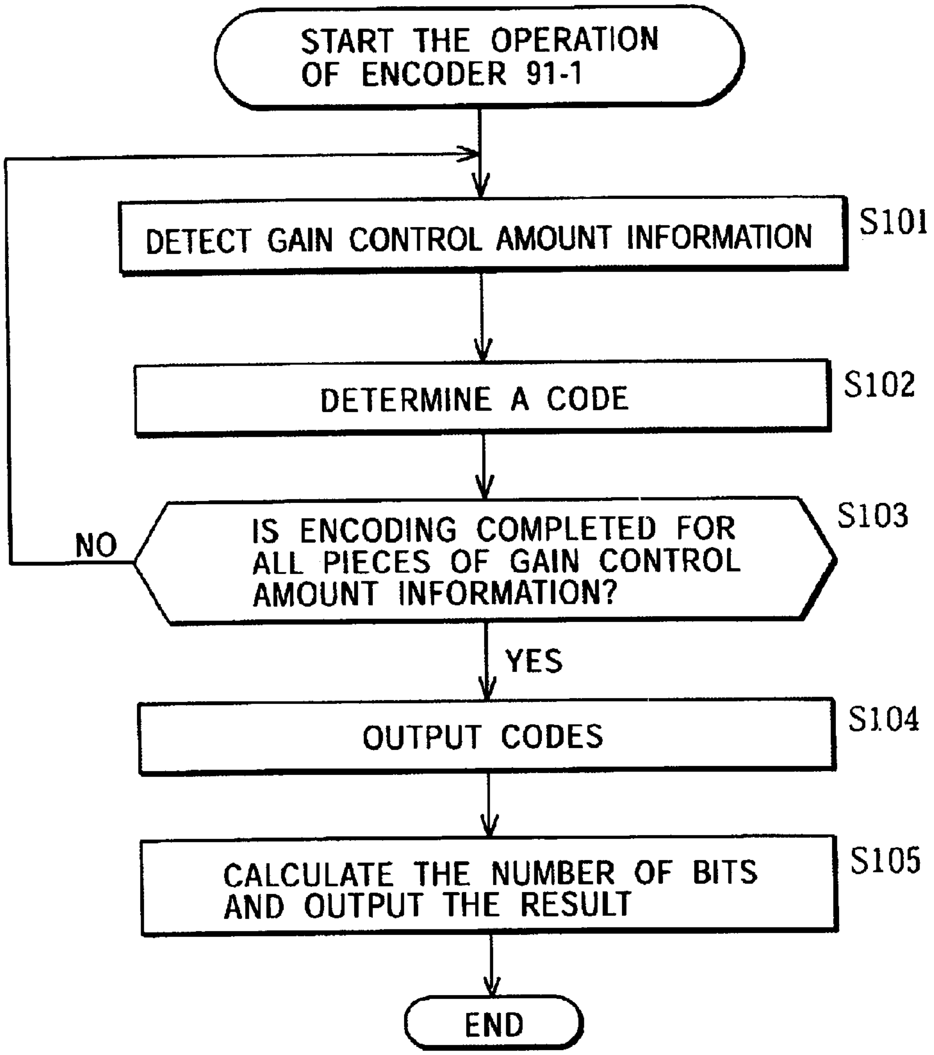
FIG. 37 is a flow chart showing the operation of an encoder 91-1.
FIG. 38 shows another table in which a value-code correspondence and a procedure of determining codes for particular values are represented.

In the table shown in FIG. 38, a 3-bit code "110" is assigned to a value 3, a 1-bit code "0" to a value 5, a 3-bit code "100" to a value 6, and a 3-bit code "101" to a value 7. Thus, if the encoder 91-1 detects gain control amount information GBi having a value 3, 5, 6, or 7, encoder 91-1 selects "110", "10", "100", or "101" corresponding to the value of the gain control amount information GBi and employs it as the code of the gain control amount information GBi.

Furthermore, in the table shown in FIG. 38, a procedure of determining a code for a value other than 3, 5, 6, and 7 is defined (more specifically, the code is given by a formula 111+original value). According to this procedure, a 7-bit code is given by a combination of a 3-bit code "111" (escape code) and a following 4-bit code indicating the gain control amount information GBi (original value). That is, if the encoder 91-1 detects gain control amount information GBi having a value other than 3, 5, 6, and 7, the encoder 91-1 determines a 7-bit code via the above-described procedure and employs it as the code for the gain control amount information GBi.

In the next step S103, the encoder 91-1 determines whether codes have been determined for all gain control amount information GB0 to GB11, that is, whether all gain control amount information GB0 to GB11 have been encoded. If it is determined that all pieces of gain control amount information GBi have not been encoded, the process returns to step S101 to perform the step S101 and following steps to encode next unencoded gain control amount information GBi.

If it is determined in step S103 that all gain control amount information GB0 to GB11 have been encoded, the process proceeds to step S104. In step S104, the encoder 91-1 outputs the codes determined in step S102 for the respective gain control amount information GB0 to GB11 to the terminal connected to the switch 93.

In the next step S105, the encoder 91-1 calculates the sum of the numbers of bits of the encoded gain control numbers GB0 to GB11 and outputs the calculated sum to the decision unit 92.

For example, the respective pieces of gain control amount information GB shown in FIG. 39 are encoded into codes with numbers of bits such as those as shown in FIG. 39, and thus the total number of bits of the codes becomes equal to 25. Thus, a signal indicating that the total number of bits is equal to 25 is supplied to the decision unit 92.

If the conventional fixed-length (4-bit) encoding method were employed, the gain control amount information GB in the example shown in FIG. 39 would be encoded into codes with a total of 52 (=4×13) bits. Thus, the total number of bits of encoded data according to the present invention is smaller by 27 than that according to the conventional technique.

Although in the coding table (FIG. 38) used in the present example, escape codes are used for some values, specific codes including no escape code may be assigned to all respective values. In the present example, the gain control amount information GB is assumed to have such a characteristic shown in FIG. 36. In the case in which the characteristic of the gain control amount information GB varies from one encoding unit Ai to another, the coding table may be switched depending on the characteristic of the gain control amount information GB.

In the case in which a waveform signal in a block includes one attack portion AT and one release portion RE, two pieces of gain control amount information GB having values corresponding to the level of a semi stationary portion SS and the level of the release portion RE, respectively, are produced. For the reason described above, there can be plural pieces of gain control amount information GBi in one frequency band (in the example shown in FIG. 39, there are two pieces of gain control amount information GB1 (with values of 6 and 5, respectively)). Similarly, also in the case of gain control position information GC which will be described later, there can be plural pieces of gain control position information GC in one frequency band.

In the present description, when there are plural pieces of gain control amount information GBi, gain control amount information GBi indicating a gain control amount corresponding to the level of a part at an earlier position in a block is described first and gain control amount information GBi indicating a gain control amount corresponding to the level of a following part in the block is described at a location on the right side of the description of the preceding part (as for the gain control amount information GB1 in the example shown in FIG. 39, a value of 6 is first described and 5 is described following 6). Hereinafter, of plural pieces of gain control amount information GBi, gain control amount information GBi described at the leftmost location (6 of gain control amount information GB1 in the example shown in FIG. 39) will be referred to as first gain control amount information GBi, and pieces of gain control amount information GBi described one after another to the right following the first gain control amount information GBi will be referred to as second gain control amount information GBi, third gain control amount information GBi, and so on. As for gain control position information GC, plural pieces of gain control position information GC will be denoted in a similar manner.

The encoding method employed by the encoder 91-2 is described.

Figure 41:
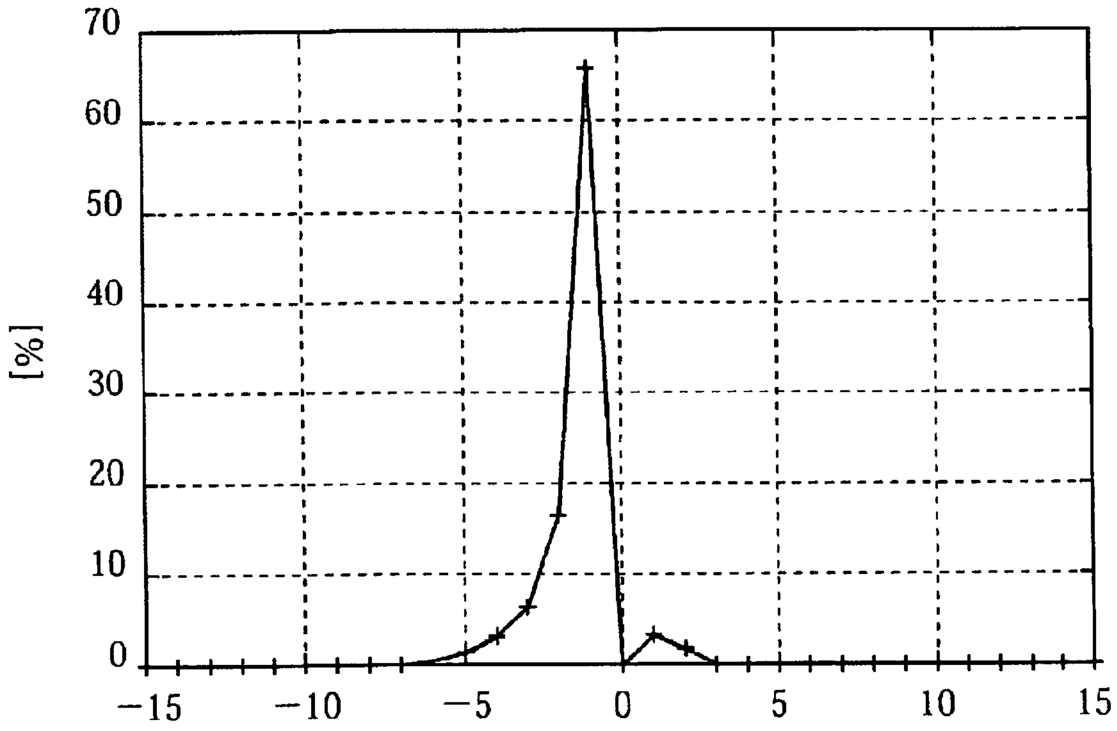
FIG. 41 is a graph showing a characteristic of a difference value VB1.

In the case in which there are plural pieces of gain control amount information GBi as with gain control amount information GB1 shown in FIG. 39 or gain control amount information GB (except for gain control amount information GB4) shown in FIG. 40, the difference value VB1 obtained by subtracting Nth gain control amount information GBi from (N+1)th gain control amount information GBi has a high probability of becoming equal to a particular value (for N=1, 2, . . . ) as shown in FIG. 41.

In view of the above, the encoder 91-2 encodes the gain control amount information GB in such a manner that codes with small numbers of bits are assigned to difference values VB1 having high occurrence probabilities.

The operation of the encoder 91-2 is described below with reference to a flow chart shown in FIG. 42.

In step S111, the encoder 91-2 detects gain control amount information GBi (i=0, 1, 2, . . . , 11) from the input gain control information G0 to G11 and calculates the difference value VB1 by subtracting Nth gain control amount information GBi of gain control amount information GBi from (N+1)th gain control amount information GBi.

Hereinafter, for simplicity, the difference value VB1 obtained by subtracting the Nth gain control amount information GBi from the (N+1)th gain control amount information GBi will be referred to simply as the difference value VB1 of the (N+1)th gain control amount information GBi.

For example, in the case of gain control amount information GB0 in the example shown in FIG. 40, the difference value VB1 of second gain control amount information GB0 (=5) is given by a value (=−2) obtained by subtracting first gain control amount information GB0) (=7) from the second gain control amount information GB0 (=5), and the difference value VB1 of third gain control amount information GB0 is given by a value (=−1) obtained by subtracting the second gain control amount information GB0) (=5) from the third gain control amount information GB0 (=4).

Referring again to FIG. 42, the encoder 91-2 determines, in step S112, a code to be assigned to the gain control amount information GBi.

More specifically, the encoder 91-2 retrieves a code corresponding to the first gain control amount information GBi of the plural pieces of gain control amount information GBi from a table similar to that shown in FIG. 38 and employs the retrieved code as the code of the first gain control amount information GBi.

For example, in the example shown in FIG. 40, a 3-bit code "101 is employed as the code of first gain control amount information GB0 (=7) of gain control amount information GB0.

Figures 42, 43:
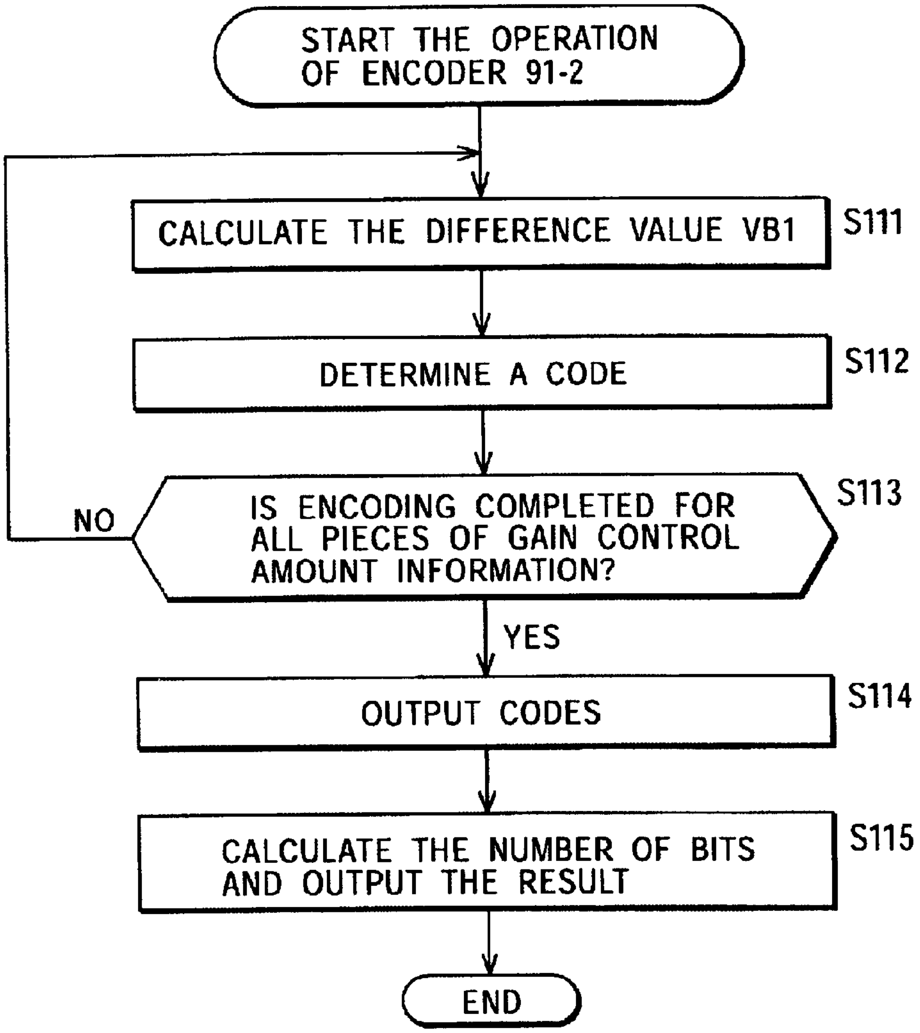
FIG. 42 is a flow chart showing the operation of an encoder 91-2.
FIG. 43 shows another table in which a value-code correspondence and a procedure of determining codes for particular values are represented.

The encoder 91-2 also retrieves a code corresponding to a value equal to the difference value VB1 from a table shown in FIG. 43 and employs the retrieved code as the code of the (N+1)th gain control amount information GBi corresponding to the difference value VB1.

For example, in the case of gain control amount information GB0 in the example shown in FIG. 40, the difference value VB1 of second gain control amount information GB0 (=5) is −2, and thus a 2-bit code "10" is employed as the code of the second gain control amount information GB0. As for third gain control amount information GB0 (=4), the difference value VB1 thereof is −1, and thus a 1-bit code "0" is employed as the code thereof.

In the table shown in FIG. 43, a 5-bit code "11100" is assigned to a value −4, a 3-bit code "110" to a value −3, a 2-bit code "10" to a value −2, a 1-bit code "0" is assigned to a value −1, and a 5-bit code "111101" to a value 1.

Furthermore, in the table shown in FIG. 43, a procedure of determining a code for a value other than the values of −4 to 1 is defined (more specifically, the code is given by a formula 1111+original value). According to this procedure, an 8-bit code is given by a combination of a 4-bit code "1111" (escape code) and a following 4-bit code indicating the gain control amount information GBi (original value).

In step S113, the encoder 91-2 determines whether codes have been determined for all gain control amount information GB0 to GB11, that is, whether all gain control amount information GB0 to GB11 have been encoded. If it is determined that all pieces of gain control amount information GBi have not been encoded, the process returns to step S111 to perform the step S111 and following steps to encode next unencoded gain control amount information GBi.

If it is determined in step S113 that all gain control amount information GB0 to GB11 have been encoded, the process proceeds to step S114. In step S114, the encoder 91-2 outputs the codes determined in step S112 for the respective gain control amount information GB0 to GB11 to the terminal connected to the switch 93.

In the next step S115, the encoder 91-2 calculates the sum of the numbers of bits of the encoded gain control numbers GB0 to GB11 and outputs the calculated sum to the decision unit 92.

For example, the respective 38 pieces of gain control amount information GB shown in FIG. 40 are encoded into codes with numbers of bits such as those shown in FIG. 40, and thus the total number of bits of the codes becomes equal to 69. Thus, a signal indicating that the total number of bits is equal to 69 is supplied to the decision unit 92.

If the conventional fixed-length (4-bit) encoding method were employed, the gain control amount information GB in the example shown in FIG. 40 would be encoded into codes with a total of 152 (=4×38) bits. Thus, the total number of bits of encoded data according to the present invention is smaller by 83 than that according to the conventional technique.

Although in the coding tables (FIGS. 38 and 43) used in the present example, escape codes are used for some values, specific codes including no escape code may be assigned to all respective values.

In the present example, the difference value VB1 is assumed to have such a characteristic shown in FIG. 41. In a case in which the characteristic of the difference value VB1 varies from one encoding unit Ai to another, the coding table may be switched depending on the characteristic of the difference value VB1.

The encoding method employed by the encoder 91-3 is described.

Figure 44:
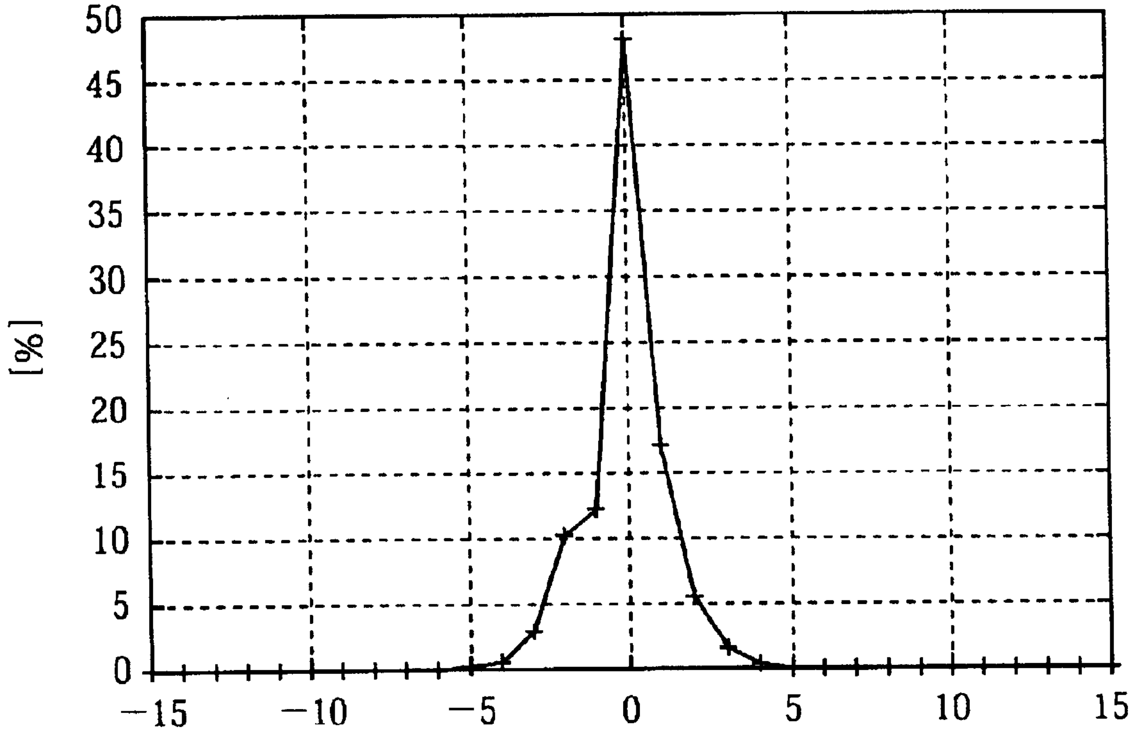
FIG. 44 is a graph showing a characteristic of a difference value VB2.

In most cases, the gain control amount information GBi of the encoding unit Ai and the gain control amount information GBi-1 of the encoding unit Ai-1 in a frequency band adjacent to that of the encoding unit Ai are equal or close to each other. Therefore, the absolute value of the difference value VB2 obtained by subtracting the gain control amount information GBi-1 from the gain control amount information GBi has a high probability of becoming equal or nearly equal to 0, as shown in FIG. 44.

In view of the above, the encoder 91-3 encodes the gain control amount information GB in such a manner that codes with small numbers of bits are assigned to difference values VB2 having high occurrence probabilities.

Figure 45:
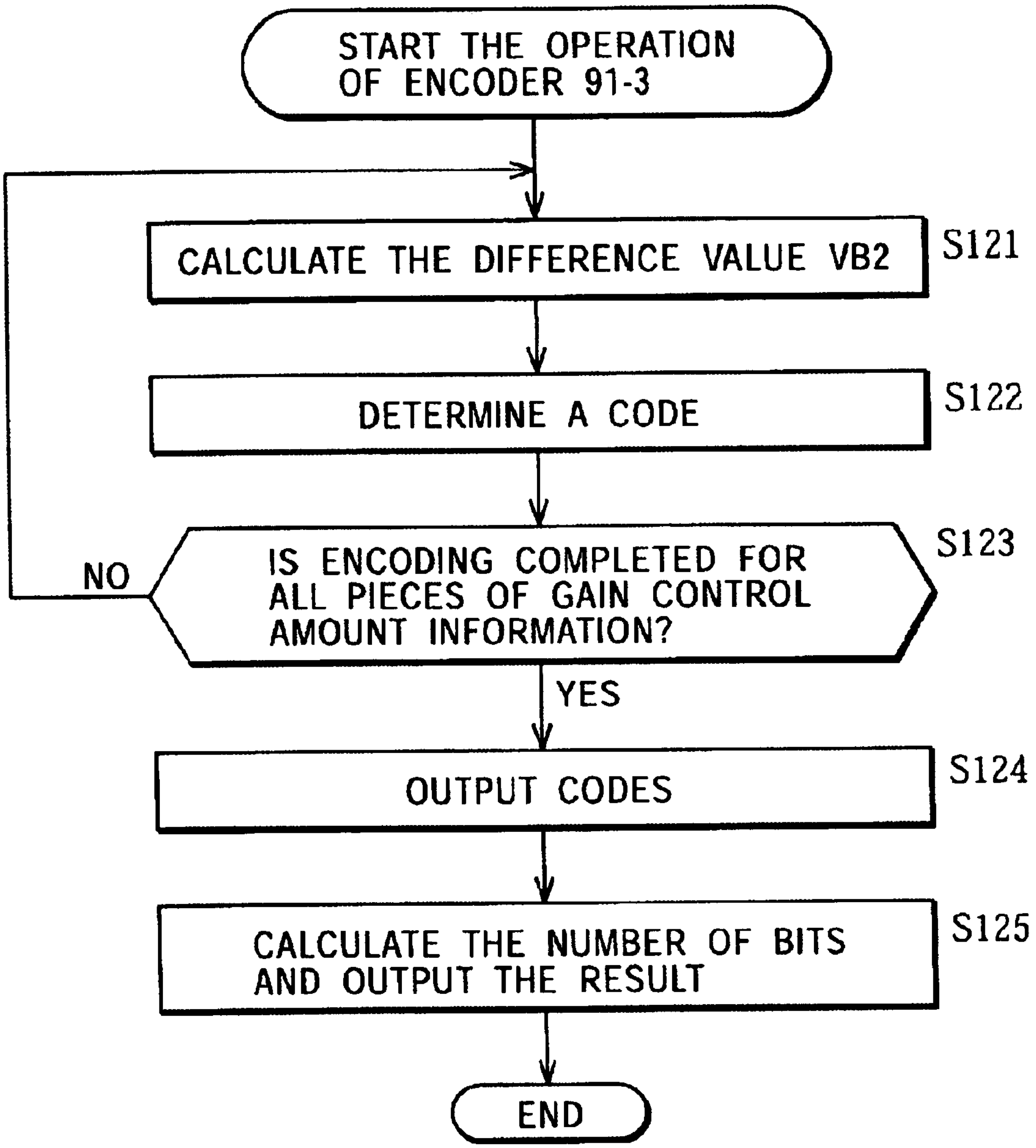
FIG. 45 is a flow chart showing the operation of an encoder 91-3.

The operation of the encoder 91-3 is described below with reference to a flow chart shown in FIG. 45.

In step S121, the encoder 91-3 detects gain control amount information GBi of one frequency band from the input gain control information G0 to G11 and determines the difference value VB2 by subtracting, from the gain control amount information GBi, the gain control amount information GBi-1 of the encoding unit Ai-1 which is in a lower frequency band adjacent to the frequency band of the encoding unit Ai and which was detected in previous execution of step S121.

Hereinafter, for simplicity, the difference value VB2 obtained by subtracting the gain control amount information GBi-1 from the gain control amount information GBi will be referred to simply as the difference value VB2 of the gain control amount information GBi.

For example, when the gain control amount information GB0 to GB11 are given as shown in FIG. 46, the difference value VB2 of gain control amount information GB3 is calculated as follows. That is, by subtracting the first gain control amount information GB2 (=7) from the first gain control amount information GB3 (=7), the difference value VB2 of the first gain control amount information GB3 (=7) is calculated as 0. Similarly, by subtracting the second gain control amount information GB2 (=6) from the second gain control amount information GB3 (=6), the difference value VB2 of the second gain control amount information GB3 (=6) is calculated as 0.

For the gain control amount information GB2, by subtracting the gain control amount information GB1 (=5) from the first gain control amount information GB2 (=7), the difference value VB2 of the first gain control amount information GB2 is calculated as 2, and by subtracting 5 from the second gain control amount information GB2 (=6), the difference value VB2 of the second gain control amount information GB2 (=6) is calculated as i. For the gain control amount information GB1, by subtracting 5 from the gain control amount information GB1 (=5), the difference value VB2 of the gain control amount information GB1 (=5) is calculated as 0.

That is, in the case in which there is no gain control amount information GBi-1 corresponding to gain control amount information GBi, the difference value VB2 of the gain control amount information GBi is determined by subtracting a value of GB which is highest in occurrence probability, that is, 5, as shown in FIG. 36, from the value of the gain control amount information GBi.

Figures 47, 48:
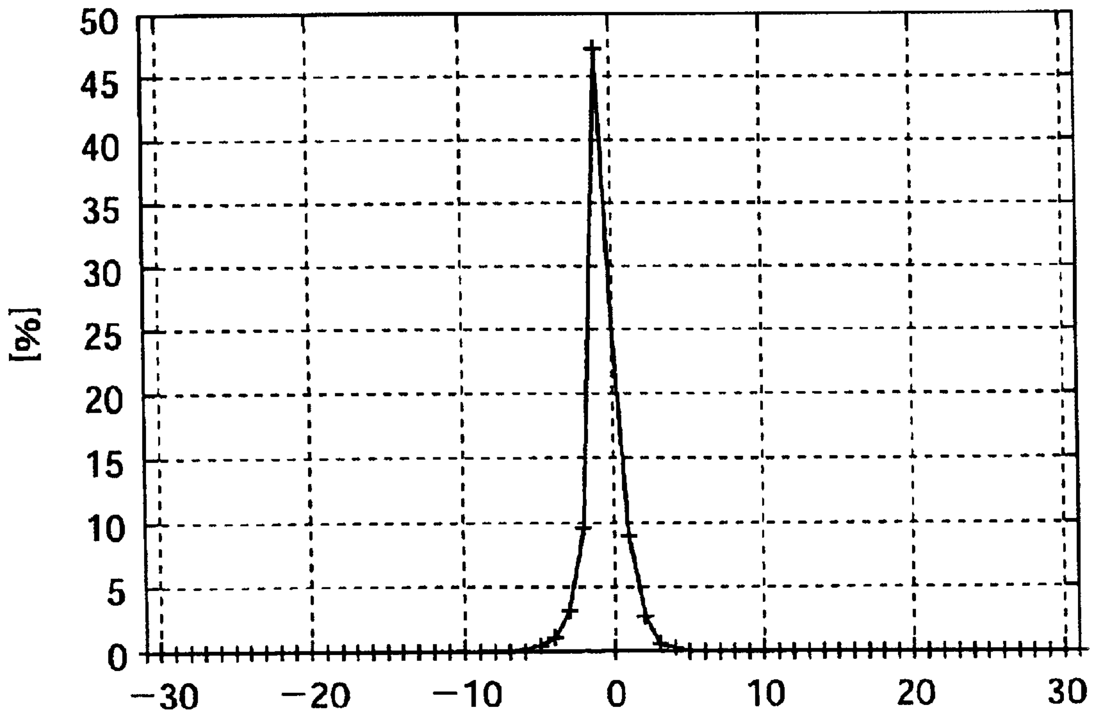
FIG. 47 shows another table in which a value-code correspondence and a procedure of determining codes for particular values are represented.
FIG. 48 is a graph showing a characteristic of a difference value VB3.

Referring again to FIG. 45, in step S122, the encoder 91-3 retrieves a code corresponding to a value equal to the difference value VB2 calculated in step S121 from a table shown in FIG. 47 and employs the retrieved code as the code of the gain control amount information GBi.

For example, in the case of gain control amount information GB2 in the example shown in FIG. 46, the difference value VB2 of the first gain control amount information GB2 (=7) is 2, and thus a 4-bit code "11110" is employed as the code for the gain control amount information GB2. Similarly, a 3-bit code "100" is employed for the second gain control amount information GB2 (=6) because the difference value VB2 of the second gain control amount information GB2 (=6) is 1.

In the table shown in FIG. 47, a 5-bit code "11110" is assigned to a value −3, a 3-bit code "110" to a value −2, a 3-bit code "101" to a value −1, a 1-bit code "0" to a value 0, a 3-bit code "100" to a value 1, and a 4-bit code "1110" to a value 2.

Furthermore, in the table shown in FIG. 47, a procedure of determining a code for a value other than the values of −3 to 2 is defined (more specifically, the code is given by a formula 11111+original value). According to this procedure, a 9-bit code is given by a combination of a 5-bit code "11111" and a following 4-bit code indicating the gain control amount information GB (original value).

In the next step S123, the encoder 91-3 determines whether codes have been determined for all gain control amount information GB0 to GB11, that is, whether all gain control amount information GB0 to GB11 have been encoded. If it is determined that all pieces of gain control amount information GBi have not been encoded, the process returns to step S121 to perform the step S121 and following steps to encode next unencoded gain control amount information GBi.

If it is determined in step S123 that all gain control amount information GB0 to GB11 have been encoded, the process proceeds to step S124. In step S124, the encoder 91-4 outputs the codes determined in step S122 for the respective gain control amount information GB0 to GB11 to the terminal connected to the switch 93.

In the next step S125, the encoder 91-3 calculates the sum of the numbers of bits of the encoded gain control numbers GB0 to GB11 and outputs the calculated sum to the decision unit 92.

For example, the respective 17 pieces of gain control amount information GB shown in FIG. 46 are encoded into bit-codes as shown in FIG. 46, and thus the total number of bits of the codes becomes equal to 35. Thus, a signal indicating that the total number of bits is equal to 35 is supplied to the decision unit 92.

If the conventional fixed-length (4-bit) encoding method were employed, the gain control amount information GB in the example shown in FIG. 46 would be encoded into codes with a total of 68 (=4×17) bits. Thus, the total number of bits of encoded data according to the present invention is smaller by 33 than that according to the conventional technique.

Although in the coding table (FIG. 47) used in the present example, escape codes are used for some values, specific codes including no escape code may be assigned to all respective values.

In the present example, the difference value VB2 of the gain control amount information GB is assumed to have such a characteristic shown in FIG. 44. In a case in which the characteristic of the difference value VB2 varies from one encoding unit Ai to another, the coding table may be switched depending on the characteristic of the difference value VB2.

The encoding method employed by the encoder 91-4 is described.

As described earlier with reference to FIG. 41, the difference value VB1 obtained by subtracting the Nth gain control amount information GBi from the (N+1)th gain control amount information GBi has a high probability of becoming equal to a particular value.

Furthermore, as described earlier with reference to FIG. 44, the difference value VB2 obtained by subtracting gain control amount information GBi-1 from gain control amount information GBi also has a high probability of becoming equal to a particular value.

Therefore, for example, the difference value VB3 obtained by subtracting the difference value VB1 of the Nth gain control amount information GBi from the difference value VB1 of the Nth gain control amount information GBi-i has a high probability of becoming equal to a particular value (0 or a value whose absolute value is close to 0) as shown in FIG. 48.

In view of the above, the encoder 91-4 encodes the gain control amount information GB in such a manner that codes with small numbers of bits are assigned to difference values VB3 having high occurrence probabilities.

Figure 49:
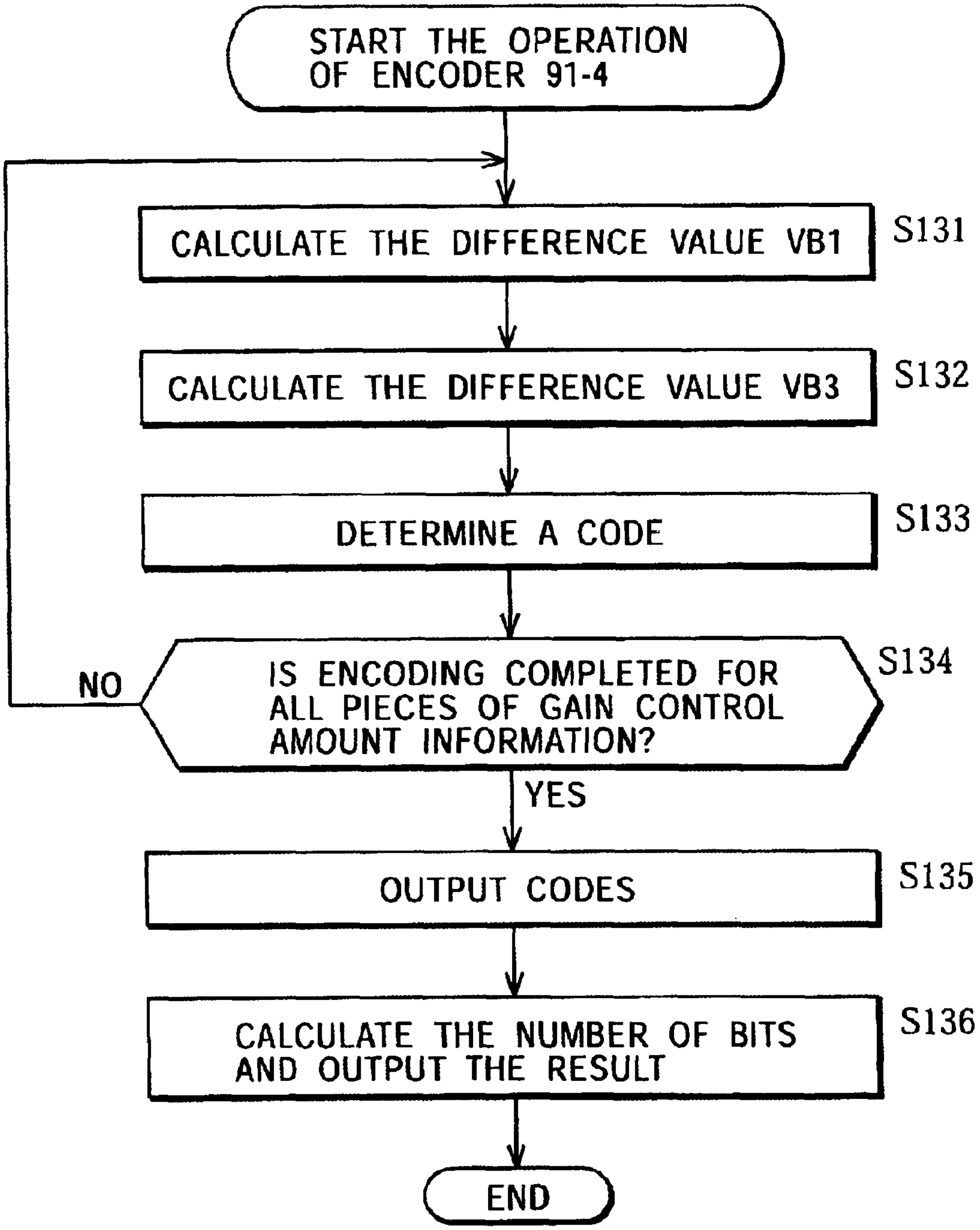
FIG. 49 is a flow chart showing the operation of an encoder 91-4.

The operation of the encoder 91-4 is described below with reference to a flow chart shown in FIG. 49.

In step S131, the encoder 91-4 detects gain control amount information GBi of one frequency band from the input gain control information G0 to G11 and calculates the difference value VB1 (the difference value B1 of the (N+1)th gain control amount information GBi) by subtracting the Nth gain control amount information GBi from the (N+1)th gain control amount information GBi.

For example, for gain control amount information GB1 of gain control amount information GB0 to GB11 shown in FIG. 50, the difference value VB1 of the second gain control amount information GB1 (=4) is calculated as −1 by subtracting the first gain control amount information GB1 (=5) from the second gain control amount information GB1 (=4), and the difference value VB1 of the third gain control amount information GB1 (=3) is calculated as −1 by subtracting the second gain control amount information GB1 (=4) from the third gain control amount information GB1 (=3).

In a similar manner, the difference value VB1 of the gain control amount information GBi following the second gain control amount information GBi (that is, the (N+1)th gain control amount information GBi) can be determined. For the first gain control amount information GBi, the difference value VB1 thereof is determined by subtracting the first gain control amount information GBi-1 detected in previous execution of step S131 from the first gain control amount information GBi.

In the specific example shown in FIG. 50, the difference value VB1 of the first gain control amount information GB1 of the gain control amount information GB1 is calculated as 0 by subtracting the first gain control amount information GB0 (=5) from the first gain control amount information GB1 (=5).

Of the gain control amount information GBi, the difference value VB1 of the first gain control amount information GB0 of the gain control amount information GB0 is given by subtracting a value of GB which is highest in occurrence probability, that is, 5 in this specific example (FIG. 36), from the value of the first gain control amount information GB0. More specifically, in the example shown in FIG. 50, the difference value VB1 of the first gain control amount information GB0 (=5) of the gain control amount information GB0 is calculated as 0 (=5−5).

In the next step S132, the encoder 91-4 determines the difference value VB3 by subtracting the difference value VB1 of the gain control amount information GBi-1 determined in the previous execution of step S131 from the difference value VB1 of the gain control amount information GBi determined in step S131.

Hereinafter, for simplicity, the difference value VB3 obtained by subtracting the difference value VB1 of the gain control amount information GBi-1 from the difference value VB1 of the gain control amount information GBi will be referred to simply as the difference value VB3 of the gain control amount information GBi.

The difference value VB3 of the first gain control amount information GB is given by the same value as that of the difference value VB1 of the first gain control amount information GB.

For example, as for gain control amount information GB2 in the example shown in FIG. 50, the difference value VB1 of the first gain control amount information GB2 (=7) is given as 2, and the same value is given as the difference value VB3 of the first gain control amount information GB2 (=7), and the value (=−1) obtained by subtracting the second difference value VB1 (=−1) of the second gain control amount information GB1 (=4) from the difference value (=−2) of the second gain control amount information GB2 (=5) is given as the difference value VB3 of the gain control amount information GB2 (=5). Furthermore, the value (=0) obtained by subtracting the difference value VB1 (=−1) of the third gain control amount information GB1 (=3) from the difference value VB1 (=−1) of the third gain control amount information GB2 (=4) is given as the difference value VB3 of the third gain control amount information GB2 (=4).

In this specific example, the difference value VB3 of the gain control amount information GB0 becomes equal to the difference value VB1. That is, as for the gain control amount information GB0 in the example shown in FIG. 50, difference values VB3 are 5, −1, and −2.

In the next step S133, the encoder 91-4 retrieves a code corresponding to a value equal to the difference value VB3 calculated in step S132 from a table shown in FIG. 51 and employs the retrieved code as the code of the gain control amount information GBi.

In the table shown in FIG. 51, a 5-bit code "11110" is assigned to a value −3, a 3-bit code "110" to a value −2, a 1-bit code "0" to a value −1, a 2-bit code "10" to a value 0, and a 4-bit code "1110" to a value 1.

Furthermore, in the table shown in FIG. 51, a procedure of determining a code for a value other than the values of −3 to 1 is defined (more specifically, the code is given by a formula 11111+original value). According to this procedure, a 9-bit code is given by a combination of a 5-bit code "11111" and a following 4-bit code indicating the gain control amount information GB (original value).

In the next step S134, the encoder 91-4 determines whether codes have been determined for all gain control amount information GB0 to GB11, that is, whether all gain control amount information GB0 to GB11 have been encoded. If it is determined that all pieces of gain control amount information GBi have not been encoded, the process returns to step S131 to perform the step S131 and following steps to encode next unencoded gain control amount information GBi.

If it is determined in step S134 that all gain control amount information GB0 to GB11 have been encoded, the process proceeds to step S135. In step S135, the encoder 91-4 outputs the codes determined in step S133 for the respective gain control amount information GB0 to GB11 to the terminal connected to the switch 93.

In the next step S316, the encoder 91-4 calculates the sum of the numbers of bits of the encoded gain control numbers GB0 to GB11 and outputs the calculated sum to the decision unit 92.

For example, as for 36 pieces of gain control amount information GB shown in FIG. 50, codes with numbers of bits as shown in FIG. 50 are generated as a result of encoding and thus a signal indicating that the total number of bits of the codes is 91 is output to the decision unit 92.

If the conventional fixed-length (4-bit) encoding method were employed, the gain control amount information GB in the example shown in FIG. 50 would be encoded into codes with a total of 144 (=4×36) bits. Thus, the total number of bits of encoded data according to the present invention is smaller by 53 than that according to the conventional technique.

The encoding method employed by the encoder 91-5 is described.

In gain control amount information GBi-1 and gain control amount information GBi, in some cases, there are an equal number of pieces of gain control amount information GB, and, besides, Nth gain control amount information GBi and corresponding Nth gain control amount information GBi-1 are equal in value to each other, as is the case, for example, with gain control amount information GB0 and gain control amount information GB1 shown in FIG. 52.

In view of the above, the encoder 91-5 encodes the gain control amount information GB in such a manner that when, in gain control amount information GBi-1 and gain control amount information GBi, there are an equal number of pieces of gain control amount information GB and Nth gain control amount information GBi-1 and corresponding Nth gain control amount information GBi are equal to each other, only a flag (encoding flag) set to a value (0, in this specific example) indicating the above fact is encoded.

Figure 53:
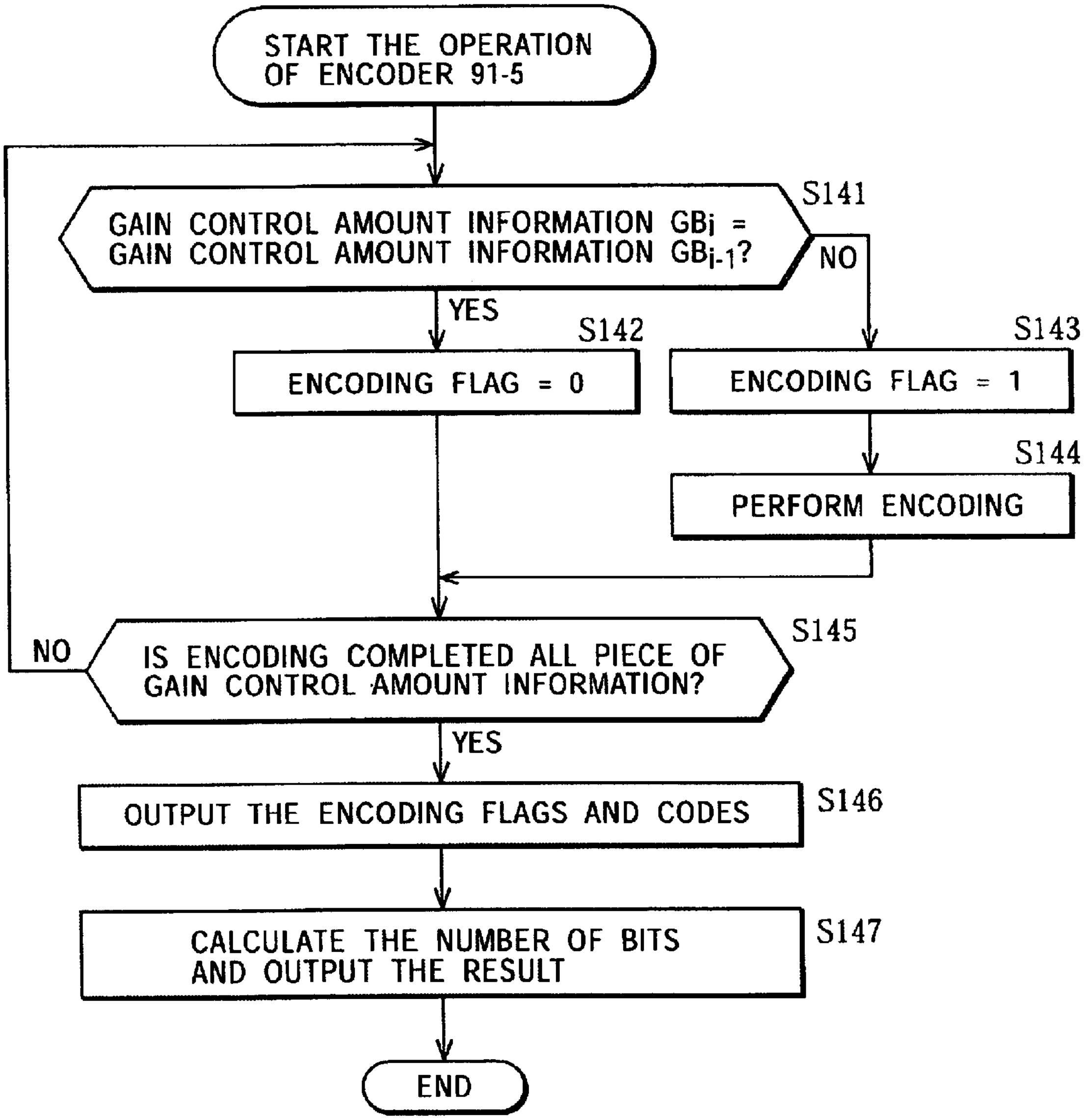
FIG. 53 is a flow chart showing the operation of an encoder 91-5.

The operation of the encoder 91-5 is described below with reference to a flow chart shown in FIG. 53.

In step S141, the encoder 91-5 detects gain control amount information GBi of one frequency band from the input gain control information G0 to G11. The encoder 91-5 determines whether there are an equal number of pieces of gain control amount information GB in both that gain control amount information GBi and gain control amount information GBi-1 detected in previous execution of step S141, and besides Nth gain control amount information GBi and corresponding Nth gain control amount information GBi-1 are equal in value to each other. If it is determined that there are an equal number of pieces of gain control amount information GB, and Nth gain control amount information GBi and corresponding Nth gain control amount information GBi-1 are equal in value to each other, the process proceeds to step S142. In step S142, the encoding flag associated with the gain control amount information GBi is set to a value (0, in this specific example) so as to indicate the above fact.

For example, in gain control amount information GB1 and gain control amount information GB0 in the example shown in FIG. 52, there are equally three pieces of gain control amount information GB and first, second, and third gain control amount information GB1 (=7, 5, and 4) are equal in value to first, second, and third gain control amount information GB0 (=7, 5, and 4), respectively, and thus the encoding flag associated with the gain control amount information GB1 is set to 0.

In the case in which it is determined in step S141 that the number of pieces of gain control amount information GB in gain control amount information GBi is not equal to that in gain control amount information GBi-1, or Nth gain control amount information GBi is not equal in value to corresponding Nth gain control amount information GBi-1, the process jumps to step S143. In step S143, the encoder 91-5 sets the encoding flag associated with the gain control amount information GBi to a value (1, in this case) so as to indicate the above fact.

For example, as for gain control amount information GB2 and gain control amount information GB1 in the example shown in FIG. 52, the number of pieces of gain control amount information GB is different between them, and thus the encoding flag associated with the gain control amount information GB2 is set to 1.

In the next step S144, the encoder 91-5 encodes the gain control amount information GBi in a similar manner as with, for example, the encoder 91-2.

More specifically, the encoder 91-5 retrieves a code corresponding to the first gain control amount information GBi from a table similar to that shown in FIG. 38 and employs the retrieved code as the code of the first gain control amount information GBi.

Furthermore, the encoder 91-5 calculates the difference value VB1 of the (N+1)th gain control amount information GBi by subtracting the Nth gain control amount information GBi from the (N+1)th gain control amount information GBi, and the encoder 91-5 then retrieves a code corresponding to the calculated difference value VB1 from the table shown in FIG. 43 and employs the retrieved code as the code for the (N+1)th gain control amount information GBi.

For example, as for gain control amount information GB2 in the example shown in FIG. 52, a 3-bit code "101" is employed as the code of first gain control amount information GB2 (=7), and, because the difference value VB1 of second gain control amount information GB2 (=6) is −1, a 1-bit code "0" is employed as the code of the second gain control amount information GB2.

In this specific example, there is no encoding flag associated with gain control amount information GB0, and the code of the gain control amount information GB0 is determined in step S144 as with gain control amount information GB corresponding to an encoding flag set to 1.

In the case in which an encoding flag has been set to 0 in step S142 or in the case in which gain control amount information GBi has been encoded in step S144, the process proceeds to step S145. In step S145, the encoder 91-5 determines whether all encoding flags associated with respective gain control amount information GB0 to GB11 have been set to 0 or 1 and codes have been determined for all pieces of gain control amount information GBi corresponding to encoding flags set to 1, that is, the encoder 91-5 determines whether gain control amount information GB0 to GB11 have all been encoded. If it is determined that all pieces of gain control amount information GBi have not been encoded, the process returns to step S141 to perform the step S141 and following steps to encode next unencoded gain control amount information GBi.

If it is determined in step S145 that all gain control amount information GB0 to GB11 have been encoded, the process proceeds to step S146. In step S146, the encoder 91-5 outputs the encoding flag set to 0 or 1 and the codes to the terminal connected to the switch 93.

In the next step S147, the encoder 91-5 calculates the sum of the numbers of bits of the encoded gain control numbers GB0 to GB11 and outputs the calculated sum to the decision unit 92.

For example, as for 36 pieces of gain control amount information GB shown in FIG. 52, 11 1-bit encoding flags and codes with numbers of bits as shown in FIG. 52 are generated as a result of encoding and thus a signal indicating that the total number of bits is equal to 38 (=11+27) is supplied to the decision unit 92.

If the conventional fixed-length (4-bit) encoding method were employed, the gain control amount information GB in the example shown in FIG. 52 would be encoded into codes with a total of 144 (=4×36) bits. Thus, the total number of bits of encoded data according to the present invention is smaller by 106 than that according to the conventional technique.

Although in the example described above, when there is a difference in the number of gain control amount information GB between gain control amount information GBi and gain control amount information GBi-1, or when there is a difference in value between Nth gain control amount information GBi and corresponding Nth gain control amount information GBi-1, encoding of gain control amount information GBi is performed in a similar manner as with the encoder 91-2, the encoding may be performed according to another method.

The encoding method employed by the encoder 91-6 is described.

Figures 54, 55:
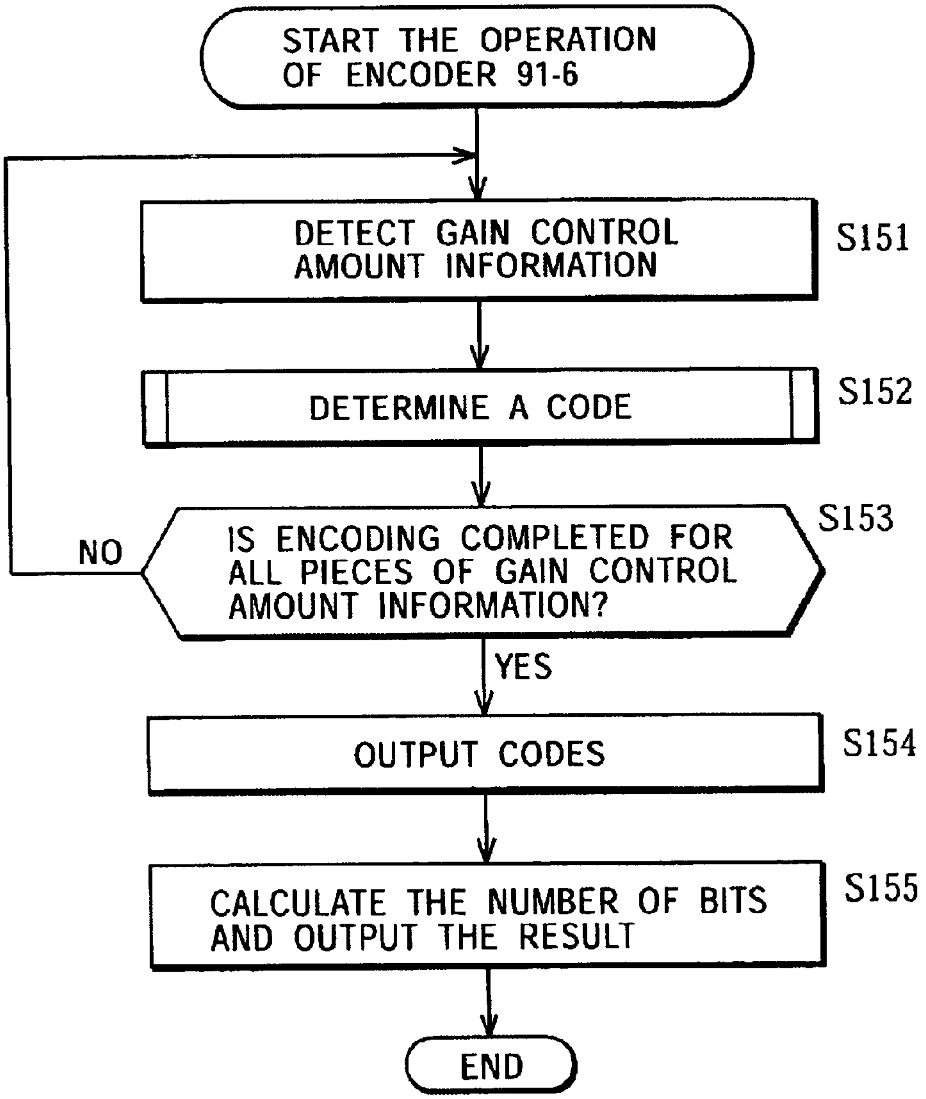
FIG. 54 is a table showing another example of a set of gain control amount information GB.
FIG. 55 is a flow chart showing the operation of an encoder 91-6.

In most cases, a plurality of values of gain control amount information GBi are close to each other as in the case of gain control amount information GB7 of gain control amount information GB0 to GB11 shown in FIG. 54. Therefore, values obtained by subtracting a minimum value of the values of gain control amount information GBi from respective values of gain control amount information GBi become small enough to represent with a small number of bits.

In view of the above, the encoder 91-6 encodes gain control amount information GB such that the value obtained by subtracting the minimum value of gain control amount information GBi from Nth gain control amount information GBi is expressed using a particular number of bits and the resultant expression is assigned as the code of the Nth gain control amount information GBi.

The operation of the encoder 91-6 is described below with reference to a flow chart shown in FIG. 55.

In step S151, the encoder 91-6 detects gain control amount information GBi of one frequency band from the input gain control information G0 to G11.

Figure 56:
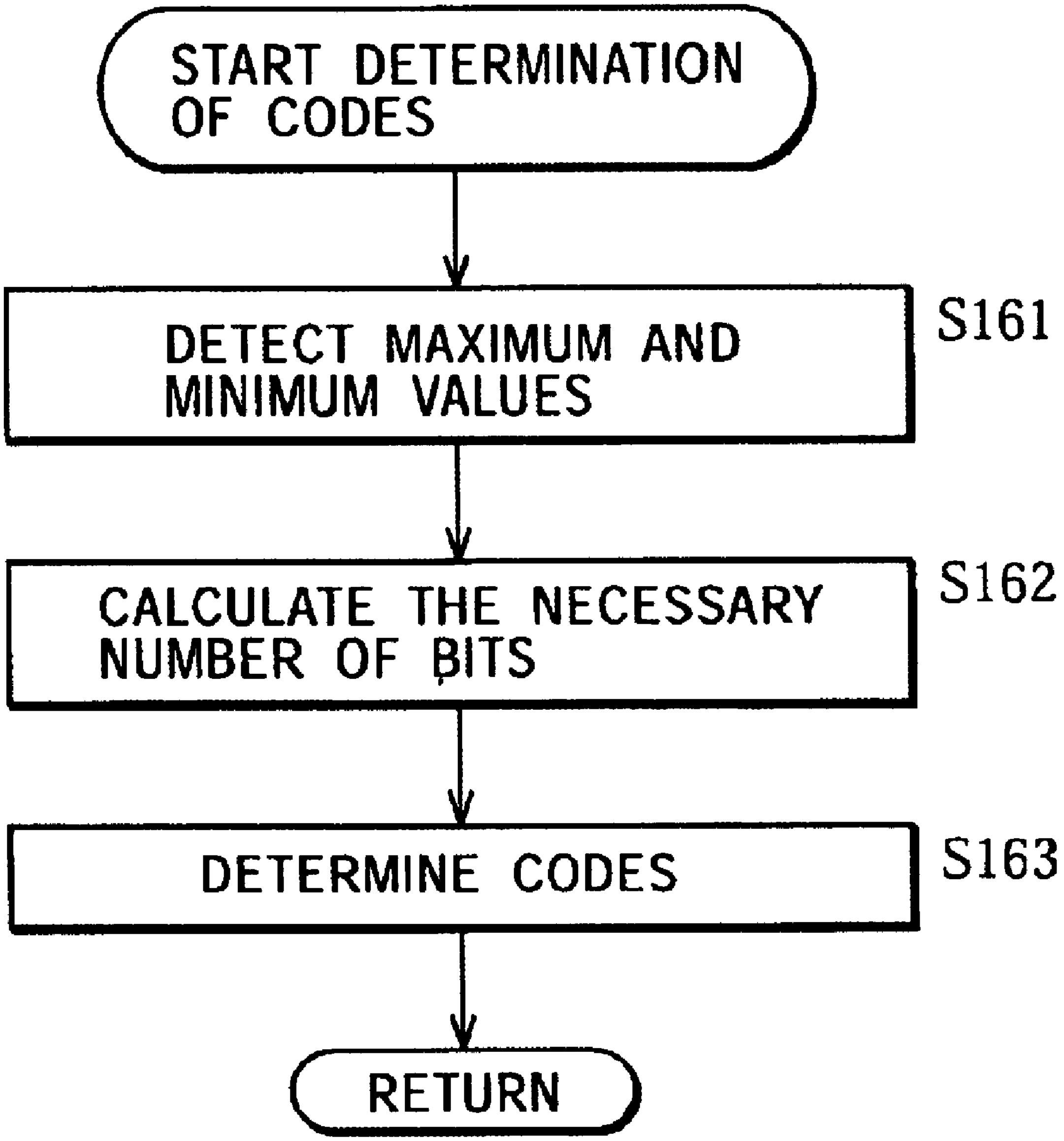
FIG. 56 is a flow chart showing the details of step S152 shown in FIG. 55.

In the next step S152, the encoder 91-6 determines a code to be assigned to the gain control amount information GBi. The details of the process in step S152 are shown in the form of a flow chart in FIG. 56.

In step S161, the encoder 91-6 detects maximum and minimum values of the gain control amount information GBi.

In the example shown in FIG. 54, 9 is detected as the maximum value and 6 is detected as the minimum value.

In step S162, the encoder 91-6 calculates the difference between the maximum and minimum values detected in step S161 and determines the number of bits which can represent the difference.

In the example shown in FIG. 54, the difference between the maximum value (9) and the minimum value (6) is equal to 3, and thus the number of bits which can represent the difference is 2.

In step S163, the encoder 91-6 subtracts the minimum value detected in step S161 from respective values of gain control amount information GBi and represents the resultant difference values using as many bits as the necessary number of bits determined in sep S162. The resultant values are employed as codes for the respective pieces of gain control amount information GBi. Because the necessary number of bits is defined as the number of bits which can represent the difference between the maximum value and the minimum value, the value obtained by subtracting the minimum value from any gain control amount information GBi can be represented using as many bits as the necessary number of bits.

In the example shown in FIG. 54, subtracting 6 from first gain control amount information GB7 (=9), second gain control amount information GB7 (=7), third gain control amount information GB7 (=6), and fourth gain control amount information GC7 (=9) yields 3, 1, 0, and 3, respectively, and 2-bit expressions of these values are employed as the codes of first to fourth gain control amount information GB7.

Thereafter, the process proceeds to step S153 shown in FIG. 55.

In step S153, the encoder 91-6 determines whether codes have been determined for all gain control amount information GB0 to GB11, that is, whether all gain control amount information GB0 to GB11 have been encoded. If it is determined that all pieces of gain control amount information GBi have not been encoded, the process returns to step S151 to perform the step S151 and following steps to encode next unencoded gain control amount information GBi.

If it is determined in step S153 that all gain control amount information GB0 to GB11 have been encoded, the process proceeds to step S154. In step S154, the data indicating the minimum value detected in step S161, the data indicating the necessary number of bits calculated in step S162, and the codes, determined in step S163, of gain control amount information GB0 to GB11 represented by as many bits as the necessary number of bits are output from the encoder 91-6 to the terminal connected to the switch 93.

In the next step S155, the encoder 91-6 calculates the sum of the numbers of bits of the encoded gain control numbers GB0 to GB11 and outputs the calculated sum to the decision unit 92.

For example, as for gain control amount information GB7 shown in FIG. 54, 2-bit data indicating a necessary number of bits, 4-bit data indicating a minimum value, and 4 2-bit codes (represented by as many bits as the necessary number of bits are generated as the result of the encoding of the gain control amount information GB7, and thus a signal indicating that the total number of bits is equal to 14 (=2+4+2×4) is supplied to the decision unit 92.

If the conventional fixed-length (4-bit) encoding method were employed, the gain control amount information GB in the example shown in FIG. 54 would be encoded into codes with a total of 16 (=4×4) bits. Thus, the total number of bits of encoded data according to the present invention is smaller by 2 than that according to the conventional technique.

The encoding method employed by the encoder 91-7 is described.

In most cases, because gain control amount information GB0 to GB11 are close in value to each other as in the case with gain control amount information GB0 to GB11 shown in FIG. 57, subtracting the minimum value (5, in the example shown in FIG. 57) of the gain control amount information GB0 to GB11 from the respective values of gain control amount information GBi results in small values which can be represented using a small number of bits.

In view of the above, the encoder 91-7 encodes gain control amount information GB in such a manner that the minimum value of the gain control amount information GB0 to GB11 is subtracted from each piece of gain control amount information GBi and an expression of the resultant difference using a particular number of bits is employed as the code of the gain control amount information GBi.

The operation of the encoder 91-7 is described below with reference to a flow chart shown in FIG. 58.

In step S171, the encoder 91-7 extracts gain control amount information GB0 to GB11 from the input gain control information G0 to G11 and detects maximum and minimum values of the extracted gain control amount information GB0 to GB11.

In the example shown in FIG. 57, the maximum value of gain control amount information GB0 to GB11 is detected as 8 and the minimum value as 5.

In step S172, the encoder 91-7 calculates the difference between the maximum and minimum values detected in step S171 and determines the number of bits which can represent the difference.

In the example shown in FIG. 57, the difference between the maximum value (8) and the minimum value (5) is equal to 3, and thus the number of bits which can represent the difference is 2.

In step S173, the encoder 91-7 subtracts the minimum value detected in step S171 from the respective values of gain control amount information GB0 to GB11 and represents the resultant difference values using as many bits as the necessary number of bits determined in sep S172. The resultant values are employed as codes for the respective pieces of gain control amount information GB. Because the necessary number of bits is defined as the number of bits which can represent the difference between the maximum value and the minimum value, the value obtained by subtracting the minimum value from any gain control amount information GB can be represented using as many bits as the necessary number of bits.

In step S174, the data indicating the minimum value detected in step S171, the data indicating the necessary number of bits calculated in step S172, and the codes, determined in step S173, of gain control amount information GB represented by as many bits as the necessary number of bits are output from the encoder 91-7 to the terminal connected the switch 93.

Figures 58, 59:
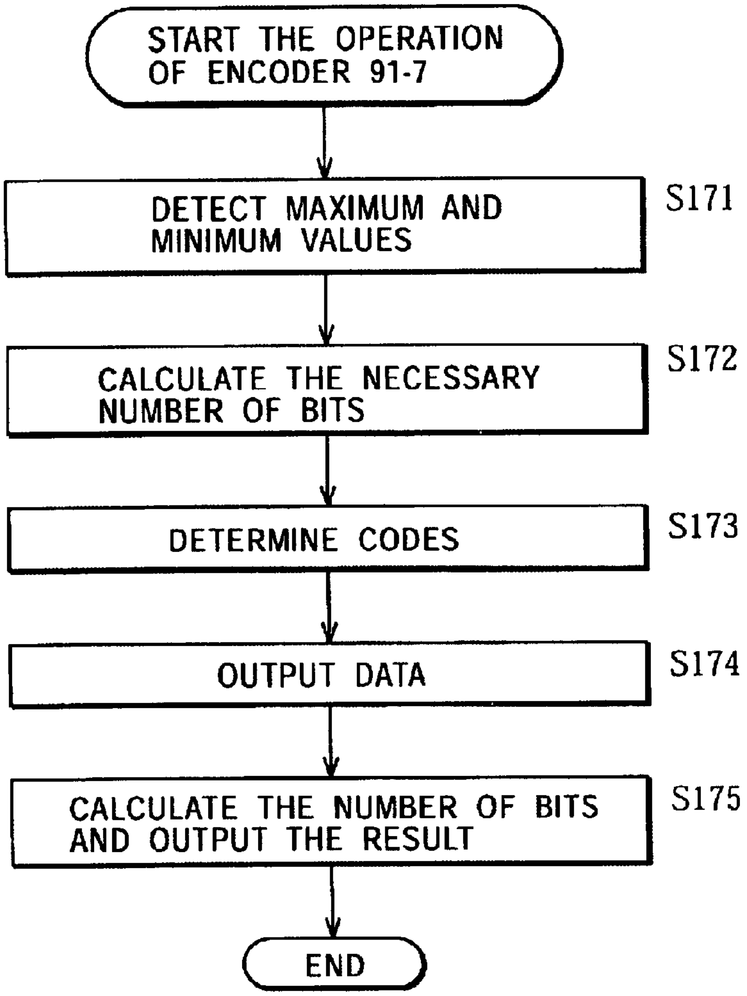
FIG. 58 is a flow chart showing the operation of an encoder 91-7.
FIG. 59 is a diagram showing an encoding method employed by the encoder 91-7.

In the example shown in FIG. 57, 4-bit data indicating a minimum value (=5), 2-bit data indicating a necessary number of bits (2 bits), and 26 2-bit codes (represented by as many bits as the necessary number of bits) are output to the switch 93 as shown in FIG. 59.

In the next step S175, the encoder 91-7 calculates the sum of the numbers of bits of the encoded gain control numbers GB0 to GB11 and outputs the calculated sum to the decision unit 92.

For example, in the case of gain control amount information GB shown in FIG. 57, 2-bit data indicating the necessary number of bits, 4-bit data indicating the minimum value, and 26 codes each represented by 2 bits (=necessary number of bits) are produced as the result of the encoding of the gain control amount information GB and thus a signal indicating that the total number of bits is 58 (=2+4+2×26) is output to the decision unit 92.

If the conventional fixed-length (4-bit) encoding method were employed, the gain control amount information GB in the example shown in FIG. 57 would be encoded into codes with a total of 104 (=4×26) bits. Thus, the total number of bits of encoded data according to the present invention is smaller by 46 than that according to the conventional technique.

The encoding method employed by the encoder 91-8 is described.

Figure 60:
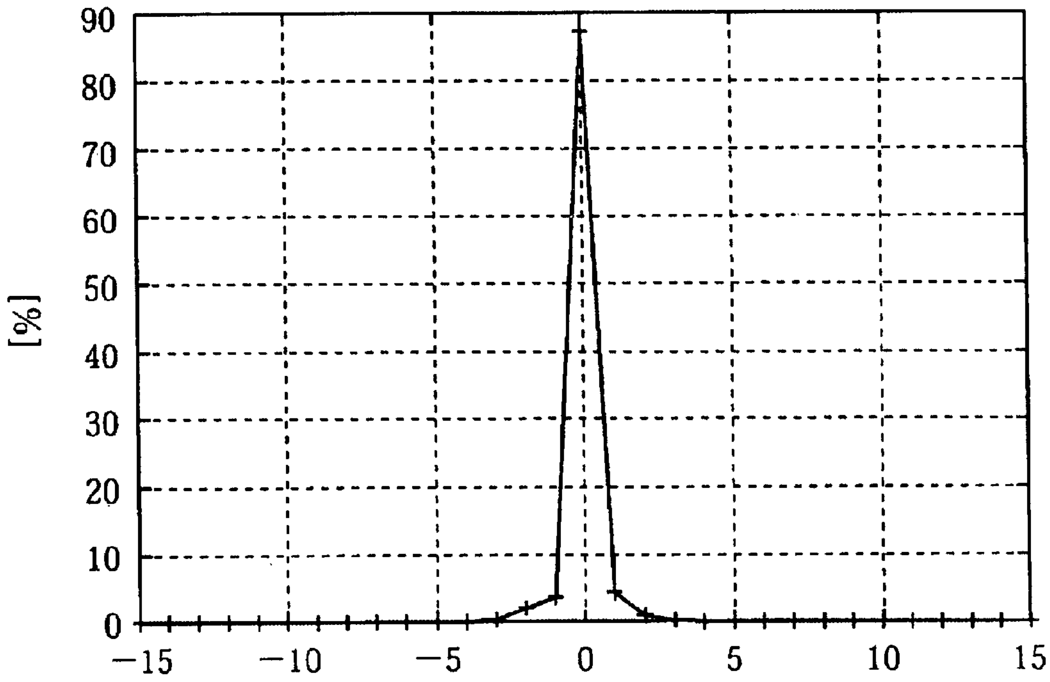
FIG. 60 is a graph showing a characteristic of a difference value WB1.

In most cases, in the stereo audio signal, the gain control amount information GBLi of the left-channel signal and the gain control amount information GBRi of the right-channel signal in the same frequency band are equal or close to each other. Therefore, the absolute value of the difference value WB1 obtained by subtracting the gain control amount information GBLi from the gain control amount information GBRi has a high probability of becoming equal or nearly equal to 0, as shown in FIG. 60.

In view of the above, the encoder 91-8 encodes gain control amount information GB such that only either gain control amount information GBL0 to GAL11 or gain control amount information GBR0 to GBR11 are encoded, and codes with small numbers of bits are assigned to difference values WB1 having high occurrence probabilities. That is, one of the gain control amount information GBL and the gain control amount information GBR is encoded by means of the above method, and the other is encoded by means of, for example, the conventional encoding method.

Figure 61:
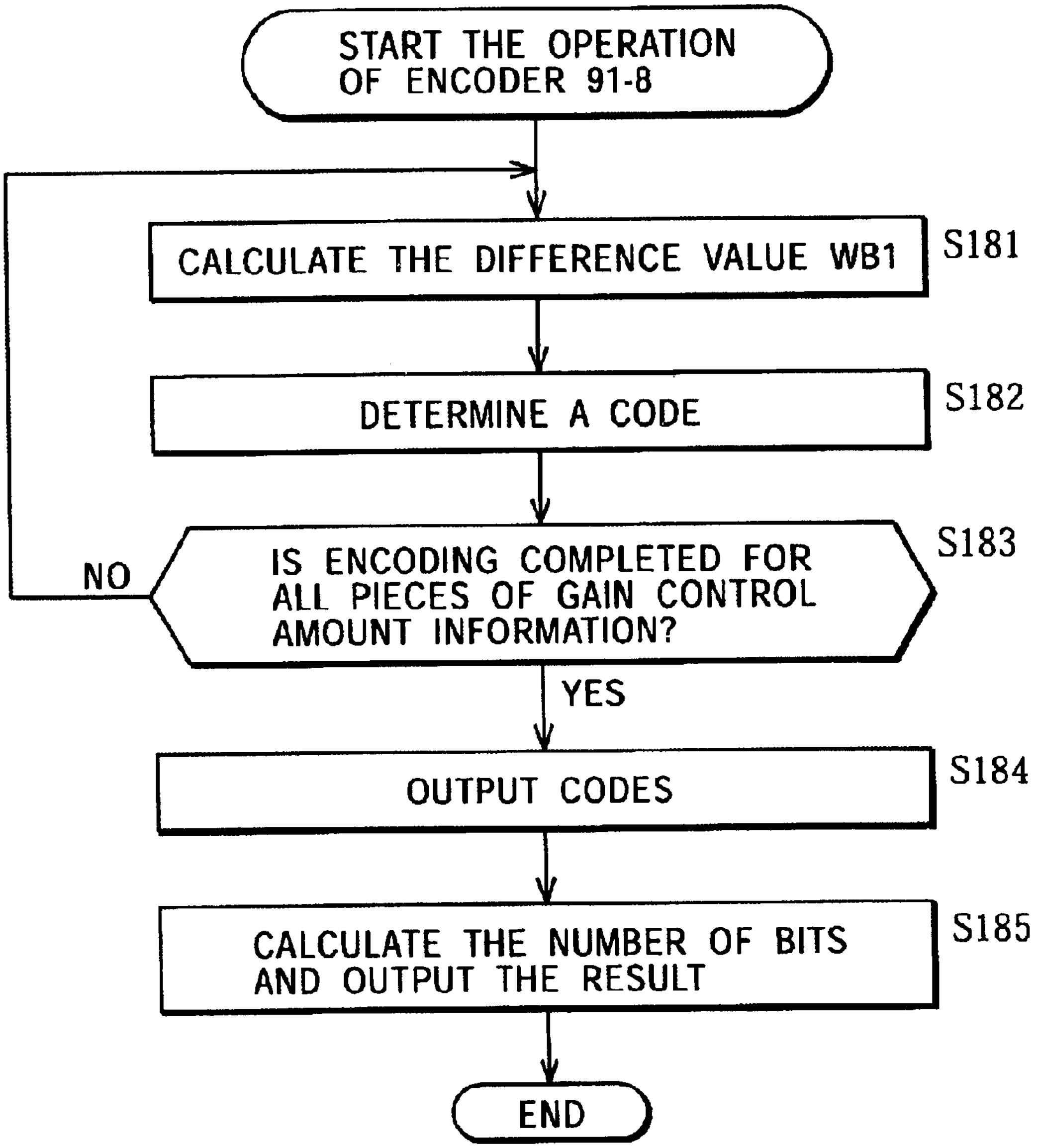
FIG. 61 is a flow chart showing the operation of an encoder 91-8.

The operation of the encoder 91-8 is described below with reference to a flow chart shown in FIG. 61. Herein, it is assumed that the encoder 91-8 encodes gain control amount information GBR.

In step S181, the encoder 91-8 detects gain control amount information GBLi in one frequency band from gain control information GL0 to GL11 of the input left-channel signal and also detects gain control amount information GBRi in the same frequency band from gain control information GR0 to GR11 of the input right-channel signal. The encoder 91-8 then calculates the difference value WB1 by subtracting the gain control amount information GBLi from the gain control amount information GBRi.

Hereinafter, for simplicity, the difference value WB1 obtained by subtracting the gain control amount information GBLi from the gain control amount information GBRi will be referred to simply as the difference value WB1 of the gain control amount information GBRi.

For example, in the case of gain control amount information GBL3 of gain control amount information GBL0 to GBL11 or gain control amount information GBR3 of gain control amount information GBR0 to GBR11 shown in FIG. 62, the difference value WB1 of first gain control amount information GBR3 is given by a value (=−1) obtained by subtracting the first gain control amount information GBL3 (=5) from the first gain control amount information GBR3 (=4), and the difference value WB1 of second gain control amount information GBR3 is given by a value (=0) obtained by subtracting the second gain control amount information GBL3 (=2) from the second gain control amount information GBR3 (=2).

In the next step S182, the encoder 91-8 retrieves a code corresponding to a value equal to the difference value WB1 calculated in step S181 from a table shown in FIG. 63 and employs the retrieved code as the code for the gain control amount information GBRi.

For example, in the case of gain control amount information GBR3, the difference value WB1 of first gain control amount information GGR3 (=4) is −1, and thus a 3 bit code "110" is employed as the code of the first gain control amount information GGR3, while the difference value WB1 of second gain control amount information GGR3 (=2) is 0, and thus a 1-bit code "0" is employed as the code of the second gain control amount information GGR3.

In the table shown in FIG. 63, a 5-bit code "1110" is assigned to a value −2, a 3-bit code "110" to a value −1, a 1-bit code "0" to a value 0, a 2-bit code "10" to a value 1, and a 5-bit code "11110" to a value 2.

Furthermore, in the table shown in FIG. 63, a procedure of determining a code for a value other than the values of −2 to 2 is defined (more specifically, the code is given by a formula 11111+original value). According to this procedure, a 9-bit code is given by a combination of a 5-bit code "11111" and a following 4-bit code indicating the gain control amount information GB (original value, the gain control amount information GBR in this specific case).

In step S183, the encoder 91-8 determines whether codes have been determined for all gain control amount information GBR0 to GBR11, that is, whether all gain control amount information GBR0 to GBR11 have been encoded. If it is determined that all pieces of gain control amount information GBR have not been encoded, the process returns to step S181 to perform the step S181 and following steps to encode next unencoded gain control amount information GBRi.

If it is determined in step S183 that all gain control amount information GBR0 to GBR11 have been encoded, the process proceeds to step S184. In step S184, the encoder 91-8 outputs the codes determined in step S182 for the respective gain control amount information GBR0 to GBR11 to the terminal connected to the switch 93.

In step S185, the encoder 91-8 calculates the sum of the numbers of bits of the encoded gain control numbers GBR0 to GBR11 and outputs the calculated sum to the decision unit 92.

For example, in the case of 16 pieces of gain control amount information GBR shown in FIG. 62, codes with numbers of bits such as those shown in FIG. 62 are generated as the result of encoding, and thus a signal indicating that the total number of bits is equal to 21 is output to the decision unit 92.

If the conventional fixed-length (4-bit) encoding method were employed, the gain control amount information GBR in the example shown in FIG. 62 would be encoded into codes with a total of 64 (=4×16) bits. Thus, the total number of bits of encoded data according to the present invention is smaller by 43 than that according to the conventional technique.

Although in the coding table (FIG. 63) used in the present example, escape codes are used for some values, specific codes including no escape code may be assigned to all respective values.

In the present example, the difference value WB1 of the gain control amount information GBL and that of the gain control amount information GBR are assumed to have such a characteristic shown in FIG. 60. In a case in which the characteristic of the difference value WB1 varies from one encoding unit Ai to another, the coding table may be switched depending on the characteristic of the difference value WB1.

The encoding method employed by the encoder 91-9 is described.

In many cases, in gain control amount information GBLi of a left-channel signal and gain control amount information GBRi of a right-channel signal in the same frequency band of a stereo audio signal, there are an equal number of pieces of gain control amount information GB and, besides, Nth gain control amount information GBLi and corresponding Nth gain control amount information GBRi are equal to each other, as is the case with gain control amount information GBL1 and gain control amount information GBR1 of gain control amount information GBL0 to GBL11 and gain control amount information GBR0 to GBR11 shown in FIG. 64.

In view of the above, the encoder 91-9 encodes either gain control amount information GBL0 to GBL11 or gain control amount information GBR0 to GBR11 into codes with a fixed bit length and encodes the other in such manner that when, in gain control amount information GBLi and gain control amount information GBRi, there are an equal number of pieces of gain control amount information GB and, besides, Nth gain control amount information GBLi and corresponding Nth gain control amount information GBRi are equal to each other, only a flag (encoding flag) set to a value (0, in this specific example) indicating the above fact is encoded.

Figure 65:
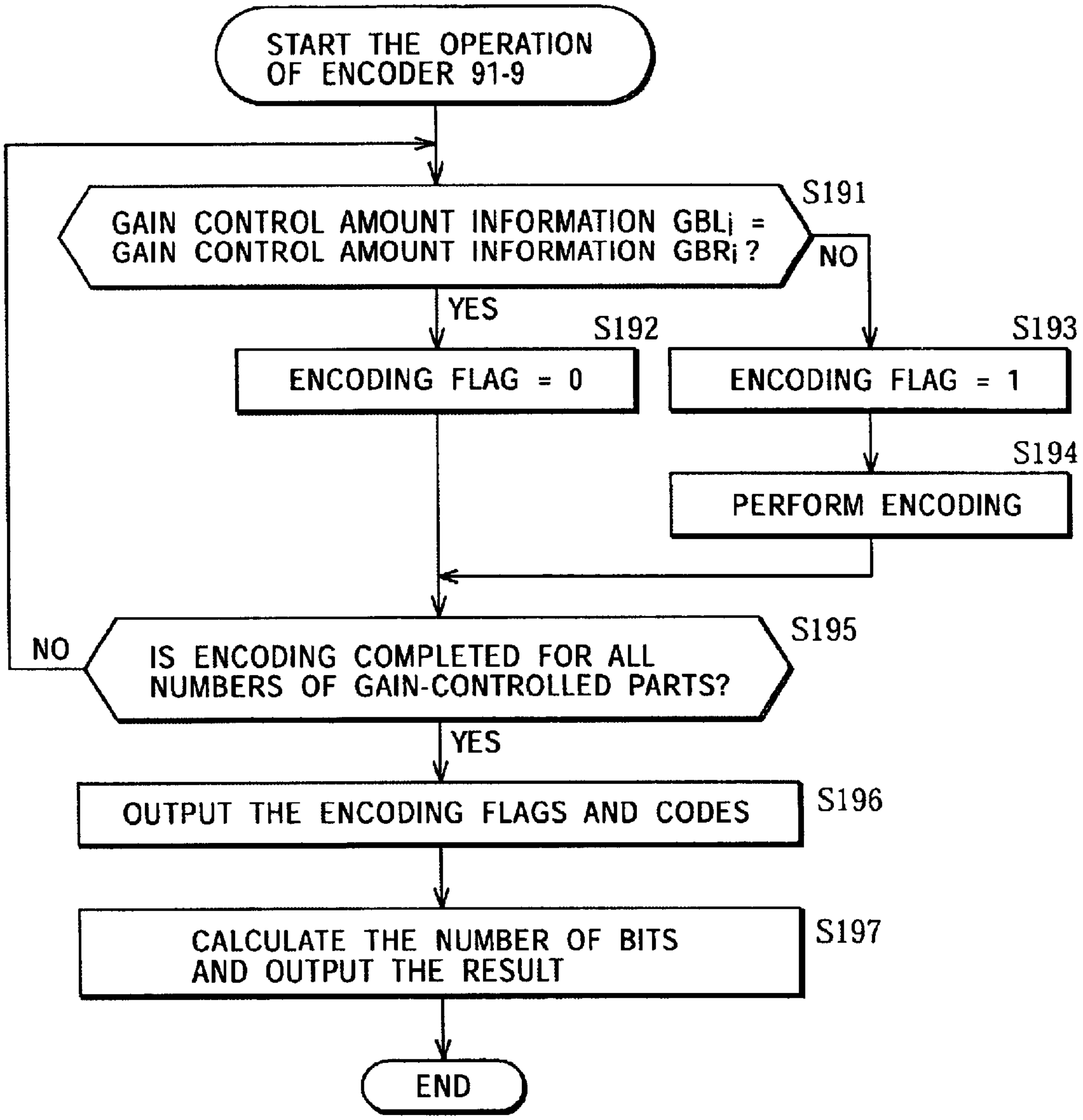
FIG. 65 is a flow chart showing the operation of an encoder 91-9.

In the case in which gain control amount information GBL is encoded into codes with a fixed bit length, coding of gain control amount information GBR is performed in a manner described below with reference to a flow chart shown in FIG. 65.

In step S191, the encoder 91-9 detects gain control amount information GBLi in one frequency band from gain control information GL0 to GL11 of the input left-channel signal and also detects gain control amount information GBRi in the same frequency band from gain control information GR0 to GR11 of the input right-channel signal. The encoder 91-9 determines whether there are an equal number of pieces of gain control amount information GB in both gain control amount information GBLi and gain control amount information GBRi and Nth gain control amount information GBLi and corresponding Nth gain control amount information GBRi are equal to each other. If it is determined that there are an equal number of pieces of gain control amount information GB, and Nth gain control amount information GBLi and corresponding Nth gain control amount information GBRi are equal to each other, the process proceeds to step S192. In step S192, the encoding flag associated with the gain control amount information GBRi is set to a value (0, in this specific example) so as to indicate the above fact.

For example, in the case of gain control amount information GBL1 and gain control amount information GBR1 in the example shown in FIG. 64, there are equally two pieces of gain control amount information GB, and first gain control amount information GBL1 (=7) and second gain control amount information GBL1 (=6) are equal to corresponding first gain control amount information GBR1 (=7) and second gain control amount information GBR1 (=6), and thus the encoding flag associated with GBR1 is set to 0.

In a case in which it is determined in step S191 that there is a difference in the number of gain control amount information GB between gain control amount information GBLi and gain control amount information GBRi, or there is a difference in value between Nth gain control amount information GBLi and corresponding Nth gain control amount information GBRi, the process jumps to step S193. In step S193, the encoder 91-9 sets the encoding flag associated with the gain control number GBRi to 1.

For example, in the case of gain control amount information GBL5 and gain control amount information GBR5 in the example shown in FIG. 64, there is a difference in value between (first) gain control amount information GBL5 (=6) and (first) gain control amount information GBR5 (=5), and thus, the encoding flag associated with the gain control amount information GBR5 is set to 1.

In the next step S194, the encoder 91-9 encodes the gain control amount information GBRi in a similar manner as with, for example, the encoder 91-8.

More specifically, the encoder 91-9 calculates the difference value WB1 by subtracting gain control amount information GBLi from the detected gain control amount information GBRi, and the encoder 91-9 retrieves a code corresponding to the calculated difference value WB1 from a table similar to that shown in FIG. 63 and employs the retrieved code as the code for the gain control amount information GBRi.

For example, in the case of gain control amount information GBR5 in the example shown in FIG. 64, the difference value WB1 thereof is −1 (=gain control amount information GBR5 (=5−gain control amount information GBL5 (=6)), and thus a 3-bit code "101" is employed as the code of the gain control amount information GBR5.

In the case in which an encoding flag has been set to 0 in step S192 or in the case in which gain control amount information GBRi has been encoded in step S194, the process proceeds to step S195. In step S195, the encoder 91-9 determines whether all encoding flags have been set to 0 or 1 and gain control amount information GBRi corresponding to an encoding flag set to 1 has been encoded, that is, the encoder 91-9 determines whether gain control amount information GBR0 to GB11 have all been encoded. If it is determined that all pieces of gain control amount information GBRi have not been encoded, the process returns to step S191 to perform the step S191 and following steps to encode next unencoded gain control amount information GBRi.

If it is determined in step S195 that all gain control amount information GBR0 to GBR11 have been encoded, the process proceeds to step S196. In step S196, the encoder 91-9 outputs the encoding flag set to 0 or 1 and the codes to the terminal connected to the switch 93.

In the next step S197, the encoder 91-9 calculates the sum of the numbers of bits of the encoded gain control numbers GBR0 to GBR11 and outputs the calculated sum to the decision unit 92.

For example, in the case of 18 pieces of gain control amount information GBR shown in FIG. 64, 12 1-bit encoding flags and codes with number of bits such as those shown in FIG. 64 are generated as a result of encoding of the 18 pieces of gain control amount information GBR, and thus a signal indicating that the total number of bits is equal to 20 (=12+8) is output to the decision unit 92.

If the conventional fixed-length (4-bit) encoding method were employed, the gain control amount information GBR in the example shown in FIG. 64 would be encoded into codes with a total of 72 (=4×18) bits. Thus, the total number of bits of encoded data according to the present invention is smaller by 52 than that according to the conventional technique.

Although in the example described above, when there is a difference in the number of gain control amount information GB between gain control amount information GBLi and gain control amount information GBRi, or when there is a difference in value between Nth gain control amount information GBLi and corresponding Nth gain control amount information GBRi, encoding of gain control amount information GBRi is performed in a similar manner as with the encoder 91-8, the encoding may be performed according to another method.

The encoding method employed by the encoder 91-10 is described.

In some cases, in the stereo audio signal, as shown in FIG. 66, all gain control amount information GBL0 to GBL11 of the left-channel signal become equal to corresponding gain control amount information GBR0 to GBR11 of the right-channel signal.

In view of the above, the encoder 91-10 encodes either gain control amount information GBL0 to GBL11 or gain control amount information GBR0 to GBR11 into codes with a fixed bit length, but, when gain control amount information GBL0 to GBL11 are all equal to corresponding gain control amount information GBR0 to GBR11, encoding is not performed for the other set of gain control amount information.

Figure 67:
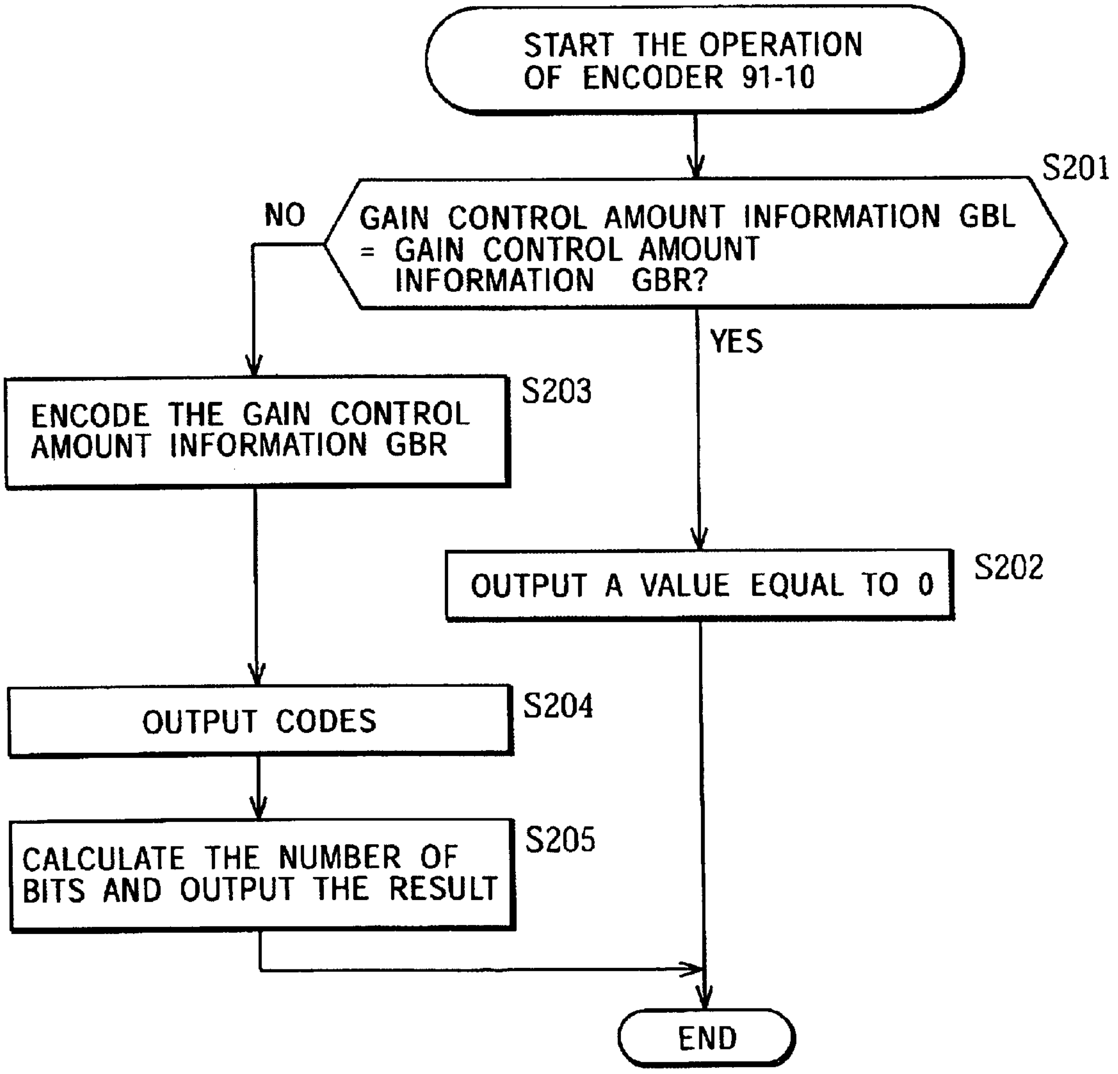
FIG. 67 is a flow chart showing the operation of an encoder 91-10.

In the case in which gain control amount information GBL is encoded into codes with a fixed bit length, coding of gain control amount information GBR is performed in a manner described below with reference to a flow chart shown in FIG. 67.

In step S201, the encoder 91-10 detects gain control amount information GBL0 to GBL11 and gain control amount information GBR0 to GBR11 from the input gain control information GL0 to GL11 of the left-channel signal and gain control information GR0 to GR11 of the right-channel signal, respectively. The encoder 91-10 then determines whether the gain control amount information GBL0 to GBL11 and the gain control amount information GBR0 to GBR11 are equal to each other between corresponding counterparts. If it is determined that they are all equal to each other as is the case in the example shown in FIG. 66, the process proceeds to step S202.

In step S202, the encoder 91-10 does not encode the gain control amount information GBR0 to GBR11, but the encoder 91-10 outputs a value of 0 indicating the number of codes to the decision unit 92.

In a case in which it is determined in step S201 that the gain control amount information GBL0 to GBL11 and the gain control amount information GBR0 to GBR11 are not all equal to each other between corresponding counterparts, the process proceeds to step S203. In step S203, the encoder 91-10 encodes the gain control amount information GBR0 to GBR11, for example, into codes with a fixed bit length (4 bits).

In the next step S204, the encoder 91-10 outputs the resultant codes of the respective gain control amount information GBR0 to GBR11 to the terminal connected to the switch 93.

In step S205, the encoder 91-10 calculates the sum of the numbers of bits of the encoded gain control amount information GBR0 to GBR11 and outputs the calculated sum to the decision unit 92.

In the example shown in FIG. 66, the total number of bits of the codes of the gain control amount information GBR is equal to 104 (=4×26). Thus, a signal indicating that the total number of bits is equal to 104 is supplied to the decision unit 92.

If the conventional fixed-length (4-bit) encoding method were employed, the gain control amount information GBR in the example shown in FIG. 66 would be encoded into codes with a total of 104 (=4×26) bits. Thus, when the gain control amount information GBR is not encoded, the total number of bits of encoded data according to the present invention is smaller by 104 than that according to the conventional technique.

The encoding method employed by the encoder 91-11 is described.

As described earlier with reference to FIG. 41, in plural pieces of gain control amount information GBi, the difference value VB1 obtained by subtracting the Nth gain control amount information GBi from the (N+1)th gain control amount information GBi has a high probability of becoming equal to a particular value.

Furthermore, in the case of stereo audio signals, as described earlier with reference to FIG. 60, the difference value WB1 obtained by subtracting gain control amount information GBLi from gain control amount information GBRi in the same frequency band has a high probability of becoming equal to a particular value.

Figure 68:
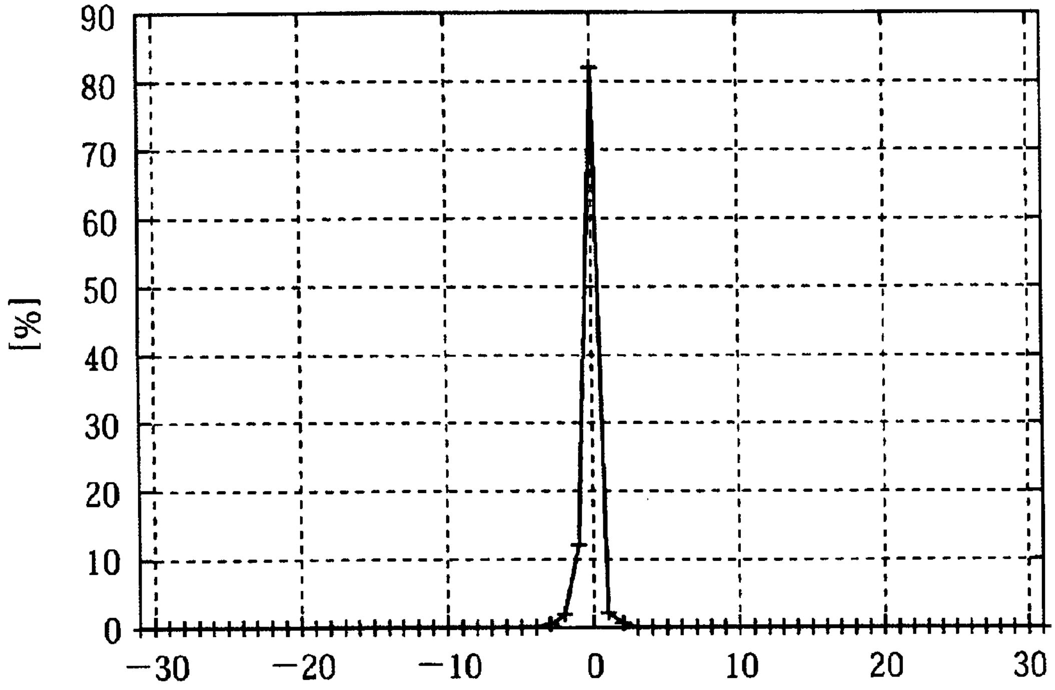
FIG. 68 is a graph showing a characteristic of a difference value WB2.

Therefore, the difference value WB2 obtained by subtracting the difference value VB1 of the gain control amount information GBLi from the difference value VB1 of the gain control amount information GBRi has a high probability of becoming equal to a particular value (0 or a value whose absolute value is close to 0) as shown in FIG. 68.

In view of the above, the encoder 91-11 encodes gain control amount information GB such that either gain control amount information GBL0 to GAL11 or gain control amount information GBR0 to GBR11 are encoded and codes with small numbers of bits are assigned to difference values WB2 having high occurrence probabilities.

Figure 69:
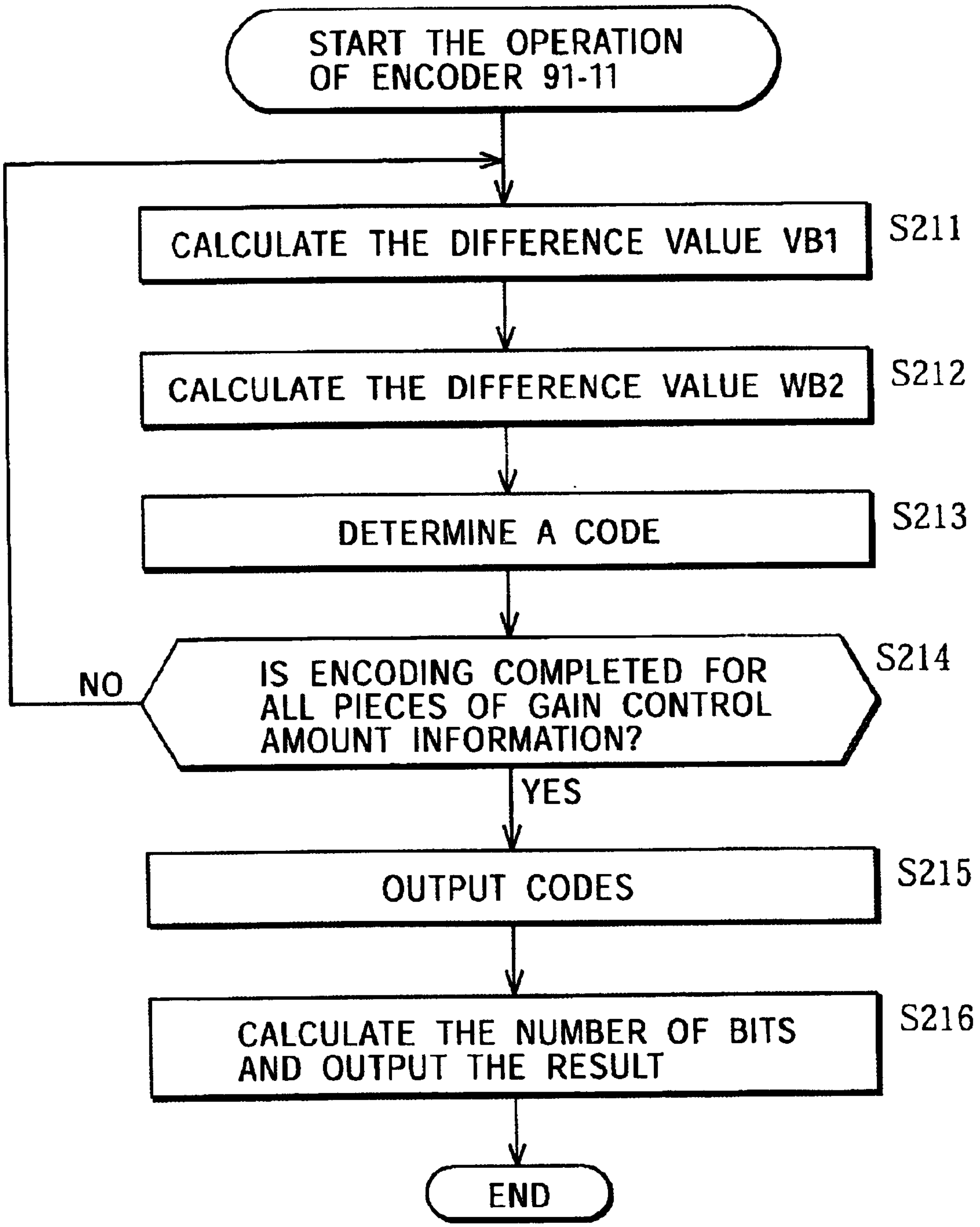
FIG. 69 is a flow chart showing the operation of an encoder 91-11.

The operation of the encoder 91-11 is described below with reference to a flow chart shown in FIG. 69. Herein, it is assumed that the encoder 91-11 encodes gain control amount information GBR.

In step S211, the encoder 91-11 detects gain control amount information GBLi in one frequency band from gain control information GL0 to GL11 of the input left-channel signal and also detects gain control amount information GBRi in the same frequency band from gain control information GR0 to GR11 of the input right-channel signal.

Furthermore, the encoder 91-11 calculates the difference value VB1 of (N+1)th gain control amount information GBLi by subtracting Nth gain control amount information GBLi from the (N+1)th gain control amount information GBLi, and also calculates the difference value VB1 of (N+1)th gain control amount information GBRi by subtracting Nth gain control amount information GBRi from the (N+1)th gain control amount information GBRi.

The difference value VB1 of first gain control amount information GBLi is defined as being equal to the value of the first gain control amount information GBLi, and the difference value VB1 of first gain control amount information GBRi is defined as being equal to the value of the first gain control amount information GBRi.

For example, in the case of gain control amount information GBL3 of gain control amount information GBL0 to GBL11 shown in FIG. 70, the difference value VB1 of first gain control amount information GBL3 is given by the same value (=5, not shown) as that of the first gain control amount information GBL3 (=5), and the difference value VB1 of second gain control amount information GBL3 is given by a value (=−3) obtained by subtracting first gain control amount information GBL3 (=5) from the second gain control amount information GBL3 (=2).

Furthermore, in the case of gain control amount information GBR3 of gain control amount information GBR0 to GBR11, the difference value VB1 of first gain control amount information GBR3 is given by the same value (=4, not shown) as that of the first gain control amount information GBR3 (=4), and the difference value VB1 of second gain control amount information GBL3 is given by a value (=−2) obtained by subtracting first gain control amount information GBR3 (=4) from the second gain control amount information GBR3 (=2).

In the next step S212, the encoder 91-11 determines the difference value WB2 by subtracting the difference value VB1 of the gain control amount information GBLi from the difference value VB1 of the gain control amount information GBRi.

Hereinafter, for simplicity, the difference value WB2 obtained by subtracting the difference value VB1 of the gain control amount information GBLi from the difference value VB1 of the gain control amount information GBRi will be referred to simply as the difference value WB2 of the gain control amount information GBRi.

For example, in the case of gain control amount information GBL3 and gain control amount information GBR3 in the example shown in FIG. 70, the difference value WB2 of first gain control amount information GBR3 is given by a value (=−1) obtained by subtracting the difference value VB1 (=5) of first gain control amount information GBL3 from the difference value VB1 (=4) of the first gain control amount information GBR3, and the difference value WB2 of second gain control amount information GBR3 is given by a value (=1) obtained by subtracting the difference value VB1 (=−3) of second gain control amount information GBL3 from the difference value VB1 (=−2) of the second gain control amount information GBR3.

Figures 71, 72:
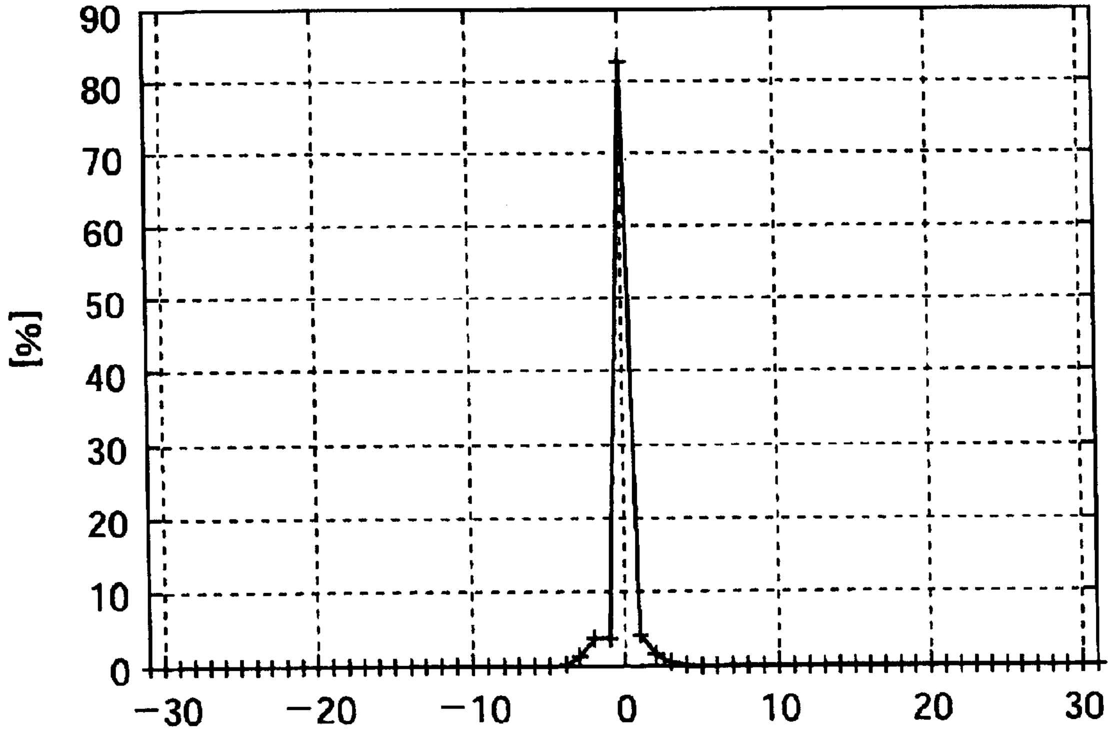
FIG. 71 shows another table in which a value-code correspondence and a procedure of determining codes for particular values are represented.
FIG. 72 is a graph showing a characteristic of a difference value WB3.

In step S213, the encoder 91-11 retrieves a code corresponding to a value equal to the difference value VB2 of the gain control amount information GBRi from a table shown in FIG. 71 and employs the retrieved code as the code for the gain control amount information GBRi.

For example, in the case of gain control amount information GBR3 in the example shown in FIG. 70, the difference value WB2 of first gain control amount information GBRL3 (=4) is −1, and thus a 2-bit code "10" is employed as the code of the first gain control amount information GBRL3. On the other hand, a 3-bit code "111" is employed for the second gain control amount information GBR3 (=2) because the difference value WB2 of the second gain control amount information GBR3 is 1.

In the table shown in FIG. 71, a 4-bit code "1100" is assigned to a value −2, a 3-bit code "10" is assigned to a value −1, a 1-bit code "0" to a value 0, and a 3-bit code "110" to a value 1.

Furthermore, in the table shown in FIG. 71, a procedure of determining a code for a value other than the values of −2 to 1 is defined (more specifically, the code is given by a formula 1111+original value). According to this procedure, an 8-bit code is given by a combination of a 4-bit code "1111" (escape code) and a following 4-bit code indicating the gain control amount information GB (original value, the gain control amount information GBR in this specific case).

In the next step S214, the encoder 91-11 determines whether codes have been determined for all gain control amount information GBR0 to GBR11, that is, whether all gain control amount information GBR0 to GBR11 have been encoded. If it is determined that all pieces of gain control amount information GBRi have not been encoded, the process returns to step S211 to perform the step S211 and following steps to encode next unencoded gain control amount information GBRi.

If it is determined in step S214 that all gain control amount information GBR0 to GBR11 have been encoded, the process proceeds to step S215. In step S215, the encoder 91-11 outputs the codes determined in step S213 for the respective gain control amount information GBR0 to GBR11 to the terminal connected to the switch 93.

In step S216, the encoder 91-11 calculates the sum of the numbers of bits of the encoded gain control numbers GBR0 to GBR11 and outputs the calculated sum to the decision unit 92.

For example, in the case of 29 pieces of gain control amount information shown in FIG. 70, codes with numbers of bits as shown in FIG. 70 are generated as a result of encoding, and thus a signal indicating that the total number of bits is equal to 37 is output to the decision unit 92.

If the conventional fixed-length (4-bit) encoding method were employed, the gain control amount information GBR in the example shown in FIG. 70 would be encoded into codes with a total of 116 (=4×29) bits. Thus, the total number of bits of encoded data according to the present invention is smaller by 79 than that according to the conventional technique.

Although in the coding table (FIG. 71) used in the present example, escape codes are used for some values, specific codes including no escape code may be assigned to all respective values.

In the present example, the difference value WB2 is assumed to have such a characteristic shown in FIG. 68. In a case in which the characteristic of the difference value WB2 varies from one encoding unit Ai to another, the coding table may be switched depending on the characteristic of the difference value WB2.

The encoding method employed by the encoder 91-12 is described.

As described earlier with reference to FIG. 44, the difference value VB2 obtained by subtracting gain control amount information GBi-1 of a lower frequency band immediately adjacent to the frequency band of gain control amount information GBi from the gain control amount information GBi has a high probability of becoming equal to a particular value.

Furthermore, in the case of stereo audio signals, as described earlier with reference to FIG. 60, the difference value WB1 obtained by subtracting gain control amount information GBRi from gain control amount information GBLi in the same frequency band has a high probability of becoming equal to a particular value.

Therefore, for example, the difference value WB3 obtained by subtracting the difference value VB2 of the gain control amount information GBLi from the difference value VB2 of the gain control amount information GBRi has a high probability of becoming equal to a particular value (0 or a value whose absolute value is close to 0 s) as shown in FIG. 72.

In view of the above, the encoder 91-12 encodes gain control amount information GB such that either gain control amount information GBL0 to GBL11 or gain control amount information GBR0 to GBR11 are encoded, and codes with small numbers of bits are assigned to difference values WB3 having high occurrence probabilities.

Figure 73:
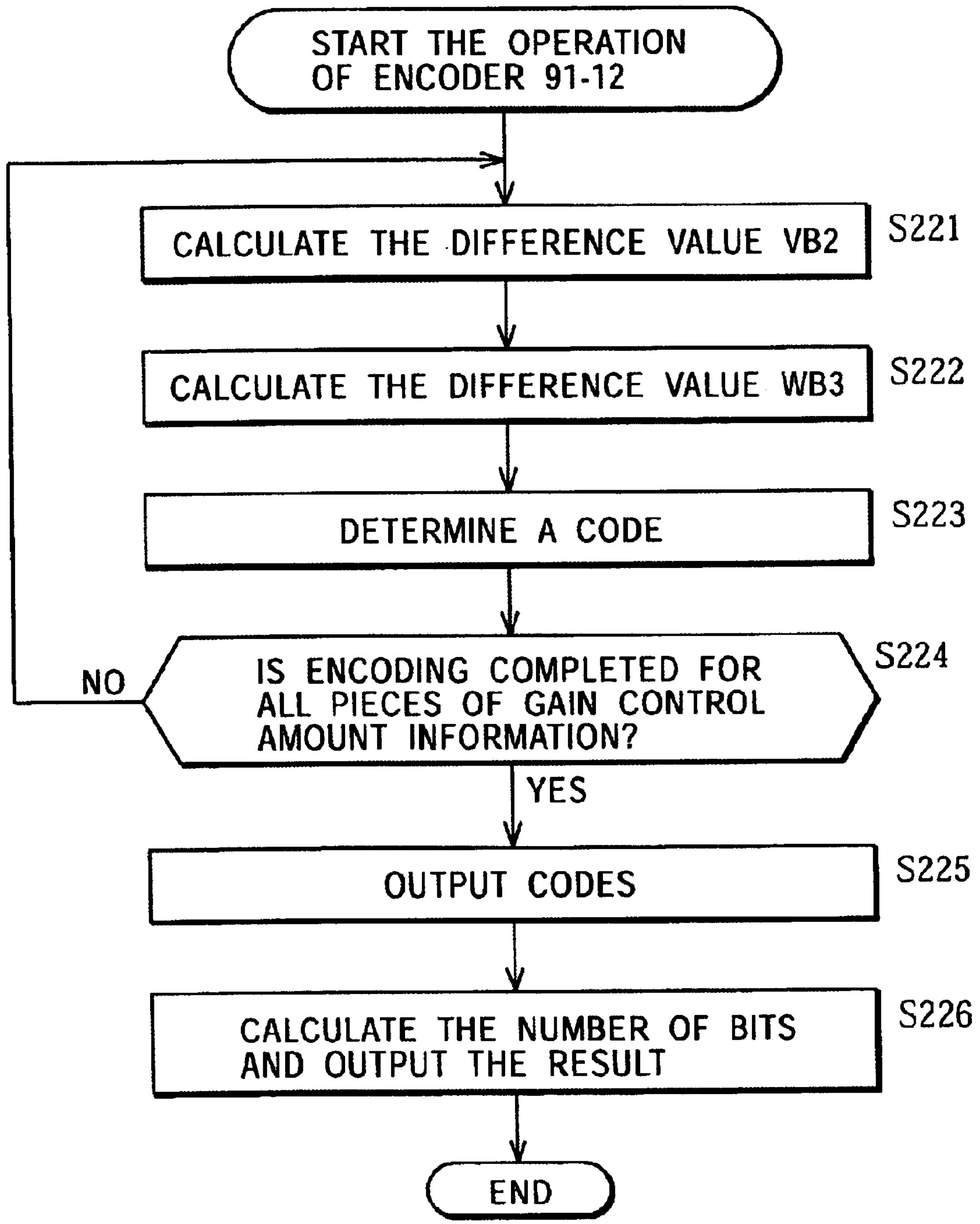
FIG. 73 is a flow chart showing the operation of an encoder 91-12.

The operation of the encoder 91-12 is described below with reference to a flow chart shown in FIG. 73. Herein, it is assumed that the encoder 91-8 encodes gain control amount information GBR.

In step S221, the encoder 91-12 detects gain control amount information GBLi in one frequency band from gain control information GL0 to GL11 of the input left-channel signal and also detects gain control amount information GBRi in the same frequency band from gain control information GR0 to GR11 of the input right-channel signal.

The encoder 91-12 determines the difference value VB2 of the gain control amount information GBLi by subtracting, from the gain control amount information GBLi, the gain control amount information GBLi-1 of an encoding unit Ai-1 which is in a lower frequency band adjacent to the frequency band of the encoding unit Ai and which was detected in previous execution of step S221.

The encoder 91-12 also determines the difference value VB2 of the gain control amount information GBRi by subtracting the gain control amount information GBRi-1, which was detected in previous execution of step S221, from the gain control amount information GBRi.

For example, in the case of gain control amount information GBL3 of gain control amount information GBL0 to GBL11 shown in FIG. 74, the difference value VB2 of first gain control amount information GBL3 (=5) is given by a value (=−1) obtained by subtracting first gain control amount information GBL2 (=6) from the first gain control amount information GBL3 (=5), and the difference value VB2 of second gain control amount information GBL3 (=2) is given by a value (=−3, not shown) obtained by subtracting second gain control amount information GBL2 (=5) from the second gain control amount information GBL3 (=2).

Furthermore, in the case of gain control amount information GBR3 of gain control amount information GBR0 to GBR11 shown in FIG. 74, the difference value VB2 of first gain control amount information GBR3 (=4) is given by a value (=−2, not shown) obtained by subtracting first gain control amount information GBR2 (=6) from the first gain control amount information GBR3 (=4), and the difference value VB2 of second gain control amount information GBR3 (=2) is given by a value (=−3, not shown) obtained by subtracting second gain control amount information GBR2 (=5) from the second gain control amount information GBR3 (=2).

In the next step S222, the encoder 91-12 determines the difference value WB3 by subtracting the difference value VB2 of the gain control amount information GBLi from the difference value VB2 of the gain control amount information GBRi.

Hereinafter, for simplicity, the difference value VB3 obtained by subtracting the difference value VB3 of the gain control amount information GBLi from the difference value VB2 of the gain control amount information GBRi will be referred to simply as the difference value WB3 of the gain control amount information GBRi.

For example, in the case of gain control amount information GBL3 and gain control amount information GBR3 in the example shown in FIG. 74, the difference value WB3 of first gain control amount information GBR3 is given by a value (=1) obtained by subtracting the difference value VB2 (=−1) of first gain control amount information GB3 from the difference value VB2 (=−2) of the first gain control amount information GBR3, and the difference value WB3 of second gain control amount information GBR3 is given by a value (=0) obtained by subtracting the difference value VB3 (=−3) of second gain control amount information GBL3 from the difference value VB2 (=−3) of the second gain control amount information GBR3.

In step S223, the encoder 91-12 retrieves a code corresponding to a value equal to the difference value WB3 calculated in step S222 from a table shown in FIG. 75 and employs the retrieved code as the code for the gain control amount information GBRi.

For example, in the case of gain control amount information GBR3 in the example shown in FIG. 74, the difference value WB3 of first gain control amount information GGR3 (=4) is −1, and thus a 3-bit code "101" is employed as the code of the first gain control amount information GGR3, and a 1-bit code "0" is employed for second gain control amount information GGR3 (=2) because the difference value WB3 of the second gain control amount information GGR3 is 0.

In the table shown in FIG. 75, a 3-bit code "100" is assigned to a value −2, a 3-bit code "101" to a value −1, a 1-bit code "0" to a value 0, and a 3-bit code "110" to 1.

Furthermore, in the table shown in FIG. 75, a procedure of determining a code for a value other than the values of −2 to 1 is defined (more specifically, the code is given by a formula 111+original value). According to this procedure, a 7-bit code is given by a combination of a 3-bit code "111" and a following 4-bit code indicating the gain control amount information GB (original value, the gain control amount information GBR in this specific case).

In the next step S224, the encoder 91-12 determines whether codes have been determined for all gain control amount information GBR0 to GBR11, that is, whether all gain control amount information GBR0 to GBR11 have been encoded. If it is determined that all pieces of gain control amount information GBRi have not been encoded, the process returns to step S221 to perform the step S221 and following steps to encode next unencoded gain control amount information GBRi.

If it is determined in step S224 that all gain control amount information GBR0 to GBR11 have been encoded, the process proceeds to step S225. In step S225, the encoder 91-12 outputs the codes determined in step S223 for the respective gain control amount information GBR0 to GBR11 to the terminal connected to the switch 93.

In step S226, the encoder 91-12 calculates the sum of the numbers of bits of the encoded gain control numbers GBR0 to GBR11 and outputs the calculated sum to the decision unit 92.

For example, in the case of 29 pieces of gain control amount information GBR shown in FIG. 74, codes with numbers of bits as shown in FIG. 74 are generated as a result of encoding, and thus a signal indicating that the total number of bits is equal to 46 is output to the decision unit 92.

If the conventional fixed-length (4-bit) encoding method were employed, the gain control amount information GBR in the example shown in FIG. 74 would be encoded into codes with a total of 116 (=4×29) bits. Thus, in this example, the total number of bits of encoded data according to the present invention is smaller by 70 than that according to the conventional technique.

Although in the coding table (FIG. 75) used in the present example, escape codes are used for some values, specific codes including no escape code may be assigned to all respective values.

In the present example, the difference value WB2 is assumed to have such a characteristic shown in FIG. 72. In a case in which the characteristic of the difference value WB3 varies from one encoding unit Ai to another, the coding table may be switched depending on the characteristic of the difference value WB3.

In addition to above-described various methods employed by the gain control amount information encoder 72 to encode the gain control amount information, there may be provided an additional encoder for encoding the gain control number into a code with a fixed bit length according to the conventional technique.

Figure 76:
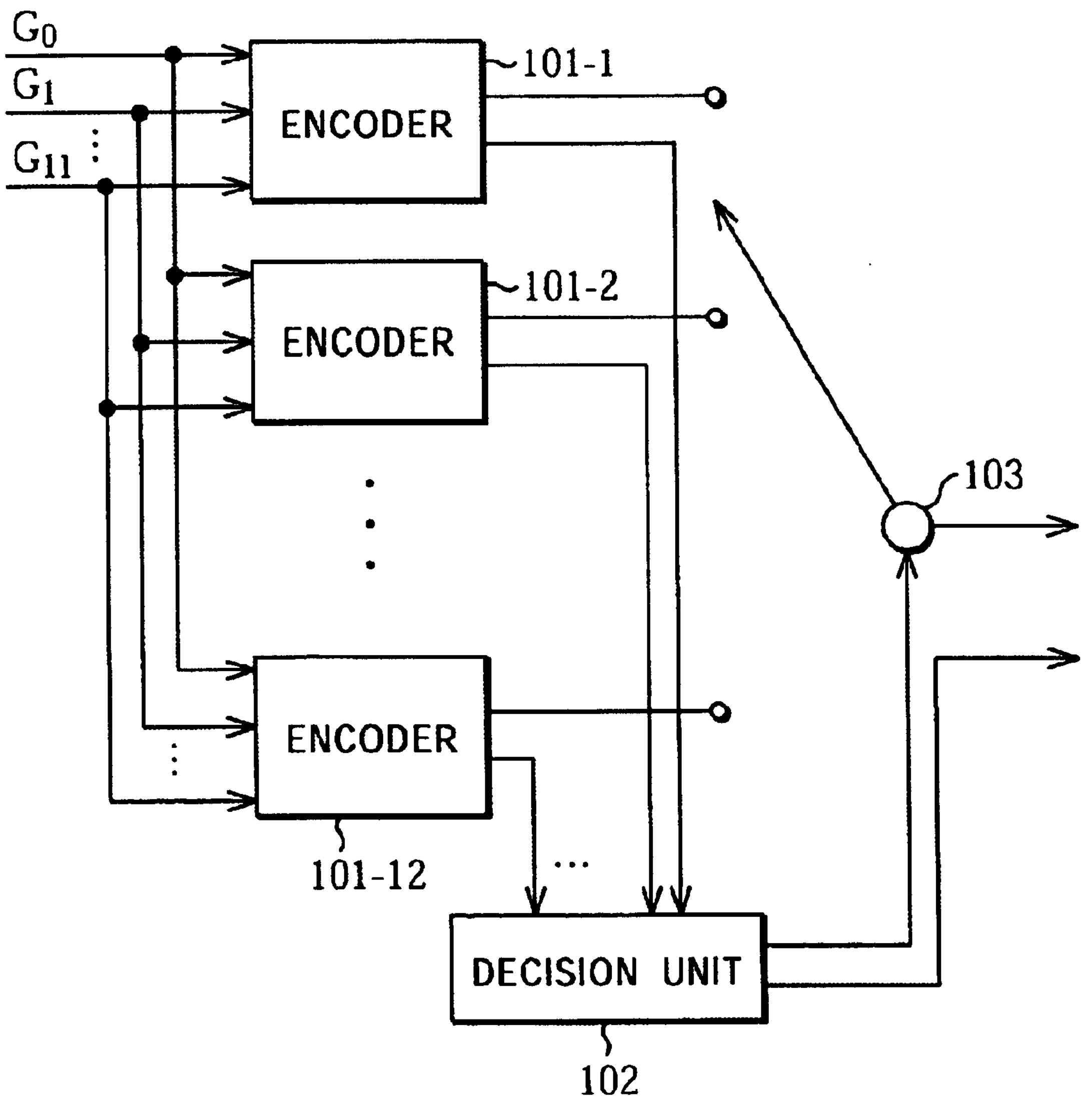
FIG. 76 is a block diagram showing an example of a construction of a gain control position information encoder 73 shown in FIG. 8.

Now, the gain control position information encoder 73 (FIG. 8) of the gain control information encoder 61 is described. FIG. 76 shows an example of a construction of the gain control position information encoder 73.

Gain control information G0 to G11 output from the spectrum converters 12-1 to 12-12 are input to each of 12 encoders 101-1 to 101-12.

The encoders 101-1 to 101-12 detect gain control position information GC0 to GC11 from the respective input gain control information G0 to G11 and encode the detected gain control position information GC0 to GC11 by means of predetermined encoding methods. Resultant encoded data are output to terminals connected to switch 103. In the present example, gain control position information GC takes one of values from 0 to 31 serving as an index indicating a gain control position.

Each of the encoders 101-1 to 101-12 calculates the sum of the numbers of bits of the encoded gain control numbers GC0 to GC11 and outputs the calculated sum to the decision unit 102.

The decision unit 102 detects, among encoders 101-1 to 101-12, an encoder 101 which has output a smallest sum, that is, an encoder 101 which has encoded the gain control numbers GC0 to GC11 into a smallest total number of bits, and the decision unit 102 controls the switch 103 so that the encoded gain control numbers GC0 to GC11 encoded by the detected encoder 101 are output to the multiplexer 16. The decision unit 102 outputs information indicating the encoding method employed by the detected encoder 101 to the multiplexer 16. The decision unit 102 stores information indicating the encoding methods employed by the respective encoders 101.

The encoding methods employed by the respective encoders 101-1 to 101-12 are described.

First, the encoding method employed by the encoder 101-1 is described below with reference to a flow chart shown in FIG. 77.

In step S231, the encoder 101-1 detects gain control position information GCi (i=0, 1, 2, . . . , 11) from the input gain control information G0 to G11.

In the next step S232, the encoder 101-1 determines a code to be assigned to first gain control position information GCi of the plural pieces of gain control position information GCi detected in step S231. More specifically, the encoder 101-1 expresses the first gain control position information GCi using 5 bits, and employs that 5-bit expression as the code of the first gain control position information GCi.

For example, in the case of gain control position information GC0 of gain control position information GC0 to GC11 shown in FIG. 79, first gain control position information GC0 (=9) is expressed using 5 bits and the resultant 5-bit expression is employed as the code of the first gain control position information GC0.

Figure 78:
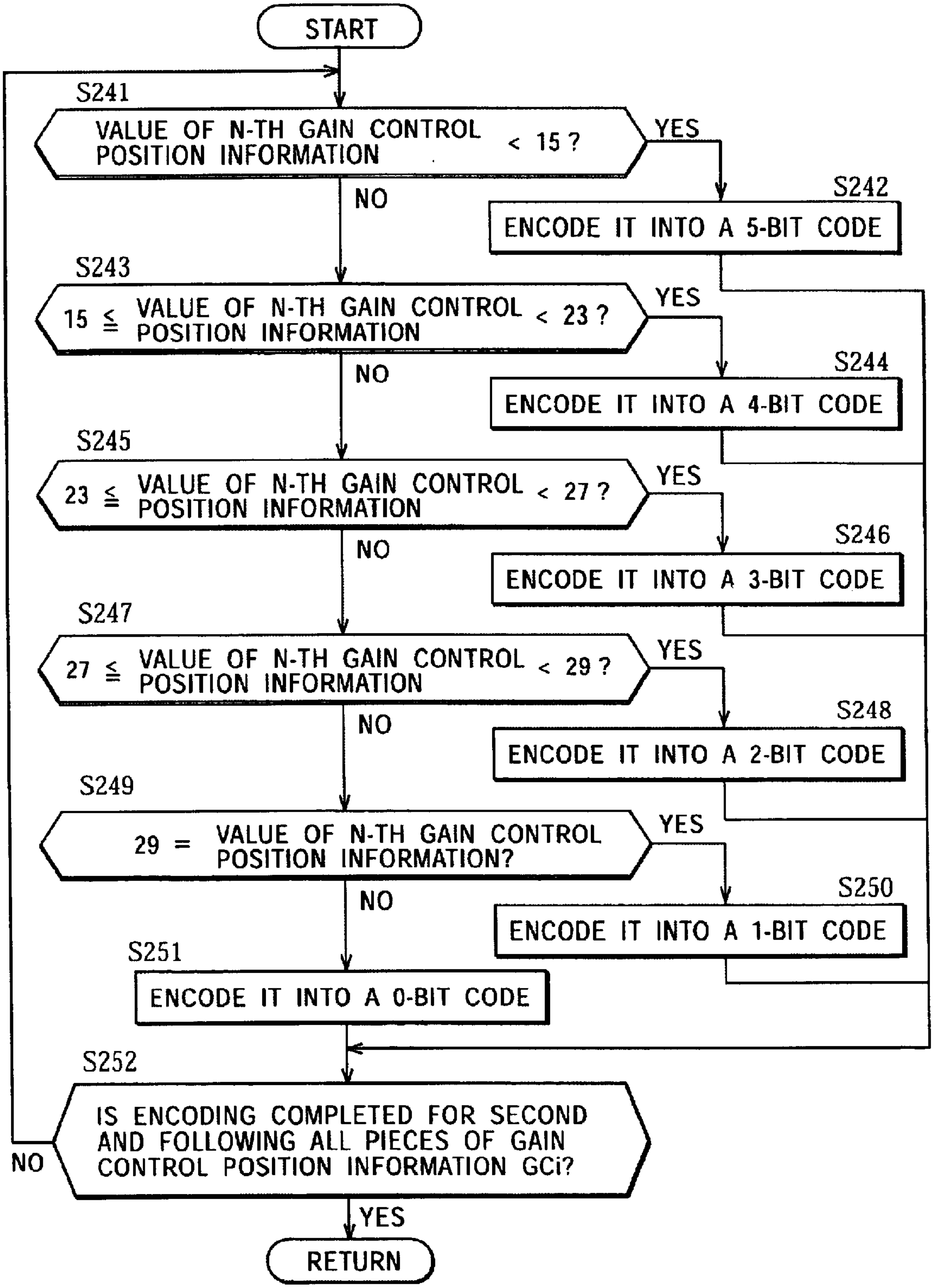
FIG. 78 is a flow chart showing the details of step S233 shown in FIG. 77.

In step S233, the encoder 101-1 determines codes for second and following gain control position information GCi of the plural pieces of gain control position information GCi detected in step S231. The details of the process in step S233 are shown in a flow chart of FIG. 78.

Herein, we denote the second gain control position information GCi and following gain control position information GCi, to be encoded, by (N+1) th gain control position information GCi (where N=1, 2, . . . ). In step S241, the encoder 101-1 determines whether Nth gain control position information GCi is smaller than 15. In the case in which it is determined that the Nth gain control position information GCi is smaller than 15, that is, in the case in which the Nth gain control position information GCi has a value in the range from 0 to 14, the process proceeds to step S242. In step S242, the encoder 101-1 expresses the (N+1)th gain control position information GCi using 5 bits, and the resultant expression in 5 bits is employed as the code of the (N+1)th gain control position information GCi.

In the case in which it is determined in step S241 that the Nth gain control position information GCi is not smaller than 15, that is, in the case in which the Nth gain control position information GCi has a value in the range from 15 to 31, the process proceeds to step S243. In step S243, the encoder 101-1 determines whether the Nth gain control position information GCi is equal to or greater than 15 but smaller than 23. If it is determined that the Nth gain control position information GCi is equal to or greater than 15 but smaller than 23, that is, in the case in which the Nth gain control position information GCi has a value in the range from 15 to 22, the process proceeds to step S244.

In step S244, the encoder 101-1 subtracts 16 from the (N+1)th gain control position information GCi and expresses the result using 4 bits. The resultant 4-bit expression is employed as the code of the (N+1)th gain control position information GCi.

When the Nth gain control position information GCi has a value in the range from 15 to 22, the (N+1)th gain control position information GCi must have a value in the range from 16 to 31. Therefore, if 16 is subtracted from the (N+1)th gain control position information GCi, the result becomes equal to or smaller than 15 and thus the resultant value can be expressed using 4 bits. Thus, the encoder 101-1 determines a 4-bit expression of the value obtained by subtracting 16 from the (N+1)th gain control position information GCi and employs the resultant 4-bit expression as the code of the (N+1)th gain control position information GCi.

In the case in which it is determined in step S243 that the Nth gain control position information GCi is not within the range from 15 to 23 (boundary value 23 is not included in the range), that is, in the case in which the Nth gain control position information GCi has a value in the range from 23 to 31, the process proceeds to step S245. In step S245, the encoder 101-1 determines whether the Nth gain control position information GCi is equal to or greater than 23 but smaller than 27.

If it is determined in step S245 that the Nth gain control position information GCi is equal to or greater than 23 but smaller than 27, that is, in the case in which the Nth gain control position information GCi has a value in the range from 23 to 26, the process proceeds to step S246. In step S246, the encoder 101-1 subtracts 24 from the (N+1)th gain control position information GCi and expresses the result using 3 bits. The resultant 3-bit expression is employed as the code of the (N+1)th gain control position information GCi.

When the Nth gain control position information GCi has a value in the range from 23 to 26, the (N+1)th gain control position information GCi must have a value in the range from 24 to 31. Therefore, if 24 is subtracted from the (N+1)th gain control position information GCi, the result becomes equal to or smaller than 7 and thus the resultant value can be expressed using 3 bits. Thus, the encoder 101-1 determines a 3-bit expression of the value obtained by subtracting 24 from the (N+1)th gain control position information GCi and employs the resultant 3-bit expression as the code of the (N+1)th gain control position information GCi.

For example, in the case of gain control position information GC3 in the example shown in FIG. 79, first gain control position information GC3 (=26) is within the range from 23 to 27 (boundary value 27 is not included in the range), and thus 3-bit data representing the value (=4) obtained by subtracting 24 from second gain control position information GC3 (=28) is employed as the code of the second gain control position information GC3 (=28).

If it is determined in step S245 that the Nth gain control position information GCi is not within the range from 23 to 27 (boundary value 27 is not included in the range), that is, in the case in which the Nth gain control position information GCi has a value in the range from 27 to 31, the process proceeds to step S247. In step S247, the encoder 101-1 determines whether the Nth gain control position information GCi is equal to or greater than 27 but smaller than 29.

If it is determined in step S247 that the Nth gain control position information GCi is equal to or greater than 27 but smaller than 29, that is, in the case in which the Nth gain control position information GCi is equal to 27 or 28, the process proceeds to step S248. In step S248, the encoder 101-1 subtracts 28 from the (N+1)th gain control position information GCi and expresses the result using 2 bits. The resultant 2-bit expression is employed as the code of the (N+1)th gain control position information GCi.

When the Nth gain control position information GCi has a value equal to 27 or 28, the (N+1)th gain control position information GCi must have a value in the range from 28 to 31. Therefore, if 28 is subtracted from the (N+1)th gain control position information GCi, the result becomes equal to or smaller than 3 and thus the resultant value can be expressed using 2 bits. Thus, the encoder 101-1 determines a 2-bit expression of the value obtained by subtracting 28 from the (N+1)th gain control position information GCi and employs the resultant 2-bit expression as the code of the (N+1)th gain control position information GCi.

For example, in the case of gain control position information GC7 in the example shown in FIG. 79, second gain control position information GC7 (=27) is within the range from 27 to 29 (boundary value 29 is not included in the range), and thus 2-bit data representing the value (=1) obtained by subtracting 28 from third gain control position information GC7 (=29) is employed as the code of the third gain control position information GC7 (=29). If it is determined in step S247 that the Nth gain control position information GCi is not within the range from 27 to 29 (boundary value 29 is not included in the range), that is, in the case in which the Nth gain control position information GCi has a value in the range from 29 to 31, the process proceeds to step S249. In step S249, the encoder 101-1 determines whether the Nth gain control position information GCi is equal to 29.

If it is determined in step S249 that the Nth gain control position information GCi is equal to 29, the process proceeds to step S250. In step S250, the encoder 101-1 subtracts 30 from the (N+1)th gain control position information GCi and expresses the result using 1 bit. The resultant 1-bit expression is employed as the code of the (N+1)th gain control position information GCi.

When the Nth gain control position information GCi has a value equal to 29, the (N+1)th gain control position information GCi must have a value equal to 30 or 31. Therefore, if 30 is subtracted from the (N+1)th gain control position information GCi, the result becomes equal to or smaller than 1 and thus the resultant value can be expressed using 1 bit. Thus, the encoder 101-1 determines a 1-bit expression of the value obtained by subtracting 30 from the (N+1)th gain control position information GCi and employs the resultant 1-bit expression as the code of the (N+1)th gain control position information GCi.

For example, in the case of gain control position information GC10 in the example shown in FIG. 79, second gain control position information GC10 has value equal to 29, and thus 1-bit data representing the value (=0) obtained by subtracting 30 from third gain control position information GC10 (=30) is employed as the code of the third gain control position information GC3 (=30).

If it is determined in step S249 that the Nth gain control position information GCi is not equal to 29, that is, in the case in which the Nth gain control position information GCi has a value equal to 30 or 31, the process proceeds to step S251. In step S251, the encoder 101-1 encodes the (N+1)th gain control position information GCi into a 0-bit code. That is, in practice, encoding of the (N+1)th gain control position information GCi is not performed.

When the value of the Nth gain control position information GCi is equal to 30, the (N+1)th gain control position information must have a value equal to 31. Therefore, when the value of the Nth gain control position information GCi is detected to be equal to 30, it can be concluded that the (N+1)th gain control position information GCi has a value equal to 31. When the value of the Nth gain control position information GCi is equal to 31, there is no (N+1)th gain control position information GCi. Therefore, when the value of the Nth gain control position information GCi is equal to 30 or 31, the encoder 101-1 does not perform encoding on the (N+1)th gain control position information GCi.

If the (N+1)th gain control position information GCi has been encoded in step S242, step S244, step S246, step S248, step S250, or step S251, the process proceeds to step S252. In step S252, the encoder 101-1 determines whether encoding is completed for second gain control position information GCi and following all pieces of gain control position information GCi of the gain control position information GCi detected in step S231. If it is determined that there is one or more pieces of gain control position information GCi which have not yet been encoded, the process returns to step S241 to perform the above-described process on next (N+1) th gain control position information GCi which has not yet been encoded.

Figure 77:
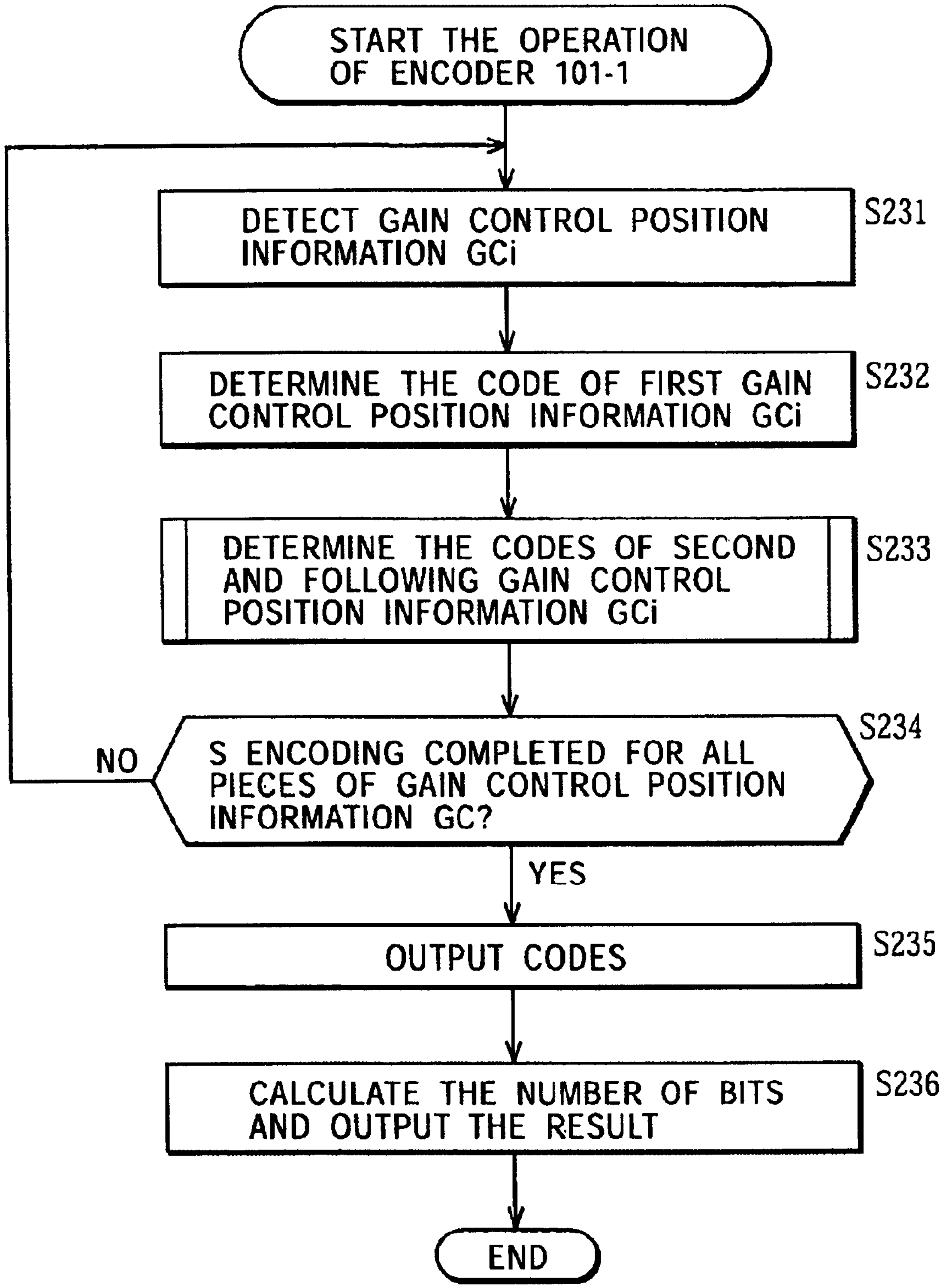
FIG. 77 is a flow chart showing the operation of an encoder 101-1.

On the other hand, if it is determined in step S252 that encoding is completed for second gain control position information GCi and following all pieces of gain control position information GCi of the gain control position information GCi detected in step S231, the flow exits the present process and proceeds to step S234 shown in FIG. 77.

In step S234, the encoder 101-1 determines whether all gain control position information GC0 to GC11 have been encoded. If it is determined that all pieces of gain control position information GC have not been encoded, the process returns to step S231 to perform the step S231 and following steps to encode next unencoded gain control position information GCi.

If it is determined in step S234 that all gain control position information GC0 to GC11 have been encoded, the process proceeds to step S235. In step S235, the encoder 101-1 outputs the codes determined in step S232 or S233 for the respective gain control position information GC0 to GC11 to the terminal connected to the switch 103.

In the next step S236, the encoder 101-1 calculates the sum of the numbers of bits of the encoded gain control position information GC0 to GC11 and outputs the calculated sum to the decision unit 102.

For example, in the case of 24 pieces of gain control position information GC shown in FIG. 79, codes with numbers of bits such as those shown in FIG. 79 are produced as a result of the encoding, and thus a signal indicating that the total number of bits is equal to 90 is output to the decision unit 102.

If the conventional fixed-length (5-bit) encoding method were employed, the gain control position information GC in the example shown in FIG. 79 would be encoded into codes with a total of 120 (=5×24) bits. Thus, the total number of bits of encoded data according to the present invention is smaller by 30 than that according to the conventional technique.

The encoding method employed by the encoder 101-2 is described.

Gain control position information GC indicates the position of an attack portion AT or a release portion RE (more precisely, information corresponding to an index indicated by gain control position information GC indicates the position of an attack portion AT or a release portion RE). The gain control position information GC indicating the position of release portions RE has high probabilities of having particular values (1, 3, 5, 7, 9, 11, 13, 15, 17, 19, 21, 23, 25, 27, and 29) as represented by broken lines in FIG. 80.

Figure 80:
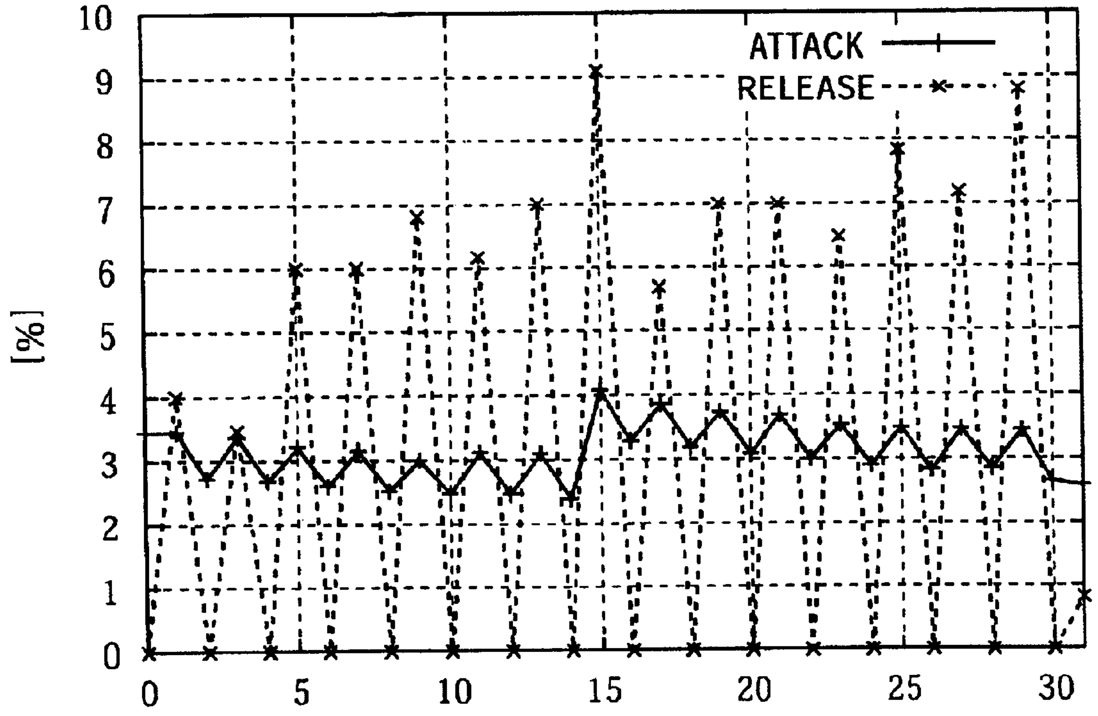
FIG. 80 is a graph showing a characteristic of gain control position information GC.

In view of the above, the encoder 101-2 encodes gain control position information GC (gain control position information GC indicating the position of a release portion RE, in the case of the example shown in FIG. 80) in such a manner that codes with small numbers of bits are assigned to values of gain control position information GC having high occurrence probabilities.

The operation of the encoder 101-2 is described below with reference to a flow chart shown in FIG. 81. In step S261, the encoder 101-2 detects gain control position information GCi of one frequency band from the input gain control information G0 to G11.

Figure 82:
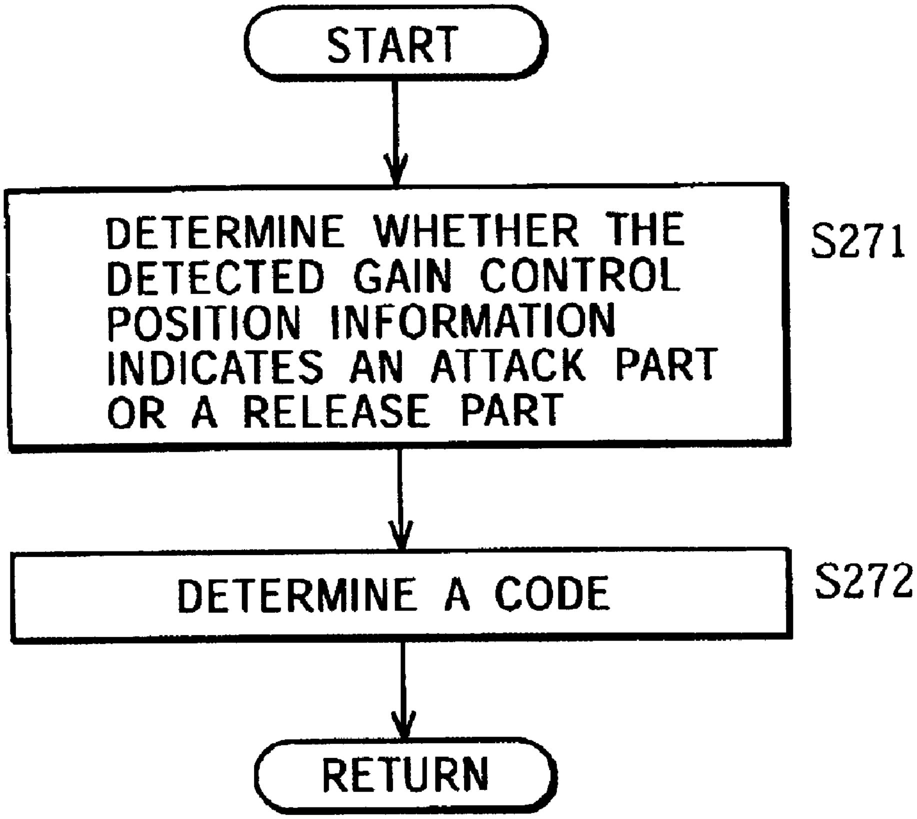
FIG. 82 is a flow chart showing the details of step S262 shown in FIG. 81.

In the next step S262, the encoder 101-2 determines a code to be assigned to the gain control position information GCi. In a case in which there are plural pieces of gain control position information GCi, the encoder 101-2 determines a code for each of the plural pieces of gain control position information GCi (first gain control position information GCi, second gain control position information GCi, . . . ). The details of the process in step S262 are shown in the form of a flow chart in FIG. 82.

That is, in step S271, the encoder 101-2 determines whether the detected gain control position information GCi indicates the position of an attack portion AT or a release portion RE.

More specifically, the encoder 101-2 detects Nth gain control amount information GBi corresponding to an Nth gain control position information GCi to be encoded and also (N+1)th gain control amount information GBi from input gain control information G0 to G11 and calculates the difference value between the Nth gain control amount information GBi and (N+1)th gain control amount information GBi. If the calculated difference value is positive, the encoder 101-2 determines that the Nth gain control position information GCi indicates the position of an attack portion AT. However, if the calculated difference value is negative, the encoder 101-2 determines that the Nth gain control position information GCi indicates the position of a release portion RE.

For example, in the case of gain control position information GC1 of gain control position information GC0 to GC11 shown in FIG. 84, first gain control position information GC1 (=4) and second gain control position information GC1 (=5) are detected as indicating the positions of attack portions AT (in FIG. 84, superscript "A" denotes that gain control position information GC indicates the position of an attack portion AT, and a similar notation is also used elsewhere), while third gain control position information GC1 (=13) is detected as indicating the positions of a release portion RE (in FIG. 84, superscript "R" denotes that gain control position information GC indicates the position of a release portion RE, a similar notation is also used elsewhere).

In the next step S272, the encoder 101-2 determines a code to be assigned to the gain control position information GCi depending on whether the gain control position information GCi indicates the position of an attack portion AT or a release portion RE.

More specifically, if the encoder 101-2 determines that gain control position information GCi indicates the position of a release portion RE, the encoder 101-2 retrieves a code corresponding to a value equal to the value of that gain control position information GCi from the table shown in FIG. 83 and employs the retrieved code as the code of the gain control position information GCi.

For example, in the case of third gain control position information GC1 (=13) of gain control position information GC1, the third gain control position information GC1 indicates the position of a release portion RE and thus a 4-bit code "0110" assigned to a value of 13 in the table shown in FIG. 83 is employed as the code of the third gain control position information GC1.

In the table shown in FIG. 83, 4-bit codes are assigned to respective values of 1, 3, 5, 7, 9, 11, 13, 15, 17, 19, 21, 23, 25, 27, and 29, and a 5-bit code is assigned to a value of 31. That is, if the encoder 101-2 determines that Nth gain control position information GCi has a value equal to one of those values, the encoder 101-2 employs a code corresponding to the value as the code of the Nth gain control position information GCi.

Furthermore, in the table shown in FIG. 83, a procedure of determining a code for a value other than 1, 3, 5, 7, 9, 11, 13, 15, 17, 19, 21, 23, 25, 27, 29, and 31 is defined (more specifically, the code is given by a formula 11111+original value). According to this procedure, a 10-bit code is given by a combination of a 5-bit code "11111" (escape code) and a following 5-bit code indicating the Nth gain control position information GCi. That is, in the case in which the Nth gain control position information GCi has a value other than 1, 3, 5, 7, 9, 11, 13, 15, 17, 19, 21, 23, 25, 27, 29, and 31, the encoder 101-2 determines a 10-bit code via the above process and employs it as the code for the Nth gain control position information GCi.

On the other hand, if it is determined that the gain control position information GCi indicates the position of an attack portion AT, the encoder 101-2 expresses the gain control position information GCi using 5 bits and employs the resultant 5-bit expression as the code of the gain control position information GCi.

For example, in the case of gain control position information GC1 in the example shown in FIG. 84, second gain control position information GC1 (=5) indicates the position of an attack portion AT, and thus 5-bit data representing the second gain control position information GC1 is employed as the code of the second gain control position information GC1.

Figure 81:
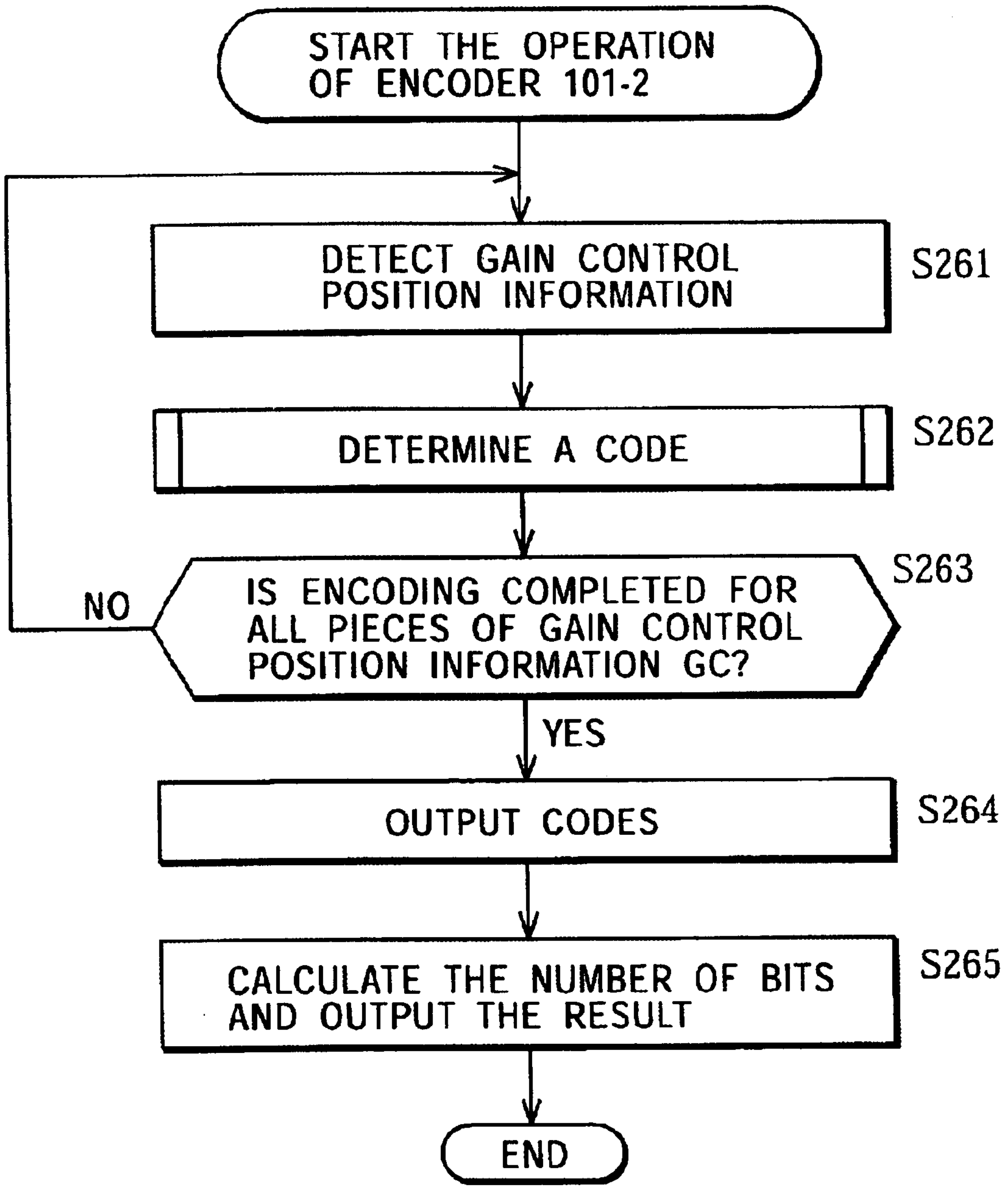
FIG. 81 is a flow chart showing the operation of an encoder 101-2.

If the code of the gain control position information GCi has been determined (in the case in which there are plural pieces of gain control position information GCi, codes are determined for respective plural pieces of gain control position information GCi), the process proceeds to step S263 shown in FIG. 81. In step S263, the encoder 101-2 determines whether codes have been determined for all gain control position information GC0 to GC11, that is, whether all gain control position information GC0 to GC11 have been encoded. If it is determined that all pieces of gain control position information GCi have not been encoded, the process returns to step S261 to perform the step S261 and following steps to encode next unencoded gain control position information GCi.

If it is determined in step S263 that all gain control position information GC0 to GC11 have been encoded, the process proceeds to step S264. In step S264, the encoder 101-2 outputs the codes determined in step S272 in FIG. 82 for the respective gain control position information GC0 to GC11 to the terminal connected to the switch 103.

In the next step S265, the encoder 101-2 calculates the sum of the numbers of bits of the encoded gain control position information GC0 to GC11 and outputs the calculated sum to the decision unit 102.

For example, in the case of 18 pieces of gain control position information GC shown in FIG. 84, codes with numbers of bits such as those shown in FIG. 84 are generated as a result of encoding, and thus a signal indicating that the total number of bits is equal to 85 is output to the decision unit 102.

If the conventional fixed-length (5-bit) encoding method were employed, the gain control position information GC in the example shown in FIG. 84 would be encoded into codes with a total of 90 (=5×18) bits. Thus, the total number of bits of encoded data according to the present invention is smaller by 5 than that according to the conventional technique.

Although in the present embodiment, the determination of whether the Nth gain control position information GCi indicates the position of an attack portion AT or a release portion RE is made on the basis of the difference value between the Nth gain control amount information GBi corresponding to the Nth gain control position information GCi and the (N+1)th gain control amount information GBi, the determination may be made such that information indicating whether gain control position information GC indicates an attack portion AT or a release portion RE is added to the gain control position information GC and the determination is made on the basis of that information.

In the encoding table (FIG. 83) employed in the present example, some values are encoded using escape codes. Alternatively, specific codes corresponding to respective values may be defined in the table for all values.

In the present example, the gain control position information GC is assumed to have such a characteristic shown in FIG. 80. In the case in which the characteristic of gain control position information GC varies from one encoding unit Ai to another, the coding table may be switched depending on the characteristic of the gain control position information GC. Codes of attack portions AT may be determined using a table, as in the case of release portions RE.

The encoding method employed by the encoder 101-3 is described.

Figure 85:
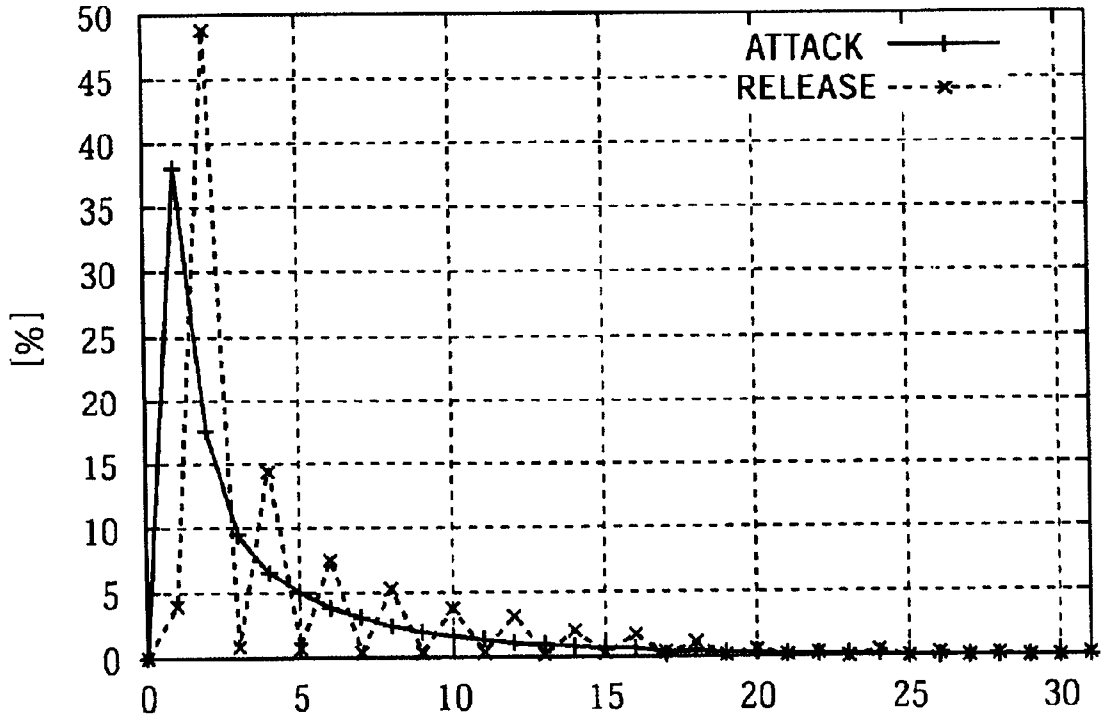
FIG. 85 is a graph showing a characteristic of a difference value VC1.

In the case in which there are plural pieces of gain control position information GCi, the difference value VC obtained by subtracting Nth gain control position information GCi from (N+1)th gain control position information GCi has a high probability of becoming equal to a particular value (for various values of N=1, 2, . . . ) as shown in FIG. 85.

In the example shown in FIG. 85, the difference value VC1 of gain control position information GC indicating the position of an attack portion AT has a high probability of taking a value of 1 (as represented by a solid line in FIG. 85), while the difference value VC1 of gain control position information GC indicating the position of a release portion RE has a high probability of taking a value of 3 (as represented by a dotted line in FIG. 85).

In view of the above, the encoder 101-3 encodes the gain control position information GC in such a manner that codes with small numbers of bits are assigned to difference values VC1 having high occurrence probabilities.

Figure 86:
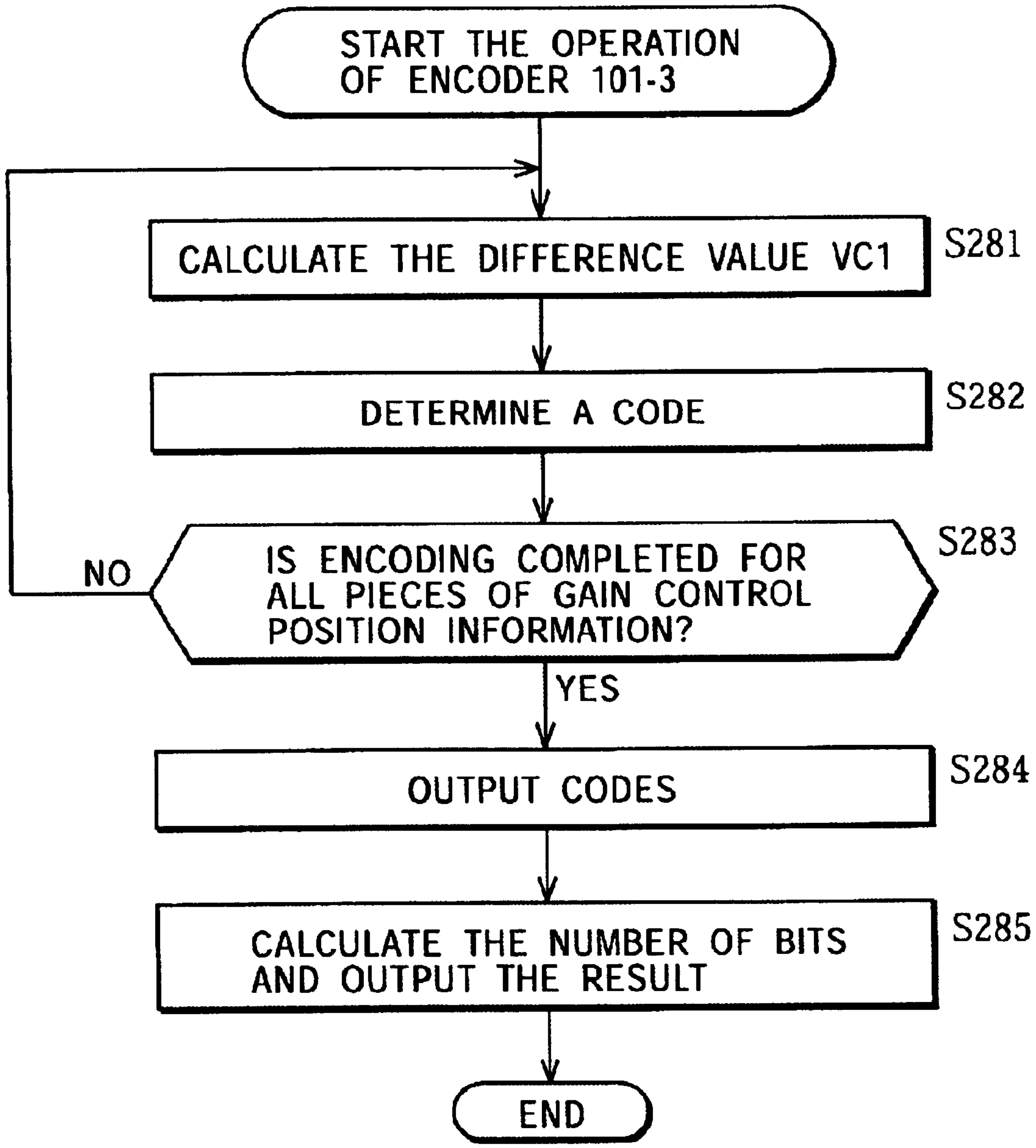
FIG. 86 is a flow chart showing the operation of an encoder 101-3.

The operation of the encoder 101-3 is described below with reference to a flow chart shown in FIG. 86.

In step S281, the encoder 101-3 detects gain control position information GCi to be encoded from the input gain control information G0 to G11 and determines whether the detected gain control position information GCi indicates the position of an attack portion AT or a release portion RE in a similar manner to the encoder 101-2.

For example, in the case of gain control position information GC1 of gain control position information GC0 to GC11 shown in FIG. 87, first gain control position information GC1 (=7) is detected as indicating the position of an attack portion AT, while second gain control position information GC1 (=17) and third gain control position information GC1 (=27) are detected as indicating the positions of release portions RE.

After determining whether gain control position information GCi indicates the position of an attack portion AT or a release portion, the encoder 101-3 calculates the difference value VC1 by subtracting Nth gain control position information GCi from (N+1)th gain control position information GCi.

Hereinafter, for simplicity, the difference value VC1 obtained by subtracting the Nth gain control position information GCi from the (N+1)th gain control position information GCi will be referred to simply as the difference value VC1 of the (N+1)th gain control position information GCi.

For example, in the case of gain control position information GC1 in the example shown in FIG. 87, the difference value VC1 of second gain control position information GC1 is given by a value (=10, not shown) obtained by subtracting first gain control position information GC1 (=7) from the second gain control position information GC1 (=17), and the difference value VC1 of third gain control position information GC1 is given by a value (=10, not shown) obtained by subtracting the second gain control position information GC1 (=17) from the third gain control position information GC1 (=27).

In the present example, the difference value VC1 of first gain control position information GCi is defined as being equal to the value of the first gain control position information GCi. For example, the difference value VC1 of first gain control position information GC1 of gain control position information GC1 is defined as being equal to 7 (not shown in the figure).

Referring again to FIG. 86, the encoder 101-3 determines, in step S282, a code to be assigned to the gain control position information GCi.

More specifically, in a case in which the Nth gain control position information GCi to be encoded indicates the position of an attack portion AT, the encoder 101-3 retrieves a code corresponding to the difference value VC1, calculated in step S281, of the Nth gain control position information GCi from a table shown in FIG. 88 and employs the retrieved code as the code for the Nth gain control position information GCi.

On the other hand, in a case in which the Nth gain control position information GCi indicates the position of a release portion RE, the encoder 101-3 retrieves a code corresponding to the difference value VC1, calculated in step S281, of the Nth gain control position information GCi from a table shown in FIG. 89 and employs the retrieved code as the code for the Nth gain control position information GCi.

For example, in the case of first gain control position information GC1 (=7) of gain control position information GC1 shown in FIG. 87, the first gain control position information GC1 indicates the position of an attack portion AT and the difference value VC1 is equal to 7, and thus a 5-bit code "11011" is employed as the code of the first gain control position information GC1 (=7).

In the case of second gain control position information GC1 (=17) and third gain control position information GC1 (=27), they indicate the positions of release portions RE and the difference values VC1 are both equal to 10 (not shown in the figure), and thus a 5-bit code "11010" is assigned to both the second gain control position information GC1 (=17) and the third gain control position information GC1 (=27).

In the table shown in FIG. 88, a 1-bit code "0" is assigned to a value 1, a 3-bit code "100" to a value 2, a 4 bit code "1010" to a value 3, a 4-bit code "1011" to a value 4, a 4-bit code "1100" to a value 5, a 5-bit code "11010" to a value 6, and a 5-bit code "11011" to a value 7.

In the table shown in FIG. 88, a procedure of determining a code of each value in the range from 8 to 15 is defined (1110+gain control position information GC-8). According to this procedure, a 7-bit code is given which consists of a 4-bit code "1111" (escape code) and a following 3-bit code indicating the gain control position information GC-8. Similarly, a procedure of determining a code of each value in the range from 16 to 31 is also defined (1111+gain control position information GC-16). According to this procedure, an 8-bit code is given which consists of a 4-bit code "1111" (escape code) and a following 4-bit code indicating the gain control position information GC-16.

In the table shown in FIG. 89, a 4-bit code "1010" is assigned to a value 1, a 1-bit code "0" to a value 2, a 3 bit code "100" to a value 4, a 4-bit code "1011" to a value 6, a 4-bit code "1100" to a value 8, a 5-bit code "11010" is assigned to a value 10, a 6-bit code "110110" to a value 12, and a 6-bit code "110111" to a value 14.

Furthermore, in the table shown in FIG. 89, a procedure of determining a code for a value other than 1, 2, 4, 6, 8, 10, 12, and 14 is defined (more specifically, the code is given by a formula 111+original value). According to this procedure, an 8-bit code is given as a combination of a 3-bit code "111" (escape code) and a following 5-bit code indicating the gain control position information GC (original value).

In the next step S283, the encoder 101-3 determines whether codes have been determined for all gain control position information GC0 to GC11, that is, whether all gain control position information GC0 to GC11 have been encoded. If it is determined that all pieces of gain control position information GCi have not been encoded, the process returns to step S281 to perform the step S281 and following steps to encode next unencoded gain control position information GCi.

If it is determined in step S283 that all gain control position information GC0 to GC11 have been encoded, the process proceeds to step S284. In step S284, the encoder 101-3 outputs the codes determined in step S282 for the respective gain control position information GC0 to GC11 to the terminal connected to the switch 103.

In the next step S285, the encoder 101-3 calculates the sum of the numbers of bits of the encoded gain control position information GC0 to GC11 and outputs the calculated sum to the decision unit 102.

For example, in the case of 39 pieces of gain control position information GC shown in FIG. 87, codes with numbers of bits such as those shown in FIG. 87 are generated as a result of encoding, and thus a signal indicating that the total number of bits is equal to 137 is output to the decision unit 102.

If the conventional fixed-length (5-bit) encoding method were employed, the gain control position information GC in the example shown in FIG. 87 would be encoded into codes with a total of 195 (=5×39) bits. Thus, the total number of bits of encoded data according to the present invention is smaller by 58 than that according to the conventional technique.

In the encoding tables (FIGS. 88 and 89) employed in the present example, some values are encoded using escape codes. Alternatively, specific codes corresponding to respective values may be defined in the table for all values.

In the present example, the difference value VC1 is assumed to have such a characteristic shown in FIG. 85. In a case in which the characteristic of the difference value VC1 varies from one encoding unit Ai to another, the coding table may be switched depending on the characteristic of the difference value VC1.

The encoding method employed by the encoder 101-4 is described.

Figure 90:
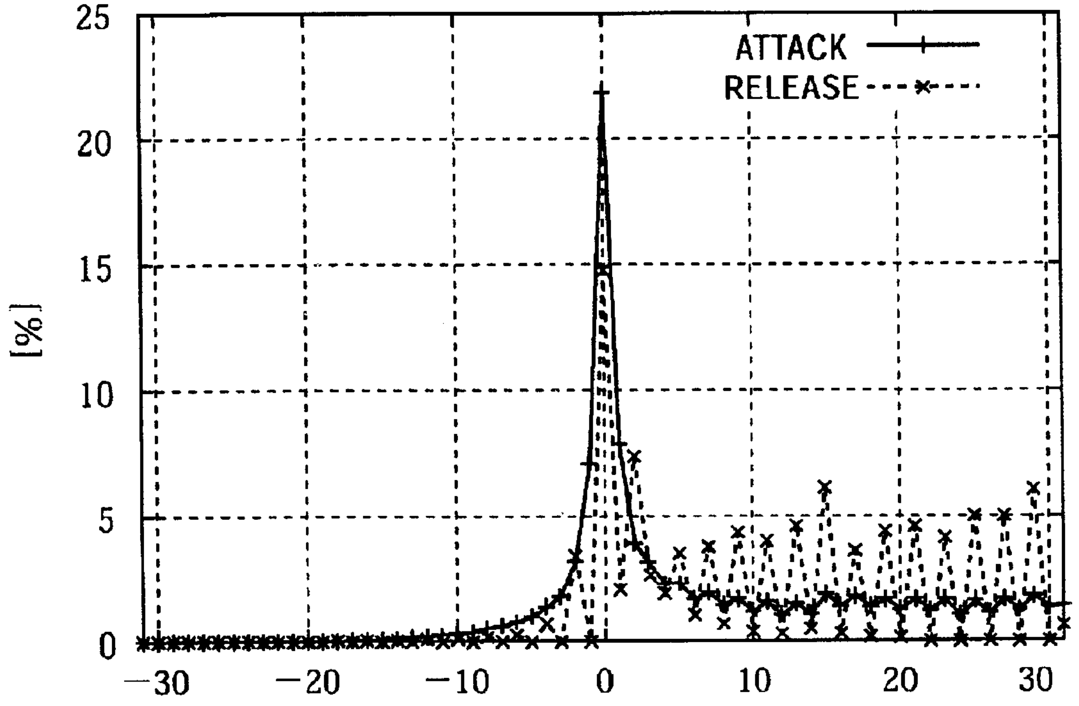
FIG. 90 is a graph showing a characteristic of a difference value VC2.

For example, the difference value VC2 obtained by subtracting gain control position information GCi-1 of an encoding unit Ai-1 from gain control position information GCi of an encoding unit Ai has a high probability of resulting in a particular value, as shown in FIG. 90.

In view of the above, the encoder 101-4 encodes the gain control position information GC in such a manner that codes with small numbers of bits are assigned to difference values VC2 having high occurrence probabilities.

Figure 91:
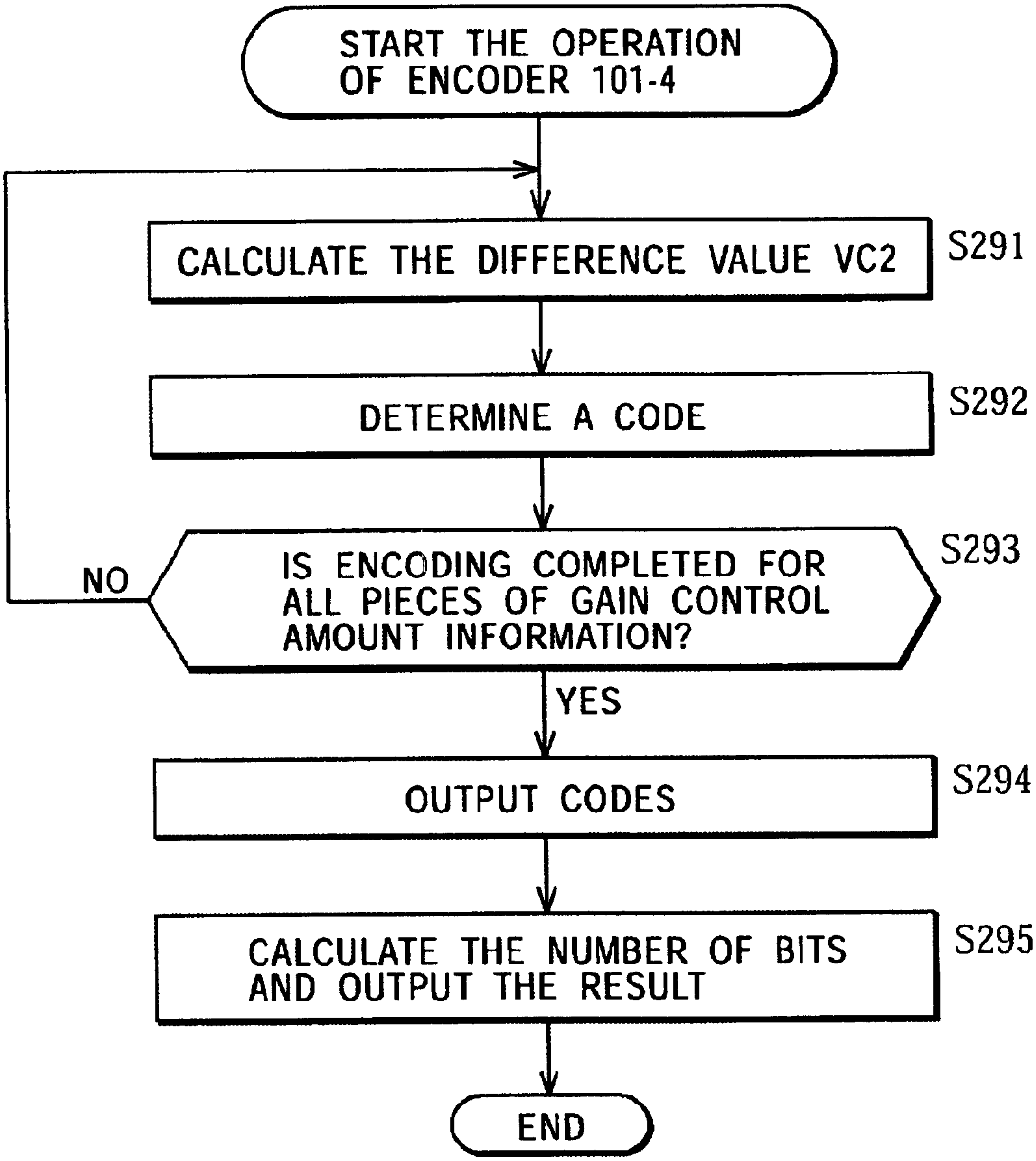
FIG. 91 is a flow chart showing the operation of an encoder 101-4.

The operation of the encoder 101-4 is described below with reference to a flow chart shown in FIG. 91.

In step S291, the encoder 101-4 detects gain control position information GCi of one frequency band from the input gain control information G0 to G11 and determines whether the detected gain control position information GCi indicates the position of an attack portion AT or a release portion RE in a similar manner to the encoder 101-2.

The encoder 101-4 then determines the difference value VC2 by subtracting, from the detected gain control position information GCi, the gain control position information GCi-1 of the encoding unit Ai-1 which is in a lower frequency band adjacent to the frequency band of the encoding unit Ai and which was detected in previous execution of step 291.

Hereinafter, for simplicity, the difference value VC2 obtained by subtracting the gain control position information GCi-1 from the gain control position information GCi will be referred to simply as the difference value VC2 of the gain control position information GCi.

For example, in the case of gain control position information GC3 of gain control position information GC0 to GC11 shown in FIG. 92, the difference value VC2 of first gain control position information GC3 (=6) is calculated as 1 (not shown) as the result of subtraction of first gain control position information GC2 (=5) from the first gain control position information GC3 (=6), and the difference value VC2 of second gain control position information GC3 (=9) is calculated as 2 (not shown) as the result of subtraction of second gain control position information GC2 (=7) from the second gain control position information GC3 (=9).

On the other hand, in the case of gain control position information GC5, the difference value VC2 of first gain control position information GC5 (=6) is calculated as 0 (not shown) as the result of subtraction of gain control position information GC4 (=6) from the first gain control position information GC5 (=6), and a value (=11, not shown in the figure) equal to the value of second gain control position information GC5 (=11) is employed as the difference value VC2 of second gain control position information GC6 (=11). That is, in this specific case, because there is no gain control position information GCi-1 corresponding to gain control position information GCi, a value equal to the value of the gain control position information GCi is employed as the difference value VC2 of that gain control position information GCi.

In the case of gain control position information GC0, the difference value VC2 thereof is not given.

In the next step S292, the encoder 101-4 determines a code to be assigned to the gain control position information GCi.

More specifically, in a case in which the Nth gain control position information GCi to be encoded indicates the position of an attack portion AT, the encoder 101-4 retrieves a code corresponding to the difference value VC2, calculated in step S291, of the Nth gain control position information GCi from a table shown in FIG. 93 and employs the retrieved code as the code for the Nth gain control position information GCi.

For example, in the case of gain control position information GC3 in the example shown in FIG. 92, first gain control position information GC3 (=6) indicates the position of an attack portion AT and the difference value VC2 thereof is equal to 1, and thus a 4-bit code "0100" is employed as the code of the first gain control position information GC3. On the other hand, second gain control position information GC3 (=9) indicates the position of an attack portion AT and the difference value VC2 thereof is equal to 2, and thus a 5-bit code "01100" is employed as the code of the second gain control position information GC3.

On the other hand, in a case in which the Nth gain control position information GCi indicates the position of a release portion RE, the encoder 101-4 retrieves a code corresponding to the difference value VC2, calculated in step S291, of the Nth gain control position information GCi from a table shown in FIG. 94 and employs the retrieved code as the code for the Nth gain control position information GCi.

For example, in the case of gain control position information GC6 in the example shown in FIG. 92, fifth gain control position information GC6 (=21) indicates the position of a release portion RE and the difference value VC2 thereof is 21 (equal to the value of the fifth gain control position information GC6), and thus a 4-bit code "1000" is employed as the code of the fifth gain control position information GC6.

As for gain control position information GC0, in this specific example, values equal to the values of first gain control position information GC0 (=5), second gain control position information GC0 (=7), and third gain control position information GC0 (=9) are respectively represented using 5 bits and resultant 5-bit expressions are employed as the codes of first, second, and third gain control position information GC0, respectively.

In the table shown in FIG. 93, a 5-bit code "01110" is assigned to a value −2, a 4-bit code "0101" to a value −1, a 2-bit code "00" to a value 0, a 4-bit code "0100" to a value 1, a 5-bit code "01100" to a value 2, a 5-bit code "01101" to a value 3, and a 5-bit code "01111" to a value 4.

Furthermore, in the table shown in FIG. 93, a procedure of determining a code for a value other than the values of −2 to 4 is defined (more specifically, the code is given by a formula 1+original value). According to this procedure, a 6-bit code is given by a combination of a 1-bit code "1" and a following 5-bit code indicating the gain control position information GC (original value).

In the table shown in FIG. 94, a code with a particular number of bits is assigned to each value. Furthermore, in the table shown in FIG. 94, a procedure of determining a code for a value other than the values having corresponding assigned codes is defined (more specifically, the code is given by a formula 111+original value). According to this procedure, an 8-bit code is given by a combination of a 1-bit code "1" and a following 5-bit code indicating the gain control position information GC (original value).

In the next step S293, the encoder 101-4 determines whether codes have been determined for all gain control position information GC0 to GC11, that is, whether all gain control position information GC0 to GC11 have been encoded. If it is determined that all pieces of gain control position information GCi have not been encoded, the process returns to step S291 to perform the step S291 and following steps to encode next unencoded gain control position information GCi.

If it is determined in step S293 that all gain control position information GC0 to GC11 have been encoded, the process proceeds to step S294. In step S294, the encoder 101-4 outputs the codes determined in step S292 for the respective gain control position information GC0 to GC11 to the terminal connected to the switch 103.

In the next step S295, the encoder 101-4 calculates the sum of the numbers of bits of the encoded gain control position information GC0 to GC11 and outputs the calculated sum to the decision unit 102.

For example, in the case of 37 pieces of gain control position information GC shown in FIG. 92, codes with numbers of bits such as those shown in FIG. 92 are generated as a result of encoding, and thus the total number of bits of the codes becomes equal to 126. Thus, a signal indicating that the total number of bits is equal to 126 is output to the decision unit 102.

If the conventional fixed-length (5-bit) encoding method were employed, the gain control position information GC in the example shown in FIG. 92 would be encoded into codes with a total of 185 (=5×37) bits. Thus, the total number of bits of encoded data according to the present invention is smaller by 59 than that according to the conventional technique.

In the encoding tables (FIGS. 93 and 94) employed in the present example, some values are encoded using escape codes. Alternatively, specific codes corresponding to respective values may be defined in the table for all values.

In the present example, the difference value VC2 is assumed to have such a characteristic shown in FIG. 90. In a case in which the characteristic of the difference value VC2 varies from one encoding unit Ai to another, the coding table may be switched depending on the characteristic of the difference value VC2.

The encoding method employed by the encoder 101-5 is described.

As described earlier with reference to FIG. 85, the difference value VC1 obtained by subtracting the Nth gain control position information GCi from the (N+1)th gain control position information GCi has a high probability of becoming equal to a particular value.

As described earlier with reference to FIG. 90, the difference value VC2 obtained by subtracting the Nth gain control position information GCi-1 of a lower frequency band immediately adjacent to the Nth gain control position information GCi from the Nth gain control position information GCi has a high probability of becoming equal to a particular value.

Figure 95:
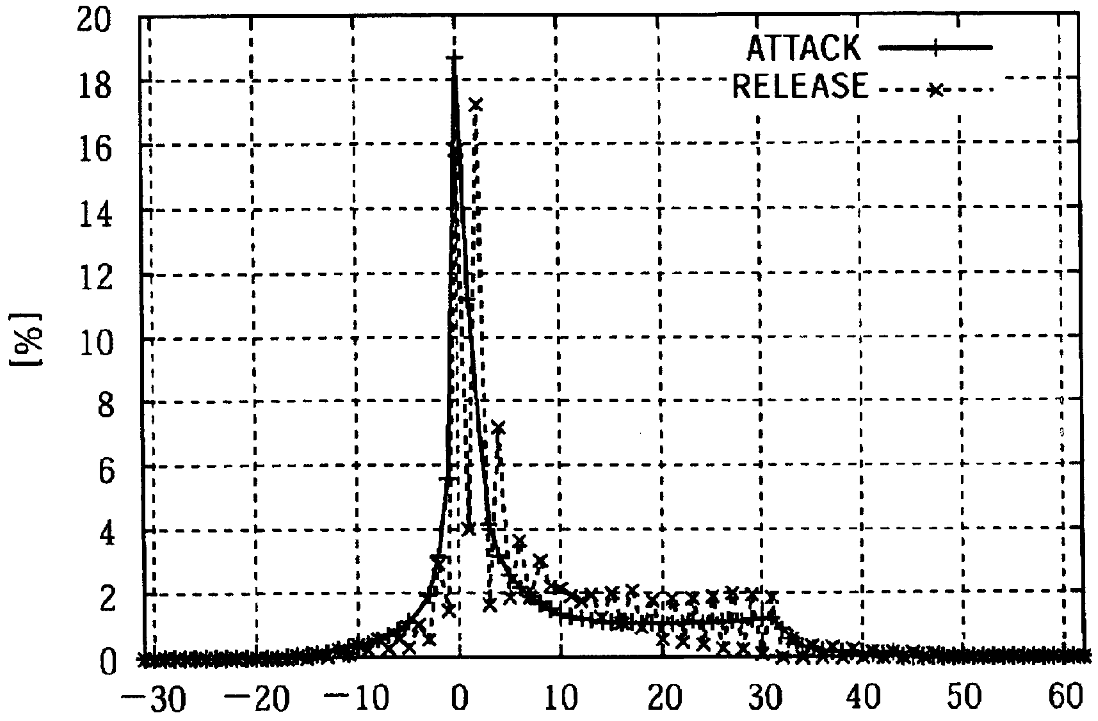
FIG. 95 is a graph showing a characteristic of a difference value VC3.

Therefore, for example, the difference value VC3 obtained by subtracting the difference value VC1 of Nth gain control amount information GCi-1 from the difference value VC1 of Nth gain control amount information GCi has a high probability of becoming equal to a particular value as shown in FIG. 95.

In view of the above, the encoder 101-5 encodes the gain control position information GC in such a manner that codes with small numbers of bits are assigned to difference values VC3 having high occurrence probabilities.

Figure 96:
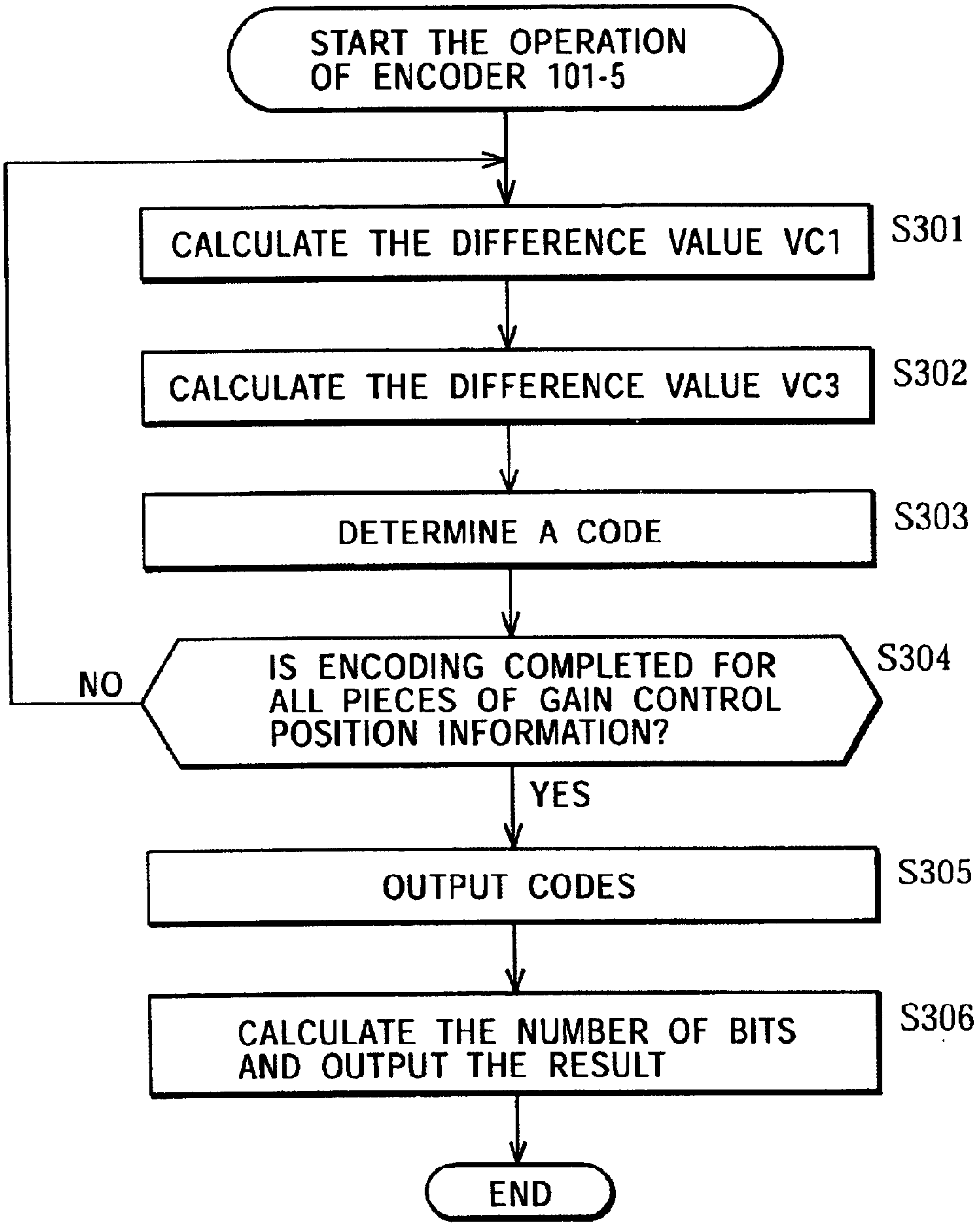
FIG. 96 is a flow chart showing the operation of an encoder 101-5.

The operation of the encoder 101-5 is described below with reference to a flow chart shown in FIG. 96.

In step S301, the encoder 101-5 detects gain control position information GCi of one frequency band from the input gain control information G0 to G11 and determines whether the detected gain control position information GCi indicates the position of an attack portion AT or a release portion RE in a similar manner to the encoder 101-2.

The encoder 101-5 then calculates the difference value VC1 by subtracting Nth gain control position information GCi from (N+1)th gain control position information GCi of gain control position information GCi. As for first gain control position information GCi, the difference value VC1 thereof is defined as being equal to the value of the first gain control position information GCi.

For example, in the case of gain control position information GC2 of gain control position information GC0 to GC11 shown in FIG. 79, and a value (5, not shown in the figure) equal to the value of first gain control position information GC2 (=5) is employed as the difference value VC2 of the first gain control position information, and the difference value VC1 of second gain control position information GC2 (=7) is calculated as 2 (not shown) as the result of subtraction of first gain control position information GC2 (=5) from the second gain control position information GC2 (=7).

On the other hand, as for gain control position information GC3, a value (6, not shown in the figure) equal to the value of first gain control position information GC3 (=6) is employed as the difference value VC1 of the first gain control position information GC3 (=6), and the difference value VC1 of second gain control position information GC3 (=9) is calculated as 3 (not shown) as the result of subtraction of the first gain control position information GC3 (=6) from the second gain control position information GC3 (=9).

In the next step S302, the encoder 101-5 determines the difference value VC3 by subtracting the difference value VC1 of the gain control position information GCi-1 determined in the previous execution of step S301 from the difference value VC1 of the gain control position information GCi determined in step S301.

Hereinafter, for simplicity, the difference value VC3 obtained by subtracting the difference value VC1 of the gain control position information GCi-1 from the difference value VC1 of the gain control position information GCi will be referred to simply as the difference value VC3 of the gain control position information GCi.

For example, in the case of gain control position information GC3 in the example shown in FIG. 97, the difference value VC3 of first gain control position information GC3 (=6) is calculated as 1 as the result of subtraction of first gain control position information GC2 (=5) from the first gain control position information GC3 (=6), and the difference value VC3 of second gain control position information GC3 (=9) is calculated as 1 as the result of subtraction of second gain control position information GC2 (=7) from the second gain control position information GC3 (=9).

As for gain control position information GC0, a value equal to the difference value VC1 is employed as the difference value VC3 of the gain control position information GC0.

In the next step S303, the encoder 101-5 determines a code to be assigned to the gain control position information GCi.

More specifically, in a case in which the gain control position information GCi indicates the position of an attack portion AT, the encoder 101-5 retrieves a code corresponding to the difference value VC3, calculated in step S302, of the gain control position information GCi from a table shown in FIG. 98 and employs the retrieved code as the code for the gain control position information GCi.

For example, in the case of gain control position information GC3 in the example shown in FIG. 97, first gain control position information GC3 (=6) indicates the position of an attack portion AT and the difference value VC3 thereof is equal to 1, and thus a 3-bit code "010" is employed as the code of the first gain control position information GC3. Second gain control position information GC3 (=9) also indicates the position of an attack portion AT and the difference value VC3 thereof is equal to 1, and thus a 3-bit code "010" is employed as the code of the second gain control position information GC3.

On the other hand, in a case in which the Nth gain control position information GCi indicates the position of a release portion RE, the encoder 101-5 retrieves a code corresponding to a value equal to the difference value VC3, calculated in step S302, of the Nth gain control position information GCi from a table shown in FIG. 99 and employs the retrieved code as the code for the Nth gain control position information GCi.

For example, in the case of gain control position information GC6 in the example shown in FIG. 97, fifth gain control position information GC6 (=21) indicates the position of an release portion RE and the difference value VC3 thereof is equal to 10, and thus a 5-bit code "1011" is employed as the code of the fifth gain control position information GC6.

In the table shown in FIG. 98, a code with a particular number of bits is assigned to each value. Furthermore, in the table shown in FIG. 98, a procedure of determining a code for a value other than the values having corresponding assigned codes is defined (more specifically, the code is given by a formula 11+original value). According to this procedure, a 7-bit code is given by a combination of a 2-bit code "11" and a following 5-bit code indicating the gain control position information GC (original value).

In the table shown in FIG. 99, a code with a particular number of bits is assigned to each value. Furthermore, in the table shown in FIG. 99, a procedure of determining a code for a value other than the values having corresponding assigned codes is defined (more specifically, the code is given by a formula 111+original value). According to this procedure, a code is determined which has a total of 8 bits including a 3-bit code "111" and a following 5-bit code indicating the gain control position information GC (original value).

In the next step S304, the encoder 101-5 determines whether codes have been determined for all gain control position information GC0 to GC11, that is, whether all gain control position information GC0 to GC11 have been encoded. If it is determined that all pieces of gain control position information GCi have not been encoded, the process returns to step S301 to perform the step S301 and following steps to encode next unencoded gain control position information GCi.

If it is determined in step S304 that all gain control position information GC0 to GC11 have been encoded, the process proceeds to step S305. In step S305, the encoder 101-5 outputs the codes determined in step S303 for the respective gain control position information GC0 to GC11 to the terminal connected to the switch 103.

In the next step S306, the encoder 101-5 calculates the sum of the numbers of bits of the encoded gain control position information GC0 to GC11 and outputs the calculated sum to the decision unit 102.

For example, in the case of 37 pieces of gain control position information GC shown in FIG. 97, codes with numbers of bits such as those shown in FIG. 97 are generated as a result of encoding, and thus the total number of bits of the codes becomes equal to 109. Thus, a signal indicating that the total number of bits is equal to 109 is output to the decision unit 102.

If the conventional fixed-length (5-bit) encoding method were employed, the gain control position information GC in the example shown in FIG. 97 would be encoded into codes with a total of 185 (=5×37) bits. Thus, the total number of bits of encoded data according to the present invention is smaller by 76 than that according to the conventional technique.

In the encoding tables (FIGS. 98 and 99) employed in the present example, some values are encoded using escape codes. Alternatively, specific codes corresponding to respective values may be defined in the table for all values.

In the present example, the difference value VC3 is assumed to have such a characteristic shown in FIG. 95. In a case in which the characteristic of the difference value VC3 varies from one encoding unit Ai to another, the coding table may be switched depending on the characteristic of the difference value VC3.

The encoding method employed by the encoder 101-6 is described.

In some cases, in gain control position information GCi-1 and gain control position information GCi, there are an equal number of pieces of gain control position information GC and, besides, Nth gain control position information GCi and corresponding Nth gain control position information GCi-1 are equal to each other, as is the case with gain control position information GC0 and gain control position information GC1 of gain control position information GC0 to GC11 shown in FIG. 100.

In view of the above, the encoder 101-6 encodes gain control position information GC in such a manner that, in the case in which, in gain control position information GCi-1 and gain control position information GCi, there are an equal number of pieces of gain control position information GC and, besides, Nth gain control position information GCi and corresponding Nth gain control position information GCi-1 are equal to each other, only a flag (encoding flag) set to a value (0, in this specific example) indicating the above fact is encoded.

Figure 101:
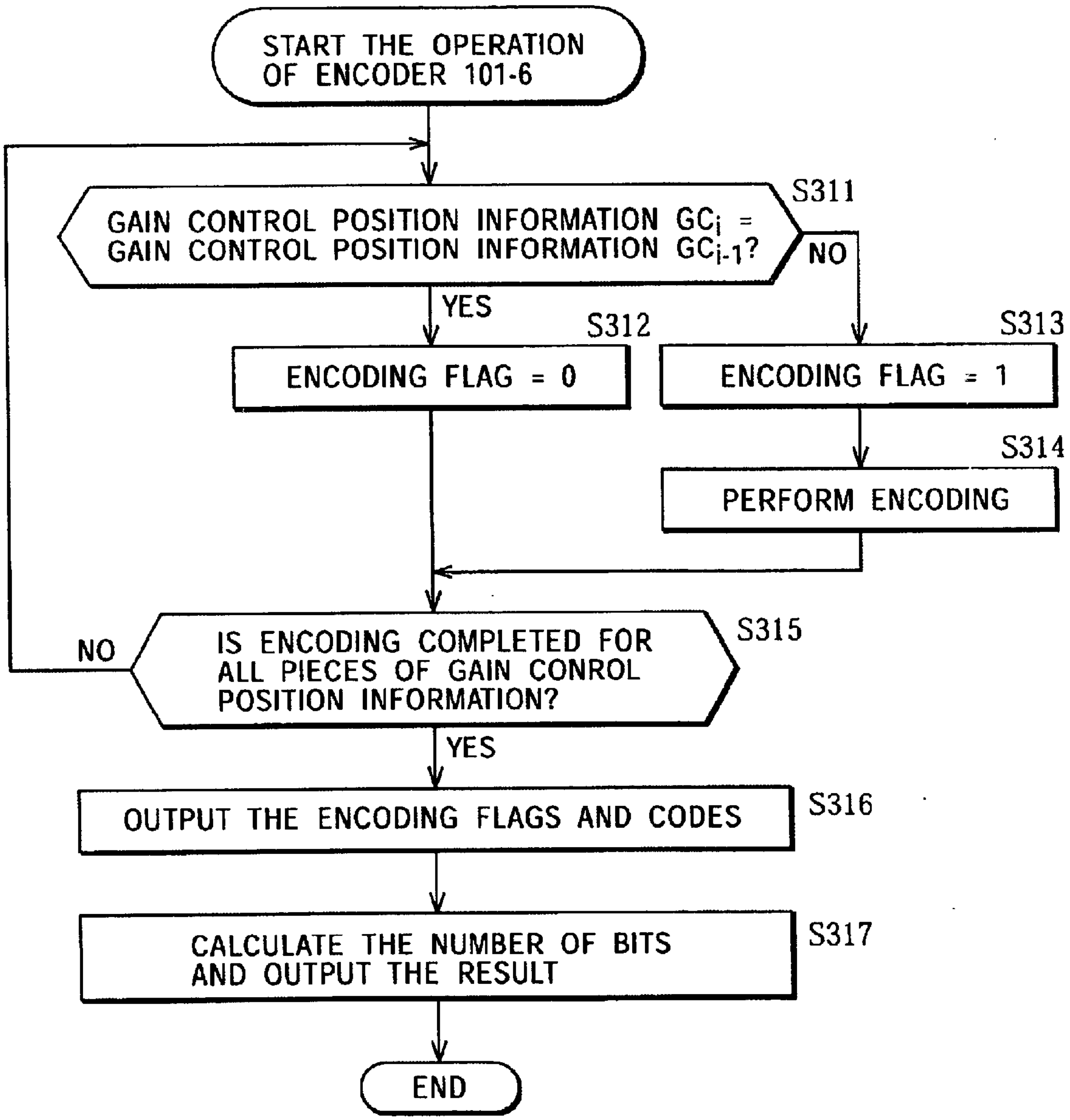
FIG. 101 is a flow chart showing the operation of an encoder 101-6.

The operation of the encoder 106-6 is described below with reference to a flow chart shown in FIG. 101.

In step S301, the encoder 101-6 detects gain control position information GCi of one frequency band from the input gain control information G0 to G11. The encoder 101-6 then determines whether there are an equal number of pieces of gain control position information GC in both gain control position information GCi and gain control position information GCi-1 detected in previous execution of step S301, and besides Nth gain control position information GCi and corresponding Nth gain control position information GCi-1 are equal to each other. If it is determined that there are an equal number of pieces of gain control position information GC, and Nth gain control position information GCi and corresponding Nth gain control position information GCi-1 are equal to each other, the process proceeds to step S312. In step S312, the encoding flag associated with the gain control position information GCi is set to a value (0, in this specific example) so as to indicate the above fact.

For example, in the case of gain control position information GC1 and gain control position information GC0 in the example shown in FIG. 100, there are equally 3 pieces of gain control position information GC, and first, second, and third gain control position information GC1 (=7, 9, 11) are equal to first, second, and third gain control position information GC0 (=7, 9, 11), respectively, and thus the encoding flag associated with the gain control position information GC1 is set to 0.

On the other hand, if it is determined in step S311 that the number of pieces of gain control position information GC is different between gain control position information GCi and gain control position information GCi-1, or Nth gain control position information GCi is not equal to corresponding Nth gain control position information GCi-1, the process proceeds to step S313. In step S313, the encoder 101-6 sets the encoding flag associated with the gain control position information GCi to a value (1, in this specific example) so as to indicate the above fact.

For example, in the case of gain control position information GC2 and gain control position information GC1 in the example shown in FIG. 100, the number of pieces of gain control position information GC is different between them, and thus the encoding flag associated with the gain control position information GC2 is set to 1.

In the next step S314, the encoder 101-6 encodes the gain control position information GCi in a similar manner as with, for example, the encoder 101-3.

That is, the encoder 101-6 determines the difference value VC1 of (N+1)th gain control position information GCi by subtracting Nth gain control position information GCi from the (N+1)th gain control position information GCi. As for first gain control position information GCi, the difference value VC1 thereof is defined as being equal to the value of the first gain control position information GCi.

The encoder 101-6 retrieves a code corresponding to the difference value VC1 of Nth gain control position information GCi from a table similar to that shown in FIG. 88 or a table similar to that shown in FIG. 89 depending on whether the Nth gain control position information GCi indicates the position of an attack portion AT or a release portion RE, and the encoder 101-6 employs the retrieved code as the code of the Nth gain control position information GCi.

If the encoding flag has been set to 0 in step S312, or if the code of gain control position information GCi has been determined in step S314, the process proceeds to step S315. In step S315, the encoder 101-6 determines whether all encoding flags have been set to 0 or 1 and codes have been determined for all pieces of gain control position information GCi corresponding to the encoding flags set to 1, that is, the encoder 101-6 determines whether encoding has been completed for all pieces of gain control position information GC0 to GC11. If it is determined that all pieces of gain control position information GCi have not been encoded, the process returns to step S311 to perform the step S311 and following steps to encode next unencoded gain control position information GCi.

If it is determined in step S315 that all gain control position information GC0 to GC11 have been encoded, the process proceeds to step S316. In step S316, the encoder 101-6 outputs the encoding flag set to 0 or 1 and the codes to the terminal connected to the switch 103.

In the next step S317, the encoder 101-6 calculates the sum of the numbers of bits of the encoded gain control position information GC0 to GC11 and outputs the calculated sum to the decision unit 102.

For example, in the case of 35 pieces of gain control position information GC shown in FIG. 100, 11 1-bit encoding flags (there is no encoding flags associated with gain control position information GC0 in this specific case) and codes with numbers of bits such as those shown in FIG. 100 are generated as the result of the encoding, and thus a signal indicating that the total number of bits is equal to 72 is output to the decision unit 102.

If the conventional fixed-length (5-bit) encoding method were employed, the gain control position information GC in the example shown in FIG. 100 would be encoded into codes with a total of 175 (=5×35) bits. Thus, the total number of bits of encoded data according to the present invention is smaller by 103 than that according to the conventional technique.

Although in the case where there are equal number of pieces of gain control position information GC in both gain control position information GCi and gain control position information GCi-1 but Nth gain control position information GCi and Nth gain control position information GCi-1 are not equal to each other, the encoder 101-6 encodes gain control position information GCi in a similar manner to the encoder 101-3, each piece of gain control position information GCi may be encoded into a code with a fixed bit length (5 bits).

The encoding method employed by the encoder 101-7 is described.

Figures 102, 103:
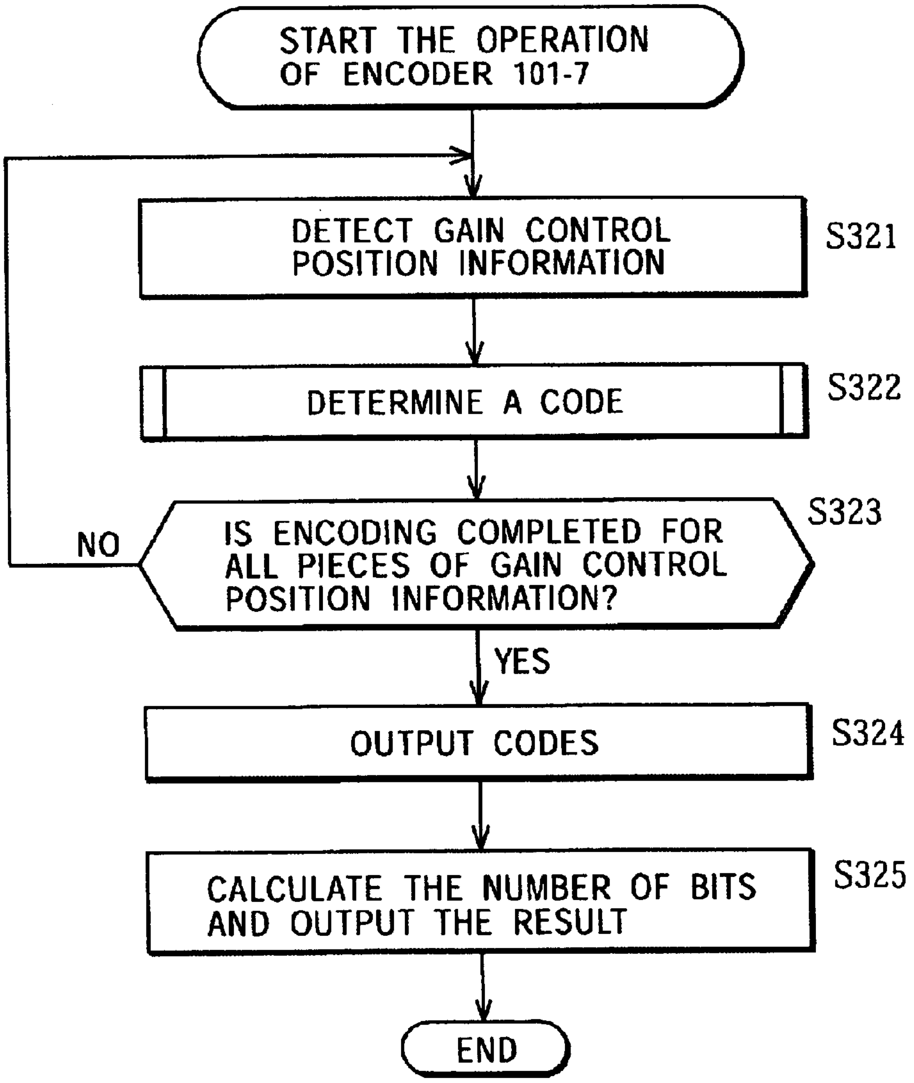
FIG. 102 is a table showing another example of a set of gain control position information GC.
FIG. 103 is a flow chart showing the operation of an encoder 101-7.

In most cases, plural pieces of gain control position information GCi take values which are close to each other as is the case with gain control position information GC3, shown in FIG. 102, of gain control position information GC0 to GC11. Therefore, values obtained by subtracting the minimum value of the values of gain control position information GCi from the values of respective pieces of gain control position information GCi become small enough to represent with a small number of bits.

In view of the above, the encoder 101-7 encodes gain control position information GC in such a manner that the minimum value of the gain control position information GC0 to GC11 is subtracted from Nth gain control position information GCi, the resultant difference is expressed using a particular number of bits, and the resultant expression is employed as the code of the Nth gain control position information GCi.

The operation of the encoder 101-7 is described below with reference to a flow chart shown in FIG. 103.

In step S321, the encoder 101-7 detects gain control position information GCi of one frequency band from the input gain control information G0 to G11.

Figure 104:
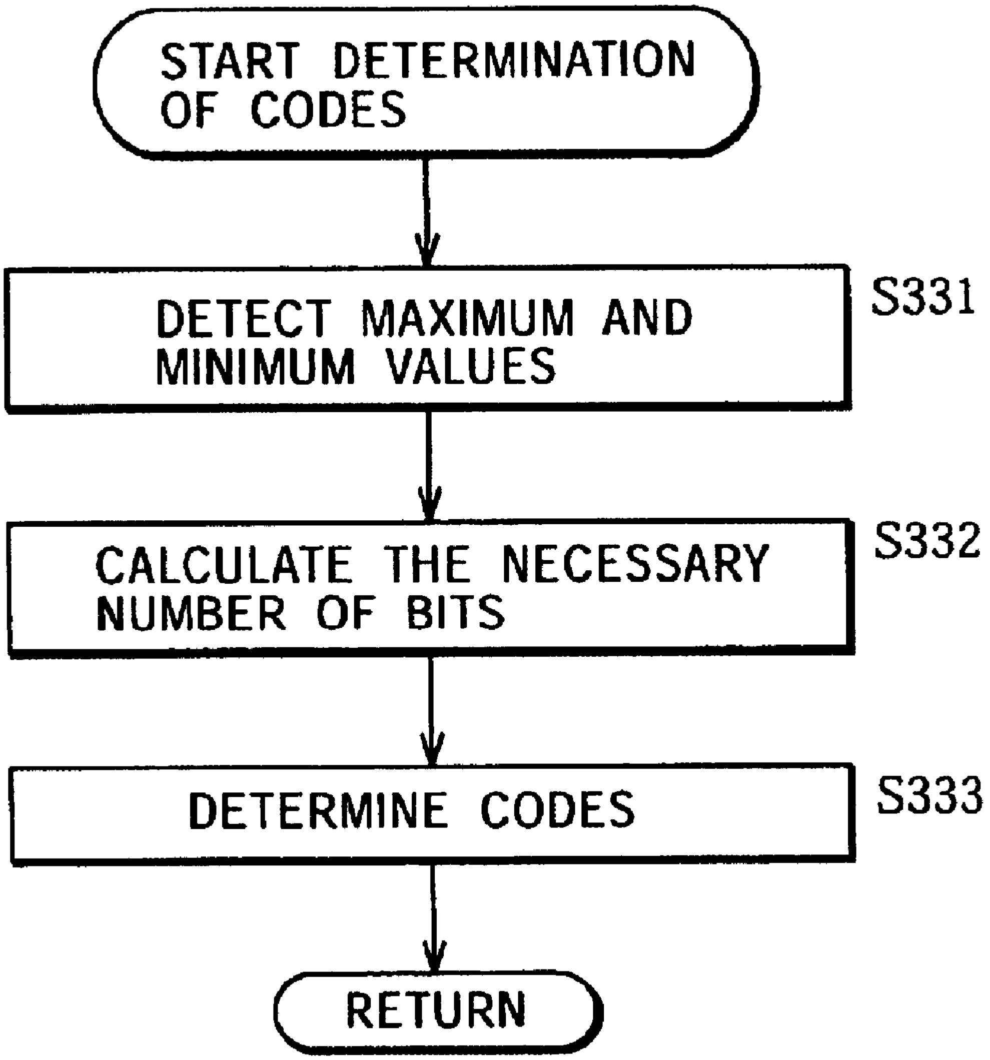
FIG. 104 is a flow chart showing the details of step S322 shown in FIG. 103.

In the next step S322, the encoder 101-7 determines a code to be assigned to the detected gain control position information GCi. The details of the process in step S322 are shown in the form of a flow chart in FIG. 104.

In step S331, the encoder 101-7 detects maximum and minimum values of the gain control position information GCi.

In the example shown in FIG. 102, 8 is detected as the maximum value and 5 is detected as the minimum value.

In step S332, the encoder 101-7 calculates the difference between the maximum and minimum values detected in step S331 and determines the number of bits which can represent the difference.

In the example shown in FIG. 102, the difference between the maximum value (8) and the minimum value (5) is equal to 3, and thus the number of bits which can represent the difference is 2.

In step S333, the encoder 101-7 subtracts the minimum value detected in step S331 from respective values of gain control position information GCi and represents the resultant difference values using as many bits as the necessary number of bits determined in sep S332. The resultant values are employed as codes for the respective pieces of gain control position information GCi. Because the necessary number of bits is defined as the number of bits which can represent the difference between the maximum value and the minimum value, the value obtained by subtracting the minimum value from any gain control position information GCi can be represented using as many bits as the necessary number of bits.

In the example shown in FIG. 102, 0, 1, 2, and 3 obtained by subtracting 5 from first gain control position information GC3 (=5), second gain control position information GC3 (=6), third gain control position information GC3 (=7), and fourth gain control position information GC3 (=8), respectively, are expressed using 2 bits, and resultant 2-bit expressions are employed as codes of first gain control position information GC3 to fourth gain control position information GC3, respectively.

Thereafter, the process proceeds to step S323 shown in FIG. 103.

In step S323, the encoder 101-7 determines whether codes have been determined for all gain control position information GC0 to GC11, that is, whether all gain control position information GC0 to GC11 have been encoded. If it is determined that all pieces of gain control position information GCi have not been encoded, the process returns to step S321 to perform the step S321 and following steps to encode next unencoded gain control position information GCi.

If it is determined in step S323 that all gain control position information GC0 to GC11 have been encoded, the process proceeds to step S324. In step S324, The data indicating the minimum value detected in step S331, the data indicating the necessary number of bits calculated in step S332, and the codes, determined in step S333, of gain control position information GC0 to GC11 represented by as many bits as the necessary number of bits are output from the encoder 101-7 to the terminal connected to the switch 103.

In the next step S325, the encoder 101-7 calculates the sum of the numbers of bits of the encoded gain control position information GC0 to GC11 and outputs the calculated sum to the decision unit 102.

For example, in the case of gain control position information GC3 shown in FIG. 102, 2-bit data indicating a necessary number of bits, 5-bit data indicating a minimum value, and 4 2-bit codes (represented by as many bits as the necessary number of bits are generated as the result of the encoding, and thus a signal indicating that the total number of bits is equal to 15 (=2+5+2×4) is output to the decision unit 102.

If the conventional fixed-length (5-bit) encoding method were employed, the gain control position information GC in the example shown in FIG. 102 would be encoded into codes with a total of 20 (=5×4) bits. Thus, the total number of bits of encoded data according to the present invention is smaller by 5 than that according to the conventional technique.

The encoding method employed by the encoder 101-8 is described.

Gain control position information GC0 to GC11 have high probabilities of taking values close to each other, as is the case with gain control position information GC0 to GC11 shown in FIG. 105, and thus subtraction of the minimum value (3, in the example shown in FIG. 105) of the gain control position information GC0 to GC11 from the values of respective pieces of gain control position information GCi result in small values which can be represented using a small number of bits.

In view of the above, the encoder 101-8 encodes gain control position information GC in such a manner that the minimum value of the gain control position information GC0 to GC11 is subtracted from gain control position information GCi, the resultant difference is expressed using a particular number of bits, and the resultant expression is employed as the code of the gain control position information GCi.

The operation of the encoder 101-8 is described below with reference to a flow chart shown in FIG. 106.

In step S341, the encoder 101-8 extracts gain control position information GC0 to GC11 from the input gain control information G0 to G11 and detects maximum and minimum values of the extracted gain control position information GC0 to GC11.

In the example shown in FIG. 105, 10 is detected as the maximum value and 3 is detected as the minimum value.

In step S342, the encoder 101-8 calculates the difference between the maximum and minimum values detected in step S341 and determines the number of bits which can represent the difference.

In the example shown in FIG. 105, the difference between the maximum value (10) and the minimum value (3) is equal to 7, and thus the necessary number of bits is 3.

In step S343, the encoder 101-8 subtracts the minimum value detected in step S341 from the respective values of gain control position information GC0 to GC11 and represents the resultant difference values using as many bits as the necessary number of bits determined in sep S342. The resultant values are employed as codes for the respective pieces of gain control position information GC. Because the necessary number of bits is defined as the number of bits which can represent the difference between the maximum value and the minimum value, the value obtained by subtracting the minimum value from any gain control position information GC can be represented using as many bits as the necessary number of bits.

In step S344, the data indicating the minimum value detected in step S341, the data indicating the necessary number of bits calculated in step S342, and the codes of respective pieces of gain control position information, determined in step S343, of gain control position information GC0 to GC11 represented by as many bits as the necessary number of bits are output from the encoder 101-8 to the terminal connected the switch 103.

Figures 106, 107:
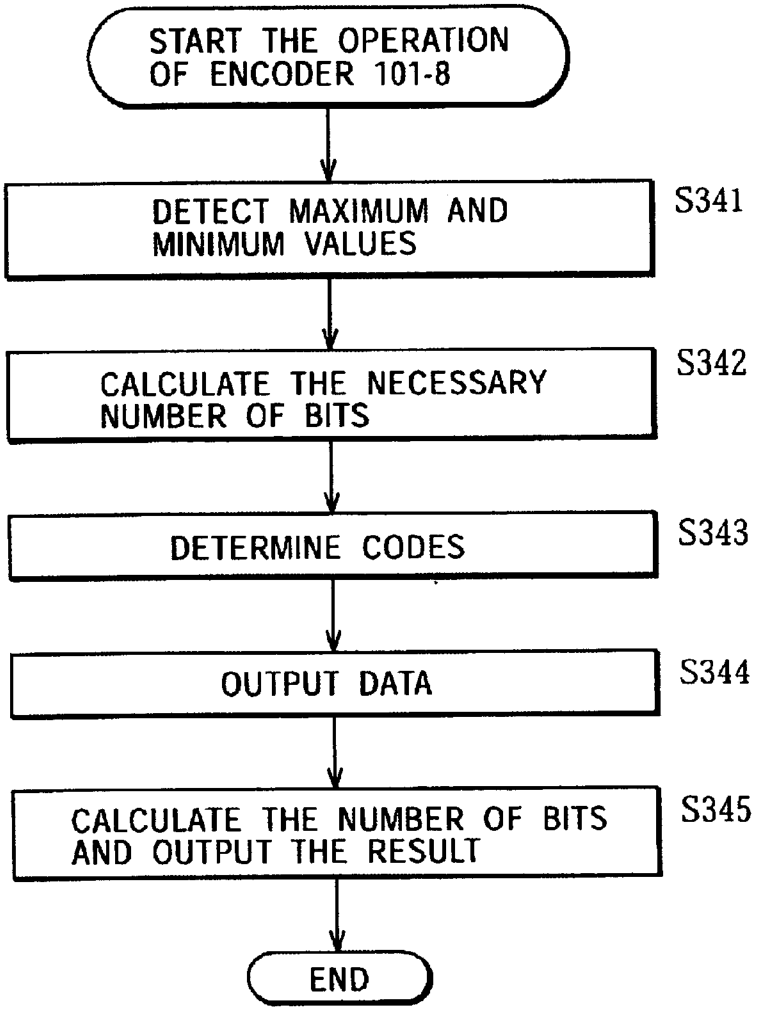
FIG. 106 is a flow chart showing the operation of an encoder 101-8.
FIG. 107 is a diagram showing an encoding method employed by the encoder 101-8.

In the example shown in FIG. 105, as shown in FIG. 107, 5-bit data indicating a minimum value (=3), 2-bit data indicating a necessary number of bits (2 bits), and 22 codes expressed in 3 bits (equal to the necessary number of bits) are output to the terminal connected the switch 103.

In the next step S345, the encoder 101-8 calculates the sum of the numbers of bits of the encoded gain control position information GC0 to GC11 and outputs the calculated sum to the decision unit 102.

For example, in the case of 22 pieces of gain control position information GC shown in FIG. 105, 2-bit data indicating a necessary number of bits, 5-bit data indicating a minimum value, and 22 codes represented in 3 bits (equal to the necessary number of bits) are generated as the result of the encoding, and thus a signal indicating that the total number of bits is equal to 73 (=2+5+3×22) is output to the decision unit 102.

If the conventional fixed-length (5-bit) encoding method were employed, the gain control position information GC in the example shown in FIG. 105 would be encoded into codes with a total of 110 (=5×22) bits. Thus, the total number of bits of encoded data according to the present invention is smaller by 37 than that according to the conventional technique.

The encoding method employed by the encoder 101-9 is described.

Figure 108:
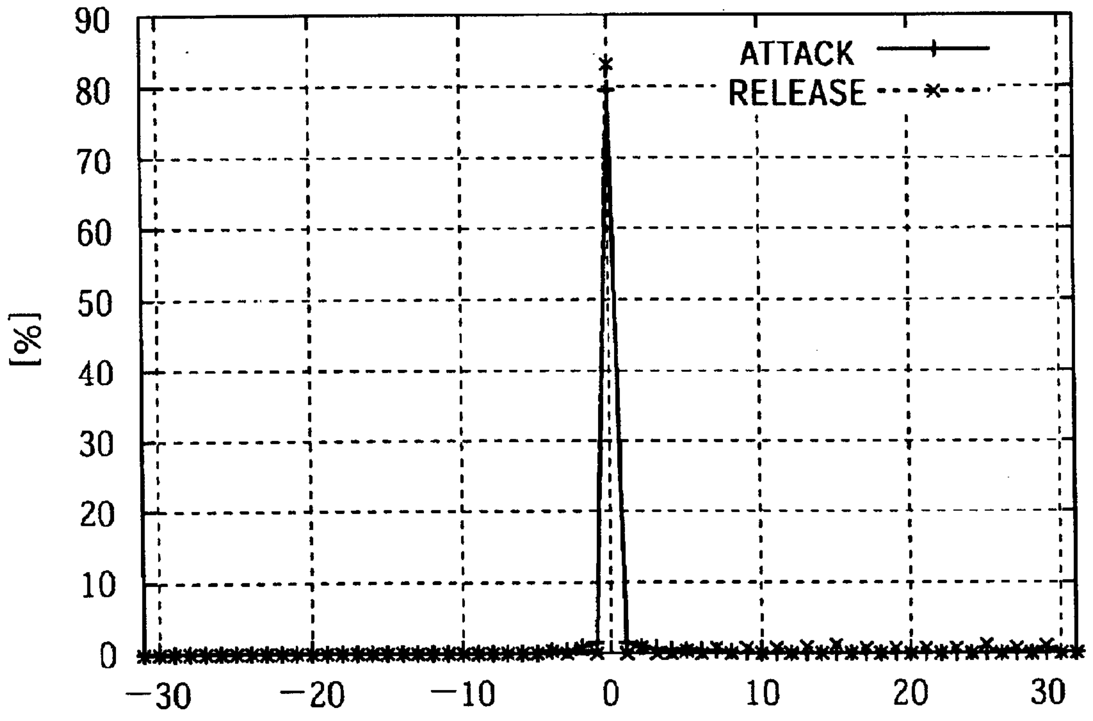
FIG. 108 is a graph showing a characteristic of a difference value WC1.

In most cases, in the stereo audio signal, the gain control position information GCLi of the left-channel signal and the gain control position information GCRi of the right-channel signal in the same frequency band are equal or close to each other. Therefore, the absolute value of the difference value WC1 obtained by subtracting the gain control position information GCLi from the gain control position information GCRi has a high probability of becoming equal or nearly equal to 0, as shown in FIG. 108.

In view of the above, the encoder 101-9 encodes gain control position information GCL such that either gain control position information GCL0 to GCL11 or gain control position information GCR0 to GCR11, and codes with small numbers of bits are assigned to difference values WC1 having high occurrence probabilities.

Figure 109:
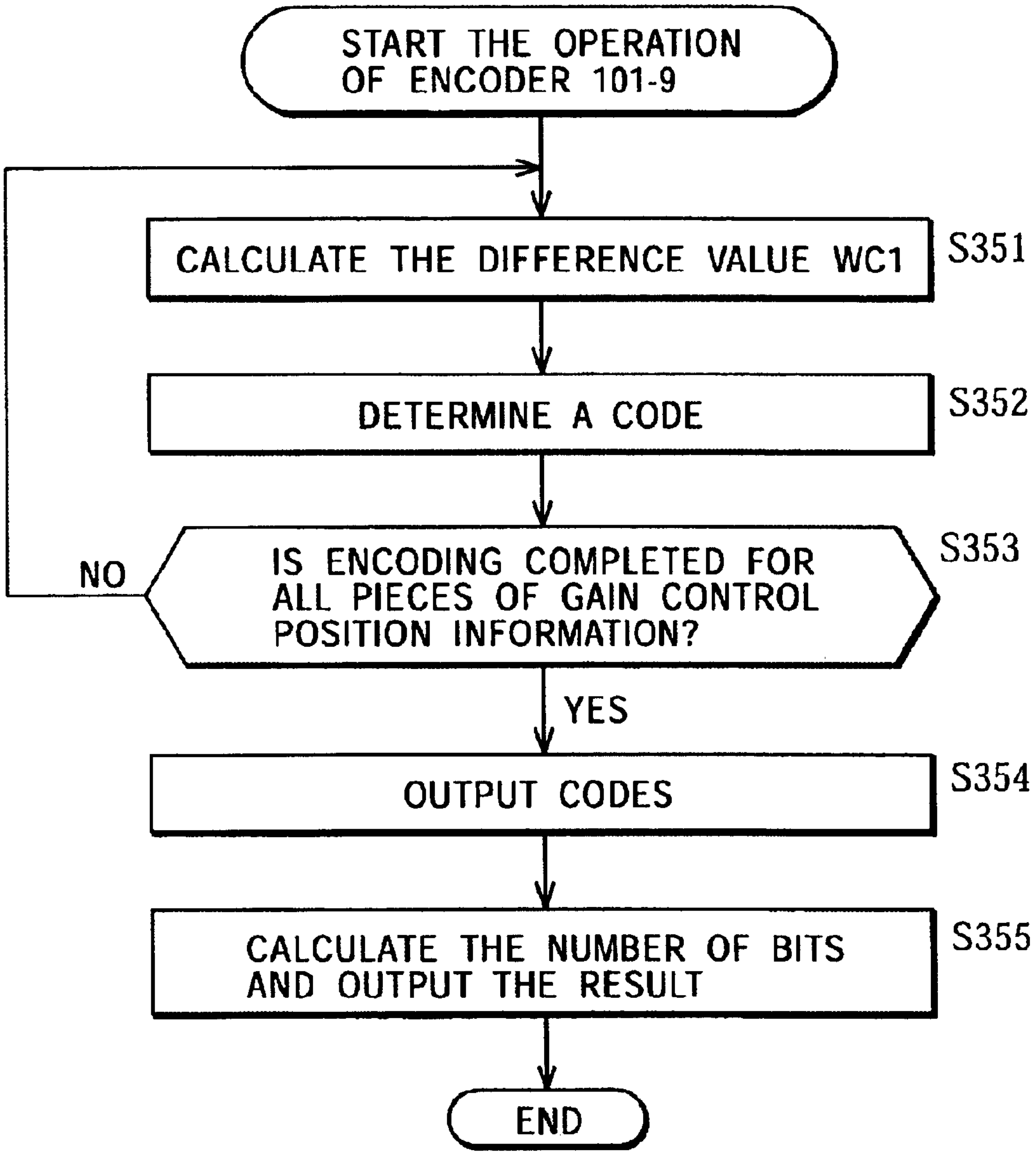
FIG. 109 is a flow chart showing the operation of an encoder 101-9.

The operation of the encoder 101-9 is described below with reference to a flow chart shown in FIG. 109.

Herein, it is assumed that the encoder 101-9 encodes gain control position information GCR.

In step S351, the encoder 101-9 detects gain control position information GCLi of one frequency band from gain control information GL0 to GL11 of the input left-channel signal and also detects gain control position information GCRi of the same frequency band from gain control information GR0 to GR11 of the input right-channel signal. The encoder 101-9 calculates the difference value WC1 by subtracting the detected gain control position information GCLi from the detected gain control position information GCRi.

Hereinafter, for simplicity, the difference value WC1 obtained by subtracting the gain control position information GCLi from the gain control position information GCRi will be referred to simply as the difference value WC1 of the gain control position information GCRi.

For example, in the case of gain control position information GCL3 of gain control position information GCL0 to GCL11 and gain control position information GCR3 of gain control position information GCR0 to GCR11 shown in FIG. 110, the difference value WC1 of first gain control position information GCR3 is calculated as 0 as the result of subtraction of first gain control position information GCL3 (=7) from the first gain control position information GCR3 (=7), and the difference value WC1 of second gain control position information GCR3 is calculated as 0 as the result of subtraction of second gain control position information GCL3 (=23) from the second gain control position information GCR3 (=23).

In the next step S352, the encoder 101-9 determines whether the gain control position information GCRi indicates the position of an attack portion AT or a release portion RE, in a similar manner to the encoder 101-2. If the gain control position information GCRi indicates the position of an attack portion AT, the encoder 101-9 retrieves a code corresponding to the difference value WC1 calculated in step S351 from the table shown in FIG. 111, while if the gain control position information GCRi indicates the position of a release portion RE, the encoder 101-9 retrieves a code corresponding to the difference value WC1 calculated in step S351 from the table shown in FIG. 112. The encoder 101-9 employs the retrieved code as the code for the gain control position information GCRi.

For example, in the case of first gain control position information GCR3 (=7) of gain control position information GCR3 in the example shown in FIG. 110, the first gain control position information GCR3 indicates the position of an attack portion AT and the difference value WC1 thereof is equal to 1, and thus a 1-bit code "0" is employed as the code of the first gain control position information GCR3.

On the other hand, as for the code of second gain control position information GCR3 (=23), the second gain control position information GCLR3 indicates the position of a release portion RE and the difference value WC1 thereof is equal to 0, and thus a 1-bit code "0" is employed as the code of the second gain control position information GCR3.

In the table shown in FIG. 111, a code with a particular number of bits is assigned to each value. Furthermore, in the table shown in FIG. 111, a procedure of determining a code for a value other than the values having corresponding assigned codes is defined (more specifically, the code is given by a formula 11+original value). According to this procedure, a 7-bit code is given by a combination of a 2-bit code "11" and a following 5-bit code indicating the gain control position information GC (original value, the gain control position information GCR in this specific case).

In the table shown in FIG. 112, a code with a particular number of bits is assigned to each value. Furthermore, in the table shown in FIG. 112, a procedure of determining a code for a value other than the values having corresponding assigned codes is defined (more specifically, the code is given by a formula 111+original value). According to this procedure, an 8-bit code is given by a combination of a 3-bit code "111" and a following 5-bit code indicating the gain control position information GC (original value, the gain control position information GCR in this specific case).

In step S353, the encoder 101-9 determines whether codes have been determined for all gain control position information GCR0 to GCR11, that is, whether all gain control position information GCR0 to GCR11 have been encoded. If it is determined that all pieces of gain control position information GCR have not been encoded, the process returns to step S351 to perform the step S351 and following steps to encode next unencoded gain control position information GCR.

If it is determined in step S353 that all gain control position information GCR0 to GCR11 have been encoded, the process proceeds to step S354. In step S354, the encoder 101-9 outputs the codes determined in step S352 for the respective gain control position information GCR0 to GCR11 to the terminal connected to the switch 103.

In step S355, the encoder 101-9 calculates the sum of the numbers of bits of the encoded gain control position information GCR0 to GCR11 and outputs the calculated sum to the decision unit 102.

For example, in the case of 17 pieces of gain control position information GCR shown in FIG. 110, codes with numbers of bits such as those shown in FIG. 110 are generated as a result of encoding, and thus a signal indicating that the total number of bits is equal to 29 is output to the decision unit 102.

If the conventional fixed-length (5-bit) encoding method were employed, the gain control position information GC in the example shown in FIG. 110 would be encoded into codes with a total of 85 (=5×17) bits. Thus, the total number of bits of encoded data according to the present invention is smaller by 56 than that according to the conventional technique.

In the encoding tables (FIGS. 111 and 112) employed in the present example, some values are encoded using escape codes. Alternatively, specific codes corresponding to respective values may be defined in the table for all values.

In the present example, the difference value WC1 is assumed to have such a characteristic shown in FIG. 108. In a case in which the characteristic of the difference value WC1 varies from one encoding unit Ai to another, the coding table may be switched depending on the characteristic of the difference value WC1.

The encoding method employed by the encoder 101-10 is described.

In many cases, in gain control position information GCLi of a left-channel signal and gain control position information GCRi of a right-channel signal in the same frequency band of a stereo audio signal, there are an equal number of pieces of gain control position information GC and, besides, Nth gain control position information GCLi and corresponding Nth gain control position information GCRi are equal to each other, as is the case with gain control position information GCL1 and gain control position information GCR1 of gain control position information GC0 to GC11 and gain control position information GCR0 to GCR11 shown in FIG. 113.

In view of the above, the encoder 101-10 encodes either gain control position information GCL0 to GCL11 or gain control position information GCR0 to GCR11 into codes with a fixed bit length, and encodes the other in such manner that when, in gain control position information GCLi and gain control position information GCRi, there are an equal number of pieces of gain control position information GC and, besides, Nth gain control position information GCLi and corresponding Nth gain control position information GCRi are equal to each other, only a flag (encoding flag) set to a value (0, in this specific example) indicating the above fact is encoded.

Figure 114:
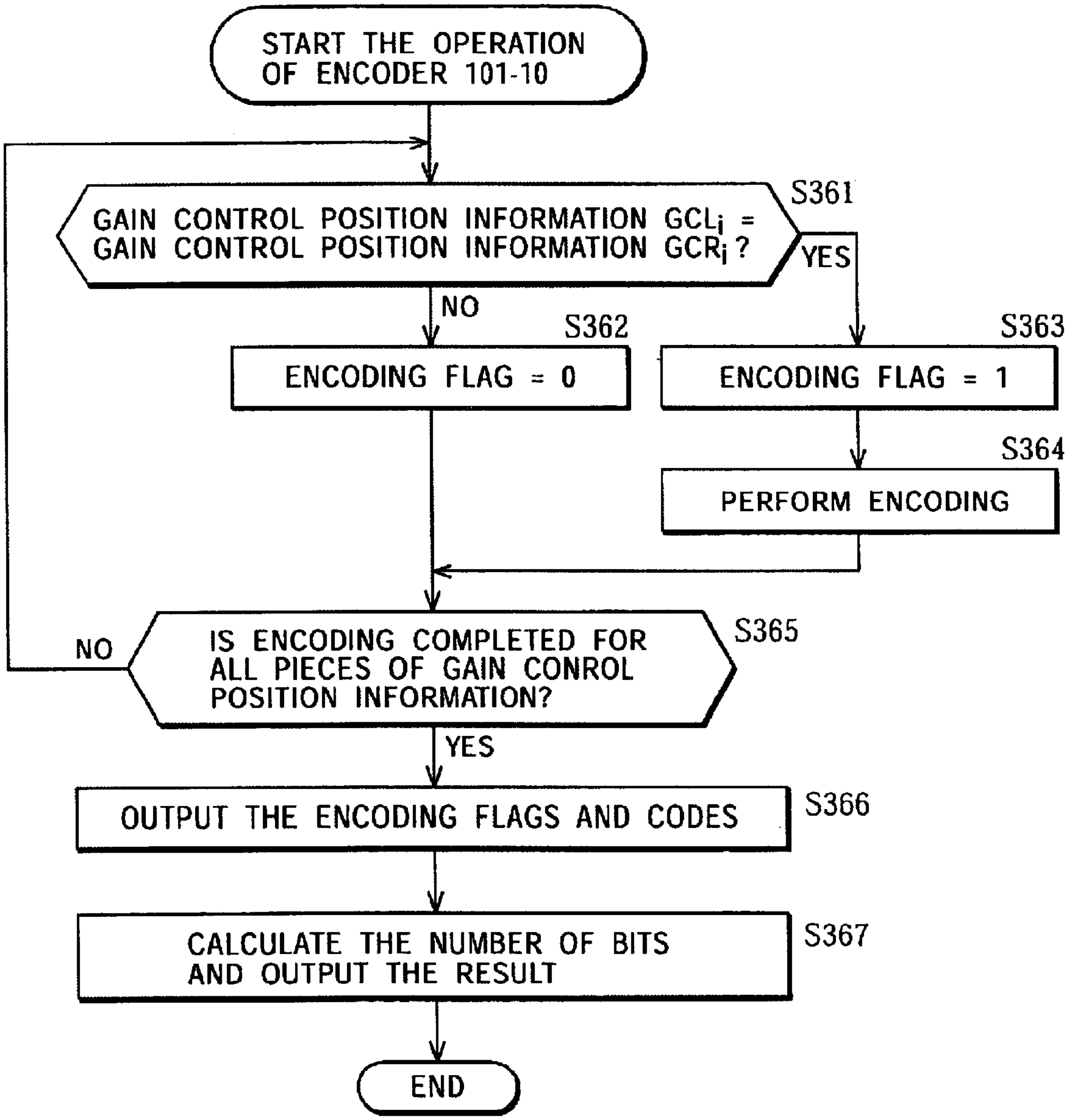
FIG. 114 is a flow chart showing the operation of an encoder 101-10.

In the case in which gain control position information GCL is encoded into codes with a fixed bit length, coding of gain control position information GCR is performed in a manner described below with reference to a flow chart shown in FIG. 114.

In step S361, the encoder 101-10 detects gain control position information GCLi in one frequency band from gain control information GL0 to GL11 of the input left-channel signal and also detects gain control position information GCRi in the same frequency band from gain control information GR0 to GR11 of the input right-channel signal. The encoder 101-10 determines whether in gain control position information GCLi and gain control position information GCRi, there are an equal number of pieces of gain control position information GC and, besides, Nth gain control position information GCLi and corresponding Nth gain control position information GCRi are equal to each other. If it is determined that in gain control position information GCLi and gain control position information GCRi, there are an equal number of pieces of gain control position information GC and, besides, Nth gain control position information GCLi and corresponding Nth gain control position information GCRi are equal to each other, the process proceeds to step S362. In step S362, the encoder 101-10 sets the encoding flag associated with the gain control position information GCRi to a value (0 in this specific example) so as to indicate the above fact.

For example, in the case of gain control position information GCL1 and gain control position information GCR1 in the example shown in FIG. 113, there are equally 3 pieces of gain control position information GC and, besides, first, second, and third gain control position information GCL1 (=4, 5, 13) and corresponding first, second, and third gain control position information GCR1 (=4, 5, 13) are equal to each other, and thus the encoding flag associated with the gain control position information GCR1 is set to 0.

On the other hand, if it is determined in step S361 that in gain control position information GCLi and gain control position information GCRi, the numbers of pieces of gain control position information GC are not equal or Nth gain control position information GCLi and corresponding Nth gain control position information GCRi are not equal to each other, the process proceeds to step S363. In step S363, the encoder 101-10 sets the encoding flag associated with the gain control position information GCRi to 1.

In the next step S364, the encoder 101-10 encodes the gain control position information GCRi in a similar manner as to, for example, the encoder 101-9.

That is, the encoder 101-10 calculates the difference value WCi by subtracting the Nth gain control position information GCLi from the Nth gain control position information GCRi.

The encoder 101-10 retrieves a code corresponding to the difference value WC1 of the Nth gain control position information GCRi from a table similar to that shown in FIG. 111 or a table similar to that shown in FIG. 112 depending on whether the Nth gain control position information GCRi indicates the position of an attack portion AT or a release portion RE, and the encoder 101-10 employs the retrieved code as the code of the Nth gain control position information GCRi.

In the case in which an encoding flag has been set to 0 in step S362 or in the case in which gain control position information GCRi has been encoded in step S364, the process proceeds to step S365. In step S365, the encoder 101-10 determines whether all encoding flags have been set to 0 or 1 and codes have been determined for all pieces of gain control position information GCRi corresponding to the encoding flags set to 1, that is, the encoder 101-10 determines whether encoding has been completed for all pieces of gain control position information GCR0 to GCR11. If it is determined that all pieces of gain control position information GCRi have not been encoded, the process returns to step S361 to perform the step S361 and following steps to encode next unencoded gain control position information GCRi.

If it is determined in step S365 that all gain control position information GCR0 to GCR11 have been encoded, the process proceeds to step S366. In step S366, the encoder 101-10 outputs the encoding flag set to 0 or 1 and the codes to the terminal connected to the switch 103.

In the next step S367, the encoder 10-10 calculates the sum of the numbers of bits of the encoded gain control position information GCR0 to GCR11 and outputs the calculated sum to the decision unit 102.

For example, in the case of 22 pieces of gain control position information GCR shown in FIG. 113, 12 1-bit encoding flags and codes with number of bits such as those shown in FIG. 113 are generated as a result of encoding, and thus a signal indicating that the total number of bits is equal to 31 is output to the decision unit 102.

If the conventional fixed-length (5-bit) encoding method were employed, the gain control position information GC in the example shown in FIG. 113 would be encoded into codes with a total of 110 (=5×22) bits. Thus, the total number of bits of encoded data according to the present invention is smaller by 79 than that according to the conventional technique.

In the present embodiment, in the case in which it is determined that in gain control position information GCLi and gain control position information GCRi, the numbers of pieces of gain control position information GC are not equal, or Nth gain control position information GCLi and corresponding Nth gain control position information GCRi are not equal to each other, encoding of gain control position information GCRi is performed in a similar manner as with the encoder 101-9. Alternatively, fixed-bit-length encoding (5-bit encoding) may be employed.

The encoding method employed by the encoder 101-11 is described.

In some cases, in the stereo audio signal, as shown in FIG. 115, all gain control position information GCL0 to GCL11 of the left-channel signal become equal to corresponding gain control position information GCR0 to GCR11 of the right-channel signal.

In view of the above, the encoder 101-11 encodes either gain control position information GCL0 to GCL11 or gain control position information GCR0 to GCR11 into codes with a fixed bit length, but, when gain control amount information GBL0 to GBL11 are all equal to corresponding gain control amount information GBR0 to GBR11, encoding of the other set of gain control amount information is not performed.

Figure 116:
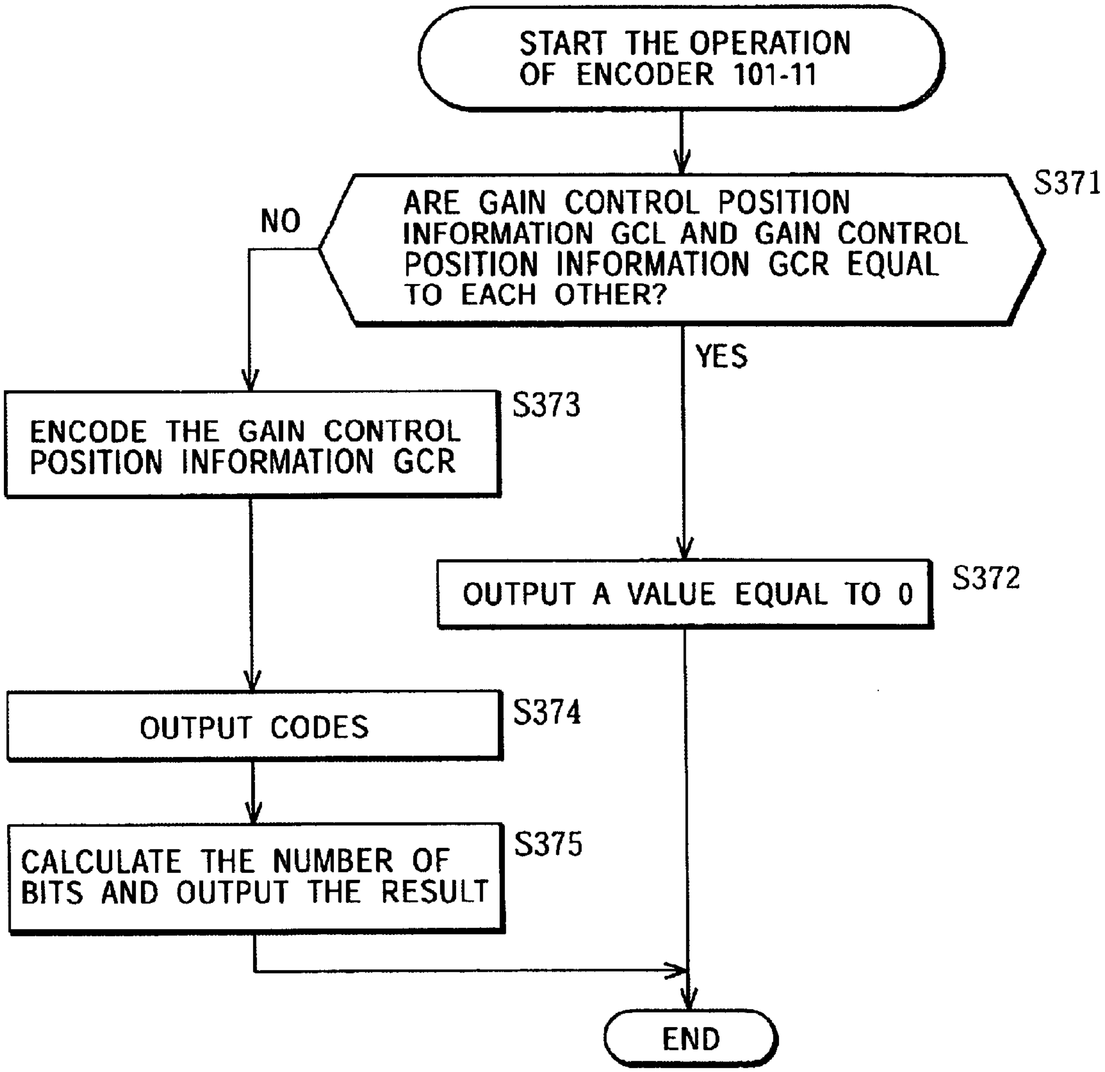

In a case in which gain control position information GCL is encoded into codes with a fixed bit length, coding of gain control position information GCR is performed in a manner described below with reference to a flow chart shown in FIG. 116.

In step S371, the encoder 101-11 detects gain control position information GCL0 to GCL11 and gain control position information GCR0 to GCR11 from the input gain control information GL0 to GL11 of the left-channel signal and gain control information GR0 to GR11 of the right-channel signal, respectively. The encoder 101-11 then determines whether the gain control position information GCL0 to GCL11 and the gain control position information GCR0 to GCR11 are equal to each other between corresponding counterparts. If it is determined that they are all equal to each other as is the case in the example shown in FIG. 115, the process proceeds to step S372.

In step S372, the encoder 101-11 does not encode the gain control position information GCR0 to GCR11, in this case, but the encoder 101-11 outputs a value of 0 indicating that the number of bits of codes is equal to 0 to the decision unit 102.

In a case in which it is determined in step S371 that the gain control position information GCL0 to GCL11 and the gain control position information GCR0 to GCR11 are not equal to each other between corresponding counterparts, the process proceeds to step S373. In step S373, the encoder 101-11 encodes the gain control position information GCR0 to GCR11, for example, into codes with a fixed bit length (5 bits).

In the next step S374, the encoder 101-11 outputs the resultant codes of the respective gain control position information GCR0 to GCR11 to the terminal connected to the switch 103.

In step S375, the encoder 101-11 calculates the sum of the numbers of bits of the encoded gain control position information GCR0 to GCR11 and outputs the calculated sum to the decision unit 102.

In the example shown in FIG. 115, the total number of bits of the codes of the gain control position information GCL is equal to 100 (=5×20). Thus, a signal indicating that the total number of bits is equal to 100 is output to the decision unit 102.

After step S372 or step S375, the process performed by the encoder 101-11 is completed.

If the conventional fixed-length (5-bit) encoding method were employed, the gain control position information GC in the example shown in FIG. 115 would be encoded into codes with a total of 100 (=5×20) bits. Thus, when the gain control position information GCR is not encoded, the total number of bits of encoded data according to the present invention is smaller by 100 than that according to the conventional technique.

The encoding method employed by the encoder 101-12 is described.

As described earlier with reference to FIG. 85, in plural pieces of gain control position information GCi, the difference value VC1 obtained by subtracting the Nth gain control position information GCi from the (N+1)th gain control position information GCi has a high probability of becoming equal to a particular value.

Furthermore, in the case of stereo audio signals, as described earlier with reference to FIG. 108, the difference value WC1 obtained by subtracting gain control position information GCLi from gain control position information GCRi in the same frequency band has a high probability of becoming equal to a particular value.

Figure 117:
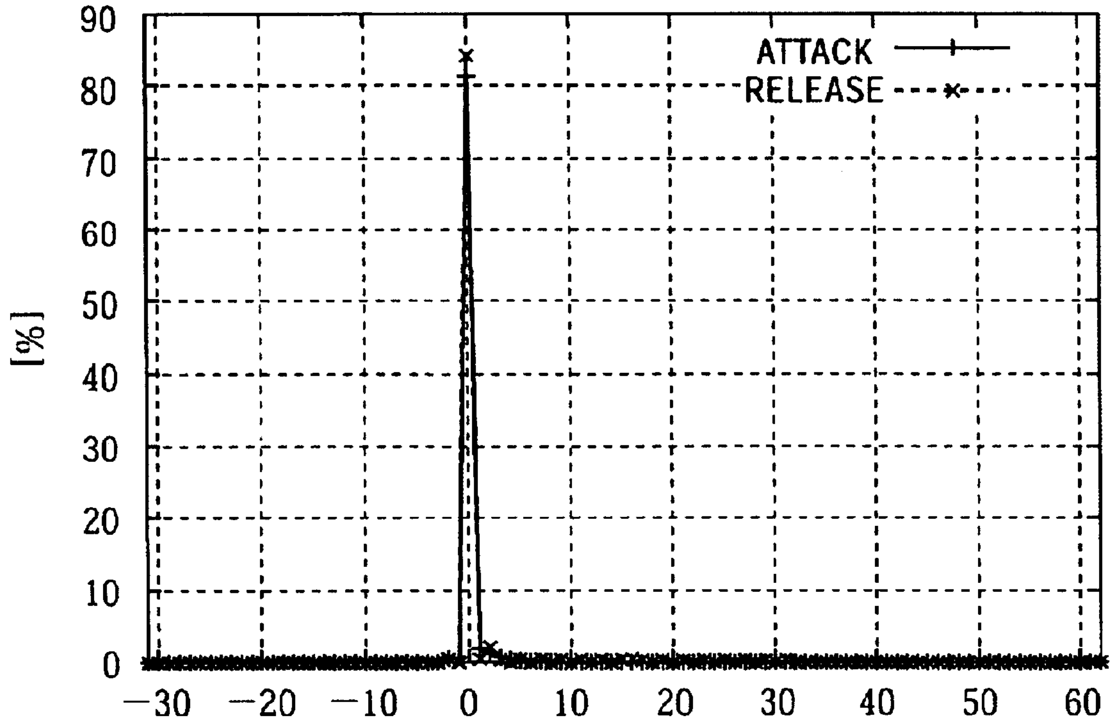

Therefore, the difference value WC2 obtained by subtracting the difference value VC1 of the gain control position information GCLi from the difference value VC1 of the gain control position information GCRi has a high probability of taking a particular value (0 or a value whose absolute value is close to 0), as shown in FIG. 117.

In view of the above, the encoder 101-12 encodes gain control position information GC such that either gain control position information GCL0 to GCL11 or gain control position information GCR0 to GCR11, and codes with small numbers of bits are assigned to difference values WC2 having high occurrence probabilities.

Figure 118:
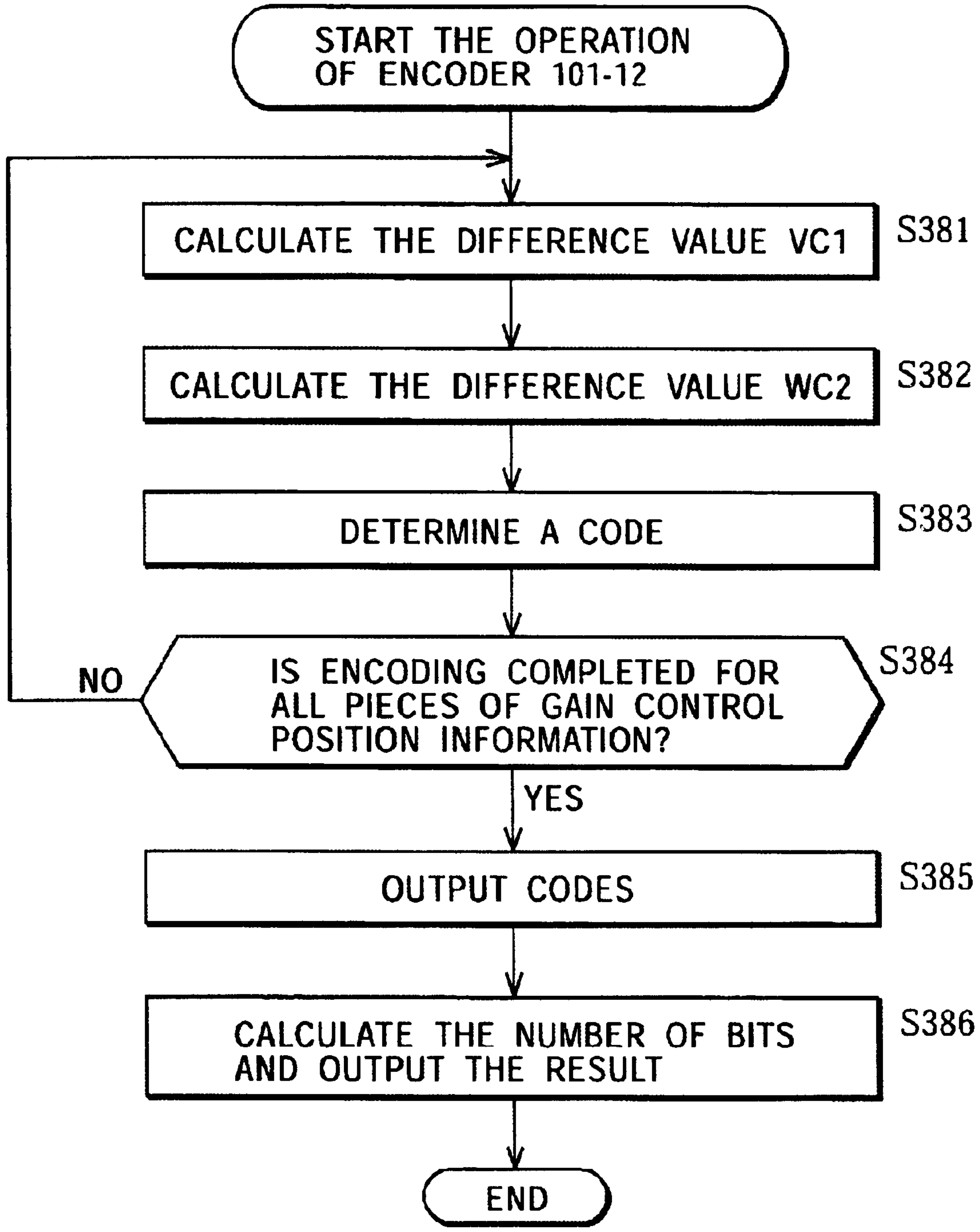

The operation of the encoder 101-12 is described below with reference to a flow chart shown in FIG. 118. Herein, it is assumed that the encoder 101-12 encodes gain control position information GCR.

In step S381, the encoder 101-12 detects gain control position information GCLi in one frequency band from gain control information GL0 to GL11 of the input left-channel signal and also detects gain control position information GCRi in the same frequency band from gain control information GR0 to GR11 of the input right-channel signal.

Furthermore, the encoder 101-12 calculates the difference value VC1 of (N+1)th gain control position information GCLi by subtracting Nth gain control position information GCLi from the (N+1)th gain control position information GCLi, and also calculates the difference value VC1 of (N+1)th gain control position information GCRi by subtracting Nth gain control position information GCRi from the (N+1)th gain control position information GCRi.

The difference value VC1 of first gain control position information GCLi is defined as being equal to the value of the first gain control position information GCLi, and the difference value VC1 of first gain control position information GCRi is defined as being equal to the value of the first gain control position information GCRi.

For example, in the case of gain control position information GCL3 of gain control position information GCL to GCL11 shown in FIG. 119, a value (7, not shown in the figure) equal to the value of first gain control position information GCL3 (=7) is employed as the difference value VC1 of the first gain control position information GCL3 (=7), and the difference value VC1 of second gain control position information GCL3 (=23) is calculated as 16 as the result of subtraction of the first gain control position information GCL3 (=7) from the second gain control position information GCL3 (=23).

On the other hand, as for gain control position information GCR3 of gain control position information GCR0 to GCR11, a value (7, not shown in the figure) equal to the value of first gain control position information GCR3 (=7) is employed as the difference value VC1 of the first gain control position information GCR3 (=7), and the difference value VC1 of second gain control position information GCR3 (=23) is calculated as 16 as the result of subtraction of the first gain control position information GCR3 (=7) from the second gain control position information GCR3 (=23).

In the next step S382, the encoder 101-12 determines the difference value WC2 by subtracting the difference value VC1 of gain control position information GCLi from the difference value VC1 of gain control position information GCRi.

Hereinafter, for simplicity, the difference value WC2 obtained by subtracting the difference value VC1 of the gain control position information GCLi from the difference value VC1 of the gain control position information GCRi will be referred to simply as the difference value WC2 of the gain control position information GCRi.

For example, in the case of gain control position information GCL3 and gain control position information GCR3 in the example shown in FIG. 119, the difference value WC2 of first gain control position information GCR3 is calculated as 0 as the result of subtraction of the difference value VC1 (=7) of first gain control position information GCL3 from the difference value VC1 (=7) of the first gain control position information GCR3, and the difference value WC2 of second gain control position information GCR3 is calculated as 0 as the result of subtraction of the difference value VC1 (=16) of second gain control position information GCL3 from the difference value VC1 (=16) of the second gain control position information GCR3.

In step S383, the encoder 101-12 determines whether Nth gain control position information GCRi indicates the position of an attack portion AT or a release portion RE, in a similar manner to the encoder 101-2. In the case in which the gain control position information GCRi indicates the position of an attack portion AT, the encoder 101-12 retrieves a code corresponding to the difference value WC2 of the Nth gain control position information GCRi from a table shown in FIG. 120 and employs the retrieved code as the code of the gain control position information GCRi.

For example, in the case of gain control position information GCR3 in the example shown in FIG. 119, first gain control position information GCL3 (=7) indicates the position of an attack portion AT and the difference value WC2 thereof is equal to 0, and thus a 1-bit code "0" is employed as the code of the first gain control position information GCL3.

On the other hand, in a case in which the gain control position information GCRi indicates the position of a release portion RE, a code corresponding to the difference value WC2 of the gain control position information GCRi is retrieved from a table shown in FIG. 121 and the retrieved code is employed as the code of the gain control position information GCRi.

For example, in the case of gain control position information GCR3 in the example shown in FIG. 119, second gain control position information GCL3 (=23) indicates the position of a release portion RE and the difference value WC3 thereof is equal to 0, and thus a 1-bit code "0" is employed as the code of the second gain control position information GCL3.

In the table shown in FIG. 120, a code with a particular number of bits is assigned to each value. Furthermore, in the table shown in FIG. 120, a procedure of determining a code for a value other than the values having corresponding assigned codes is defined (more specifically, the code is given by a formula 11+original value). According to this procedure, a 7-bit code is given by a combination of a 2-bit code "11" and a following 5-bit code indicating the gain control position information GC (original value, the gain control position information GCR in this specific case).

In the table shown in FIG. 121, a code with a particular number of bits is assigned to each value. Furthermore, in the table shown in FIG. 121, a procedure of determining a code for a value other than the values having corresponding assigned codes is defined (more specifically, the code is given by a formula 111+original value). According to this procedure, an 8-bit code is given by a combination of a 3-bit code "111" and a following 5-bit code indicating the gain control position information GC (original value, the gain control position information GCR in this specific case).

In the next step S384, the encoder 101-12 determines whether codes have been determined for all gain control position information GCR0 to GCR11, that is, whether all gain control position information GCR0 to GCR11 have been encoded. If it is determined that all pieces of gain control position information GCRi have not been encoded, the process returns to step S381 to perform the step S381 and following steps to encode next unencoded gain control position information GCRi.

If it is determined in step S384 that all gain control position information GCR0 to GCR11 have been encoded, the process proceeds to step S385. In step S385, the encoder 101-12 outputs the codes determined in step S383 for the respective gain control position information GCR0 to GCR11 to the terminal connected to the switch 103.

In step S386, the encoder 101-12 calculates the sum of the numbers of bits of the encoded gain control position information GCR0 to GCR11 and outputs the calculated sum to the decision unit 102.

For example, in the case of 22 pieces of gain control position information GCR shown in FIG. 119, codes with numbers of bits such as those shown in FIG. 119 are generated as a result of encoding, and thus the total number of bits of the codes becomes equal to 48. Thus, a signal indicating that the total number of bits is equal to 48 is output to the decision unit 102.

If the conventional fixed-length (5-bit) encoding method were employed, the gain control position information GC in the example shown in FIG. 119 would be encoded into codes with a total of 110 (=5×22) bits. Thus, the total number of bits of encoded data according to the present invention is smaller by 62 than that according to the conventional technique. In the encoding tables (FIGS. 120 and 121) employed in the present example, some values are encoded using escape codes. Alternatively, specific codes corresponding to respective values may be defined in the table for all values.

In the present example, the difference value WC2 is assumed to have such a characteristic shown in FIG. 117. In a case in which the characteristic of the difference value WC2 varies from one encoding unit Ai to another, the coding table may be switched depending on the characteristic of the difference value WC2.

The encoding method employed by the encoder 101-13 is described.

As described earlier with reference to FIG. 90, the difference value VC2 obtained by subtracting gain control position information GCi-1 of a lower frequency band immediately adjacent to gain control position information GCi from the gain control position information GCi has a high probability of becoming equal to a particular value.

Furthermore, in the case of stereo audio signals, as described earlier with reference to FIG. 108, the difference value WC1 obtained by subtracting gain control position information GCLi from gain control position information GCRi in the same frequency band has a high probability of becoming equal to a particular value.

Figure 122:
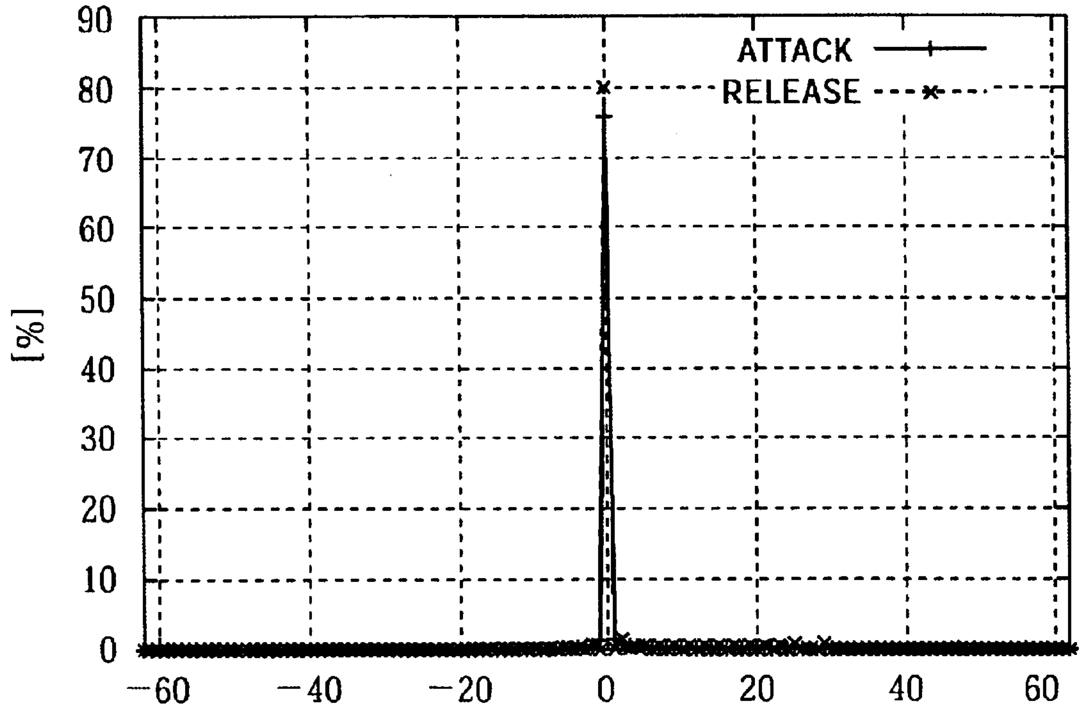

Therefore, the difference value WC3 obtained by subtracting the difference value VC2 of the gain control position information GCLi from the difference value VC2 of the gain control position information GCRi has a high probability of taking a particular value (0 or a value whose absolute value is close to 0), as shown in FIG. 122.

In view of the above, the encoder 101-13 encodes gain control position information GC such that either gain control position information GCL0 to GCL11 or gain control position information GCR0 to GCR11, and codes with small numbers of bits are assigned to difference values WC3 having high occurrence probabilities.

Figure 123:
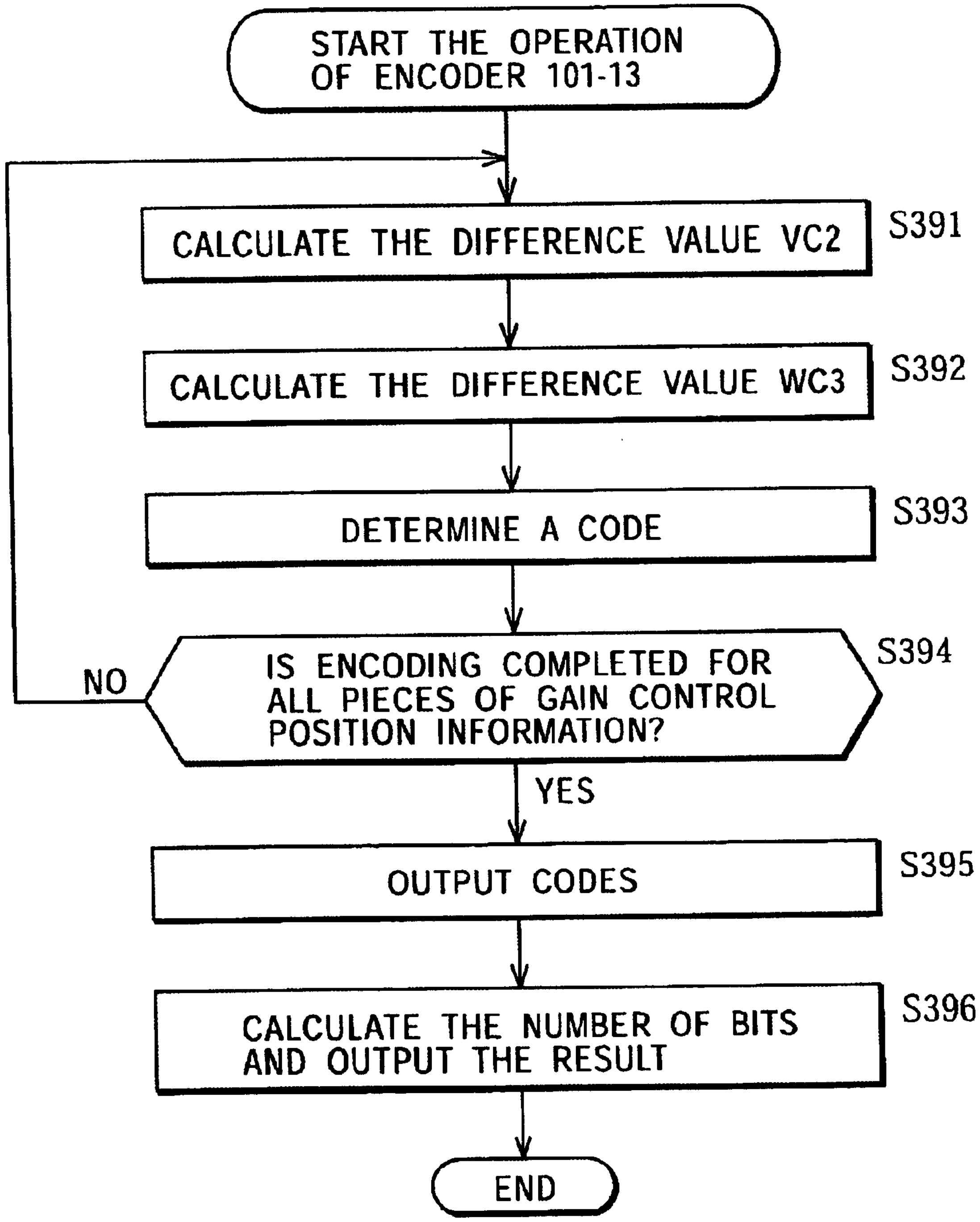

The operation of the encoder 101-13 is described below with reference to a flow chart shown in FIG. 123. Herein, it is assumed that the encoder 101-13 encodes gain control position information GCR.

In step S391, the encoder 101-13 detects gain control position information GCLi in one frequency band from gain control information GL0 to GL11 of the input left-channel signal and also detects gain control position information GCRi in the same frequency band from gain control information GR0 to GR11 of the input right-channel signal.

The encoder 101-13 then determines the difference value VC2 of the gain control position information GCLi by subtracting, from the gain control position information GCLi, the gain control position information GCLi-1 of the encoding unit Ai-1 which is in a lower frequency band adjacent to the frequency band of the encoding unit Ai and which was detected in previous execution of step S391.

The encoder 101-13 also determines the difference value VC2 of the gain control position information GCRi by subtracting, from the gain control position information GCRi, the gain control position information GCRi-1 of the encoding unit Ai-1 and which was detected in previous execution of step S391.

For example, in the case of gain control position information GCL3 of gain control position information GCL0 to GCL11 shown in FIG. 124, the difference value VC2 of first gain control position information GCL3 is given by a value (=−1, not shown) obtained by subtracting first gain control position information GCL2 (=8) from the first gain control position information GCL3 (=7), and the difference value VC2 of second gain control position information GCL3 is given by a value (=11, not shown) obtained by subtracting second gain control position information GCL2 (=10) from the second gain control position information GCL3 (=21).

Furthermore, in the case of gain control position information GCR3 of gain control position information GCR0 to GCR11 shown in FIG. 124, the difference value VC2 of first gain control position information GCR3 is given by a value (=−1, not shown) obtained by subtracting first gain control position information GCR2 (=8) from the first gain control position information GCR3 (=7), and the difference value VC2 of second gain control position information GCR3 is given by a value (=13, not shown) obtained by subtracting second gain control position information GCR2 (=10) from the second gain control position information GCR3 (=23).

In the next step S392, the encoder 101-13 determines the difference value WC3 by subtracting the difference value VC2 of the gain control position information GCLi from the difference value VC2 of the gain control position information GCRi.

Hereinafter, for simplicity, the difference value WC3 obtained by subtracting the difference value VC2 of the gain control position information GCLi from the difference value VC2 of the gain control position information GCRi will be referred to simply as the difference value WC3 of the gain control position information GCRi.

For example, in the case of gain control position information GCL3 and gain control position information GCR3 in the example shown in FIG. 124, the difference value WC3 of first gain control position information GCR3 is given by a value (=0) obtained by subtracting the difference value VC2 (=−1) of first gain control position information GCL3 (=7) from the difference value VC2 (=−1) of the first gain control position information GCR3 (=7), and the difference value WC3 of second gain control position information GCR3 is given by a value (=2) obtained by subtracting the difference value VC2 (=11) of second gain control position information GCL3 (=21) from the difference value VC2 (=13) of the second gain control position information GCR3 (=23).

In step S393, the encoder 101-13 determines whether the gain control position information GCRi indicates the position of an attack portion AT or a release portion RE, in a similar manner to the encoder 101-2. In a case in which the gain control position information GCRi indicates the position of an attack portion AT, the encoder 101-13 retrieves a code corresponding to the difference value WC3 of the gain control position information GCRi from a table shown in FIG. 125 and employs the retrieved code as the code for the gain control position information GCRi.

For example, in the case of first gain control position information GCR3 (=7) of gain control position information GCR3 in the example shown in FIG. 124, the first gain control position information GCR3 indicates the position of an attack portion AT and the difference value WC3 thereof is equal to 0, and thus a 1-bit code "0" is employed as the code of the first gain control position information GCR3.

On the other hand, in a case in which the gain control position information GCRi indicates the position of a release portion RE, a code corresponding to the difference value WC3 of the gain control position information GCRi is retrieved from a table shown in FIG. 126 and the retrieved code is employed as the code of the gain control position information GCRi.

For example, in the case of second gain control position information GCR3 (=23) of the gain control position information GCR3 in the example shown in FIG. 124, the second gain control position information GCR3 indicates the position of a release portion RE and the difference value WC3 thereof is equal to 2, and thus a 2-bit code "110" is employed as the code of the second gain control position information GCR3.

In the table shown in FIG. 125, a 1-bit code "0" is assigned to a value of 0. Furthermore, in the table shown in FIG. 125, a procedure of determining a code for a value other 0 is defined (more specifically, the code is given by a formula 1+original value). According to this procedure, a 5-bit code is given by a combination of a 1-bit code "1" and a following 5-bit code indicating the gain control position information GC (original value, the gain control position information GCR in this specific case).

In the table shown in FIG. 126, a 1-bit code "0" is assigned to a value of 0 and a 2-bit code "10" is assigned to a value of 2. Furthermore, in the table shown in FIG. 126, a procedure of determining a code for a value other 0 and 2 is defined (more specifically, the code is given by a formula 11+original value). According to this procedure, a 7-bit code is given by a combination of a 2-bit code "11" and a following 5-bit code indicating the gain control position information GC (original value, the gain control position information GCR in this specific case).

In the next step S394, the encoder 101-13 determines whether codes have been determined for all gain control position information GCR0 to GCR11, that is, whether all gain control position information GCR0 to GCR11 have been encoded. If it is determined that all pieces of gain control position information GCRi have not been encoded, the process returns to step S391 to perform the step S391 and following steps to encode next unencoded gain control position information GCRi.

If it is determined in step S394 that all gain control position information GCR0 to GCR11 have been encoded, the process proceeds to step S395. In step S395, the encoder 101-13 outputs the codes determined in step S393 for the respective gain control position information GCR0 to GCR11 to the terminal connected to the switch 103.

In step S396, the encoder 101-13 calculates the sum of the numbers of bits of the encoded gain control position information GCR0 to GCR11 and outputs the calculated sum to the decision unit 102.

For example, in the case of 22 pieces of gain control position information GCR shown in FIG. 124, codes with numbers of bits such as those shown in FIG. 124 are generated as a result of encoding, and thus a signal indicating that the total number of bits is equal to 50 is output to the decision unit 102.

If the conventional fixed-length (5-bit) encoding method were employed, the gain control position information GCR in the example shown in FIG. 124 would be encoded into codes with a total of 110 (=5×22) bits. Thus, in this example, the total number of bits of encoded data according to the present invention is smaller by 60 than that according to the conventional technique.

In the encoding tables (FIGS. 125 and 126) employed in the present example, some values are encoded using escape codes. Alternatively, specific codes corresponding to respective values may be defined in the table for all values.

In the present example, the difference value WC3 is assumed to have such a characteristic shown in FIG. 122. In a case in which the characteristic of the difference value WC3 varies from one encoding unit Ai to another, the coding table may be switched depending on the characteristic of the difference value WC3.

In addition to above-described various methods employed by the gain control position information encoder 73 to encode the gain control position information, there may be provided an additional encoder for encoding the gain control number into a code with a fixed bit length according to the conventional technique.

Figure 5:
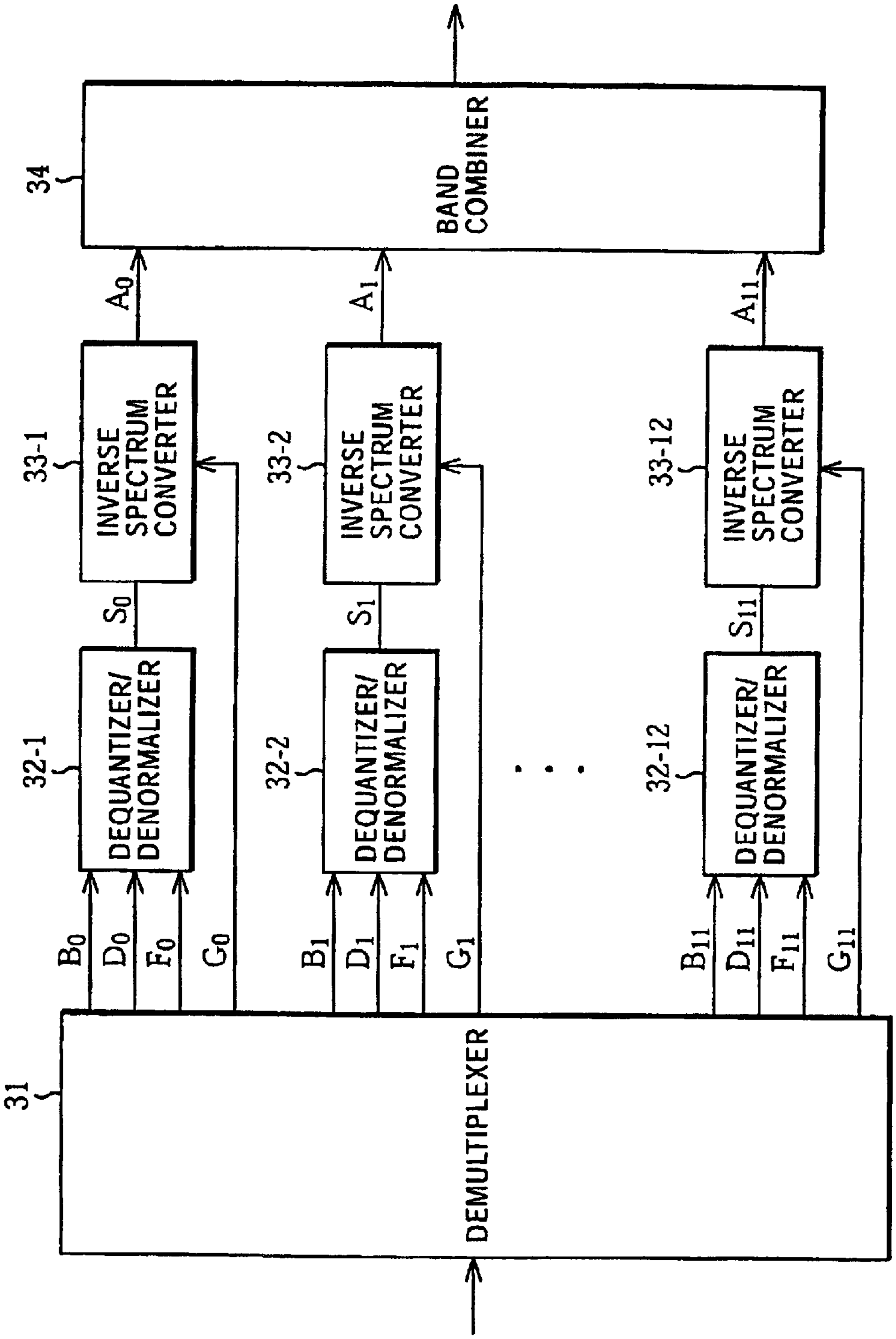
FIG. 5 RELATED ART
FIG. 5 is a block diagram showing an example of a construction of a decoding apparatus 2 according to a conventional technique.
Figure 6:
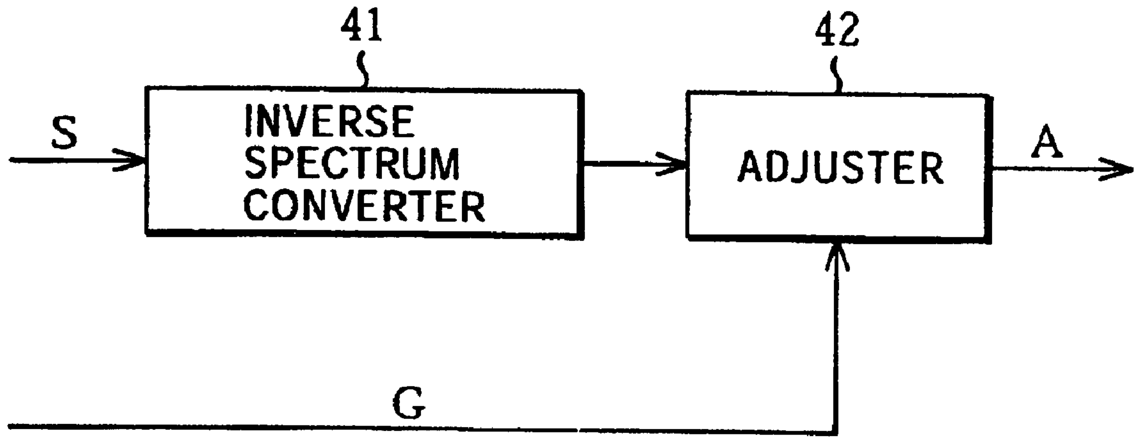
FIG. 6 RELATED ART
FIG. 6 is a block diagram showing an example of an inverse spectrum converter 33 shown in FIG. 5.

FIG. 127 shows an example of a construction of a decoding apparatus 151 according to the present invention. In addition to the parts employed in the decoding apparatus 2 shown in FIG. 5, the encoding apparatus 151 further includes gain control information decoder 161. The other parts are similar to those of the decoding apparatus 2 shown in FIG. 5 and thus they are not described in further detail herein.

The demultiplexer 31 processes encoded data so as to separate it into decoded normalized coefficients B0 to B11, decoded quantization step size information D0 to D11, decoded quantized coefficients F0 to F11, codes into which gain control information G0 to G11 have been encoded (hereinafter, such codes will be referred to as encoded gain control information GX), and information indicating the encoding method applied to the gain control information G (hereinafter, referred to as gain control information encoding information GY).

The separated normalized coefficients B0 to B11, quantization step size information D0 to D11, and quantized coefficients F0 to F11 are supplied to corresponding dequantizers/denormalizers 32-1 to 32-12 from the demultiplexer 31, while the encoded gain control information GX and the gain control information encoding information GY are supplied to the gain control information decoder 161.

The dequantizer/denormalizer 32 dequantizes the quantized coefficients F by employing a quantization step size corresponding to that indicated by the quantization step size information D and multiplies the normalized data C obtained via the dequantization by a value corresponding to the normalized coefficient B (thereby denormalizing the normalized data C. The signal obtained as a result of the above process is supplied to the inverse spectrum converter 33.

FIG. 128 shows the construction of the gain control information decoder 161, in which the encoded gain control information GX and the gain control information encoding information GY received from the demultiplexer 31 are applied to a gain control number decoder 171, a gain control amount information decoder 172, and a gain control position information decoder 173 of the gain control information decoder 161.

The gain control number decoder 171 decodes the encoded gain control number GAX included in the input encoded gain control information GX in accordance with the gain control number encoding information GAY included in the input gain control information encoding information GY. That is, the gain control number decoder 171 performs decoding corresponding to the encoding performed on the gain control number GA by the encoder 51. The gain control numbers GA0 to GA11 obtained via the decoding process are supplied to inverse spectrum converters 33-1 to 33-12, respectively, in synchronization with respective gain control amount information GB0 to GB11 output from the gain control amount information decoder 172 and respective gain control position information GC0 to GC11 output from the gain control position information decoder 173.

The gain control amount information decoder 172 decodes the encoded gain control amount information GBX included in the input encoded gain control information GX in accordance with the gain control amount information encoding information GBY included in the input gain control information encoding information GY. That is, the gain control amount information decoder 172 performs decoding corresponding to the encoding performed on the gain control amount information GB by the encoder 51. The gain control amount information GB0 to GB11 obtained via the decoding process are supplied to inverse spectrum converters 33-1 to 33-12, respectively, in synchronization with respective gain control numbers GA0 to GA11 output from the gain control number decoder 171 and respective gain control position information GC0 to GC11 output from the gain control position information decoder 173.

The gain control position information decoder 173 decodes the encoded gain control position information GCX included in the input encoded gain control information GX in accordance with the input gain control position information encoding information GCY included in the input gain control information encoding information GY. That is, the gain control position information decoder 173 performs decoding corresponding to the encoding performed on the gain control position information GC by the encoder 51. The gain control position information GC0 to GC11 obtained via the decoding process are supplied to inverse spectrum converters 33-1 to 33-12, respectively, in synchronization with respective gain control numbers GA0 to GA11 output from the gain control number decoder 171 and respective gain control amount information GB0 to GB11 output from the gain control amount information decoder 172.

Referring again to FIG. 127, the inverse spectrum converter 33 performs an inverse spectrum conversion which is an inverse process of the spectrum conversion performed in the encoding apparatus 51.

Furthermore, the inverse spectrum converter 33 performs a gain control adjustment on the signal obtained as the result of the inverse spectrum conversion in accordance with the gain control information G received from the gain control information decoder 161. An encoding unit A obtained as the result is output to a band combiner 34.

The band combiner 34 combines the encoding units A received from the inverse spectrum converter 33 such that overlapped sample data of the block are interfered with each other, thereby reconstructing an audio signal.

FIG. 129 shows an example of a construction of the gain control number decoder 171. Although in the present example, the gain control number decoder 171 includes nine decoders 181-1 to 181-8, the number of decoders is not limited to eight, but the gain control number decoder 171 may include an arbitrary plural number of decoders 181.

The encoded gain control information GX is input to the eight decoders 181-1 to 181-8, as required. In the respective decoders 181-1 to 181-8, the encoded gain control number GAX included in the input encoded gain control information GX is subjected to decoding processes corresponding to the encoding processes performed by the respective encoders 81-1 to 81-8 (FIG. 9) of the gain control number encoder 71 (FIG. 8) of the gain control information encoder 61 in the encoding apparatus 51. The decoded results are output from terminals connected to a switch 184.

A decision unit 182 detects, from the gain control number encoding information GAY included in the input gain control information encoding information GY, encoding information associated with the encoded gain control number GAX (more specifically, detects which one of encoders 81 encoded the gain control number GAX or detects which table was used in the encoding of the gain control number GAX). In accordance with the detected encoding information, the decision unit 182 selects a decoder 181 to be used in decoding.

The decision unit 182 controls the switch 183 so that the encoded gain control information GX is input to the selected decoder 181 and also controls the switch 184 so that the output from the selected decoder 181 is properly supplied to inverse spectrum converters 33.

FIG. 130 shows an example of a construction of the gain control amount information decoder 172. Although in the present example, the gain control amount information decoder 172 includes twelve decoders 191-1 to 191-12, the number of decoders is not limited to twelve, but the gain control amount information decoder 172 may include an arbitrary plural number of decoders 191.

The encoded gain control information GX is input to the twelve decoders 191-1 to 191-12, as required. In the respective decoders 191-1 to 191-12, the encoded gain control amount information GBX included in the input encoded gain control information GX is subjected to decoding processes corresponding to the encoding processes performed by the respective encoders 91-1 to 91-12 (FIG. 35) of the gain control amount information encoder 72 of the gain control information encoder 61 in the encoding apparatus 51. The decoded results are output from terminals connected to a switch 194.

A decision unit 192 detects, from the gain control amount information encoding information GBY included in the input gain control information encoding information GY, encoding information associated with the encoded gain control amount information GBX (more specifically, detects which one of encoders 91 encoded the gain control amount information GBX or detects which table was used in the encoding of the gain control amount information GBX In accordance with the detected encoding information, the decision unit 192 selects a decoder 191 to be used in decoding.

The decision unit 192 controls the switch 193 so that the encoded gain control information GX is input to the selected decoder 191 and also controls the switch 194 so that the output from the selected decoder 191 is properly supplied to inverse spectrum converters 33.

FIG. 131 shows an example of a construction of the gain control position information decoder 173. Although in the present example, the gain control position information decoder 173 includes twelve decoders 201-1 to 201-12, the number of decoders is not limited to twelve, but the gain control position information decoder 173 may include an arbitrary plural number of decoders 201.

The encoded gain control information GX is input to the twelve decoders 201-1 to 201-12, as required. In the respective decoders 201-1 to 201-12, the encoded gain control position information GCX included in the input encoded gain control information GX is subjected to decoding processes corresponding to the encoding processes performed by the respective encoders 101-1 to 101-12 (FIG. 76) of the gain control position information encoder 73 of the gain control information encoder 61 in the encoding apparatus 51. The decoded results are output from terminals connected to a switch 204.

A decision unit 202 detects, from the gain control position information encoding information GCY included in the input gain control information encoding information GY, encoding information associated with the encoded gain control position information GCX (more specifically, detects which one of encoders 101 encoded the gain control position information GCX or detects which table was used in the encoding of the gain control position information GCX). In accordance with the detected encoding information, the decision unit 202 selects a decoder 201 to be used in decoding.

The decision unit 202 controls the switch 203 so that the encoded gain control information GX is input to the selected decoder 201 and also controls the switch 204 so that the output from the selected decoder 201 is properly supplied to inverse spectrum converters 33.

FIG. 132 shows another example of a construction of the encoding apparatus 51. In addition to the parts employed in the encoding apparatus 51 shown in FIG. 7, the encoding apparatus 51 further includes a normalized coefficient encoder 251 and a quantization step size information encoder 252.

The normalizers 13-1 to 13-12 detect a signal component having a greatest absolute value from the spectral component signals S0 to S11 every unit of time and normalize the spectral component signals S0 to S11 by employing relative values of coefficients with respect to the detected greatest value as the normalized spectral component signals B0 to B11.

The quantizers 13-1 to 13-12 supply the normalized data C0 to C11 obtained by normalizing the spectral component signals S0 to S11 to respective quantizers 15-1 to 15-12 corresponding to the respective bands, and supply the calculated normalized coefficients B0 to B11 to the normalized coefficient encoder 251.

On the basis of the spectral component signals S0 to S11 received from the spectrum converters 12-1 to 12-12, a quantization step size setting unit 14 determines quantization step sizes to be used in quantization of the normalized data C0 to C11, and outputs quantization step size information D0 to D11 indicating the determined quantization step sizes to the corresponding quantizers 15-1 to 15-12 and also to the quantization step size information encoder 252.

The normalized coefficient encoder 251 encodes the normalized coefficients B0 to B11 received from the normalizers 13-1 to 13-12 by means of various different encoding methods. The normalized coefficient encoder 251 detects encoded normalized coefficients B0 to B11 which have been encoded into the least number of bits of those encoded by means of various difference encoding methods, and the normalized coefficient encoder 251 outputs the detected encoded normalized coefficients B0 to B11 to the multiplexer 16.

The quantization step size information encoder 252 encodes the quantization step size information D0 to D11 received from the quantization step size setting unit 14 by means of various different encoding methods. The quantization step size information encoder 252 detects encoded quantization step size information D0 to D11 which have been encoded into the least number of bits of those encoded by means of various difference encoding methods, and the normalized coefficient encoder 251 outputs the detected encoded quantization step size information D0 to D11 to the multiplexer 16.

That is, in the present example, not only the gain control information G but also the normalized coefficient B and the quantization step size information D are encoded into variable-length codes to further improve encoding efficiency associated with the quantized coefficient F.

FIG. 133 shows an example of a construction of a decoding apparatus 151 for decoding the encoded data generated by the encoding apparatus 51 shown in FIG. 132. This decoding apparatus 151 further includes a normalized coefficient decoder 351 and a quantization step size information decoder 352 in addition to the parts employed in the decoding apparatus 151 shown in FIG. 127.

The demultiplexer 31 decodes encoded data and separates the decoded data into encoded gain control information G0 to G11 (encoded gain control information GX), information indicating the encoding method applied to the gain control information G (gain control information encoding information GY), encoded normalized coefficients B0 to B11 (hereinafter, referred to simply as encoded normalized coefficients), information indicating the encoding method applied to the normalized coefficients B (hereinafter, referred to as normalized coefficient encoding information), encoded quantization step size information D0 to D11 (hereinafter, referred to as encoded quantization step size information, information indicating the encoding method applied to the quantization step size information D (hereinafter, referred to as quantization step size information encoding information), and decoded quantized coefficients F0 to F11.

The demultiplexer 31 outputs the encoded gain control information GX and the gain control information encoding information GY to the gain control information decoder 161, the encoded normalized coefficients and the encoded normalized coefficient encoding information to a normalized coefficient decoder 351, and the encoded quantization step size information and the quantization step size information encoding information to a quantization step size information decoder 352.

The demultiplexer 31 also outputs the respective quantized coefficients F0 to F11 to corresponding dequantizers/denormalizers 32-1 to 32-14.

The normalized coefficient decoder 351 decodes the encoded normalized coefficients received from the demultiplexer 31, by a decoding method corresponding to the normalized coefficient encoding information, that is, a decoding method corresponding to the encoding method employed by the normalized coefficient encoder 251 of the encoding apparatus 51 in the encoding of the normalized coefficient B. The resultant decoded normalized coefficients B0 to B11 are respectively output to the corresponding dequantizers/denormalizers 32-1 to 32-12.

The quantization step size information decoder 352 decodes the encoded quantization step size information received from the demultiplexer 31 by a decoding method corresponding to the quantization step size information encoding information, that is, by the decoding method corresponding to the encoding method employed by the quantization step size information encoder 252 of the encoding apparatus 51 in the encoding of the quantization step size information D. The resultant decoded quantization step size information D0 to D11 are respectively output to the corresponding dequantizers/denormalizers 32-1 to 32-12.

The process described above may be performed by hardware or software. In the case in which the processes are performed by software, a software program is installed on a computer, and the computer executes the program so as to realize the functions of the encoding apparatus 51 or the decoding apparatus 151 described above.

FIG. 134 is a block diagram showing a construction of a computer 501 used to realize the functions of the encoding apparatus 51 or the decoding apparatus 151 described above. An input/output interface 516 is connected to a CPU (Central Processing Unit) 511 via a bus 515. If the CPU 511 receives, via the input/output interface 516, a command issued by a user using an input unit 518 including a keyboard, a mouse, or the like, the CPU 511 loads a program into a RAM (Random Access Memory) 513 from a ROM (Random Only Memory) 512, a hard disk 514, or a removable storage medium such as a magnetic disk 531, an optical disk 532, a magnetooptical disk 533, or a semiconductor memory 534 mounted on a drive 520 and executes the loaded program thereby performing various processes described above. The CPU 511 outputs the result of the process, as required, to an output unit 517 such as an LCD (Liquid Crystal Display) via the input/output interface 516. The program may be supplied to users in various manners. For example, the program may be stored in advance in the hard disk 514 or the ROM 512 and the program may be supplied to users together with the computer 501, or the program may be supplied in the form of a package medium such as a magnetic disk 531, an optical disk 532, a magnetooptical disk 533, or a semiconductor memory 534. The program may also be downloaded onto the hard disk 514 via a communication unit 519 and via a satellite or a network.

In the present description, the steps described in the program stored in the storage medium may be performed either in time sequence in accordance with the order described in the program or in a parallel or separate fashion.

Industrial Applicability

The present invention makes it possible to achieve an improvement in encoding efficiency.

What is claimed is:

1. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting a gain control number of a first arbitrary band signal of the band signals and a gain control number of a second band signal in a band adjacent to the band of the first band signal;

calculation means for calculating the difference value between first gain control number detected by the detection means from the first band signal and second gain control number detected by the detection means from the second band signal;

retaining means for retaining a table indicating a value-code correspondence in which a code with a small number of bits is assigned to a value having a high probability of being obtained as the result of the calculation of the difference value performed by the calculation means;

gain control number encoding means for encoding the first gain control number such that a code corresponding to the difference value calculated by the calculation means is retrieved from the table and the retrieved code is employed as the code of the first gain control number;

gain control amount information encoding means for encoding gain control amount information indicating a particular value corresponding to the gain control amount; and gain control position information encoding means for encoding gain control position information indicating a particular value corresponding to the gain control position.

2. An encoding apparatus according to claim 1, wherein the table indicating the difference value versus code correspondence includes only one or more difference values having high probabilities of being obtained as the result of the calculation performed by the calculation means; and in a case in which the correspondence of the calculated difference value is not indicated by the table, the gain control number encoding means encodes an escape code and the first gain control number.

3. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting a gain control number of a first arbitrary band signal of the band signals and a gain control number of a second band signal in a band adjacent to the band of the first band signal;

a calculation step of calculating the difference value between first gain control number detected in the detection step from the first band signal and second gain control number detected in the detection step from the second band signal;

a retaining step of retaining a table indicating a value-code correspondence in which a code with a small number of bits is assigned to a value having a high probability of being obtained as the result of the calculation of the difference value performed in the calculation step;

a gain control number encoding step of encoding the first gain control number such that a code corresponding to the difference value calculated in the calculation step is retrieved from the table and the retrieved code is employed as the code of the first gain control number;

a gain control amount information encoding step of encoding gain control amount information indicating a particular value corresponding to the gain control amount; and a gain control position information encoding step of encoding gain control position information indicating a particular value corresponding to the gain control position.

4. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting a gain control number of a first arbitrary band signal of the band signals and a gain control number of a second band signal in a band adjacent to the band of the first band signal;

determination means for determining whether a first gain control number detected by the detection means from the first band signal and a second gain control number detected by the detection means from the second band signal are equal to each other;

gain control number encoding means for performing encoding such that if the determination made by the determination means is affirmative, only a flag indicating that the first and second gain control numbers are equal to each other is encoded, while, if the determination made by the determination means is negative, both a flag indicating that the first and second gain control numbers are not equal to each other and the second gain control number are encoded;

gain control amount information encoding means for encoding gain control amount information indicating a particular value corresponding to the gain control amount; and gain control position information encoding means for encoding gain control position information indicating a particular value corresponding to the gain control position.

5. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting a gain control number of a first arbitrary band signal of the band signals and a gain control Dumber of a second band signal in a band adjacent to the band of the first band signal;

a determination step of determining whether the first gain control number detected in the detection step from the first band signal is equal to the second gain control number detected in the detection step from the second band signal;

a gain control number encoding step of performing encoding such that if the determination made in the determination step is affirmative, only a flag indicating that the first and second gain control numbers are equal to each other is encoded, while, if the determination made in the determination step is negative, both a flag indicating that the first and second gain control numbers are not equal to each other and the second gain control number are encoded;

a gain control amount information encoding step of encoding gain control amount information indicating a particular value corresponding to the gain control amount; and a gain control position information encoding step of encoding gain control position information indicating a particular value corresponding to the gain control position.

6. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control numbers of the band signals;

calculation means for calculating a smallest number of bits which can represent the difference between the maximum and minimum values of the gain control numbers detected by the detection means;

gain control number encoding means for encoding the gain control number such that the minimum value determined by the calculation means is encoded, a value obtained by subtracting the minimum value from the gain control number detected by the detection means is expressed by as many bits as the smallest number of bits calculate by the calculation means, and a resultant expression is employed as the code of the gain control number;

gain control amount information encoding means for encoding gain control amount information indicating a particular value corresponding to the gain control amount; and gain control position information encoding means for encoding gain control position information indicating a particular value corresponding to the gain control position.

7. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control numbers of the band signals;

a calculation step of calculating a smallest number of bits which can represent the difference between the maximum and minimum values of the gain control numbers detected in the detection step;

a gain control number encoding step for encoding the gain control number such that the minimum value determined in the calculation step is encoded, a value obtained by subtracting the minimum value from the gain control number detected in the detection step is expressed by as many bits as the smallest number of bits calculated in the calculation step, and a resultant expression is employed as the code of the gain control number;

a gain control amount information encoding step of encoding gain control amount information indicating a particular value corresponding to the gain control amount; and a gain control position information encoding step of encoding gain control position information indicating a particular value corresponding to the gain control position.

8. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting a gain control number of an arbitrary band signal of the left-channel signal and a gain control number of a band signal of the right-channel signal in the same band as that of the band signal of the left-channel signal;

calculation means for calculating the difference value between first gain control number detected by the detection means from the band signal of the left-channel signal and second gain control number detected by the detection means from the band signal of the right-channel signal;

retaining means for retaining a table indicating a value-code correspondence in which a code with a small number of bits is assigned to a value having a high probability of being obtained as the result of the calculation of the difference value performed by the calculation means;

gain control number encoding means for encoding the first or second gain control number such that a code corresponding to the difference value calculated by the calculation means is retrieved from the table and the retrieved code is employed as the code of the first or second gain control number;

gain control amount information encoding means for encoding gain control amount information indicating a particular value corresponding to the gain control amount; and gain control position information encoding means for encoding gain control position information indicating a particular value corresponding to the gain control position.

9. An encoding apparatus according to claim 8, wherein the table indicating the difference value versus code correspondence includes only one or more difference values having high probabilities of being obtained as the result of the calculation performed by the calculation means; and in a case in which the correspondence of the calculated difference value is not indicated by the table, the gain control number encoding means encodes an escape code and the first gain control number.

10. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting a gain control number of an arbitrary band signal of the left-channel signal and a gain control number of a band signal of the right-channel signal in the same band as that of the band signal of the left-channel signal;

a calculation step of calculating the difference value between first gain control number detected in the detection step from the band signal of the left-channel signal and second gain control number detected in the detection step from the band signal of the right-channel signal;

a retaining step of retaining a table indicating a value-code correspondence in which a code with a small number of bits is assigned to a value having a high probability of being obtained as the result of the calculation of the difference value performed in the calculation step;

a gain control number encoding step of encoding the first or second gain control number such that a code corresponding to the difference value calculated in the calculation step is retrieved from the table and the retrieved code is employed as the code of the first or second gain control number;

a gain control amount information encoding step of encoding gain control amount information indicating a particular value corresponding to the gain control amount; and a gain control position information encoding step of encoding gain control position information indicating a particular value corresponding to the gain control position.

11. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting a gain control number of an arbitrary band signal of the left-channel signal and a gain control number of a band signal of the right-channel signal in the same band as that of the band signal of the left-channel signal;

determination means for determining whether a first gain control number detected by the detection means from a band signal of the left-channel signal and a second gain control number detected by the detection means from a band signal of the right-channel signal are equal to each other;

gain control number encoding means for performing encoding such that if the determination made by the determination means is affirmative, a flag indicating that the first and second gain control numbers are equal to each other and the first or second gain control number are encoded, while, if the determination made by the determination means is negative, a flag indicating that the first and second gain control numbers are not equal to each other and the second and gain control numbers are encoded;

gain control amount information encoding means for encoding gain control amount information indicating a particular value corresponding to the gain control amount; and gain control position information encoding means for encoding gain control position information indicating a particular value corresponding to the gain control position.

12. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting a gain control number of an arbitrary band signal of the left-channel signal and a gain control number of a band signal of the right-channel signal in the same band as that of the band signal of the left-channel signal;

a determination step of determining whether the first gain control number detected in the detection step from the band signal of the left-channel signal is equal to the second gain control number detected in the detection step from the band signal of the right-channel signal;

a gain control number encoding step of performing encoding such that if the determination made in the determination step is affirmative, a flag indicating that the first and second gain control numbers are equal to each other and the first or second gain control number are encoded, while, if the determination made in the determination means is negative, a flag indicating that the first and second gain control numbers are not equal to each other and the second and gain control numbers are encoded;

a gain control amount information encoding step of encoding gain control amount information indicating a particular value corresponding to the gain control amount; and a gain control position information encoding step of encoding gain control position information indicating a particular value corresponding to the gain control position.

13. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control numbers of band signals of the left-channel signal and gain control numbers of band signals of the right-channel signal;

determination means for determining whether first gain control numbers detected by the detection means from the band signals of the left-channel signal and second gain control numbers detected by the detection means from the corresponding band signals of the right-channel signal are equal to each other for all bands; gain control number encoding means for performing encoding such that if the determination made by the determination means is affirmative, the first or second gain control numbers are encoded, while, if the determination made by the determination means is negative, the first and second gain control numbers are encoded; gain control amount information encoding means for encoding gain control amount information indicating a particular value corresponding to the gain control amount; and gain control position information encoding means for encoding gain control position information indicating a particular value corresponding to the gain control position.

14. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting a gain control number of a band signal of the left-channel signal and a gain control number of a band signal of the right-channel signal;

a determination step of determining whether first gain control numbers detected in the detection step from the band signals of the left-channel signal and second gain control numbers detected in the detection step from the corresponding band signals of the right-channel signal are equal to each other for all bands;

a gain control number encoding step of performing encoding such that if the determination made in the determination step is affirmative, the first or second gain control numbers are encoded, while, if the determination made in the determination step is negative, the first and second gain control numbers are encoded;

a gain control amount information encoding step of encoding gain control amount information indicating a particular value corresponding to the gain control amount; and a gain control position information encoding step of encoding gain control position information indicating a particular value corresponding to the gain control position.

15. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control numbers of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal;

first calculation means for calculating the difference value between first gain control number detected by the detection means from the first band signal and second gain control number detected by the detection means from the second band signal;

second calculation means for calculating the difference value between third gain control number detected from the third band signal and fourth gain control number detected from the fourth band signal;

third calculation means for calculating the difference value between the difference value calculated by the first calculation means and the difference value calculated by the second calculation means;

retaining means for retaining a table indicating a value-code correspondence in which a code with a small number of bits is assigned to a value having a high probability of being obtained as the result of the calculation of the difference value performed by the third calculation means;

gain control number encoding means for encoding the first gain control number such that a code corresponding to the difference value calculated by the calculation means is retrieved from the table and the retrieved code is employed as the code of the first gain control number;

gain control amount information encoding means for encoding gain control amount information indicating a particular value corresponding to the gain control amount; and gain control position information encoding means for encoding gain control position information indicating a particular value corresponding to the gain control position.

16. An encoding apparatus according to claim 15, wherein the table indicating the difference value versus code correspondence includes only one or more difference values having high probabilities of being obtained as the result of the calculation performed by the third calculation means; and in a case in which the correspondence of the calculated difference value is not indicated by the table, the gain control number encoding means encodes an escape code and the first gain control number.

17. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step for detecting gain control numbers of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal;

a first calculation step of calculating the difference value between a first gain control number detected in the detection step from the first band signal and a second gain control number detected in the detection step from the second band signal;

a second calculation step of calculating the difference value between a third gain control number detected from the third band signal and a fourth gain control number detected from the fourth band signal;

a third calculation step of calculating the difference value between the difference value calculated in the first calculation step and the difference value calculated in the second calculation step;

a retaining step of retaining a table indicating a value-code correspondence in which a code with a small number of bits is assigned to a value having a high probability of being obtained as the result of the calculation of the difference value performed in the third calculation step;

a gain control number encoding step of encoding the first gain control number such that a code corresponding to the difference value calculated in the third calculation step is retrieved from the table and the retrieved code is employed as the code of the first gain control number;

a gain control amount information encoding step of encoding gain control amount information indicating a particular value corresponding to the gain control amount; and a gain control position information encoding step of encoding gain control position information indicating a particular value corresponding to the gain control position.

18. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control amount information indicating a particular value corresponding to a gain control amount of a band signal;

calculation means for calculating the difference value between arbitrary first gain control amount information of one or more pieces of gain control amount information detected by the detection means from one of the band signals and gain control amount information corresponding to a gain control amount of gain adjustment performed on a part adjacent to a part subjected to gain adjustment performed according to the gain control amount corresponding to the first gain control amount information;

retaining means for retaining a table indicating a value-code correspondence in which a code with a small number of bits is assigned to a value having a high probability of being obtained as the result of the calculation of the difference value performed by the calculation means;

gain control amount information encoding means for encoding the first gain control amount information by retrieving a code assigned to the difference value calculated by the calculation means from the table and employing the retrieved code as an code of the first gain control amount information;

gain control number encoding means for encoding the gain control number; and gain control position information encoding means for encoding gain control position information indicating a particular value corresponding to the gain control position.

19. The encoding apparatus of claim 18, wherein the table indicates the correspondence of only one or more difference values having high probabilities of being obtained as the result of the calculation performed by the calculation means; and in a case in which the correspondence of the calculated difference value is not indicated by the table, the gain control amount information encoding means encodes an escape code and the first gain control amount information.

20. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control amount information indicating a particular value corresponding to a gain control amount of a band signal;

a calculation step of calculating the difference value between arbitrary first gain control amount information of one or more pieces of gain control amount information detected in the detection step from one of the band signals and gain control amount information corresponding to a gain control amount of gain adjustment performed on a part adjacent to a part subjected to gain adjustment performed according to the gain control amount corresponding to the first gain control amount information;

a retaining step of retaining a table indicating a value-code correspondence in which a code with a small number of bits is assigned to a value having a high probability of being obtained as the result of the calculation of the difference value performed in the calculation step;

a gain control amount information encoding step of encoding the first gain control amount information such that a code corresponding to the difference value calculated in the calculation step is retrieved from the table and the retrieved code is employed as the code of the first gain control amount information;

a gain control number encoding step of encoding the gain control number;

a gain control position information encoding step of encoding gain control position information indicating a particular value corresponding to the gain control position.

21. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control amount information indicating a value corresponding to a gain control amount of a first arbitrary band signal of the band signals and detecting gain control amount information indicating a value corresponding to a gain control amount of a second band signal in a band adjacent to the band of the first band signal;

calculation means for calculating the difference value between first gain control amount information detected by the detection means from the first band signal and second gain control amount information detected by the detection means from the second band signal;

retaining means for retaining a table indicating a value-code correspondence in which a code with a small number of bits is assigned to a value having a high probability of being obtained as the result of the calculation of the difference value performed by the calculation means;

gain control amount information encoding means for encoding the first gain control amount information such that a code corresponding to the difference value calculated by the calculation means is retrieved from the table and the retrieved code is employed as the code of the first gain control amount information;

gain control number encoding means for encoding the gain control number; and gain control position information encoding means for encoding gain control position information indicating a particular value corresponding to the gain control position.

22. An encoding apparatus according to claim 21, wherein the table indicating the difference value versus code correspondence includes only one or more difference values having high probabilities of being obtained as the result of the calculation performed by the calculation means; and in a case in which the correspondence of the calculated difference value is not indicated by the table, the gain control amount information encoding means encodes an escape code and the gain control amount information.

23. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control amount information indicating a value corresponding to a gain control amount of a first arbitrary band signal of the band signals and detecting gain control amount information indicating a value corresponding to a gain control amount of a second band signal in a band adjacent to the band of the first band signal;

a calculation step of calculating the difference value between first gain control amount information detected in the detection step from the first band signal and second gain control amount information detected in the detection step from the second band signal;

a retaining step of retaining a table indicating a value-code correspondence in which a code with a small number of bits is assigned to a value having a high probability of being obtained as the result of the calculation of the difference value performed in the calculation step;

a gain control amount information encoding step of encoding the first gain control amount information such that a code corresponding to the difference value calculated in the calculation step is retrieved from the table and the retrieved code is employed as the code of the first gain control amount information;

a gain control number encoding step of encoding the gain control number; and a gain control position information encoding step of encoding gain control position information indicating a particular value corresponding to the gain control position.

24. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control amount information indicating a value corresponding to a gain control amount of a first arbitrary band signal of the band signals and detecting gain control amount information indicating a value corresponding to a gain control amount of a second band signal in a band adjacent to the band of the first band signal;

first calculation means for calculating the first difference value between arbitrary first gain control amount information of one or more pieces of gain control amount information detected by the detection means from the first band signal and gain control amount information corresponding to a gain control amount of gain adjustment performed on a part adjacent to a part subjected to gain adjustment performed according to the gain control amount corresponding to the first gain control amount information and also calculating the second difference value between third gain control amount information corresponding to the first gain control amount information and fourth gain control amount information corresponding to the second gain control amount information, the third gain control amount information and the fourth gain control amount information having been detected from the second band signal;

second calculation means for calculating the third difference value between the first difference value and the second difference value;

retaining means for retaining a table indicating a value-code correspondence in which a code with a small number of bits is assigned to a value having a high probability of being obtained as the third difference value in the calculation performed by the second calculation means;

gain control amount information encoding means for encoding the first gain control amount information such that a code corresponding to the third difference value calculated by the second calculation means is retrieved from the table and the retrieved code is employed as the code of the first gain control amount information;

gain control number encoding means for encoding the gain control number; and gain control position information encoding means for encoding gain control position information indicating a particular value corresponding to the gain control position.

25. An encoding apparatus according to claim 24, wherein the table indicating the difference value versus code correspondence may include only one or more difference values having high probabilities of being obtained as the result of the calculation of the third difference value performed by the calculation means; and in a case in which the correspondence of the calculated third difference value is not indicated by the table, the gain control amount information encoding means encodes an escape code and the first gain control amount information.

26. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control amount information indicating a value corresponding to a gain control amount of a first arbitrary band signal of the band signals and detecting gain control amount information indicating a value corresponding to a gain control amount of a second band signal in a band adjacent to the band of the first band signal;

a first calculation step for calculating the first difference value between arbitrary first gain control amount information of one or more pieces of gain control amount information detected in the detection step from the first band signal and gain control amount information corresponding to a gain control amount of gain adjustment performed on a part adjacent to a part subjected to gain adjustment performed according to the gain control amount corresponding to the first gain control amount information and also calculating the second difference value between third gain control amount information corresponding to the first gain control amount information and fourth gain control amount information corresponding to the second gain control amount information, the third gain control amount information and the fourth gain control amount information having been detected from the second band signal;

a second calculation step of calculating the third difference value between the first difference value and the second difference value;

a retaining step of retaining a table indicating a value-code correspondence in which a code with a small number of bits is assigned to a value having a high probability of being obtained as the third difference value in the calculation performed in the second calculation step;

a gain control amount information encoding step of encoding the first gain control amount information such that a code corresponding to the third difference value calculated in the second calculation step is retrieved from the table and the retrieved code is employed as the code of the first gain control amount information;

a gain control number encoding step of encoding the gain control number; and a gain control position information encoding step of encoding gain control position information indicating a particular value corresponding to the gain control position.

27. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control amount information indicating a value corresponding to gain control amount information of a first arbitrary band signal of the band signals and detecting gain control amount information indicating a value corresponding to gain control amount information of a second band signal in a band adjacent to the band of the first band signal;

determination means for determining whether first gain control amount information detected by the detection means from the first band signal and second gain control amount information detected from the second band signal are equal to each other;

gain control amount information encoding means for performing encoding such that if the determination made by the determination means is affirmative only a flag indicating that the first gain control amount information and second gain control amount information are equal to each other is encoded, while, if the determination made by the determination means is negative, both a flag, indicating that the first gain control amount information and second gain control amount information are not equal to each other, and the second gain control amount information are encoded;

gain control number encoding means for encoding the gain control number; and gain control position information encoding means for encoding gain control position information indicating a particular value corresponding to the gain control position.

28. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control amount information indicating a value corresponding to gain control amount information of a first arbitrary band signal of the band signals and detecting gain control amount information indicating a value corresponding to gain control amount information of a second band signal in a band adjacent to the band of the first band signal;

a determination step of determining whether the first gain control amount information detected in the detection step from the first band signal is equal to the second gain control amount information detected in the detection step from the second band signal;

a gain control amount information encoding step of performing encoding such that if the determination made in the determination step is affirmative, only a flag indicating that the first gain control amount information and second gain control amount information are equal to each other is encoded, while, if the determination made in the determination step is negative, both a flag, indicating that the first gain control amount information and second gain control amount information are not equal to each other, and the second gain control amount information are encoded;

a gain control number encoding step of encoding the gain control number; and a gain control position information encoding step of encoding gain control position information indicating a particular value corresponding to the gain control position.

29. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control amount information indicating a particular value corresponding to a gain control amount of a band signal;

calculation means for calculating a smallest number of bits which can represent the difference between the maximum and minimum values of the gain control amount information detected by the detection means;

gain control amount information encoding means for encoding the gain control amount information such that the minimum value determined by the calculation means is encoded, a value obtained by subtracting the minimum value from the gain control amount information detected by the detection means is expressed by as many bits as the number of bits calculate by the calculation means, and a resultant expression is employed as the code of the gain control amount information;

gain control number encoding means for encoding the gain control number; and gain control position information encoding means for encoding gain control position information indicating a particular value corresponding to the gain control position.

30. An encoding apparatus according to claim 29, wherein the calculation means calculates a smallest number of bits which can represent the difference between the maximum and minimum values of one or more pieces of gain control amount information detected by the detection means from one band signal; and the gain control amount information encoding means encodes the gain control amount information such that values obtained by subtracting the minimum value from the one or more pieces of gain control amount information are expressed by as many bits as the number of bits calculate by the calculation means and resultant expressions are employed as the codes of the one or more pieces of gain control amount information.

31. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control amount information indicating a particular value corresponding to a gain control amount of a band signal;

a calculation step of calculating a smallest number of bits which can represent the difference between the maximum and minimum values of the gain control amount information detected in the detection step;

a gain control amount information encoding step for encoding the gain control amount information such that the minimum value determined in the calculation step is encoded, a value obtained by subtracting the minimum value from the gain control amount information detected in the detection step is expressed by as many bits as the number of bits calculated in the calculation step, and a resultant expression is employed as the code of the gain control amount information;

a gain control number encoding step of encoding the gain control number; and a gain control position information encoding step of encoding gain control position information indicating a particular value corresponding to the gain control position.

32. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control amount information indicating a particular value corresponding to a gain control amount of a band signal of a left-channel signal and that of a band signal of a right-channel signal in the same band as that of the band signal of the left-channel signal;

calculation means for calculating the difference value between first gain control amount information detected by the detection means from the band signal of the left-channel signal and second gain control amount information detected by the detection means from the band signal of the right-channel signal;

retaining means for retaining a table indicating a value-code correspondence in which a code with a small number of bits is assigned to a value having a high probability of being obtained as the result of the calculation of the difference value performed by the calculation means;

gain control amount information encoding means for encoding the first or second gain control amount information such that a code corresponding to the difference value calculated by the calculation means is retrieved from the table and the retrieved code is employed as the code of the first or second gain control amount information;

gain control number encoding means for encoding the gain control number; and gain control position information encoding means for encoding gain control position information indicating a particular value corresponding to the gain control position.

33. An encoding apparatus according to claim 32, wherein the table indicating the difference value versus code correspondence includes only one or more difference values having high probabilities of being obtained as the result of the calculation performed by the calculation means; and in a case in which the correspondence of the calculated difference value is not indicated by the table, the gain control amount information encoding means encodes an escape code and the gain control amount information.

34. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control amount information indicating a particular value corresponding to a gain control amount of a band signal of a left-channel signal and that of a band signal of a right-channel signal in the same band as that of the band signal of the left-channel signal;

a calculation step of calculating the difference value between first gain control amount information detected in the detection step from the band signal of the left-channel signal and the second gain control amount information detected in the detection step from the band signal of the right-channel signal;

a retaining step of retaining a table indicating a value-code correspondence in which a code with a small number of bits is assigned to a value having a high probability of being obtained as the result of the calculation of the difference value performed in the calculation step;

a gain control amount information encoding step of encoding the first or second gain control amount information such that a code corresponding to the difference value calculated in the calculation step is retrieved from the table and the retrieved code is employed as the code of the first or second gain control amount information;

a gain control number encoding step of encoding the gain control number; and a gain control position information encoding step of encoding gain control position information indicating a particular value corresponding to the gain control position.

35. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control amount information indicating a particular value corresponding to a gain control amount of an arbitrary band signal of a left-channel signal and that of a band signal of a right-channel signal in the same band as that of the band signal of the left-channel signal;

determination means for determining whether gain control amount information detected by the detection means from a band signal of the left-channel signal and second gain control amount information detected by the detection means from a band signal of the right-channel signal are equal to each other;

gain control amount information encoding means for performing encoding such that if the determination made by the determination means is affirmative, a flag indicating that the first gain control amount information and the second gain control amount information are equal to each other and the first or second gain control amount information are encoded, while, if the determination made by the determination means is negative, a flag indicating that the first gain control amount information and the second gain control amount information are not equal to each other, the first gain control amount information, and the second and gain control amount information are encoded;

gain control number encoding means for encoding the gain control number; and gain control position information encoding means for encoding gain control position information indicating a particular value corresponding to the gain control position.

36. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control amount information indicating a particular value corresponding to a gain control amount of an arbitrary band signal of a left-channel signal and that of a band signal of a right-channel signal in the same band as that of the band signal of the left-channel signal;

a determination step of determining whether the first gain control amount information detected in the detection step from the band signal of the left-channel signal is equal to the second gain control amount information detected in the detection step from the band signal of the right-channel signal;

a gain control amount information encoding step of performing encoding such that if the determination made in the determination step is affirmative, a flag indicating that the first gain control amount information and the second gain control amount information are equal to each other and the first or second gain control amount information are encoded, while, if the determination made in the determination step is negative, a flag indicating that the first gain control amount information and the second gain control amount information are not equal to each other, the first gain control amount information, and the second and gain control amount information are encoded;

a gain control number encoding step of encoding the gain control number; and a gain control position information encoding step of encoding gain control position information indicating a particular value corresponding to the gain control position.

37. An encoding apparatus for encoding a stereo audio signal such that a left-channel signal and a right-channel signal of the stereo audio signal are respectively split into band signals of left and right-channel signals in predetermined bands and gain adjustment is made on the band signals, at again control position by a gain control amount, for each of as many positions as indicated by a gain control number, said encoding apparatus comprising:

detection means for detecting gain control amount information indicating a particular value corresponding to a gain control amount of a band signal of a left-channel signal and that of a band signal of a right-channel signal;

determination means for determining whether gain control amount information detected by the detection means from the band signals of the left-channel signal and gain control amount information detected by the detection means from the corresponding band signals of the right-channel signal are equal to each other for all bands;

gain control amount information encoding means for performing encoding such that if the determination made by the determination means is affirmative, the first or second gain control amount information is encoded, while, if the determination made by the determination means is negative, the first gain control amount information and the second gain control amount information are encoded;

gain control number encoding means for encoding the gain control number; and gain control position information encoding means for encoding gain control position information indicating a particular value corresponding to the gain control position.

38. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

detection step for detecting gain control amount information indicating a particular value corresponding to a gain control amount of a band signal of a left-channel signal and that of a band signal of a right-channel signal;

a determination step of determining whether gain control amount information detected in the detection step from the band signals of the left-channel signal and gain control amount information detected in the detection step from the band signals of the right-channel signal are equal to each other in each of all bands;

a gain control amount information encoding step of performing encoding such that if the determination made in the determination step is affirmative, the first or second gain control amount information is encoded, while, if the determination made in the determination step is negative, the first gain control amount information and the second gain control amount information are encoded;

a gain control number encoding step of encoding the gain control number; and a gain control position information encoding step of encoding gain control position information indicating a particular value corresponding to the gain control position.

39. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control amount information indicating a particular value corresponding to a gain control amount of an arbitrary band signal of a left-channel signal and that of a band signal of a right-channel signal in the same band as that of the band signal of the left-channel signal;

first calculation means for calculating the first difference value between arbitrary first gain control amount information of one or more pieces of gain control amount information detected by the detection means from the band signal of the left-channel signal and gain control amount information corresponding to a gain control amount of gain adjustment performed on a part adjacent to a part subjected to gain adjustment performed according to the gain control amount corresponding to the first gain control amount information and also calculating the second difference value between third and fourth gain control amount information of one or more pieces of gain control amount information detected from the band signal of the right-channel signal, the third gain control amount information and the fourth gain control amount information corresponding to the first gain control amount information and the second gain control amount information, respectively;

second calculation means for calculating the third difference value between the first difference value and the second difference value;

retaining means for retaining a table indicating a value-code correspondence in which a code with a small number of bits is assigned to a value having a high probability of being obtained as the third difference value in the calculation performed by the second calculation means;

gain control amount information encoding means for encoding the first gain control amount information such that a code corresponding to the third difference value calculated by the second calculation means is retrieved from the table and the retrieved code is employed as the code of the first gain control amount information;

gain control number encoding means for encoding the gain control number; and gain control position information encoding means for encoding gain control position information indicating a particular value corresponding to the gain control position.

40. An encoding apparatus according to claim 39, wherein the table indicating the difference value versus code correspondence includes only one or more difference values having high probabilities of being obtained as the result of the calculation performed by the calculation means; and in a case in which the correspondence of the calculated third difference value is not indicated by the table, the gain control amount information encoding means encodes an escape code and the first gain control amount information.

41. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control amount information indicating a particular value corresponding to a gain control amount of an arbitrary band signal of a left-channel signal and that of a band signal of a right-channel signal in the same band as that of the band signal of the left-channel signal;

a first calculation step for calculating the first difference value between arbitrary first gain control amount information of one or more pieces of gain control amount information detected in the detection step from the band signal of the left-channel signal and gain control amount information corresponding to a gain control amount of gain adjustment performed on a part adjacent to a part subjected to gain adjustment performed according to the gain control amount corresponding to the first gain control amount information and also calculating the second difference value between third and fourth gain control amount information of one or more pieces of gain control amount information detected from the band signal of the right-channel signal, the third gain control amount information and the fourth gain control amount information corresponding to the first gain control amount information and the second gain control amount information, respectively;

a second calculation step of calculating the third difference value between the first difference value and the second difference value;

a retaining step of retaining a table indicating a value-code correspondence in which a code with a small number of bits is assigned to a value having a high probability of being obtained as the third difference value in the calculation performed in the second calculation step;

a gain control amount information encoding step of encoding the first gain control amount information such that a code corresponding to the third difference value calculated in the second calculation step is retrieved from the table and the retrieved code is employed as the code of the first gain control amount information;

a gain control number encoding step of encoding the gain control number; and a gain control position information encoding step of encoding gain control position information indicating a particular value corresponding to the gain control position.

42. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control amount information indicating values corresponding to gain control amounts of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal;

first calculation means for calculating the difference value between first gain control amount information detected by the detection means from the first band signal and second gain control amount information detected by the detection means from the second band signal;

second calculation means for calculating the difference value between third gain control amount information detected from the third band signal and fourth gain control amount information detected from the fourth band signal;

third calculation means for calculating the difference value between the difference value calculated by the first calculation means and the difference value calculated by the second calculation means;

retaining means for retaining a table indicating a value-code correspondence in which a code with a small number of bits is assigned to a value having a high probability of being obtained as the result of the calculation of the difference value performed by the third calculation means;

gain control amount information encoding means for encoding the first gain control amount information such that a code corresponding to the difference value calculated by the third calculation means is retrieved from the table and the retrieved code is employed as the code of the first gain control amount information;

gain control number encoding means for encoding the gain control number; and gain control position information encoding means for encoding gain control position information indicating a particular value corresponding to the gain control position.

43. An encoding apparatus according to claim 42, wherein the table indicating the difference value versus code correspondence includes only one or more difference values having high probabilities of being obtained as the result of the calculation performed by the third calculation means; and in a case in which the correspondence of the calculated difference value is not indicated by the table, the gain control amount information encoding means encodes an escape code and the first gain control amount information.

44. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control amount information indicating values corresponding to gain control amounts of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal;

a first calculation step of calculating the difference value between first gain control amount information detected in the detection step from the first band signal and second gain control amount information detected in the detection step from the second band signal;

a second calculation step of calculating the difference value between third gain control amount information detected from the third band signal and fourth gain control amount information detected from the fourth band signal;

a third calculation step of calculating the difference value between the difference value calculated in the first calculation step and the difference value calculated in the second calculation step;

a retaining step of retaining a table indicating a value-code correspondence in with a code with a small number of bits is assigned to a value having a high probability of being obtained as the result of the calculation of the difference value performed in the third calculation step;

a gain control amount information encoding step of encoding the first gain control amount information such that a code corresponding to the difference value calculated in the third calculation step is retrieved from the table and the retrieved code is employed as the code of the first gain control amount information;

a gain control number encoding step of encoding the gain control number; and a gain control position information encoding step of encoding gain control position information indicating a particular value corresponding to the gain control position.

45. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of a band signal;

gain control position information encoding means for encoding gain control position information such that a value represented by a particular number of bits indicating the difference between first gain control position information of one or more pieces of gain control position information detected by the detection means from one of the band signals and gain control position information corresponding to a gain control position of a part adjacent to a part indicated by a gain control position corresponding to the first gain control position information is employed as the code of the first gain control position information;

gain control number encoding means for encoding the gain control number; and gain control amount information encoding means for encoding gain control amount information indicating a particular value corresponding to the gain control amount.

46. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step, of detecting gain control position information indicating a particular value corresponding to a gain control position of a band signal;

a gain control position information encoding step of encoding gain control position information such that a value represented by a particular number of bits indicating the difference between first gain control position information of one or more pieces of gain control position information detected in the detection step from one of the band signals and gain control position information corresponding to a gain control position of a part adjacent to a part indicated by a gain control position corresponding to the first gain control position information is employed as the code of the first gain control position information;

a gain control number encoding step of encoding the gain control number; and a gain control amount information encoding step of encoding gain control amount information indicating a particular value corresponding to the gain control amount.

47. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of a band signal;

calculation means for calculating the difference value between arbitrary first gain control position information of one or more pieces of gain control position information detected by the detection means from one of the band signals and gain control position information corresponding to the gain control position of a part adjacent to a part indicated by the gain control position corresponding to the first gain control position information;

retaining means for retaining a table indicating a value-code correspondence in which a code with a small number of bits is assigned to a value having a high probability of being obtained as the result of the calculation of the difference value performed by the calculation means;

gain control position information encoding means for encoding the first gain control position information such that a code corresponding to the difference value calculated by the calculation means is retrieved from the table and the retrieved code is employed as the code of the first gain control position information;

gain control number encoding means for encoding the gain control number; and gain control amount information encoding means for encoding gain control amount information indicating a particular value corresponding to the gain control amount.

48. An encoding apparatus according to claim 47, wherein the table indicating the difference value versus code correspondence includes only one or more difference values having high probabilities of being obtained as the result of the calculation performed by the calculation means; and in a case in which the correspondence of the calculated difference value is not indicated by the table, the gain control position information encoding means encodes an escape code and the first gain control position information.

49. An encoding apparatus according to claim 47, wherein the retaining means retaining a first table indicating a value-code correspondence which is applied when the first gain control position information indicates a position of an attack portion and in which a code with a small number of bits is assigned to a value having a high probability of being obtained as the result of the calculation of the difference value performed by the calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the calculation means;

the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

50. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step, of detecting gain control position information indicating a particular value corresponding to a gain control position of a band signal;

a calculation step for calculating the difference value between arbitrary first gain control position information of one or more pieces of gain control position information detected in the detection step from one of the band signals and gain control position information corresponding to the gain control position of a part adjacent to a part indicated by the gain control position corresponding to the first gain control position information;

a retaining step of retaining a table indicating a value-code correspondence in which a code with a small number of bits is assigned to a value having a high probability of being obtained as the result of the calculation of the difference value performed in the calculation step;

a gain control position information encoding step of encoding the first gain control position information such that a code corresponding to the difference value calculated in the calculation step is retrieved from the table and the retrieved code is employed as the code of the first gain control position information;

a gain control number encoding step of encoding the gain control number; and a gain control amount information encoding step of encoding gain control amount information indicating a particular value corresponding to the gain control amount.

51. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting a gain control position information indicating a value corresponding to a gain control position of a first arbitrary band signal of the band signals and detecting gain control position information indicating a value corresponding to a gain control position of a second band signal in a band adjacent to the band of the first band signal;

calculation means for calculating the difference value between the first gain control position information detected by the detection means from the first band signal and the second gain control position information detected by the detection means from the second band signal;

retaining means for retaining a table indicating a value-code correspondence in which a code with a small number of bits is assigned to a value having a high probability of being obtained as the result of the calculation of the difference value performed by the calculation means;

gain control position information encoding means for encoding the first gain control position information such that a code corresponding to the difference value calculated by the calculation means is retrieved from the table and the retrieved code is employed as the code of the first gain control position information;

gain control number encoding means for encoding the gain control number; and gain control amount information encoding means for encoding gain control amount information indicating a particular value corresponding to the gain control amount.

52. An encoding apparatus according to claim 51, wherein the table indicating the difference value versus code correspondence includes only one or more difference values having high probabilities of being obtained as the result of the calculation performed by the calculation means; and in a case in which the correspondence of the calculated difference value is not indicated by the table, the gain control position information encoding means encodes an escape code and the first gain control position information.

53. An encoding apparatus according to claim 51, wherein the retaining means retaining a first table indicating a value-code correspondence which is applied when the first gain control position information indicates a position of an attack portion and in which a code with a small number of bits is assigned to a value having a high probability of being obtained as the result of the calculation of the difference value performed by the calculation means, and also retaining a second table indicating a value-code correspondence which is applied when the first gain control position information indicates a position of a release portion and in which a node with a small number of bits is assigned to a value having a high probability of being obtained as the result of the calculation of the difference value performed by the calculation means;

the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

54. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control position information indicating a particular value corresponding to a gain control position of a first arbitrary band signal of band signals and gain control position information indicating a particular value corresponding to a gain control position of a second band signal in a band adjacent to the band of the first band signal;

a calculation step of calculating the difference value between first gain control position information detected in the detection step from the first band signal and second gain control position information detected in the detection step from the second band signal;

a retaining step of retaining a table indicating a value-code correspondence in which a code with a small number of bits is assigned to a value having a high probability of being obtained as the result of the calculation of the difference value performed in the calculation step;

a gain control position information encoding step of encoding the first gain control position information such that a code corresponding to the difference value calculated in the calculation step is retrieved from the table and the retrieved code is employed as the code of the first gain control position information;

a gain control number encoding step of encoding the gain control number; and a gain control amount information encoding step of encoding gain control amount information indicating a particular value corresponding to the gain control amount.

55. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting a gain control position information indicating a value corresponding to a gain control position of a first arbitrary band signal of the band signals and detecting gain control position information indicating a value corresponding to a gain control position of a second band signal in a band adjacent to the band of the first band signal;

first calculation means for calculating the first difference value between arbitrary first gain control position information of one or more pieces of gain control position information detected by the detection means from the first band signal and gain control position information corresponding to the gain control position of a part adjacent to a part indicated by the gain control position corresponding to the first gain control position information and also calculating the second difference value between third gain control position information corresponding to the first gain control position information and fourth gain control position information corresponding to the second gain control position information, the third gain control position information and the fourth gain control position information having been detected from the second band signal;

second calculation means for calculating the third difference value between the first difference value and the second difference value;

retaining means for retaining a table indicating a value-code correspondence in which a code with a small number of bits is assigned to a value having a high probability of being obtained as the third difference value in the calculation performed by the second calculation means;

gain control position information encoding means for encoding the first gain control position information such that a code corresponding to the third difference value calculated by the second calculation means is retrieved from the table and the retrieved code is employed as the code of the first gain control position information;

gain control number encoding means for encoding the gain control number; and gain control amount information encoding means for encoding gain control amount information indicating a particular value corresponding to the gain control amount.

56. An encoding apparatus according to claim 55, wherein the table indicating the difference value versus code correspondence may include only one or more difference values having high probabilities of being obtained as the result of the calculation of the third difference value performed by the calculation means; and in a case in which the correspondence of the calculated third difference value is not indicated by the table, the gain control position information encoding means encodes an escape code and the first gain control position information.

57. An encoding apparatus according to claim 55, wherein the retaining means retaining a first table indicating a value-code correspondence which is applied when the first gain control position information indicates a position of an attack portion and in which a code with a small number of bits is assigned to a third difference value having a high probability of being obtained as a result of the calculation performed by the second calculation means, and also retaining a second table indicating a value-code correspondence which is applied when the first gain control position information indicates a position of a release portion and in which a code with a small number of bits is assigned to a third difference value having a high probability of being obtained as a result of the calculation performed by the second calculation means; and the first encoding means performs encoding of the first gain control position information such that when the first gain control position information corresponds to the position of an attack portion, a code corresponding to the third difference value is retrieved from the first table and the retrieved code is employed as the code of the first gain control position information, while when the first gain control position information corresponds to the position of a release portion, a code corresponding to the third difference value is retrieved from the second table and the retrieved code is employed as the code of the first gain control position information.

58. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control position information indicating a particular value corresponding to a gain control position of a first arbitrary band signal of band signals and gain control position information indicating a particular value corresponding to a gain control position of a second band signal in a band adjacent to the band of the first band signal;

a first calculation step of calculating the first difference value between arbitrary first gain control position information of one or more pieces of gain control position information detected in the detection step from the first band signal and gain control position information corresponding to the gain control position of a part adjacent to a part indicated by the gain control position corresponding to the first gain control position information and also calculating the second difference value between third gain control position information corresponding to the first gain control position information and fourth gain control position information corresponding to the second gain control position information, the third gain control position information and the fourth gain control position information having been detected from the second band signal;

a second calculation step of calculating the third difference value between the first difference value and the second difference value;

a retaining step of retaining a table indicating a value-code correspondence in which a code with a small number of bits is assigned to a value having a high probability of being obtained as the third difference value in the calculation performed in the second calculation step;

a gain control position information encoding step of encoding the first gain control position information such that a code corresponding to the third difference value calculated in the second calculation step is retrieved from the table and the retrieved code is employed as the code of the first gain control position information;

a gain control number encoding step of encoding the gain control number; and a gain control amount information encoding step of encoding gain control amount information indicating a particular value corresponding to the gain control amount.

59. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting a gain control position information indicating a value corresponding to a gain control position of a first arbitrary band signal of the band signals and detecting gain control position information indicating a value corresponding to a gain control position information of a second band signal in a band adjacent to the band of the first band signal;

determination means for determining whether first gain control position information detected by the detection means from the first band signal and second gain control position information detected from the second band signal are equal to each other;

gain control position information encoding means for performing encoding such that if the determination made by the determination means is affirmative, only a flag indicating that the first gain control position information and second gain control position information are equal to each other is encoded, while, if the determination made by the determination means is negative, both a flag, indicating that the first gain control position information and second gain control position information are not equal to each other, and the second gain control position information are encoded;

gain control number encoding means for encoding the gain control number; and gain control amount information encoding means for encoding gain control amount information indicating a particular value corresponding to the gain control amount.

60. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step of detecting gain control position information indicating a particular value corresponding to a gain control position of a first arbitrary band signal of band signals and gain control position information indicating a particular value corresponding to gain control position information of a second band signal in a band adjacent to the band of the first band signal;

a determination step of determining whether the first gain control position information detected in the detection step from the first band signal is equal to the second gain control position information detected in the detection step from the second band signal;

a gain control position information encoding step of performing encoding such that if the determination made in the determination step is affirmative, only a flag indicating that the first gain control position information and second gain control position information are equal to each other is encoded, while, if the determination made in the determination step is negative, both a flag, indicating that the first gain control position information and second gain control position information are not equal to each other, and the second gain control position information are encoded;

a gain control number encoding step of encoding the gain control number; and a gain control amount information encoding step of encoding gain control amount information indicating a particular value corresponding to the gain control amount.

61. An encoding apparatus for encoding an acoustic time series signal such that the acoustic time series signal is split into band signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of a band signal;

calculation means for calculating a smallest number of bits which can represent the difference between the maximum and minimum values of the gain control position information detected by the detection means;

gain control position information encoding means for encoding the gain control position information such that the minimum value determined by the calculation means is encoded, a value obtained by subtracting the minimum value from the gain control position information detected by the detection means is expressed by as many bits as the number of bits calculate by the calculation means, and a resultant expression is employed as the code of the gain control position information;

gain control number encoding means for encoding the gain control number; and gain control amount information encoding means for encoding gain control amount information indicating a particular value corresponding to the gain control amount.

62. An encoding apparatus according to claim 61, wherein the calculation means calculates a smallest number of bits which can represent the difference between the maximum and minimum values of one or more pieces of gain control position information detected by the detection means from one band signal; and the gain control position information encoding means encodes the gain control position information such that values obtained by subtracting the minimum value from the one or more pieces of gain control position information are expressed by as many bits as the number of bits calculate by the calculation means and resultant expressions are employed as the codes of the one or more pieces of gain control position information.

63. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a detection step, of detecting gain control position information indicating a particular value corresponding to a gain control position of a band signal;

a calculation step of calculating a smallest number of bits which can represent the difference between the maximum and minimum values of the gain control position information detected in the detection step;

a gain control position information encoding step for encoding the gain control position information such that the minimum value determined in the calculation step is encodes, a value obtained by subtracting the minimum value from the gain control position information detected in the detection step is expressed by as many bits as the number of bits calculated in the calculation step, and a resultant expression is employed as the code of the gain control position information;

a gain control number encoding step of encoding the gain control number; and a gain control amount information encoding step of encoding gain control amount information indicating a particular value corresponding to the gain control amount.

64. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of an arbitrary band signal of a left-channel signal and that of a band signal of a right-channel signal in the same band as that of the band signal of the left-channel signal;

calculation means for calculating the difference value between the first gain control position information detected by the detection means from the band signal of the left-channel signal and the second gain control position information detected by the detection means from the band signal of the right-channel signal;

retaining means for retaining a table indicating a value-code correspondence in which a code with a small number of bits is assigned to a value having a high probability of being obtained as the result of the calculation of the difference value performed by the calculation means;

gain control position information encoding means for encoding the first or second gain control position information such that a code corresponding to the difference value calculated by the calculation means is retrieved from the table and the retrieved code is employed as the code of the first or second gain control position information;

gain control number encoding means for encoding the gain control number; and gain control amount information encoding means for encoding gain control amount information indicating a particular value corresponding to the gain control amount.

65. An encoding apparatus according to claim 64, wherein the table indicating the difference value versus code correspondence includes only one or more difference values having high probabilities of being obtained as the result of the calculation performed by the calculation means; and in a case in which the correspondence of the calculated difference value is not indicated by the table, the gain control position information encoding means encodes an escape code and the gain control position information.

66. An encoding apparatus according to claim 64, wherein the retaining means retaining a first table indicating a value-code correspondence which is applied when the first gain control position information indicates a position of an attack portion and in which a code with a small number of bits is assigned to a value having a high probability of being obtained as the result of the calculation of the difference value performed by the calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the calculation means;

the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

67. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control position information indicating a particular value corresponding to a gain control position of an arbitrary band signal of a left-channel signal and that of a band signal of a right-channel signal in the same band as that of the band signal of the left-channel signal;

a calculation step of calculating the difference value between first gain control position information detected in the detection step from the band signal of the left-channel signal and second gain control position information detected in the detection step from the band signal of the right-channel signal;

a retaining step of retaining a table indicating a value-code correspondence in which a code with a small number of bits is assigned to a value having a high probability of being obtained as the result of the calculation of the difference value performed in the calculation step;

a gain control position information encoding step of encoding the first or second gain control position information such that a code corresponding to the difference value calculated in the calculation step is retrieved from the table and the retrieved code is employed as the code of the first or second gain control position information;

a gain control number encoding step of encoding the gain control number; and a gain control amount information encoding step of encoding gain control amount information indicating a particular value corresponding to the gain control amount.

68. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of an arbitrary band signal of a left-channel signal and that of a band signal of a right-channel signal in the same band as that of the band signal of the left-channel signal;

determination means for determining whether gain control position information detected by the detection means from a band signal of the left-channel signal and second gain control position information detected by the detection means from a band signal of the right-channel signal are equal to each other;

gain control position information encoding means for performing encoding such that if the determination made by the determination means is affirmative, a flag indicating that the first gain control position information and the second gain control position information are equal to each other and the first or second gain control position information are encoded, while, if the determination made by the determination means is negative, a flag indicating that the first gain control position information and the second gain control position information are not equal to each other, the first gain control position information, and the second and gain control position information are encoded;

gain control number encoding means for encoding the gain control number; and gain control amount information encoding means for encoding gain control amount information indicating a particular value corresponding to the gain control amount.

69. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control position information indicating a particular value corresponding to a gain control position of an arbitrary band signal of a left-channel signal and that of a band signal of a right-channel signal in the same band as that of the band signal of the left-channel signal;

a determination step of determining whether gain control position information detected in the detection step from the band signal of the left-channel signal and gain control position information detected in the detection step from the band signal of the right-channel signal are equal to each other;

a gain control number encoding step of performing encoding such that if the determination made in the determination step is affirmative, a flag indicating that the first gain control position information and the second gain control position information are equal to each other and the first or second gain control position information are encoded, while, if the determination made in the determination step is negative, a flag indicating that the first gain control position information and the second gain control position information are not equal to each other, the first gain control position information, and the second and gain control position information are encoded;

a gain control number encoding step of encoding the gain control number; and a gain control amount information encoding step of encoding gain control amount information indicating a particular value corresponding to the gain control amount.

70. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of a band signal of a left-channel signal and that of a band signal of a right-channel signal;

determination means for determining whether gain control position information detected by the detection means from the band signals of the left-channel signal and gain control position information detected by the detection means from the corresponding band signals of the right-channel signal are equal to each other for all bands;

gain control position information encoding means for performing encoding such that if the determination made by the determination means is affirmative, the first or second gain control position information is encoded, while, if the determination made by the determination means is negative, the first gain control position information and the second gain control position information are encoded;

gain control number encoding means for encoding the gain control number; and gain control amount information encoding means for encoding gain control amount information indicating a particular value corresponding to the gain control amount.

71. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control number, said encoding method comprising:

detection step for detecting gain control position information indicating a particular value corresponding to a gain control position of a band signal of a left-channel signal and that of a band signal of a right-channel signal;

a determination step of determining whether gain control position information detected in the detection step from the band signal of the left-channel signal and gain control position information detected in the detection step from the band signal of the right-channel signal are equal to each other for all bands;

a gain control number encoding step of performing encoding such that if the determination made in the determination step is affirmative, the first or second gain control position information is encoded, while, if the determination made in the determination step is negative, the first gain control position information and the second gain control position information are encoded;

a gain control number encoding step of encoding the gain control number; and a gain control amount information encoding step of encoding gain control amount information indicating a particular value corresponding to the gain control amount.

72. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control position information indicating a particular value corresponding to a gain control position of an arbitrary band signal of a left-channel signal and that of a band signal of a right-channel signal in the same band as that of the band signal of the left-channel signal;

first calculation means for calculating the difference value between first gain control position information and second gain control position information, wherein the first gain control position information is arbitrary gain control position information of one or more pieces of gain control position information detected by the detection means from the band signal of the left-channel signal, and the second gain control position information has a value corresponding to a gain control position adjacent to the first gain control position;

second calculation means for calculating the difference value between third gain control position information and fourth gain control position information, wherein the third gain control position information and fourth gain control position information are gain control position information of one or more pieces of gain control position information detected from the band signal of the right-channel signal, and the third gain control position information and fourth gain control position information correspond to the first gain control position information and second gain control position information, respectively;

third calculation means for calculating the difference value between the difference value calculated by the first calculation means and the difference value calculated by the second calculation means;

retaining means for retaining a table indicating a value-code correspondence in which a code with a small number of bits is assigned to a value having a high probability of being obtained as the result of the calculation of the difference value performed by the third calculation means;

gain control position information encoding means for encoding the first gain control position information such that a code corresponding to the difference value calculated by the third calculation means is retrieved from the table and the retrieved code is employed as the code of the first gain control position information;

gain control number encoding means for encoding the gain control number; and gain control amount information encoding means for encoding gain control amount information indicating a particular value corresponding to the gain control amount.

73. An encoding apparatus according to claim 72, wherein the table indicating the difference value versus code correspondence includes only one or more difference values having high probabilities of being obtained as the result of the calculation performed by the third calculation means; and in a case in which the correspondence of the calculated difference value is not indicated by the table, the gain control position information encoding means encodes an escape code and the first gain control position information.

74. An encoding apparatus according to claim 72, wherein the retaining means retaining a first table indicating a value-code correspondence which is applied when the first gain control position information indicates a position of an attack portion and in which a code with a small number of bits is assigned to a value having a high probability of being obtained as the result of the calculation of the difference value performed by the third calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the third calculation means; and the gain control position information encoding means encodes the gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

75. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step of detecting gain control position information indicating a particular value corresponding to a gain control position of an arbitrary band signal of a left-channel signal and that of a band signal of a right-channel signal in the same band as that of the band signal of the left-channel signal;

a first calculation step of calculating the difference value between first gain control position information and second gain control position information, wherein the first gain control position information is arbitrary gain control position information of one or more pieces of gain control position information detected in the detection step from the band signal of the left-channel signal, and the second gain control position information has a value corresponding to a gain control position adjacent to the first gain control position;

a second calculation step for calculating the difference value between third gain control position information and fourth gain control position information, wherein the third gain control position information and fourth gain control position information are gain control position information of one or more pieces of gain control position information detected from the band signal of the right-channel signal, and the third gain control position information and fourth gain control position information correspond to the first gain control position information and second gain control position information, respectively;

a third calculation step of calculating the difference value between the difference value calculated in the first calculation step and the difference value calculated in the second calculation step;

a retaining step of retaining a table indicating a value-code correspondence in which a code with a small number of bits is assigned to a value having a high probability of being obtained as the result of the calculation of the difference value performed in the third calculation step;

a gain control position information encoding step of encoding the first gain control position information such that a code corresponding to the difference value calculated in the third calculation step is retrieved from the table and the retrieved code is employed as the code of the first gain control position information;

a gain control number encoding step of encoding the gain control number; and a gain control amount information encoding step of encoding gain control amount information indicating a particular value corresponding to the gain control amount.

76. An encoding apparatus for encoding a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding apparatus comprising:

detection means for detecting gain control position information indicating values corresponding to gain control positions of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal;

first calculation means for calculating the difference value between first gain control position information detected by the detection means from the first band signal and second gain control position information detected by the detection means from the second band signal;

second calculation means for calculating the difference value between third gain control position information detected from the third band signal and fourth gain control position information detected from the fourth band signal;

third calculation means for calculating the difference value between the difference value calculated by the first calculation means and the difference value calculated by the second calculation means;

retaining means for retaining a table indicating a value-code correspondence in which a code with a small number of bits is assigned to a value having a high probability of being obtained as the result of the calculation of the difference value performed by the third calculation means;

gain control position information encoding means for encoding the first gain control position information such that a code corresponding to the difference value calculated by the third calculation means is retrieved from the table and the retrieved code is employed as the code of the first gain control position information;

gain control number encoding means for encoding the gain control number; and gain control amount information encoding means for encoding gain control amount information indicating a particular value corresponding to the gain control amount.

77. An encoding apparatus according to claim 76, wherein the table indicating the difference value versus code correspondence includes only one or more difference values having high probabilities of being obtained as the result of the calculation performed by the third calculation means; and in a case in which the correspondence of the calculated difference value is not indicated by the table, the gain control position information encoding means encodes an escape code and the first gain control position information.

78. An encoding apparatus according to claim 76, wherein the retaining means retaining a first table indicating a value-code correspondence which is applied when the first gain control position information indicates a position of an attack portion and in which a code with a small number of bits is assigned to a value having a high probability of being obtained as the result of the calculation of the difference value performed by the third calculation means, and also retaining a second table indicating a value-code correspondence which is applied when the first gain control position information indicates a position of a release portion and in which a code with a small number of bits is assigned to a value having a high probability of being obtained as the result of the calculation of the difference value performed by the third calculation means;

the first encoding means performs encoding of the first gain control position information such that when the first gain control position information corresponds to the position of an attack portion, a code corresponding to the difference value is retrieved from the first table and the retrieved code is employed as the code of the first gain control position information, while when the first gain control position information corresponds to the position of a release portion, a code corresponding to the difference value is retrieved from the second table and the retrieved code is employed as the code of the first gain control position information.

79. An encoding method for an encoding apparatus to encode a stereo audio signal such that a left-channel signal and a right-channel signal of the stereo audio signal are respectively split into band signals of left and right-channel signals in predetermined bands and gain adjustment is made on the band signals, at a gain control position by a gain control amount, for each of as many positions as indicated by a gain control number, said encoding method comprising:

a detection step for detecting gain control position information indicating values corresponding to gain control positions of an arbitrary first band signal, a second band signal, a third band signal, and a fourth band signal, respectively, the first band signal and the second band signal being of band signals of a left-channel signal, the second band signal being of a band adjacent to a band of the first band signal, the third band signal and the fourth band signal being of band signals of a right-channel signal, the third band signal corresponding to the first band signal, the fourth band signal corresponding to the second band signal;

a calculation step of calculating the difference value between first gain control position information detected in the detection step from the first band signal and second gain control position information detected in the detection step from the second band signal;

a second calculation step for calculating the difference value between third gain control position information detected from the third band signal and fourth gain control position information detected from the fourth band signal;

a third calculation step of calculating the difference value between the difference value calculated in the first calculation step and the difference value calculated in the second calculation step;

a retaining step of retaining a table indicating a value-code correspondence in which a code with a small number of bits is assigned to a value having a high probability of being obtained as the result of the calculation of the difference value performed in the third calculation step;

a gain control position information encoding step of encoding the first gain control position information such that a code corresponding to the difference value calculated in the third calculation step is retrieved from the table and the retrieved code is employed as the code of the first gain control position information;

a gain control number encoding step of encoding the gain control number; and a gain control amount information encoding step of encoding gain control amount information indicating a particular value corresponding to the gain control amount.

80. An encoding apparatus for encoding an acoustic time series signal such that the acoustic time series signal is split into band signals in predetermined bands and gain adjustment is made on the band signals in accordance with gain control amount data at as many positions indicated by gain control position data as indicated by gain control number data, said encoding apparatus comprising:

band splitting means for splitting the acoustic time series signal into N bands thereby producing N band signals;

execution means for producing the gain control numbers, the gain control amount information having values corresponding to the gain control amounts, and gain control position information having values corresponding to the gain control positions associated with the respective band signals and executing gain control process on the band signals in accordance with the gain control numbers, the gain control amount information, and the gain control position information;

a plurality of gain control number encoding means for encoding the gain control number;

first selection means for selecting one of the gain control number encoding means, in accordance with information indicating the code length of the gain control numbers encoded by the plurality of gain control number encoding means;

a plurality of gain control amount information encoding means for encoding the gain control amount information;

second selection means for selecting one of the gain control amount information encoding means, in accordance with information indicating the code length of the gain control amount information encoded by the plurality of gain control amount information encoding means;

a plurality of gain control position information encoding means for encoding the gain control position information;

third selection means for selecting one of the gain control position information encoding means, in accordance with information indicating the code length of the gain control position information encoded by the plurality of gain control position information encoding means; and multiplexing means for multiplexing the gain control numbers encoded by the gain control number encoding means selected by the first selection means, the gain control amount information encoded by the gain control amount information encoding means selected by the second selection means, and the gain control position information encoded by the gain control position information encoding means selected by the third selection means, together with the encoded acoustic time series signal, thereby producing encoded data.

81. An encoding method for an encoding apparatus to encode an acoustic time series signal such that the acoustic time series signal is split into band signals in predetermined bands and gain adjustment is made on the band signals, at a gain control position by a gain control amount, for each of as many positions as indicated by a gain control number, said encoding method comprising:

a band splitting step of splitting the acoustic time series signal into N bands thereby producing N band signals;

an execution step of producing the gain control numbers, the gain control amount information having values corresponding to the gain control amounts, and gain control position information having values corresponding to the gain control positions associated with the respective band signals and executing gain control process on the band signals in accordance with the gain control numbers, the gain control amount information, and the gain control position information;

a gain control number encoding step of encoding the gain control numbers;

a first selection step of selecting one of the gain control number encoding step, in accordance with information indicating the code length of the gain control numbers encoded in the plurality of gain control number encoding step;

a plurality of gain control amount information encoding steps for encoding the gain control amount information;

a second selection step of selecting one of the gain control amount information encoding step, in accordance with information indicating the code length of the gain control amount information encoded in the plurality of gain control amount information encoding step;

a plurality of gain control position information encoding steps for encoding the gain control position information;

a third selection step of selecting one of the gain control position information encoding step, in accordance with information indicating the code length of the gain control position information encoded in the plurality of gain control position information encoding step; and a multiplexing step of multiplexing the gain control numbers encoded in the gain control number encoding step selected in the first selection step, the gain control amount information encoded in the gain control amount information encoding steps selected in the second selection step, and the gain control position information encoded in the gain control position information encoding steps selected in the third selection step, together with the encoded acoustic time series signal, thereby producing encoded data.

* * * * *